(12) United States Patent
Kiuchi et al.

(10) Patent No.: US 8,780,326 B2
(45) Date of Patent: Jul. 15, 2014

(54) EXPOSURE APPARATUS, EXPOSURE METHOD, AND DEVICE MANUFACTURING METHOD

(75) Inventors: Tohru Kiuchi, Higashi-kurume (JP); Takeyuki Mizutani, Kumagaya (JP); Masahiro Nei, Yokohama (JP); Masato Hamatani, Kounosu (JP); Masahiko Okumura, Tokyo (JP)

(73) Assignee: Nikon Corporation, Tokyo (JP)

( * ) Notice: Subject to any disclaimer, the term of this patent is extended or adjusted under 35 U.S.C. 154(b) by 595 days.

(21) Appl. No.: 11/517,397

(22) Filed: Sep. 8, 2006

(65) Prior Publication Data

US 2011/0222037 A1      Sep. 15, 2011

Related U.S. Application Data

(60) Provisional application No. 60/819,634, filed on Jul. 11, 2006.

(30) Foreign Application Priority Data

Sep. 9, 2005 (JP) .................................. 2005-261888
Sep. 30, 2005 (JP) .................................. 2005-286487

(51) Int. Cl.
*G03B 27/42* (2006.01)
*G03B 27/52* (2006.01)
*G03B 27/58* (2006.01)
*G03B 27/32* (2006.01)
*G03B 27/54* (2006.01)

(52) U.S. Cl.
USPC ................... 355/53; 355/30; 355/55; 355/67; 355/72; 355/77

(58) Field of Classification Search
USPC ....................... 355/53, 30, 55, 67–71, 72–77; 250/492.1, 492.2, 492.22, 548; 430/8, 430/30, 311, 312, 22, 321, 322
See application file for complete search history.

(56) References Cited

U.S. PATENT DOCUMENTS

| 4,346,164 A | 8/1982 | Tabarelli et al. |
| 4,480,910 A | 11/1984 | Takanashi et al. |

(Continued)

FOREIGN PATENT DOCUMENTS

| DE | 221 563 A1 | 4/1985 |
| DE | 224 448 A1 | 7/1985 |

(Continued)

OTHER PUBLICATIONS

English translation of JP2005-020299, which is domestic republication of W02005-020299, published Mar. 3, 2005.*

(Continued)

*Primary Examiner* — Toan Ton
*Assistant Examiner* — Christina Riddle
(74) *Attorney, Agent, or Firm* — Oliff PLC

(57) ABSTRACT

An exposure apparatus comprises a liquid immersion system, a first mover, and a prescribed member. The exposure apparatus exposes a substrate via an optical member and a liquid. The liquid immersion system performs supply and recovery of the liquid. The first mover can move in a first area, and can hold the liquid between itself and the optical member. The prescribed member is removed from the first mover when the first mover withdraws from a position opposing the optical member, and can hold the liquid between itself and the optical member.

20 Claims, 58 Drawing Sheets

(56) References Cited

U.S. PATENT DOCUMENTS

| | | | |
|---|---|---|---|
| 5,610,683 A | 3/1997 | Takahashi | |
| 5,715,039 A | 2/1998 | Fukuda et al. | |
| 5,825,043 A | 10/1998 | Suwa | |
| 5,969,441 A | 10/1999 | Loopstra et al. | |
| 6,341,007 B1* | 1/2002 | Nishi et al. | 355/53 |
| 6,590,634 B1 | 7/2003 | Nishi et al. | |
| 6,611,316 B2 | 8/2003 | Sewell | |
| 6,778,257 B2 | 8/2004 | Bleeker et al. | |
| 6,842,248 B1* | 1/2005 | Binnard et al. | 356/401 |
| 6,879,382 B2* | 4/2005 | Akutsu et al. | 355/67 |
| 6,897,963 B1 | 5/2005 | Taniguchi et al. | |
| 2001/0028456 A1* | 10/2001 | Nishi | 356/400 |
| 2003/0123041 A1* | 7/2003 | Tanaka | 355/72 |
| 2004/0165159 A1 | 8/2004 | Lof et al. | |
| 2004/0211920 A1* | 10/2004 | Derksen et al. | 250/492.1 |
| 2004/0263809 A1 | 12/2004 | Nakano | |
| 2005/0036121 A1* | 2/2005 | Hoogendam et al. | 355/30 |
| 2005/0041225 A1* | 2/2005 | Sengers et al. | 355/30 |
| 2005/0175776 A1 | 8/2005 | Streefkerk et al. | |
| 2005/0231694 A1* | 10/2005 | Kolesnychenko et al. | 355/53 |
| 2006/0023186 A1* | 2/2006 | Binnard | 355/53 |
| 2006/0077367 A1* | 4/2006 | Kobayashi et al. | 355/53 |
| 2006/0082741 A1 | 4/2006 | Van Der Toorn et al. | |
| 2006/0103820 A1* | 5/2006 | Donders et al. | 355/53 |
| 2006/0132733 A1 | 6/2006 | Modderman | |
| 2006/0152696 A1* | 7/2006 | Boogaard et al. | 355/53 |
| 2006/0215144 A1* | 9/2006 | Shibazaki | 355/72 |
| 2006/0227308 A1* | 10/2006 | Brink et al. | 355/53 |
| 2007/0263182 A1* | 11/2007 | Nakano et al. | 355/30 |
| 2008/0137045 A1* | 6/2008 | Kiuchi | 355/30 |
| 2009/0002658 A1* | 1/2009 | Kiuchi | 355/53 |

FOREIGN PATENT DOCUMENTS

| | | | |
|---|---|---|---|
| EP | 1 420 299 A2 | 5/2004 | |
| EP | 1 662 554 A1 | 5/2006 | |
| EP | 1 713 113 A1 | 10/2006 | |
| EP | 1 737 024 A1 | 12/2006 | |
| EP | 1 806 771 A1 | 7/2007 | |
| JP | A 57-117238 | 7/1982 | |
| JP | A-57-117238 | 7/1982 | |
| JP | A 58-202448 | 11/1983 | |
| JP | A 59-19912 | 2/1984 | |
| JP | A 62-65326 | 3/1987 | |
| JP | A 63-157419 | 6/1988 | |
| JP | A 04-65603 | 3/1992 | |
| JP | A-04-065603 | 3/1992 | |
| JP | A 04-305915 | 10/1992 | |
| JP | A 04-305917 | 10/1992 | |
| JP | A 05-62877 | 3/1993 | |
| JP | A 06-124873 | 5/1994 | |
| JP | A 07-220990 | 8/1995 | |
| JP | A 08-316125 | 11/1996 | |
| JP | A 10-163099 | 6/1998 | |
| JP | A 10-214783 | 8/1998 | |
| JP | A 10-303114 | 11/1998 | |
| JP | A 10-340846 | 12/1998 | |
| JP | A 11-16816 | 1/1999 | |
| JP | A 11-135400 | 5/1999 | |
| JP | A 11-176727 | 7/1999 | |
| JP | A 2000-58436 | 2/2000 | |
| JP | T 2000-505958 | 5/2000 | |
| JP | A 2000-164504 | 6/2000 | |
| JP | A 2000-511704 | 9/2000 | |
| JP | A 2000-323404 | 11/2000 | |
| JP | T 2001-510577 | 7/2001 | |
| JP | A 2001-223159 | 8/2001 | |
| JP | A 2001-513267 | 8/2001 | |
| JP | A 2002-14005 | 1/2002 | |
| JP | A 2002-158168 | 5/2002 | |
| JP | T 2004-519850 | 7/2004 | |
| JP | A 2004-289126 | 10/2004 | |
| JP | A 2004-289128 | 10/2004 | |
| JP | A 2004-343114 | 12/2004 | |
| JP | A 2005-19864 | 1/2005 | |
| JP | A 2005-150734 | 6/2005 | |
| JP | A 2006-100686 | 4/2006 | |
| JP | A 2006-121077 | 5/2006 | |
| JP | A 2006-140498 | 6/2006 | |
| JP | A 2006-179906 | 7/2006 | |
| WO | WO 98/40791 | 9/1998 | |
| WO | WO 99/23692 | 5/1999 | |
| WO | WO 99/28790 | 6/1999 | |
| WO | WO 99/32940 | 7/1999 | |
| WO | WO 99/49504 A1 | 9/1999 | |
| WO | WO 01/35168 A1 | 5/2001 | |
| WO | WO 2004/019128 A2 | 3/2004 | |
| WO | WO 2004090577 A2 * | 10/2004 | |
| WO | WO 2005020299 A1 * | 3/2005 | H01L 21/027 |
| WO | WO 2005/074014 A1 | 8/2005 | |
| WO | WO 2005/093792 A1 | 10/2005 | |
| WO | WO 2006040890 A1 * | 4/2006 | G03F 7/20 |

OTHER PUBLICATIONS

Sep. 2, 2010 Office Action issued in corresponding Singapore Patent Application No. 20081934-1.

Nov. 21, 2006 International Search Report issued in corresponding International Patent Application No. PCT/JP2006/317902 (with translation).

Nov. 21, 2006 Written Opinion issued in corresponding International Patent Application No. PCT/JP2006/317902 (with translation).

Apr. 11, 2011 Notice of Allowance issued in Singapore Patent Application No. 200801934-1.

Feb. 28, 2012 Office Action issued in JP Application No. 2007-534490 (with English translation).

May 24, 2012 Office Action issued in Indian Application No. 1190/KOLNP/2008.

* cited by examiner

FIG. 13
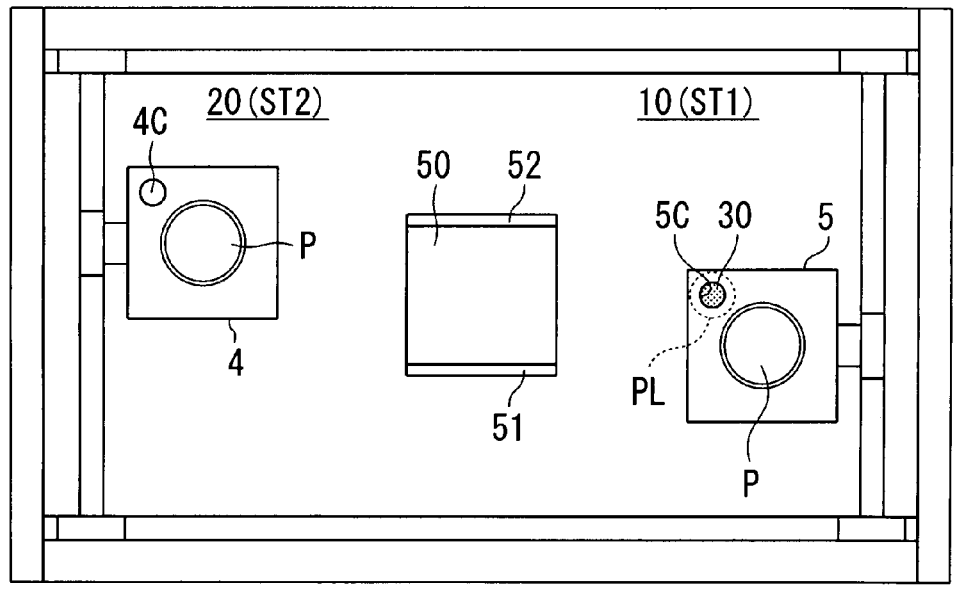
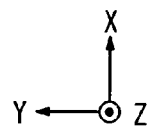
FIG. 14
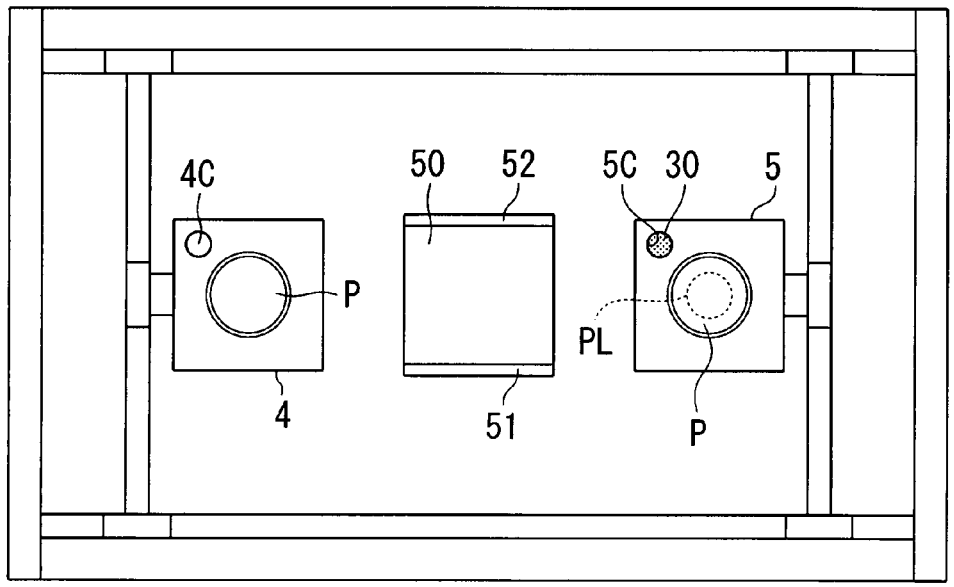
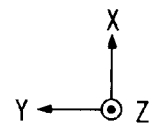

FIG. 41
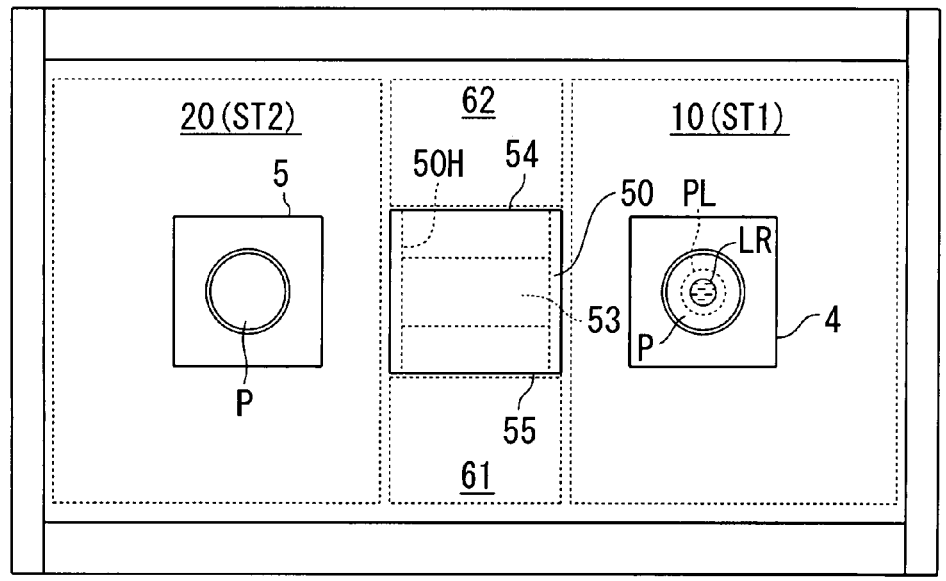
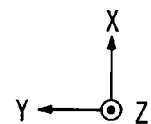
FIG. 42
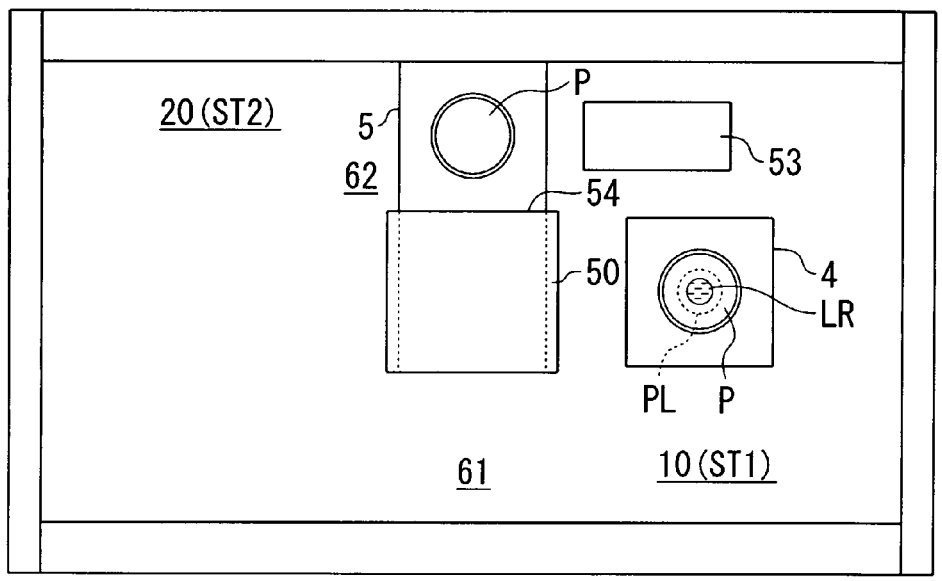
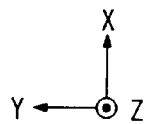

FIG. 43
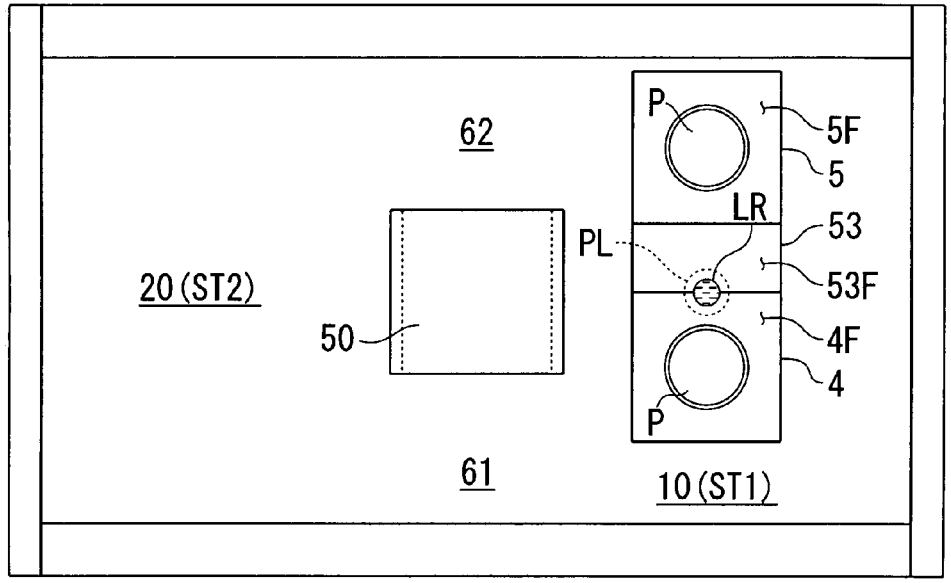
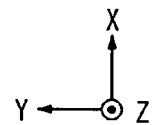
FIG. 44
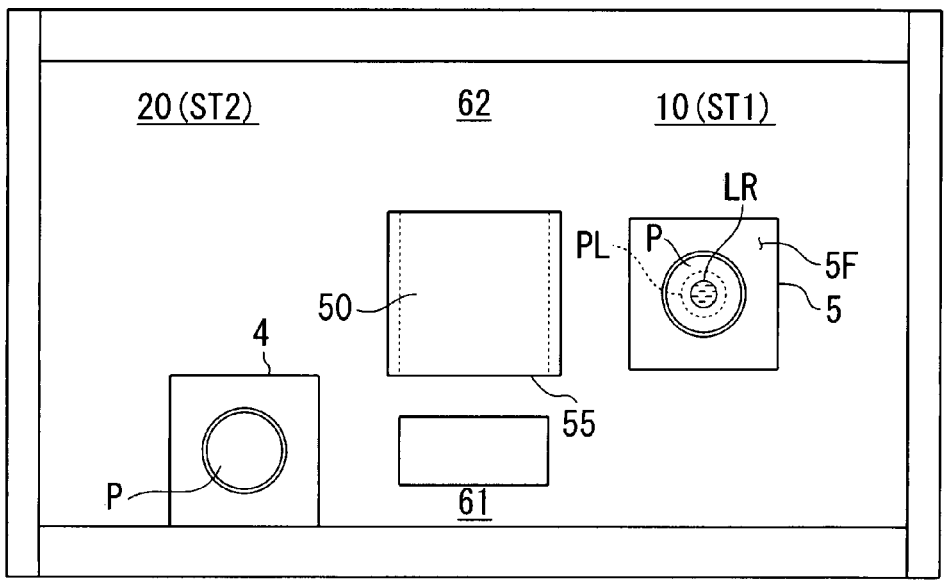
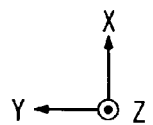

FIG. 45
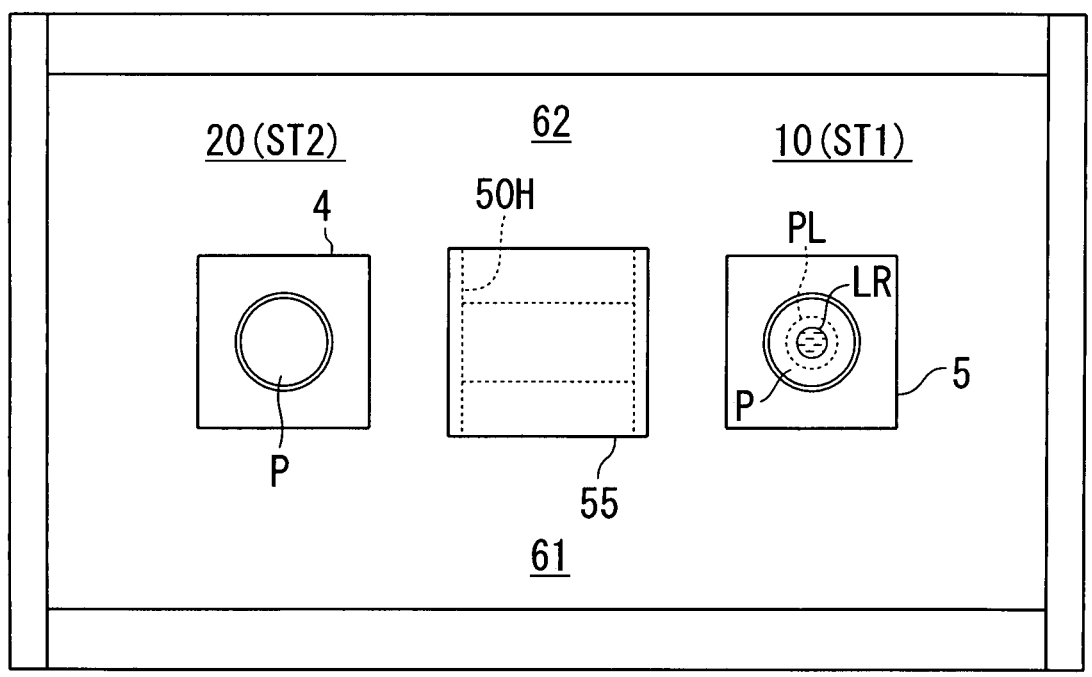
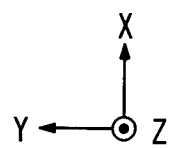

US 8,780,326 B2

EXPOSURE APPARATUS, EXPOSURE METHOD, AND DEVICE MANUFACTURING METHOD

CROSS-REFERENCE TO RELATED APPLICATION

This application is non-provisional application claiming benefit of provisional application No. 60/819,634, filed Jul. 11, 2006, and claims priority to Japanese Patent Application No. 2005-261888, filed on Sep. 9, 2005, and Japanese Patent Application No. 2005-286487, filed on Sep. 30, 2005, the contents of which are incorporated herein by reference.

BACKGROUND OF THE INVENTION

1. Field of the Invention

The present invention relates to an exposure apparatus and exposure method to expose a substrate via a liquid, as well as to a device manufacturing method.

2. Description of Related Art

Among exposure systems used in photolithography processes, liquid immersion type exposure systems in which a space of the optical path of the exposure light is filled with a liquid and a substrate is exposed via this liquid, such as for example those disclosed in Japanese Unexamined Patent Application, First Publication Nos. 2004-289126 and 2004-289128, are well known. In addition, multi-stage type exposure systems comprising a plurality of substrate stages to hold substrates, such as those disclosed in Published Japanese Translation No. 2000-511704 of the PCT International Application, Japanese Unexamined Patent Application, First Publication No. 2000-323404, Published Japanese Translation No. 2001-513267 of the PCT International Application, and Japanese Unexamined Patent Application, First Publication No. 2002-158168, are well known.

In an exposure system used in photolithography processes, when the liquid immersion method is applied, it is required that the substrate be subjected to exposure processing efficiently. Furthermore, in multi-stage type exposure systems, an operation is performed in which a plurality of substrate stages are arranged in succession on an exposure station; and when the liquid exposure method is applied to a multi-stage type exposure system also, it is important that the operation of positioning substrate stages at the exposure station be performed rapidly, and that substrate exposure be performed efficiently.

SUMMARY OF THE INVENTION

An object of this invention is to provide an exposure apparatus, exposure method, and device manufacturing method, enabling efficient and satisfactory exposure via a liquid.

According to a first aspect of the invention, an exposure apparatus which exposes a substrate via an optical member and a liquid is provided, comprising: a liquid immersion system that performs supply and recovery of the liquid; a first mover that moves in a first area and between which and the optical member the liquid can be held; and a prescribed member that, when the first mover withdraws from a position opposed to the optical member, is removed from the first mover and between which and the optical member the liquid can be held.

According to the first aspect of the invention, even when the first mover has moved from the optical member, the space between the optical member and the prescribed member can continue to be filled with liquid, so that reductions in the availability factor of the exposure apparatus can be suppressed.

According to a second aspect of the invention, an exposure apparatus which exposes a substrate via an optical member and a liquid is provided, comprising a first mover that moves in a first area and between which and the optical member the liquid can be held; a prescribed member that, when the first mover withdraws from the optical member, is removed from the first mover and between which and the optical member the liquid can be held; and a measurement device that is provided at the prescribed member and performs a prescribed measurement.

According to the second aspect of the invention, even when the first move has moved from the optical member, the space between the optical member and the prescribed member can continue to be filled with liquid, and prescribed measurements can be performed in this state, so that reductions in the availability factor of the exposure apparatus can be suppressed.

According to a third aspect of the invention, an exposure apparatus which exposes a substrate via an optical member and a liquid is provided, comprising a first mover that moves in a first area and between which and the optical member the liquid can be held; a prescribed member that, when the first mover withdraws from the optical member, is removed from the first mover and between and the optical member the liquid can be held; and a temperature controller that is provided at the prescribed member and adjusts at least one of a temperature of an object adjacent to the prescribed member and a temperature of the liquid.

According to the third aspect of the invention, even when the first move has moved from the optical member, the space between the optical member and the prescribed member can continue to be filled with liquid, and temperature adjustment can be performed in this state, so that reductions in the availability factor of the exposure apparatus can be suppressed.

According to a fourth aspect of the invention, an exposure apparatus which exposes a substrate via an optical member and a liquid is provided, comprising a first mover that moves in a first area and between which and the optical member the liquid can be held; a second mover that moves in a second area and between which and the optical member the liquid can be held; and a prescribed member that is attachable to and detachable from each of the first mover and the second mover and that, in a state in which the prescribed member is removed from the first mover and from the second mover, between which and the optical member the liquid can be held.

According to the fourth aspect of the invention, even when the first mover and the second mover have each moved from the optical member, the space between the optical member and the prescribed member can continue to be filled with liquid, so that reductions in the availability factor of the exposure apparatus can be suppressed.

According to a fifth aspect of the invention, an exposure apparatus which exposes a substrate via an optical member and a liquid is provided, comprising a first mover that moves in a first area and between which and the optical member the liquid can be held; a second mover that moves in a second area and between which and the optical member the liquid can be held; and an auxiliary, wherein a liquid immersion region of the liquid moves between a surface of the auxiliary and a surface of the first mover, or between the surface of the auxiliary and a surface of the second mover.

According to the fifth aspect of the invention, by moving the liquid immersion region of the liquid in the space between the surface of the auxiliary and either a surface of the first mover or a surface of the second mover, the optical path can continue to be filled with liquid, so that reductions in the availability factor of the exposure apparatus can be suppressed.

According to a sixth aspect of the invention, a device manufacturing method which uses an exposure apparatus of an above aspect is provided.

According to the sixth aspect of the invention, an exposure apparatus in which reductions in availability factor are suppressed can be used in device manufacture.

According to a seventh aspect of the invention, an exposure method to expose a substrate via an optical member and a liquid is provided, comprising exposing the substrate held by a first mover, the exposure comprising positioning the first mover in a position opposed to the optical member, and disposing the liquid between the optical member and the substrate; and holding the liquid between the optical member and a prescribed member, the holding of the liquid comprising removing the prescribed member from the first mover, retracting the first mover from the position opposed to the optical member, and supplying and recovering the liquid to and from a space between the optical member and the prescribed member.

According to the seventh aspect of the invention, even when the first mover has moved from the optical member, the space between the optical member and the prescribed member can continue to be filled with liquid, so that reductions in the availability factor of the exposure apparatus can be suppressed.

According to an eighth aspect of the invention, an exposure method to expose a substrate via an optical member and a liquid is provided, comprising exposing the substrate held by a first mover, the exposure comprising positioning the first mover in a position opposed to the optical member, and disposing the liquid between the optical member and the substrate; holding the liquid between the optical member and a prescribed member, the holding of the liquid comprising removing the prescribed member from the first mover, and retracting the first mover from the position opposed to the optical member; and executing a prescribed measurement using a measurement device provided at the prescribed member.

According to the eighth aspect of the invention, even when the first mover has moved from the optical member, the space between the optical member and the prescribed member can continue to be filled with liquid, and in this state a prescribed measurement can be performed, so that reductions in the availability factor of the exposure apparatus can be suppressed.

According to a ninth aspect of the invention, an exposure method to expose a substrate via an optical member and a liquid is provided, comprising exposing the substrate held by a first mover, the exposure comprising positioning the first mover in a position opposed to the optical member, and disposing the liquid between the optical member and the substrate; holding the liquid between the optical member and a prescribed member, the holding of the liquid comprising removing the prescribed member from the first mover, and retracting the first mover from the position opposed to the optical member; and adjusting at least one of a temperature of an object adjacent to the prescribed member and a temperature of the liquid, using a temperature controller.

According to the ninth aspect of the invention, even when the first mover has moved from the optical member, the space between the optical member and the prescribed member can continue to be filled with liquid, and in this state temperature adjustment can be performed, so that reductions in the availability factor of the exposure apparatus can be suppressed.

According to a tenth aspect of the invention, an exposure method to expose a substrate via an optical member and a liquid is provided, comprising exposing the substrate held by a first mover, the exposure comprising positioning the first mover in a position opposed to the optical member, and disposing the liquid between the optical member and the substrate; holding the liquid between the optical member and a prescribed member, the holding of the liquid comprising removing the prescribed member from the first mover, and retracting the first mover from the position opposed to the optical member; and attaching the prescribed member to a second mover, the attachment comprising positioning the second mover at the position opposed to the optical member after the retraction of the first mover from the optical member.

According to the tenth aspect of the invention, even when the first mover and second mover have each moved from the optical member, the space between the optical member and the prescribed member can continue to be filled with liquid, so that reductions in the availability factor of the exposure apparatus can be suppressed.

According to an 11th aspect of the invention, an exposure method to expose a substrate via an optical member and a liquid is provided, comprising exposing the substrate held by a first mover, the exposure comprising positioning the first mover in a position opposed to the optical member, and forming a liquid immersion region of the liquid between the optical member and the substrate; moving the liquid immersion region from the surface of the substrate to a surface of a third mover, the movement comprising moving the first mover and the third mover together, in a state of either proximity or contact; moving the liquid immersion region from the surface of the third mover to a surface of a second mover, the movement comprising moving the third mover and the second mover together, in a state of either proximity or contact; and exposing the substrate held by the second mover, via the liquid moved to the surface of the second mover.

According to the 11th aspect of the invention, the liquid immersion region is moved in the area between the surface of the third mover and either the surface of the first mover or the surface of the second mover, so that the optical path can continue to be filled with liquid, and reductions in the availability factor of the exposure apparatus can be suppressed.

According to a 12th aspect of the invention, a device manufacturing method using an exposure method of the above aspects is provided.

According to the 12th aspect of the invention, devices can be manufactured using an exposure method in which reductions in the availability factor can be suppressed.

According to a 13th aspect of the invention, an exposure apparatus which exposes a substrate via an optical member and a liquid is provided, comprising a first mover that moves in a prescribed area, the prescribed area comprising a first area opposed to the optical member, a second area distant from the first area, and a third area between the first area and the second area; a second mover that moves independently of the first mover in the prescribed area; a first holding device that releasably holds a prescribed member so as to be opposed to the optical member when the first mover and the second mover are both distant from the first area; a second holding device that is provided at the first mover and releasably holds the prescribed member during exposure of a substrate held by the first mover; and a third holding device that is provided at the second mover and releasably holds the prescribed member during exposure of a substrate held by the second mover, wherein the second holding device is provided at the first mover such that, when transferring the holding of the prescribed member from the first holding device to the second holding device, a movement distance of the first mover from the third area to the first area is shortened; and the third holding device is provided at the second mover such that, when transferring the holding of the prescribed member from the first holding device to the third holding device, a movement distance of the second mover from the third area to the first area is shortened.

According to the 13th aspect of the invention, the substrate can be efficiently exposed.

According to a 14th aspect of the invention, an exposure apparatus which exposes a substrate via an optical member and a liquid is provided, comprising a first mover that moves in a prescribed area, the prescribed area comprising a first area opposed to the optical member, a second area distant from the first area, and a third area between the first area and the second area; a second mover that moves independently of the first mover in the prescribed area; a first holding device that releasably holds a prescribed member so as to be opposed to the optical member when the first mover and the second mover are both distant from the first area; a second holding device that is provided at the first mover and releasably holds the prescribed member during exposure of a substrate held by the first mover; and a third holding device that is provided at the second mover and releasably holds the prescribed member during exposure of a substrate held by the second mover, wherein the first mover and the second mover move from the second area to the first area over substantially the same path; and a position of the second holding device on the first mover is substantially the same as a position of the third holding device on the second mover.

According to the 14th aspect of the invention, the substrate can be efficiently exposed.

According to a 15th aspect of the invention, an exposure apparatus which exposes a substrate via an optical member and a liquid is provided, comprising a first mover that moves in a prescribed area, the prescribed area comprising a first area opposed to the optical member, a second area distant from the first area, and a third area between the first area and the second area; a second mover that moves independently of the first mover in the prescribed area; a first holding device that releasably holds a prescribed member so as to be opposed to the optical member when the first mover and the second mover are both distant from the first area; a second holding device that is provided at the first mover and releasably holds the prescribed member during exposure of a substrate held by the first mover; and a third holding device that is provided at the second mover and releasably holds the prescribed member during exposure of a substrate held by the second mover, wherein the first mover and the second mover move from the second area to the first area over mutually different paths; and a position of the second holding device on the first mover is different from a position of the third holding device on the second mover.

According to the 15th aspect of the invention, the substrate can be efficiently exposed.

According to a 16th aspect of the invention, an exposure apparatus which exposes a substrate via an optical member and a liquid is provided, comprising a first mover that moves in a prescribed area, the prescribed area comprising a first area opposed to the optical member, a second area distant from the first area, and a third area between the first area and the second area; a second mover that moves independently of the first mover in the prescribed area; a first holding device that releasably holds a prescribed member so as to be opposed to the optical member when the first mover and the second mover are both distant from the first area; a second holding device that is provided at the first mover and releasably holds the prescribed member during exposure of a substrate held by the first mover; and a third holding device that is provided at the second mover and releasably holds the prescribed member during exposure of a substrate held by the second mover, wherein the first and the second movers each have a measurement region, opposable to the optical member; after the prescribed member that had been held by the first holding device is held by the second holding device of the first mover, when the liquid immersion region on the prescribed member is moved onto the measurement region, the liquid immersion region and the first mover are put into relative motion such that the liquid of the liquid immersion region does not make contact with the substrate held by the first mover; and after the prescribed member that had been held by the first holding device is held by the third holding device of the second mover, when the liquid immersion region on the prescribed member is moved onto the measurement region, the liquid immersion region and the second mover are put into relative motion such that the liquid of the liquid immersion region does not make contact with the substrate held by the second mover.

According to the 16th aspect of the invention, the substrate can be efficiently exposed.

According to a 17th aspect of the invention, an exposure apparatus which exposes a substrate via an optical member and a liquid is provided, comprising a first mover that moves in a prescribed area, the prescribed area comprising a first area opposed to the optical member, a second area distant from the first area, and a third area between the first area and the second area; a second mover that moves independently of the first mover in the prescribed area; a first holding device that releasably holds a prescribed member so as to be opposed to the optical member when the first mover and the second mover are both distant from the first area; a second holding device that is provided at the first mover and releasably holds the prescribed member during exposure of a substrate held by the first mover, and a third holding device that is provided at the second mover and releasably holds the prescribed member during exposure of a substrate held by the second mover, wherein when a plurality of shot areas on the substrate held by the first mover are successively exposed, exposure ends at a shot area close to the second holding device among the plurality of shot areas; and when a plurality of shot areas on the substrate held by the second mover are successively exposed, exposure ends at a shot area close to the third holding device among the plurality of shot areas.

According to the 17th aspect of the invention, the substrate can be efficiently exposed.

According to an 18th aspect of the invention, an exposure apparatus which exposes a substrate via an optical member and a liquid is provided, comprising a mover that holds a substrate and can move in two-dimensional directions, the mover having substantially a rectangular shape along the two-dimensional directions; a first holding device that releasably holds a prescribed member so as to oppose the optical member when the mover is distant from the optical member; a second holding device that is provided at the mover and releasably holds a prescribed member during exposure of the substrate held by the mover; and reflecting surfaces that are provided at three side faces among four side faces of the mover, to measure position information for the mover in a direction perpendicular to the two-dimensional directions, wherein the mover has four corners, opposable to the optical member; and the second holding device is positioned at a corner at which the reflecting surface is formed at only one side face of the two adjacent side faces, among the four corners of the mover.

According to the 18th aspect of the invention, the substrate can be efficiently exposed.

According to a 19th aspect of the invention, a device manufacturing method using an exposure device of the above aspects is provided.

According to the 19th aspect of the invention, devices can be manufactured using an exposure device capable of efficient exposure of substrates, and productivity can be improved.

According to a 20th aspect of the invention, an exposure method to expose successively a plurality of shot areas on a substrate held by a mover via an optical member and a liquid, is provided, comprising a first process, prior to initiating exposure of the substrate held by the mover, of releasing a prescribed member held by a first holding device so as to be opposed to the optical member from the first holding device, and of holding the prescribed member with a second holding device provided at the mover; a second process, after holding of the prescribed member by the second holding device, of acquiring alignment information in a measurement region provided on the mover opposably to the optical member; a third process, after acquiring the alignment information, of initiating exposure from a first shot area close to the measurement region among the plurality of shot areas; a fourth process of ending exposure at a last shot area close to the second holding device among the plurality of shot areas; and a fifth process, after ending exposure of the plurality of shot areas on the substrate, of moving the mover such that the optical member and the second holding device are opposed, and of releasing the prescribed member from the second holding device, and of holding the prescribed member with the first holding device such that the optical member and the prescribed member are opposed.

According to the 20th aspect of the invention, the substrate can be efficiently exposed.

According to a 21st aspect of the invention, a device manufacturing method using an exposure method of the above aspects is provided.

According to the 21st aspect of the invention, devices can be manufactured using an exposure method capable of efficient exposure of substrates, and productivity can be improved.

According to a 22nd aspect of the invention, an exposure apparatus which exposes a substrate via an optical system and a liquid is provided, comprising a placement table on which the substrate is placed; a prescribed member, the liquid being held at a lower surface of the optical system with the prescribed member when an upper surface of the placement table is distant from the lower surface of the optical system; and a support member that supports the prescribed member, wherein the placement table comprises a mooring portion that temporarily moors the prescribed member and an optical receiver that receives exposure light from the optical system via the liquid, and a control portion is further comprised which, after the prescribed member is moored to the mooring portion, effects relative movement of the placement table and the optical system such that the liquid at the lower surface of the optical system does not make contact with the substrate placed on the placement table.

According to a 23rd aspect of the invention, an exposure method to expose a substrate via an optical system and a liquid is provided, comprising a placement step of placing the substrate on a placement table; a holding step, when an upper surface of the placement table is distant from a lower surface of the optical system, of holding the liquid at the lower surface of the optical system with a prescribed member; and a step of supporting the prescribed member with a support member; wherein the placement table comprises a mooring portion that temporarily moors the prescribed member and an optical receiver that receives exposure light from the optical system via the liquid, and a control step is further comprised, after the prescribed member is moored to the mooring portion, of effecting relative movement of the placement table and the optical system such that the liquid at the lower surface of the optical system does not make contact with the substrate placed on the placement table.

According to a 24th aspect of the invention, an exposure apparatus is provided, comprising first and second tables on which are placed substrates that receive an energy beam from a projection optical system, each of the tables being independently movable in two dimensions; a liquid holding mechanism that holds a liquid in a local space between a lower portion of the projection optical system and the substrate, wherein after irradiating the substrate on the first table with an energy beam via the liquid, positions of the first and the second tables are exchanged in order to irradiate the substrate on the second table with the energy beam, and a prescribed member is further comprised which, when exchanging the positions of the first and the second tables, is attachably and detachably set at a lower-portion side of the projection optical system such that the liquid is held at the lower portion of the projection optical system; and wherein a mooring portion is formed on each of the first and the second tables, which temporarily moors the prescribed portion removed from the lower portion of the projection optical system; and a control portion is further comprised which, controls movement of the first and the second tables, such that there is a transition, in order, between a state in which the prescribed member is moored to the mooring portion of the first table, a state in which the prescribed member is set at the lower-portion side of the projection optical system, and a state in which the prescribed member is moored to the mooring portion of the second table.

According to a 25th aspect of the invention, an exposure method is provided, comprising a step of moving, independently in two dimensions, first and second tables on each of which is placed a substrate to receive an energy beam from a projection optical system; a liquid holding step of holding a liquid in a local space between a lower portion of the projection optical system and the substrate; and an exchange step, after irradiation of the substrate on the first table with the energy beam via the liquid, of exchanging positions of the first and the second tables in order to irradiate the substrate on the second table with the energy beam via the liquid; wherein a prescribed member is attachably and detachably set at a lower-portion side of the projection optical system so as to hold the liquid at the lower portion of the projection optical system at the time of the exchange of the positions of the first and the second tables; a mooring portion which temporarily moors the prescribed member removed from the lower portion of the projection optical system is formed on each of the first and the second tables; and a control step is further comprised, at the time of the exchange of the positions of the first and the second tables, to control the movement of the first and the second tables so as to transition, in order, between a state in which the prescribed member is moored to the mooring portion of the first table, a state in which the prescribed member is set at the lower-portion side of the projection optical system, and a state in which the prescribed member is moored to the mooring portion of the second table.

According to this invention, substrates can be exposed efficiently, and device productivity can be improved.

BRIEF DESCRIPTION OF THE DRAWINGS

FIG. 13 is a drawing used to explain the exposure method in the first embodiment.

FIG. 14 is a drawing used to explain the exposure method in the first embodiment.

FIG. 41 is a drawing used to explain the exposure method in an eighth embodiment.

FIG. 42 is a drawing used to explain the exposure method in the eighth embodiment.

FIG. 43 is a drawing used to explain the exposure method in the eighth embodiment.

FIG. 44 is a drawing used to explain the exposure method in the eighth embodiment.

FIG. 45 is a drawing used to explain the exposure method in the eighth embodiment.

DETAILED DESCRIPTION OF THE INVENTION

Hereunder is a description of embodiments of the present invention with reference to the drawings. However the present invention is not limited to this description.

First Embodiment

Figure 1:
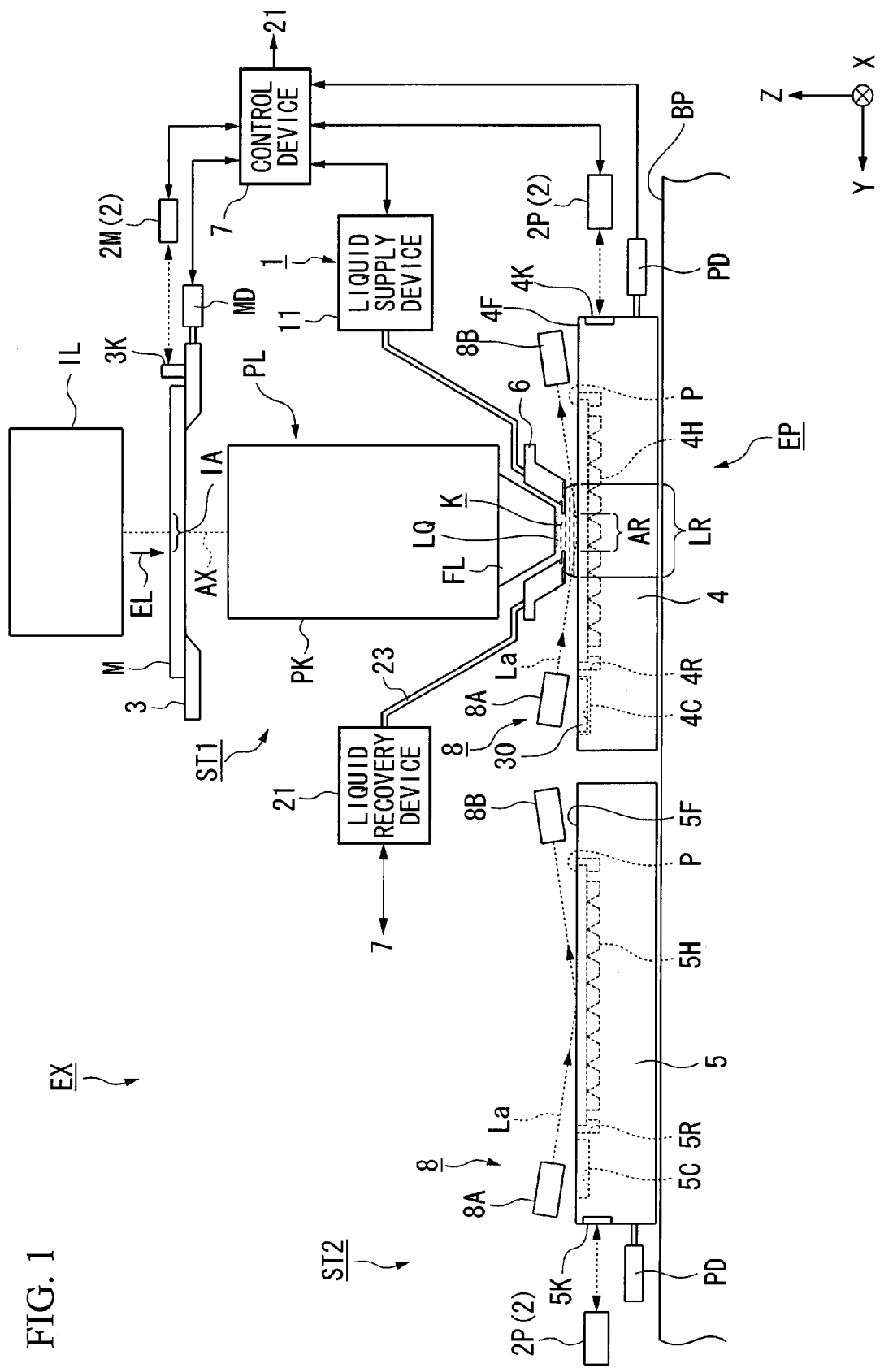
FIG. 1 is a summary diagram of the configuration of the exposure apparatus according to a first embodiment.

A first embodiment will be explained. FIG. 1 is a summary diagram of the configuration of an exposure apparatus EX according to the first embodiment. In FIG. 1, the exposure apparatus EX includes a movable mask stage 3 which holds a mask M; a movable first substrate stage 4 and the second substrate stage 5, each of which holds a substrate P; a laser interference system 2 which measures position information for each stage; an illumination system IL which illuminates the mask M held by the mask stage 3 with exposure light EL; a projection optical system PL which projects a pattern image of the mask M illuminated by the exposure light EL onto the substrates P; and a control device 7 which controls the operation of the entire exposure apparatus EX. The substrate here includes one a sensitive material (photoresist) is spread on a substrate of a semiconductor wafer or the like, and includes a reticule formed with a device pattern which is reduction size projected onto the substrate. In the present embodiment, a transmission mask is used as the mask, however a reflecting mask may be used.

In the embodiment, an example is explained of a case in which, as the exposure apparatus EX, a scanning-type exposure apparatus (a so-called scanning stepper), in which a pattern formed on the mask M is exposed onto the substrate P while the mask M and the substrate P are simultaneously moved in a predetermined scanning direction, is used. In the following description, the direction of simultaneous movement of the mask M and substrate P (the scanning direction) in the horizontal plane is taken to be the Y-axis direction; the direction in the horizontal plane perpendicular to the Y direction is taken to be the X-axis direction (the non-scanning direction); and the direction perpendicular to the X-axis and Y-axis directions, and coincident with the optical axis AX of the projection optical system PL, is taken to be the Z-axis direction. The rotation (inclination) directions about the X axis, Y axis, and Z axis are respectively the $\theta X$, $\theta Y$, and $\theta Z$ directions.

In the embodiment, the exposure apparatus EX is a twin-stage type exposure apparatus comprising a plurality of (two) movable substrate stages 4 and 5 which hold substrates P, such as have been disclosed for example in Japanese Unexamined Patent Application, First Publication No. H10-163099 and Japanese Unexamined Patent Application, First Publication No. H10-214783 (corresponding to U.S. Pat. No. 6,590,634), Published Japanese Translation No. 2000-505958 of the PCT International Application (corresponding to U.S. Pat. No. 5,969,441), Published Japanese Translation No. 2000-511704 of the PCT International Application, Japanese Unexamined Patent Application, First Publication No. 2000-323404, Published Japanese Translation No. 2001-513267 of the PCT International Application, Japanese Unexamined Patent Application, First Application No. 2002-158168, and similar. The exposure apparatus EX includes an exposure station ST1 which irradiates a substrate P with exposure light EL, and a measurement station ST2 which performs prescribed measurements and exchanges. The first substrate stage 4 and the second substrate stage 5 can each move between the exposure station ST1 and the measurement station ST2 while in a state of holding a substrate P.

In the embodiment, the exposure apparatus EX is an immersion exposure apparatus applicable to an immersion method for substantially shortening the exposure length and improving the resolution, and also substantially expanding the depth of focus; and includes a liquid immersion system 1 which fills the space K of the optical path of the exposure light EL in the vicinity of the image plane of the projection optical system PL with a liquid LQ. Operation of the liquid immersion system 1 is controlled by the control device 7. The liquid immersion system 1 forms a liquid immersion region LR so as to fill with liquid LQ the space K of the optical path of exposure light EL between the lower surface of the final optical element FL closest to the image plane of the projection optical system PL, and the surface of the substrate P on the substrate stages 4 or 5 positioned on the image-plane side of the projection optical system PL. In this embodiment, water (pure water) is used as the liquid LQ.

The exposure apparatus EX uses a liquid immersion system 1 to fill the optical path K of the exposure light EL with a liquid LQ at least during exposure of the pattern image of the mask M onto the substrate P. The exposure apparatus EX exposes the pattern image of the mask M onto the substrate P by irradiating the substrate P with exposure light EL, which has passed through the mask M, via the projection optical system PL and the liquid LQ which fills the optical path space K. In the embodiment, the exposure apparatus EX adopts a local liquid immersion method where the liquid LQ, which fills the space K of the exposure light EL between the final optical element FL and the substrate P, locally forms an immersion region LR which is greater than a projection region AR, and smaller than the substrate P, on a region of one part of the substrate P which includes the projection region AR of the projection optical system PL.

The liquid immersion region LR can be formed not only on the substrate P, but also on an object positioned at a position EP opposing (directly below) the final optical element FL on the image-plane side of the projection optical system PL; for example, the liquid immersion region LR can be formed on at least one among the upper surface 4F of the first substrate stage 4 and the upper surface 5F of the second substrate stage 5.

The illumination optical system IL is one which illuminates a predetermined illumination region IA on the mask M with exposure light EL of a uniform luminance distribution. For the exposure light EL radiated from the illumination optical system IL, for example emission lines (g-ray, h-ray, i-ray), radiated for example from a mercury lamp, deep ultraviolet beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm), may be used. In this embodiment, the ArF excimer laser beam is used.

The mask stage 3 is moveable in the X axis, the Y axis, and the θZ direction in a condition holding the mask M, by means of drive from a mask stage driving device MD which includes an actuator such as a linear motor. Position information for the mask stage 3 (and for the mask M) is measured by a laser interferometer 2M, which is constituent part of a laser interference system 2. The laser interferometer 2M uses a movement mirror 3K which is provided on the mask stage 3 to measure the position information of the mask stage 3. The control device 7 controls the mask stage driving device MD based on the measured results of the laser interferometer 2M, and controls the position of the mask M which is held in the mask stage 3.

The projection optical system PL projects a pattern image of the mask M onto the substrate P at a predetermined projection magnification, and has a plurality of optical elements; these optical elements are held in a lens barrel PK. In the embodiment, the projection optical system PL is a reduction system with a projection magnification of for example ¼, ⅕, ⅛, or the like, and forms a reduced image of the mask pattern on a projection area AR which is conjugate with the above-described illumination area. The projection optical system PL may be a reduction system, an equal system or a magnification system. Furthermore, the projection optical system PL may include any one of; a refractive system which does not include a reflection optical element, a reflection system which does not include a refractive optical element, or a cata-dioptric system which includes a reflection optical system and a refractive optical system. Moreover, the projection optical system PL may form either an inverted image or an erect image. Furthermore, in the embodiment, of the plurality of optical elements of the projection optical system PL, only the final optical element FL which is closest to the image surface of the projection optical system PL is contacted with the liquid LQ at the optical path K.

Figure 2:
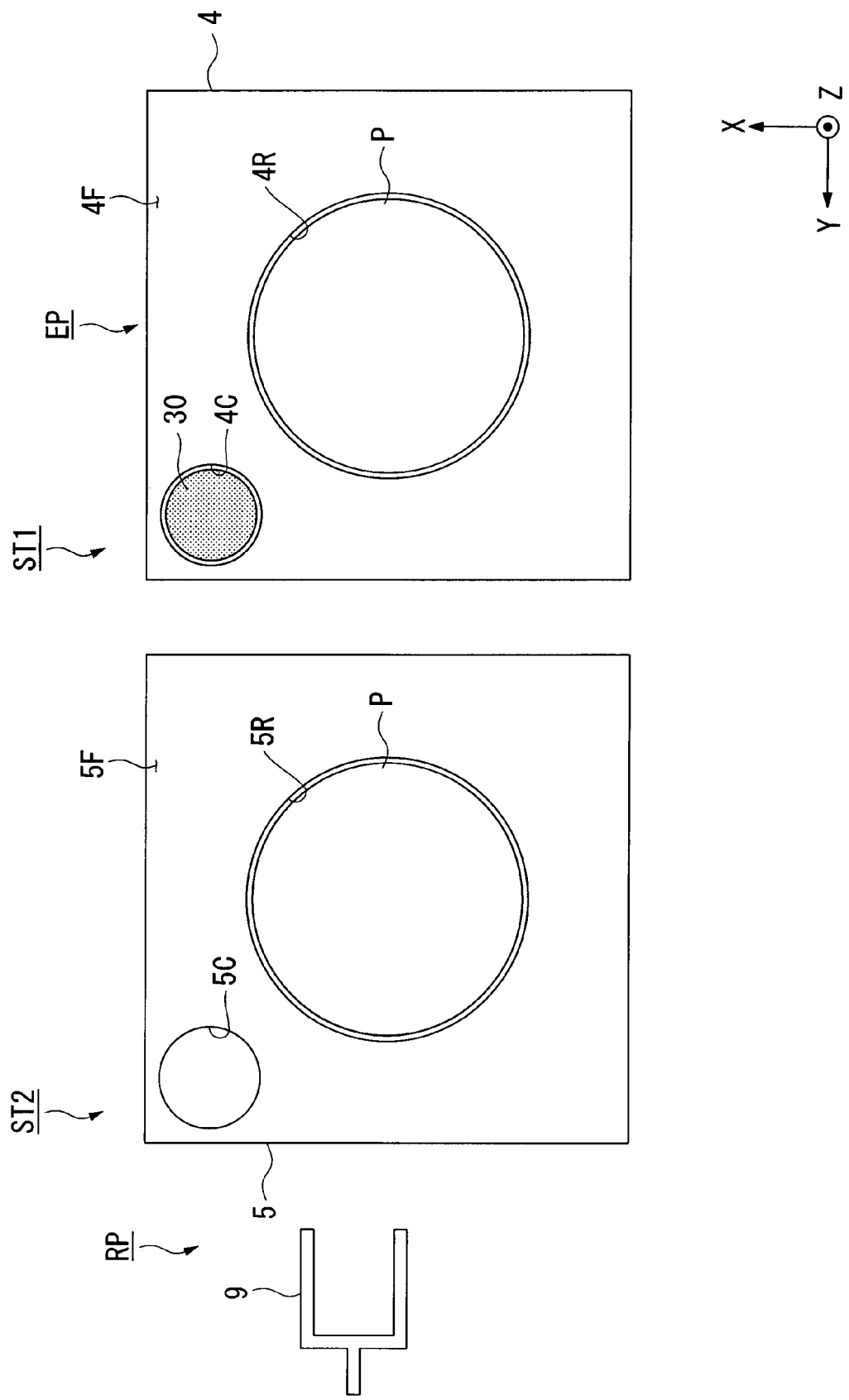
FIG. 2 is a plane view seen from above of the first substrate stage and the second substrate stage.

Next, the movable substrate stages 4 and 5 which hold substrates P are explained, referring to FIG. 1 and FIG. 2. FIG. 2 is a plane view seen from above of the first and second substrate stages 4, 5.

The first substrate stage 4 and the second substrate stage 5 are each independently movable on a common base member BP. Each of the first substrate stage 4 and the second substrate stage 5 can move between the exposure station ST1 and the measurement station ST2 by moving in the XY plane on the base member BP. The illumination system IL, the mask stage 3, the projection optical system PL, and the liquid immersion system 1 are provided at the exposure station ST1, and at the exposure station ST1, the substrate P is exposed via the projection optical system PL and the liquid LQ. On the other hand, a measurement system to perform measurements of the substrate P is provided at the measurement station ST2, and the measurements and the exchange of the substrates P are executed at the measurement station ST2.

The first substrate stage 4 has a substrate holder 4H which holds a substrate P, and is movable in a direction of six degrees of freedom of, the X-axis, the Y-axis, the Z-axis, the θX, the θY, and the θZ directions, on the base member BP in a condition holding the substrate P, by means of drive from a substrate stage driving device PD which includes an actuator such as a linear motor. The substrate holder 4H is arranged in a recess portion 4R which is provided in the first substrate stage 4, and an upper surface 4F of the first substrate stage 4 other than the recess portion 4R becomes a flat surface of approximately the same height (flush) as the surface of the substrate P which is held in the substrate holder 4H. This is because a part of the immersion region LR which runs out from the surface of the substrate P is formed on the upper surface 4F, at for example the time of the exposure operation of the substrate P. Only one part of the upper surface 4F of the substrate stage 4, for example, a predetermined region surrounding the substrate P (including the region where the immersion region LR runs out), may be approximately the same height as the surface of the substrate P. Furthermore, if the optical path space K on the image surface side of the projection optical system PL is continuously filled with the liquid LQ (for example the immersion region LR can be favorably maintained), then there may be a step between the surface of the substrate P which is held in the substrate holder 4H, and the upper surface 4F of the first substrate stage 4. Furthermore, the substrate holder 4H may be formed as one with one part of the substrate stage 4. However, in the embodiment, the substrate holder 4H and the substrate stage 4 are made separate, and the substrate holder 4H is secured in the substrate stage 4 by, for example, vacuum attraction.

The second substrate stage 5 has a substrate holder 5H which holds a substrate P, and is movable in a direction of six degrees of freedom of, the X-axis, the Y-axis, the Z-axis, the θX, the θY, and the θZ directions, on the base member BP in a condition holding the substrate P, by means of drive from a substrate stage driving device PD which includes an actuator such as a linear motor. The substrate holder 5H is arranged in a recess portion 5R which is provided in the second substrate stage 5, and an upper surface 5F of the first substrate stage 5 other than the recess portion 5R becomes a flat surface of approximately the same height (flush) as the surface of the substrate P which is held in the substrate holder 5H. This is because a part of the immersion region LR which runs out from the surface of the substrate P is formed on the upper surface 5F, at for example the time of the exposure operation of the substrate P. Only one part of the upper surface 5F of the substrate stage 5, for example, a predetermined region surrounding the substrate P (including the region where the immersion region LR runs out), may be approximately the same height as the surface of the substrate P. Furthermore, if the optical path space K on the image surface side of the projection optical system PL is continuously filled with the liquid LQ (for example the immersion region LR can be favorably maintained), then there may be a step between the surface of the substrate P which is held in the substrate holder 5H, and the upper surface 5F of the second substrate stage 5.

Position information for the first substrate stage 4 and the second substrate stage 5 is measured by a laser interferometer 2P which is constituent part of the laser interference system 2. Laser interferometers 2P are provided at both the exposure station ST1 and at the measurement station ST2. The laser interferometer 2P provided at the exposure station ST1 measures position information for the first substrate stage 4 (or the second substrate stage 5) existing at the exposure station ST1. The laser interferometer 2P provided at the measurement station ST2 measures position information for the second substrate stage 5 (or first substrate stage 4) existing at the measurement station ST2. Movement mirrors 4K, 5K are provided at prescribed positions on each of the first substrate stage 4 and the second substrate stage 5. The laser interferometers 2P uses the movement mirrors 4K, 5K to measure the position information of the first substrate stage 4 and the second substrate stage 5 along the X-axis, the Y-axis, and the θZ directions, and so to measure position information of each of the substrates P held by the first and second substrate stages 4, 5.

The laser interferometer system 2 may also be capable of measuring the position in the Z axis direction of the substrate stage 4 or the substrate stage 5, and the rotation information in the θX and the θY directions. More detail of this is disclosed for example in Japanese Unexamined Patent Application, First Publication No. 2001-510577 (corresponding PCT International Publication No. WO 1999/28790). Furthermore, instead of fixing the movement mirror 4K (5K) to the substrate stage 4 (the substrate stage 5), a reflection surface may be used where for example a part (the side face or the like) of the substrate stage 4 (the substrate stage 5) is formed by a mirror polishing process.

Furthermore, focus/leveling detection systems 8, which detect surface position information (position information along the Z-axis, θX, θY directions) for the surface of the substrate P held by the first or second substrate stages 4, 5, are provided at the exposure station ST1 and at the measurement station ST2. The focus/leveling detection systems 8 includes a projection system 8A, which irradiates the surface of the substrate P with detection light La from an oblique direction, and a light-receiving system 8B which can receive detection light La reflected by the surface of the substrate P. The focus/leveling detection system 8 provided at the exposure station ST1 detects surface position information for the surface of the substrate P held by the first substrate stage 4 (or the second substrate stage 5) existing at the exposure station ST1. The focus/leveling detection system 8 provided at the measurement station ST2 detects surface position information for the surface of the substrate P held by the second substrate stage 5 (or first substrate stage 4) existing at the measurement station ST2. The control device 7 drives the substrate station driving device PD based on measurement results of the laser interferometer 2P and detection results of the focus/leveling detection systems 8, and can control the positions of the substrates P held by the first and second substrate stages 4 and 5.

Although not shown, as a measurement system in addition to the above-described focus/leveling detection system 8, an alignment system is provided at the measurement station ST2 to detect alignment marks provided on substrates P or reference marks provided on a substrate stage, similar to that disclosed for example in Japanese Unexamined Patent Application, First Publication No. H04-65603. And as shown in FIG. 2, a transport system 9 is provided in proximity to the measurement station ST2 for the purpose of exchanging substrates P. The control device 7 can perform substrate exchange tasks, using the transport system 9 to unload a substrate P for which exposure processing is completed, on the first substrate stage 4 (or the second substrate stage 5) which has been moved to the substrate exchange position (loading position) of the measurement station ST2, and loading a substrate to be subjected to exposure processing onto the first substrate stage 4 (or the second substrate stage 5).

The exposure apparatus EX of this embodiment includes a movable cap member 30 which can hold liquid LQ between the member and the final optical element FL. The cap member 30 is formed in a size and shape according to a nozzle member 6, described below, and in this embodiment has a sheet-shape member which in plane view is substantially circular in shape. The surface of the cap member 30 has the property of repelling the liquid LQ. In this embodiment, the cap member 30 is formed using a material such as for example a fluoride resin material comprising polytetrafluoroethylene or another material with liquid-repellency. The cap member 30 may also be formed from stainless steel, titanium, or another prescribed metal, and the surface covered with a material having liquid-repellency.

A cap holder 4C which attachably and detachably holds the cap member 30 is provided on the first substrate stage 4. Similarly, a cap holder 5C which attachably and detachably holds the cap member 30 is provided on the second substrate stage 5. That is, the cap member 30 is attachably and detachably provided on both the first substrate stage 4 and the second substrate stage 5. The cap holders 4C, 5C have a vacuum chuck mechanism, for example, and use vacuum clamping to hold the cap member 30. When the cap member 30 is formed from a magnetic material (metal), the cap holders 4C, 5C may have a mechanism to hold the cap member 30 by magnetic force.

In this embodiment, the exposure apparatus EX includes one cap member 30. Hence when the cap member 30 is held by the cap holder 4C of the first substrate stage 4, the cap holder 5C of the second substrate stage 5 does not hold the cap member 30, and is in the empty state. Similarly, when the cap holder 5C of the second substrate stage 5 holds the cap member 30, the cap holder 4C of the first substrate stage 4 does not hold the cap member 30, and is in the empty state.

The cap holders 4C, 5C are provided such that the surface (upper face) of the cap member 30 held by the cap holder 4C (5C) is substantially flush with the upper surface 4F of the first substrate stage 4 (upper surface 5F of the second substrate stage 5).

Figure 3:
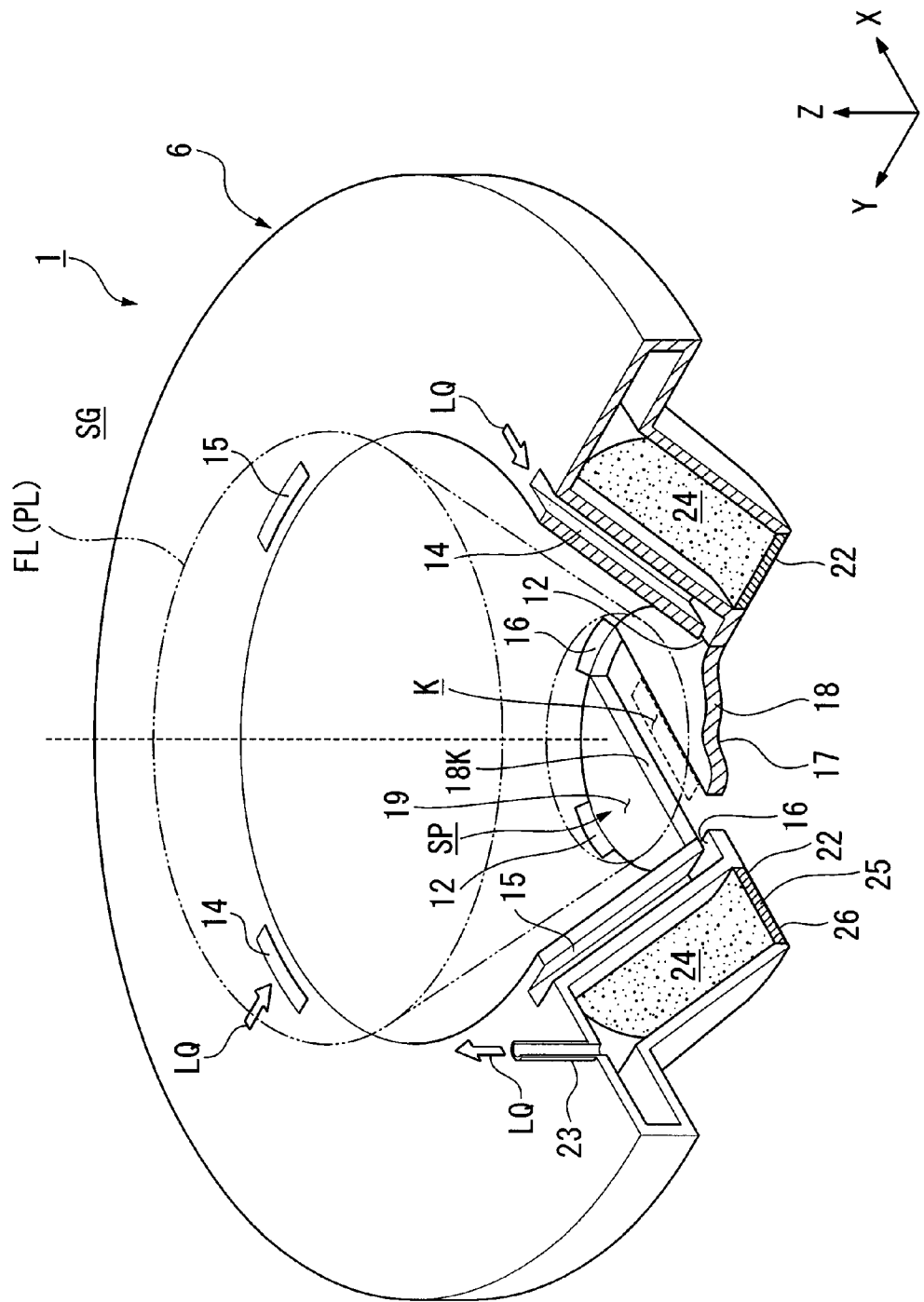
FIG. 3 is a partial cut-away of a summary perspective view showing the principal portions of a liquid immersion system.
Figure 4:
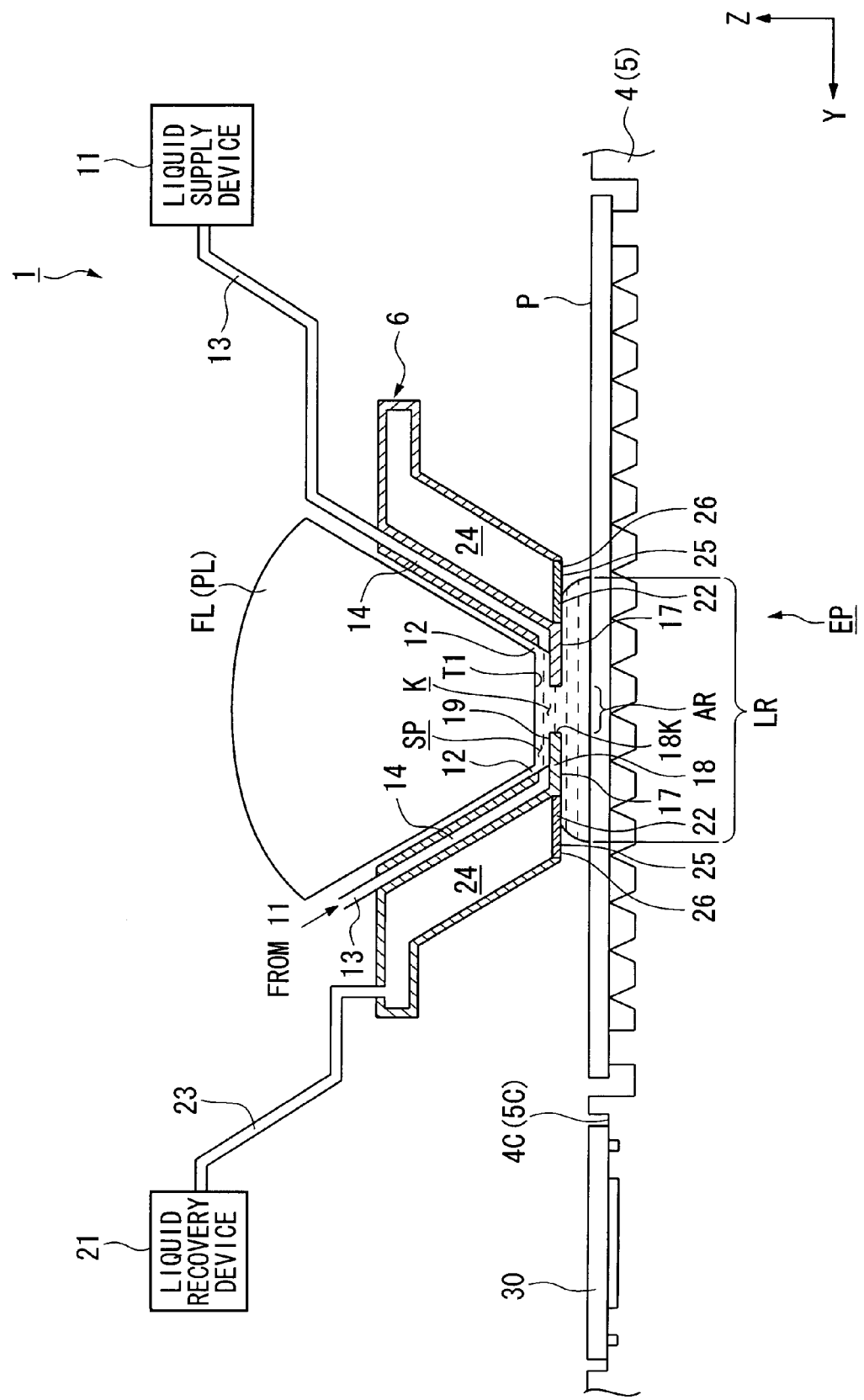
FIG. 4 is a cross-sectional view parallel to the YZ plane in FIG. 3.
Figure 5:
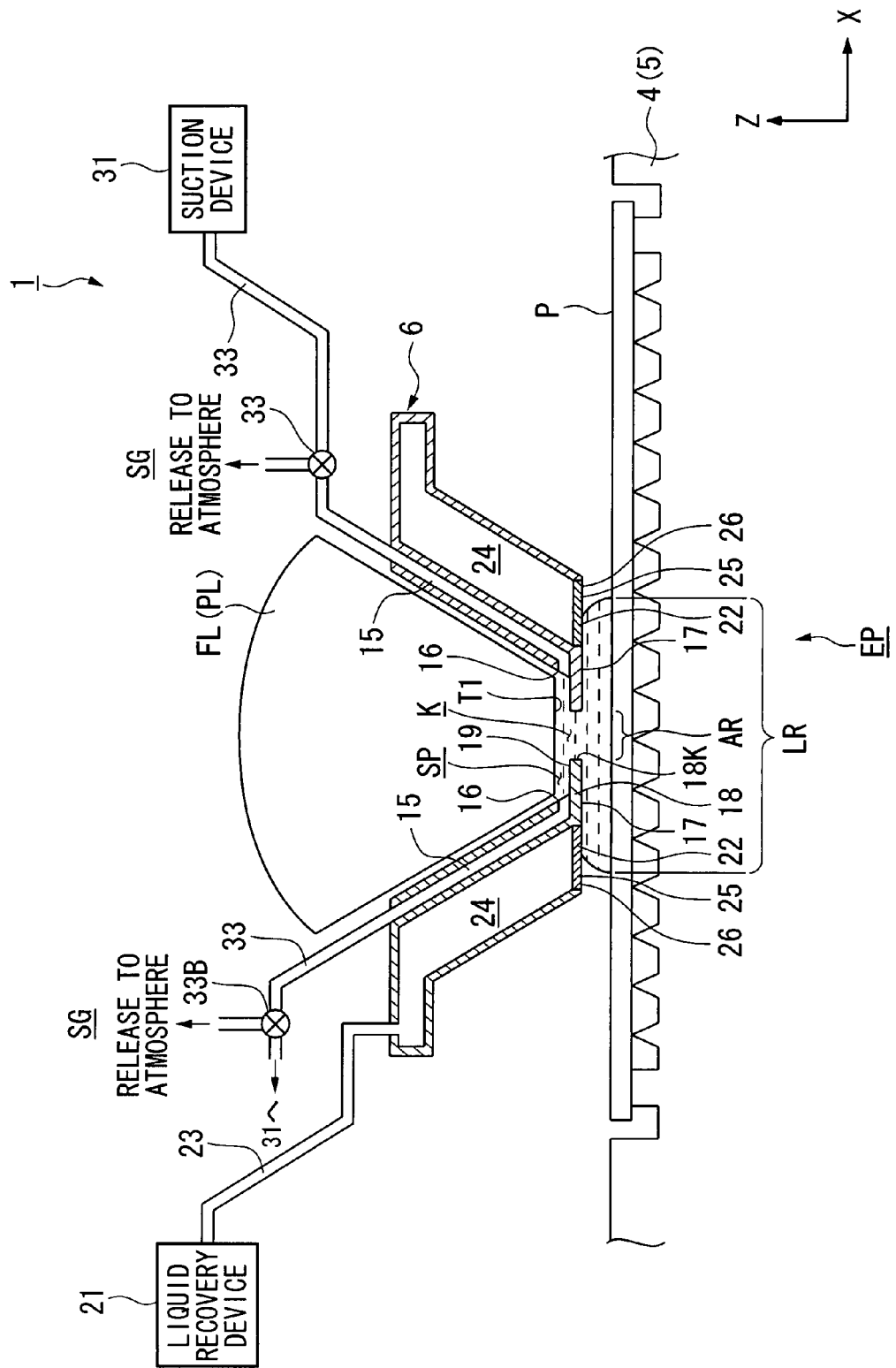
FIG. 5 is a cross-sectional view parallel to the XZ plane in FIG. 3.

Next, a liquid immersion system 1 is explained referring to FIG. 3 through FIG. 5. FIG. 3 is a partial cut-away of a summary oblique view showing the principal portions of a liquid immersion system, FIG. 4 is a side cross-sectional view parallel to the YZ plane in FIG. 3, and FIG. 5 is a side cross-sectional view parallel to the XZ plane in FIG. 3.

The liquid immersion system 1 fills with liquid LQ the optical path space K between the final optical element FL of the projection optical system PL through which exposure light EL passes, and the substrate P on either the first substrate stage 4 or on the second substrate stage 5, positioned at the position EP opposing the final optical element FL at the exposure station ST1. The liquid immersion system 1 includes a nozzle member 6, provided in proximity to the optical path space K, having a supply port 12 which supplies liquid LQ to the optical path space K and a collection port 22 which recovers liquid LQ; a liquid supply device 11, which supplies liquid LQ via a supply tube 13 and the supply port 12 of the nozzle member 6; and a liquid recovery device 21, which recovers liquid LQ via the collection port 22 of the nozzle member 6 and a recovery tube 23. The nozzle member 6 is a ring-shape member provided so as to surround at least one optical element (in this example, the final optical element FL) positioned on the image-plane side of the projection optical system PL. In the interior of the nozzle member 6 are formed a supply flow path 14 which connects the supply port 12 and the supply tube 13, and a recovery flow path 24 which connects the collection port 22 and the recovery tube 23. Operation of the liquid supply device 11 and liquid recovery device 21 is controlled by the control device 7. The liquid supply device 11 can deliver liquid LQ which is clean and has been temperature-adjusted; the liquid recovery device 21, including a vacuum system or similar, can recover liquid LQ.

The nozzle member 6 has a base plate 18, having an upper surface 19 opposing the lower surface T1 of the final optical element FL. A portion of the base plate 18 is positioned between the lower surface T1 of the final optical element FL of the projection optical system PL and the substrate P (substrate stage) in the Z-axis direction. Furthermore, an aperture 18K through which exposure light EL passes is formed in the center portion of the base plate 18. The aperture 18K is formed to be larger than the projection area AR irradiated with exposure light EL. By this means, exposure light EL which has passed through the projection optical system PL (final optical element FL) can arrive at the substrate P without being blocked by the base plate 18. In this embodiment, the aperture 18K is formed in a substantially rectangular shape in plane view, according to the cross-sectional shape of the exposure light EL (that is, the projection area AR). The shape of the aperture 18K in the base plate 18 may be modified as appropriate, so long as exposure light EL can pass through.

Among the surfaces of the nozzle member 6, the lower surface opposing the surface of the substrate P held by the substrate stage is a flat surface parallel to the XY plane. The lower surface of the nozzle member 6 includes the lower surface 17 of the base plate 18. Because the surface of the substrate P held by the substrate stage is substantially parallel to the XY plane, the lower surface 17 of the nozzle member 6 is provided so as to oppose the surface of the substrate P held by the substrate stage, and so as to be substantially parallel to the surface of the substrate P. In the following description, the lower surface 17 of the nozzle member 6 (base plate 18) may be called a land surface 17 as appropriate. The land surface 17 is a flat surface on the nozzle member 6, provided at the position closest to the substrate P held by the substrate stage, and provided so as to surround the optical path space K (projection area AR) of the exposure light EL between the lower surface T1 of the final optical element FL of the projection optical system PL and the surface of the substrate P.

The liquid LQ which fills the optical path space K is in contact with the land surface 17, and the liquid LQ filling the optical path space K is also in contact with the lower surface T1 of the final optical element FL. That is, the land surface 17 of the nozzle member 6 and the lower surface T1 of the final optical element FL are liquid contact surfaces which are in contact with the liquid LQ filling the optical path space K.

Furthermore, the base plate 18 is provided so as not to make contact with the lower surface T1 of the final optical element FL or the substrate P (substrate stage). A space having a prescribed gap is provided between the lower surface T1 of the final optical element FL and the upper surface 19 of the base plate 18. In the following description, the space on the inner side of the nozzle member 6 including the space between the lower surface T1 of the final optical element FL and the upper surface 19 of the base plate 18 is called the inner space SP as appropriate.

A supply flow path 14 connected to the supply port 12 is formed within the nozzle member 6. The supply flow path 14 is formed by a slit-shape penetrating hole which penetrates a portion of the nozzle member 6. In this embodiment, supply flow paths 14 are provided at both sides in the Y-axis direction relative to the optical path space K (projection area AR). The upper-end portions of the supply flow paths 14 and the liquid supply device 11 are connected via supply tubes 13. On the other hand, the lower-end portions of the supply flow paths 14 are connected to the inner space SP between the final optical element FL and the base plate 18, so that the lower-end portions of the supply flow paths 14 become supply ports 12. Hence the supply ports 12 and the liquid supply device 11 are connected via the supply tubes 13 and supply flow paths 14. In this embodiment, the supply ports 12 are at the outside of the optical path space K of the exposure light EL, and are provided in prescribed positions located lateral to both sides in the Y direction of the optical path space K. Pluralities of supply tubes 13 and supply flow paths 14 are provided according to the plurality (two) of supply ports 12.

The nozzle member 6 includes a suction aperture 16, connected to the inner space SP, to suck fluid in the inner space SP. The suction aperture 16 can suck the liquid LQ and air in the inner space SP. In this embodiment, suction apertures 16 are at the outside of the optical path space K of the exposure light EL, and are provided at prescribed positions located lateral to both sides in the X-axis direction of the optical path space K. Within the nozzle member 6 is formed a suction flow path 15 connected to the suction aperture 16. The suction flow path 15 is formed by means of a slit-shape penetrating hole which penetrates a portion of the nozzle member 6. The lower-end portion of the suction flow path 15 is the suction aperture 16. Suction flow paths 15 are provided on both sides in the X-axis direction of the optical path space K (projection area AR). The upper-end portion of the suction flow paths 15 and a suction device 31 including a vacuum system are connected by suction tubes 33. Pluralities of suction tubes 33 and suction flow paths 15 are provided corresponding to the plurality (two) of suction apertures 16. The suction apertures 16 are connected to the suction device 31 via the suction flow paths 15 and the suction tubes 33. Fluid in the inner space SP can be discharged to the exterior via the suction apertures 16.

As shown in FIG. 5, valve mechanisms 33B are provided at prescribed positions of the suction tubes 33. Operation of the valve mechanisms 33B is controlled by the control device 7. The control device 7 can for example connect the suction device 31 and the suction apertures 16 via control of the valve mechanisms 33B. The control device 7 can also connect the suction apertures 16 to the exterior space (the atmosphere) SG by controlling the valve mechanisms 33B. That is, by controlling the valve mechanisms 33B, the control device 7 can discharge (eject) fluid in the inner space SP to the exterior space (atmosphere) SG via the suction apertures 16, suction flow paths 15, and a portion of the suction tubes 33.

Within a nozzle member 6 is formed a recovery flow path 24 connected to the collection port 22. A space, open in the downward direction, is formed in the nozzle member 6, and the recovery flow path 24 includes this space. The collection port 22 has an aperture of the space with the downward-open aperture. A recovery flow path 24 is provided lateral to the supply flow paths 14 and suction flow paths 15 related to the optical path space K.

The collection port 22 is provided at a position opposing the surface of the substrate P above the substrate P held by the substrate stage. The surface of the substrate P held by the substrate stage and the collection port 22 provided in the nozzle member 6 are at a prescribed distance from each other. The collection port 22 is provided lateral to the supply ports 12 and suction apertures 16 relative to the optical path space K on the image-plane side of the projection optical system PL, formed into a ring shape surrounding the optical path space K (projection area AR), land surface 17, supply ports 12, and suction apertures 16. In this embodiment, the collection port 22 is formed into a circular ring shape in plane view. The recovery flow path 24 and liquid recovery device 21 are connected by a recovery tube 23. Hence the collection port 22 and the liquid recovery device 21 are connected via the recovery tube 23 and the recovery flow path 24.

The nozzle member 6 is positioned so as to cover the collection port 22, and includes a porous member 25 having numerous holes. The porous member 25 can for example be formed from titanium or stainless steel (for example SUS316) mesh, or from a ceramic porous member. The porous member 25 has a lower surface 26 which opposes the substrate P held by the substrate stage. The lower surface 26 of the porous member 25 opposing the substrate P is substantially flat. The porous member 25 is provided at the collection port 22 such that the lower surface 26 is substantially parallel to the surface of the substrate P (that is, the XY plane) held by the substrate stage. Liquid LQ is recovered via the porous member 25 positioned at the collection port 22. Because the collection port 22 is formed in a ring shape surrounding the optical path space K, the porous member 25 positioned at the collection port 22 is formed in a ring shape so as to surround the optical path space K, corresponding to the collection port 22. The porous member 25 is provided at the collection port 22 such that the lower surface 26 is at substantially the same position (height) in the Z-axis direction as the land surface 17, and also such that the lower surface 26 and the land surface 17 are substantially continuous. That is, the land surface 17 and the lower surface 26 of the porous member 25 are substantially flush.

In this embodiment, the liquid immersion system 1 is provided so as to recover only liquid LQ via the collection port 22 by optimizing the difference between the pressure in the recovery flow path 24 and the pressure of the exterior space (atmosphere) SG, according to the diameter of each of the holes in the porous member 25, the angle of connection of the porous member 25 and the liquid LQ, the surface tension of the liquid LQ, and similar. Specifically, the liquid immersion system 1 controls the suction force on the recovery flow path 24 by the liquid recovery device 21 to optimize the pressure in the recovery flow path 24, to recovery only liquid LQ.

The numbers, positions, shapes and similar of the supply ports, collection ports, and suction apertures of the nozzle member 6 are not limited to those shown in FIG. 3 through FIG. 5, but need only be sufficient to enable formation of a satisfactory liquid immersion region LR. For example, supply ports 12 may be provided lateral to both sides in the X-axis direction of the optical path space K, and suction apertures 16 may be provided lateral to both sides in the Y-axis direction.

When filling the optical path space K of the exposure light EL with liquid LQ, either the first substrate stage 4 or the second substrate stage 5 is positioned at the position EP opposing the final optical element FL of the projection optical system PL. As described above, the first and second substrate stages 4 and 5 can each be moved between the exposure station ST1 and the measurement station ST2. The first and second substrate stages 4 and 5 are provided so as to enable motion, while holding a substrate P, in a prescribed area on the base member BP, the area comprising the position EP opposed to the final optical element FL of the projection optical system PL provided in the exposure station ST1, and when each of the stages 4, 5 is opposed to the final optical element FL, liquid LQ can be held between the substrate P and the final optical element FL (nozzle member 6).

With either the first substrate stage 4 or the second substrate stage 5 positioned in the position EP opposing the final optical element FL of the projection optical system PL, the control device 7 drives both the liquid supply device 11 and the liquid recovery device 21. Liquid LQ delivered from the liquid supply device 11 flows through the supply tubes 13, then passes through the supply flow paths 14 of the nozzle member 6, and is supplied from the supply ports 12 to the inner space SP. Liquid LQ which has been supplied from supply ports 12 to the inner space SP fills the inner space SP, flows into the space between the land surface 17 and the substrate P (substrate stage) via the aperture 18K, and fills the optical path space K of the exposure light EL. In this way, by supplying liquid LQ from the supply ports 12 to the inner space SP between the final optical element FL and the base plate 18, the optical path space K of exposure light EL between the final optical element FL (projection optical system PL) and the substrate P (substrate stage) is filled with liquid LQ. When liquid LQ is supplied to the inner space SP from supply ports 12, the control device 7 controls the valve mechanisms 33B so as to connect the suction apertures 16 to the exterior space SG. That is, when supplying liquid LQ to the inner space SP from supply ports 12, the inner space SP is opened to the outside atmosphere. By supplying liquid LQ to the inner space SP in this state, the air portion which had existed in the inner space SP is discharged to the exterior space SG via the suction apertures 16 and/or the aperture 18K. Hence at the time of initiation of supply of liquid LQ to the inner space SP, problems such as the lingering of air in the inner space SP can be prevented, and such difficulties as the generation of air portions (air bubbles) in the liquid LQ in the optical path space K can be prevented.

When liquid LQ is supplied to the inner space SP from supply ports 12, the control device 7 may control the valve mechanisms 33B such that the suction apertures 16 and suction device 31 are connected. And, the suction device 31 may be driven, and while forcibly discharging air from the inner space SP via the suction apertures 16, liquid LQ may be supplied to the inner space SP via the supply ports 12.

Liquid LQ existing between the nozzle member 6 (collection port 22) and substrate P is recovered via the collection port 22 by the liquid recovery device 21. The liquid recovery device 21 recovers a prescribed amount of liquid LQ per unit time. The liquid recovery device 21 including a vacuum system can recover liquid LQ existing between the collection port 22 (porous member 25) and substrate P, via the collection port 22, by inducing a negative pressure in the recovery flow path 24. Liquid LQ which fills the optical path space K of exposure light EL flows through the collection port 22 of the nozzle member 6 into the recovery flow path 24, and after passing through the recovery tube 23 is recovered by the liquid recovery device 21. The control device 7 controls the liquid immersion system 1, and by causing to be performed in parallel the liquid supply operation of the liquid supply device 11 and the liquid recovery operation of the liquid recovery device 21, the optical path space K is filled with liquid LQ, and a liquid immersion region LR of the liquid LQ is formed locally in an area on a portion of the substrate P.

Figure 6:
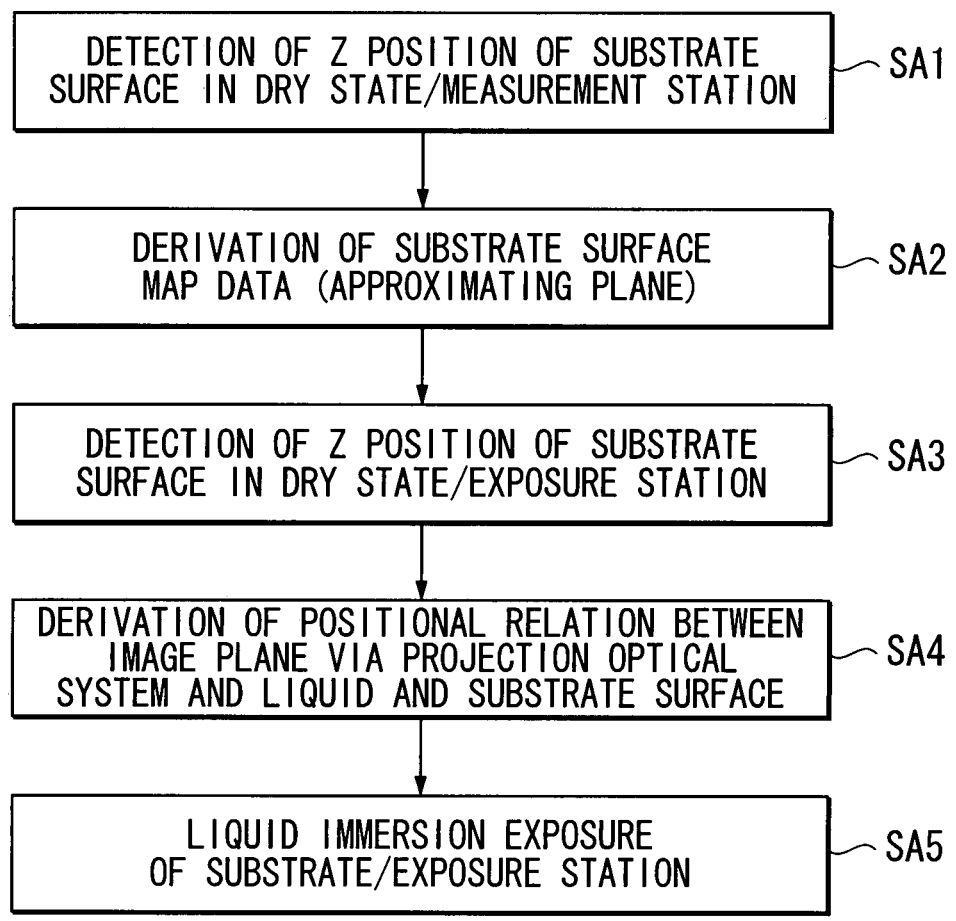
FIG. 6 is a flowchart used to explain basic operation of an exposure apparatus.

Next, basic operation of the exposure apparatus EX is explained, referring to the flowchart of FIG. 6. In this embodiment, with the optical path space K of the exposure light EL filled with liquid LQ, the control device 7 controls movement of one substrate stage 4 (or 5) existing at the exposure station ST1 among the first substrate stage 4 and the second substrate stage 5, and performs exposure of the substrate P held by that stage 4 (or 5) via the projection optical system PL and liquid LQ. On the other hand, at the measurement station ST2, prescribed measurements are performed, without the mediation of liquid LQ, on the substrate P held by the other stage 5 (or 4).

At the measurement station ST2, the control device 7 initiates exchange and measurement processing of the substrate P. For example, the second substrate stage 5 is positioned at the substrate exchange position RP of the measurement station ST2, and the transport system 9 is used to load the substrate P to be subjected to exposure processing onto the second substrate stage 5. The control device 7 initiates measurement processing for the second substrate stage 5 holding the substrate P at the measurement station ST2. On the other hand, the first substrate stage 4, holding a substrate P for which measurement processing at the measurement station ST2 has been completed, is positioned at the exposure station ST1.

In this embodiment, measurements of a substrate P at the measurement station ST2 include detection of surface position information of the surface of the substrate P by the focus/leveling detection system 8. At the measurement station ST2, the liquid LQ is not supplied above the substrate P. The focus/leveling detection system 8 detects surface position information for the surface of the substrate P held by the second substrate stage 5 without the mediation of liquid LQ (step SA1). In this embodiment, the control device 7 controls movement of the second substrate stage 5, and while moving the second substrate stage 5 holding the substrate P in the XY plane, uses the focus/leveling detection system 8 to detect, without the mediation of liquid LQ, the position in the Z-axis direction of a plurality of detection points on the surface of the substrate P. For example, the control device 7 moves the second substrate stage 5 while monitoring the output of the laser interferometer 2P, and, without the mediation of liquid LQ, uses the focus/leveling detection system 8 to detect position information in the Z-axis direction for a plurality of points in the plane (in the XY plane) of the surface of the substrate P. Specifically, while moving the second substrate stage 5 in XY directions such that detection light La emitted from the projection system 8A of the focus/leveling detection system 8 is incident on a plurality of positions on the surface of the substrate P, the position (attitude) of the second substrate stage 5 in the Z-axis, $\theta X$, and $\theta Y$ directions is adjusted, and position information in the Z-axis direction for a plurality of points on the surface of the substrate P is detected relative to a prescribed reference position (reference surface). The detection results of the focus/leveling detection system 8 are stored in the control device 7, in association with the position in the XY plane of the substrate P (second substrate stage 5).

Next, the control device 7 creates map data based on position information for the plurality of detection points on the surface of the substrate P, detected in step SA1, and determines an approximate plane (approximate surface) for the surface of the substrate P based on the map data (step SA2). By this means, an approximate plane for the surface of the substrate P is determined with reference to a prescribed reference position (reference surface). The control device 7 stores the approximate plane for the surface of the substrate P thus determined at the measurement station ST2.

When processing ends at the exposure station ST1 and at the measurement station ST2, the control device 7 moves the first substrate stage 4 to the measurement station ST2 and moves the second substrate stage 5 to the exposure station ST1. After the first substrate stage 4, holding the substrate P for which exposure processing has been completed, has been moved to the measurement station ST2, the transport system 9 unloads the substrate P on the first substrate stage 4. A substrate P to be subjected to exposure processing is loaded onto the first substrate stage 4 at the measurement station ST2, and the above-described measurement processing is performed.

On the other hand, after the second substrate stage 5, holding a substrate P subjected to measurement processing at the measurement station ST2, has been moved to the exposure station ST1, the focus/leveling detection system 8 provided at the exposure station ST1 detects, without the mediation of liquid LQ, position information in the Z-axis direction of one detection point on the surface of the substrate P on the second substrate stage 5, or of a number of detection points smaller than the number of detection points detected at the measurement station ST2 (step SA3). An approximate plane of the surface of the substrate P was determined in step SA2. Hence at the exposure station ST1, by detecting position information in the Z-axis direction for one detection point (or a plurality of detection points) on the surface of the substrate P and position information in the XY plane, an approximate plane for the surface of the substrate P can be derived, based on the detection results, with reference to a prescribed reference position (reference surface) at the exposure station ST1.

The control device 7 stores in advance position information for the image plane, with the mediation of liquid LQ, of the projection optical system PL relative to a prescribed reference position (reference surface). Hence the control device 7 can determine the positional relation between the image plane formed by the projection optical system PL via liquid LQ and the surface (approximate surface) of the substrate P, with reference to a prescribed reference position (reference surface) (step SA4).

When the above-described measurement processing ends, the control device 7 controls movement of the second substrate stage 5, and positions the substrate P in the position opposing the final optical element FL of the projection optical system PL. Based on the surface position information of the surface of the substrate derived based on detection results of the focus/leveling detection system 8 at the measurement station ST2, and while adjusting the position of the surface of the substrate P relative to the image plane via liquid LQ of the projection optical system PL at the exposure station ST1, the control device 7 exposes the substrate P via the projection optical system PL and liquid LQ, while moving the substrate P in the Y-axis direction with respect to the optical path space K (step SA5).

After liquid immersion exposure processing of the substrate P on the second substrate stage 5 has ended, the control device 7 moves the second substrate stage 5 at the exposure station ST1 to the measurement station ST2. In parallel with this, the first substrate stage 4 holding a substrate P for which measurement processing has ended at the measurement station ST2 is moved to the exposure station ST1. The transport system 9 unloads the substrate P for which exposure processing has ended, held by the second substrate stage 5, which has been moved to the measurement station ST2.

Figure 7:
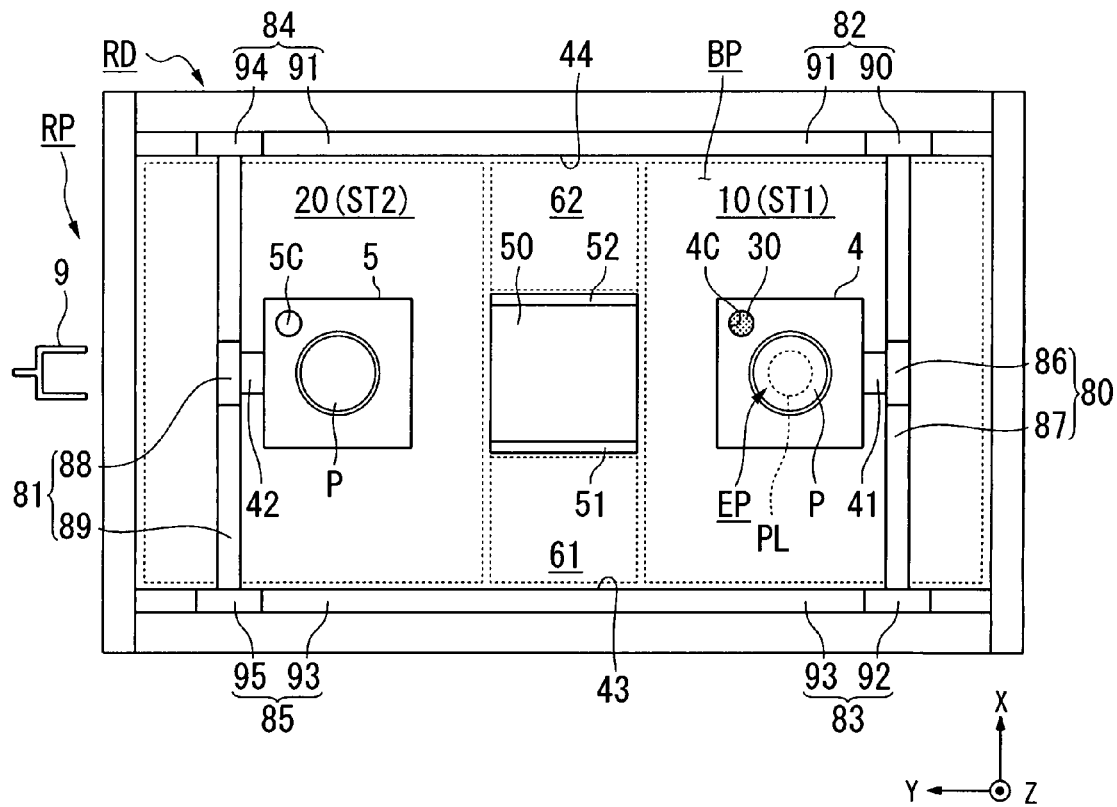
FIG. 7 is a drawing used to explain the exposure method in the first embodiment.

Next, an example of a substrate stage driving device PD is explained, referring to FIG. 7. FIG. 7 is a view from above of first and second substrate stages 4, 5 and a substrate stage driving device PD. In FIG. 7, the substrate stage driving device PD includes linear motors 80, 81, 82, 83, 84, 85. The substrate stage driving device PD includes a pair of Y-axis linear guides 91, 93 extending in the Y-axis direction. The Y-axis linear guides 91, 93 are positioned separated a prescribed interval in the X-axis direction. The Y-axis linear guides 91, 93 each includes, for example, magnet units, incorporating permanent magnet groups having a plurality of sets of N-pole magnets and S-pole magnets, arranged at prescribed intervals along the Y-axis direction and in alternation. On one of the Y-axis linear guides 91, two sliders 90, 94 are supported to enable motion in the Y-axis direction in a contact-free state. Similarly, two sliders 92, 95 are supported on the other Y-axis linear guide 93 to enable motion in the Y-axis direction in a contact-free state. Each of the sliders 90, 92, 94, 95 has for example a coil unit, incorporating armature coils arranged at prescribed intervals along the Y axis. That is, in this embodiment, by means of the sliders 90, 94, having coil units, and the Y-axis linear guide 91 having a magnet unit, moving-coil type Y-axis linear motors 82, 84 are configured. Similarly, by means of the sliders 92, 95, having coil units, and the Y-axis linear guide 93 having a magnet unit, moving-coil type Y-axis linear motors 83, 85 are configured.

The sliders 90, 92 comprised by the Y-axis linear motors 82, 83 are respectively fixed to one end portion and the other end portion in the length direction of an X-axis linear guide 87 extending in the X-axis direction. Furthermore, the sliders 94, 95 comprised by the Y-axis linear motors 84, 85 are respectively fixed to one end portion and the other end portion in the length direction of an X-axis linear guide 89 extending in the X-axis direction. Hence the X-axis linear guide 87 is movable in the Y-axis direction by means of the Y-axis linear motors 82, 83, and the X-axis linear guide 89 is movable in the Y-axis direction by means of the Y-axis linear motors 84, 85.

Each of the X-axis linear guides 87, 89 includes for example a coil unit incorporating armature coils arranged at prescribed intervals along the X axis. On one of the X-axis linear guides 87 is supported the slider 86 to enable motion in the X-axis direction in a contact-free state. Similarly, on the other X-axis linear guide 89 is supported the slider 88 to enable motion in the X-axis direction in a contact-free state. The sliders 86, 88 includes for example magnet units having permanent magnet groups having a plurality of sets of N-pole magnets and S-pole magnets, arranged at prescribed intervals along the X-axis direction and in alternation.

In FIG. 7, each of the first and second substrate stages 4, 5 is connected to the sliders 86, 88 via releasable joints 41, 42, such as those disclosed for example in Japanese Unexamined Patent Application, First Publication No. 2001-223159. The joints 41, 42 can be coupled to side faces of the first and second substrate stages 4, 5 respectively. That is, the joint 41 connected to the slider 86 can be coupled to the −Y side face of the first substrate stage 4 and to the −Y side face of the second substrate stage 5. The joint 42 connected to the slider 88 can be coupled to the +Y side face of the second substrate stage 5 and to the +Y side face of the first substrate stage 4. By means of the slider 86 and the X-axis linear guide 87, a moving magnet type X-axis linear motor 80 is configured which drives the first substrate stage 4 (second substrate stage 5) connected via the joint 41 to the slider 86 in the X-axis direction. And by means of the slider 88 and the X-axis linear guide 89, a moving magnet type X-axis linear motor 81 is configured which drives the second substrate stage 5 (first substrate stage 4) connected via the joint 42 to the slider 88 in the X-axis direction.

By making the thrusts generated by the pair of Y-axis linear motors 82, 83 (or 84, 85) slightly different, the substrate stage can be controlled in the θZ direction. In the figure, the substrate stages are shown as single substrate stages. In actuality, each substrate stage includes an XY stage, driven by a Y-axis linear motor, and a Z-tilt stage, mounted via a Z-leveling driving mechanism (for example, a voice coil motor or similar) on the XY stage, and finely driven in the Z-axis direction and in the θX and θY directions relative to the XY stage. The substrate holder holding the substrate P is supported by the Z-tilt stage.

On the base member BP is provided an auxiliary 50 which prevents collision between the first substrate stage 4 and the second substrate stage 5. The auxiliary 50 is provided to prevent collisions between the first substrate stage 4 and the second substrate stage 5, which move in XY directions on the base member BP, and is provided between a first work area 10 comprising the exposure station ST1, and a second work area 20 comprising a measurement station ST2.

The auxiliary 50 has a prescribed size. A first passageway 61 is formed between the auxiliary 50 and the −X side wall 43 comprising the Y linear guide 93. A second passageway 62 is formed between the auxiliary 50 and the +X side wall 44 comprising the Y linear guide 91. And, the auxiliary 50 has regulating members 51, 52 which perform regulation such that the first substrate stage 4 and the second substrate stage 5 move only on mutually different paths. The first substrate stage 4 moves only on the first passageway 61 among the first passageway 61 and the second passageway 62, and the second substrate stage 5 moves only on the second passageway 62, by means of the auxiliary 50 comprising the regulating members 51, 52.

Next, a method of exposure of a substrate P using an exposure apparatus EX having the above-described configuration is explained, referring to the plane views of FIG. 7 through FIG. 14 and FIG. 15 through FIG. 24.

Figure 15:
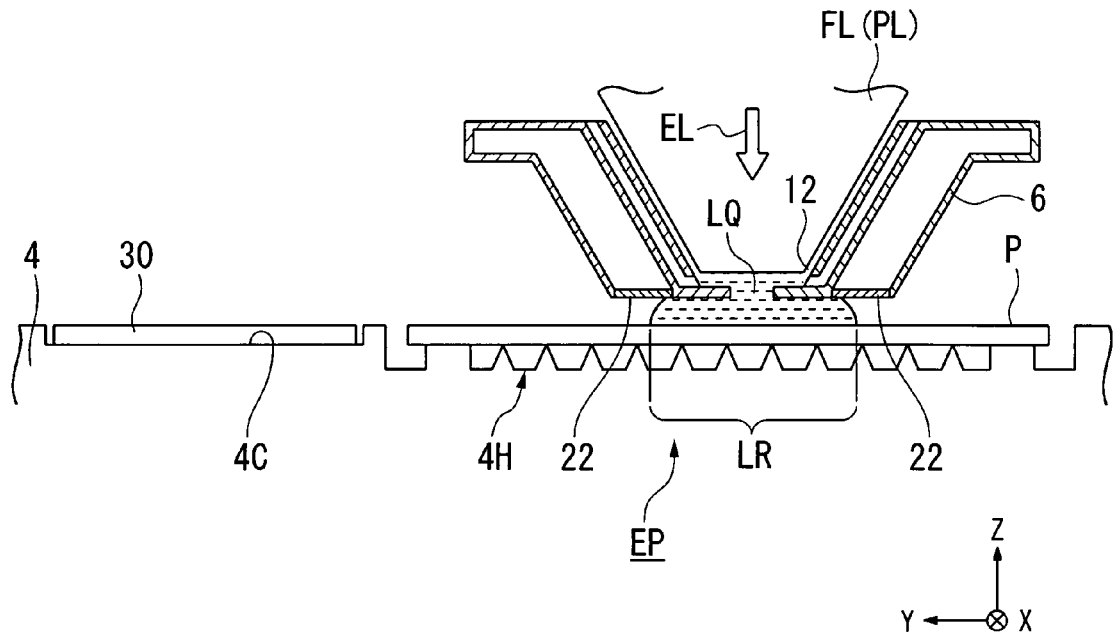
FIG. 15 is a drawing used to explain the exposure method in the first embodiment.

As shown in FIG. 7 and FIG. 15, in the first work area 10 of the exposure station ST1, liquid immersion exposure of the substrate P held by the first substrate stage 4 is performed. At the measurement station ST2, measurement processing of the substrate P held by the second substrate stage 5 is performed. In order to perform liquid immersion exposure of the substrate P on the first substrate stage 4, the control device 7 positions the first substrate stage 4 at the position opposing the final optical element FL of the projection optical system PL (the position directly below the final optical element FL) EP. Then, the control device 7 uses the liquid immersion system 1 to fill the optical path space K between the final optical element FL and the substrate P held by the first substrate stage 4 with liquid LQ, and exposes the substrate R Furthermore, the cap member 30 is held by the cap holder 4C on the first substrate stage 4. And as described above, when the first substrate stage 4 is positioned at the position EP opposing the final optical element FL, the second substrate stage 5 is subjected to measurement processing, substrate exchange, and other prescribed processing in the second work area 20 of the measurement station ST2 comprising the substrate exchange position RP.

Figure 8:
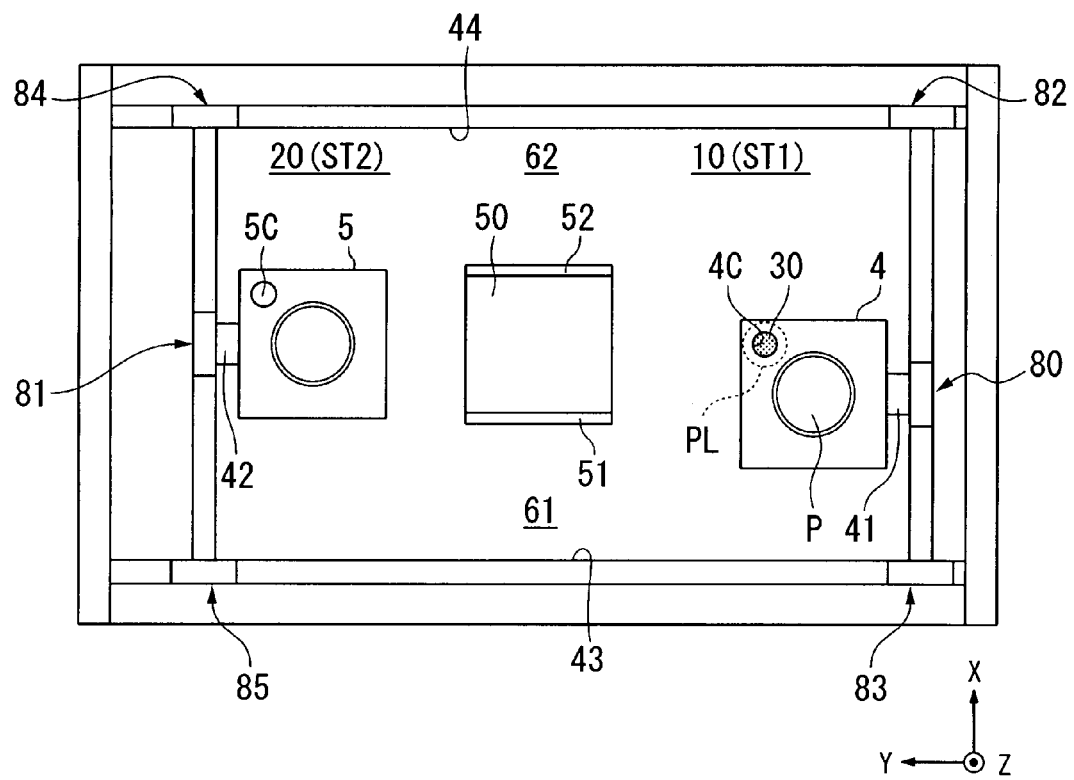
FIG. 8 is a drawing used to explain the exposure method in the first embodiment.
Figure 16:
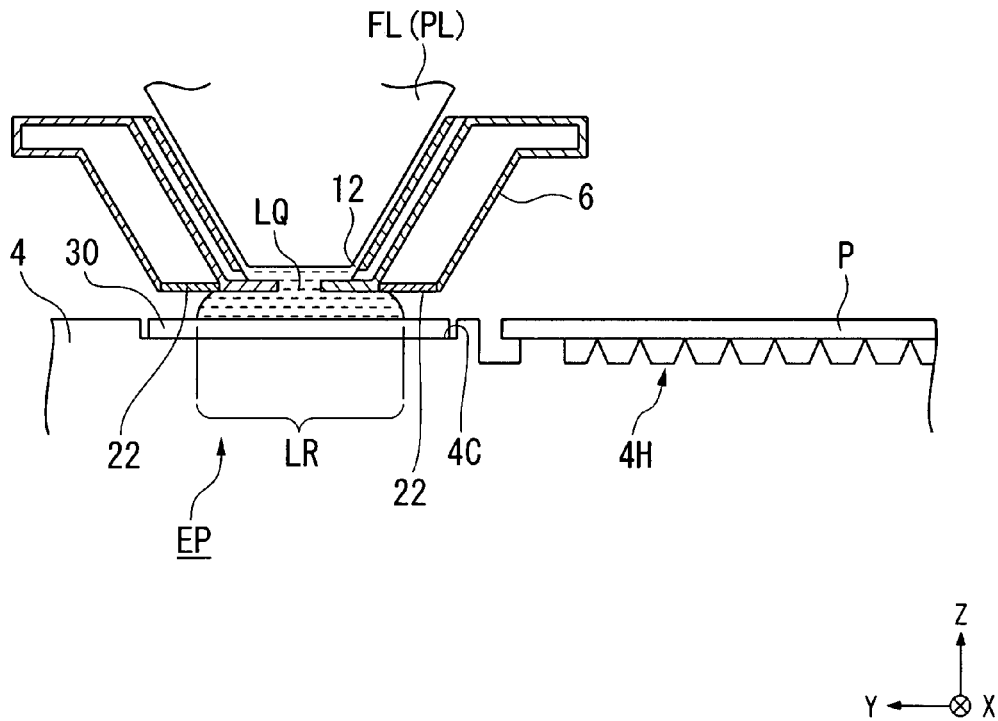
FIG. 16 is a drawing used to explain the exposure method in the first embodiment.

As shown in FIG. 8 and FIG. 16, after the end of liquid immersion exposure of the substrate P on the first substrate stage 4, the control device 7 moves the first substrate stage 4 in XY directions, while liquid LQ is held between the final optical element FL of the projection optical system PL and the substrate P held by the first substrate stage 4, and moves the liquid immersion region LR of liquid LQ from on the substrate P to on the cap member 30 held by the cap holder 4C above the first substrate stage 4. The upper surface of the cap member 30 held by the cap holder 4C of the first substrate stage 4 is substantially flush with the upper surface 4F of the substrate P held by the substrate holder 4H of the first substrate stage 4 and with the upper surface 4F of the first substrate stage 4. While performing in parallel the supply of liquid LQ from the supply ports 12 and the recovery of liquid LQ via the collection port 22, the first substrate stage 4 is moved in XY directions within a prescribed area comprising the position EP opposing the final optical element FL, and by this means the liquid immersion region LR formed on the substrate P can be smoothly moved on the cap member 30.

Figure 17:
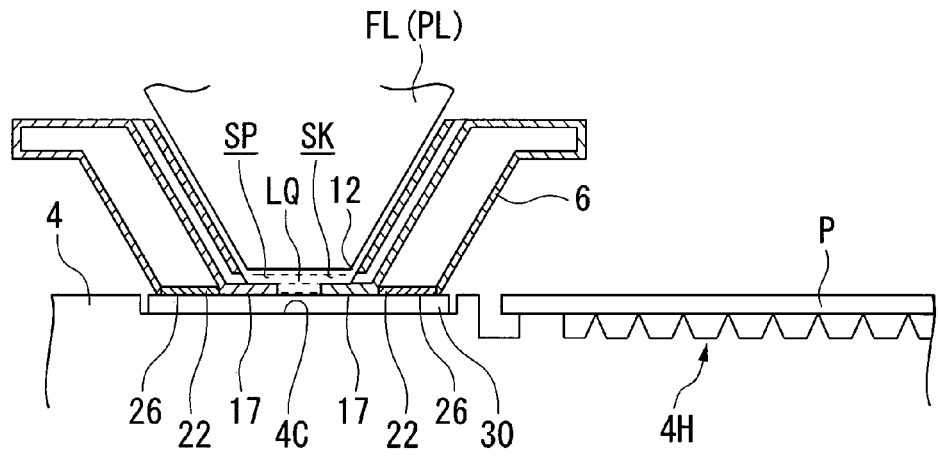
FIG. 17 is a drawing used to explain the exposure method in the first embodiment.

After moving the liquid immersion region LR on the cap member 30, the control device 7 adjusts the positional relation between the nozzle member 6 and the cap member 30 in the Z-axis direction, as shown in FIG. 17, and causes the lower surface of the nozzle member 6 (17, 26) to make contact with the upper surface of the cap member 30. Specifically, the first substrate stage 4, holding the cap member 30, is raised in the +Z direction, and the lower surface of the cap member 6 is brought into contact with the upper surface of the cap member 30. Furthermore, position information in XY directions for the first substrate stage 4 is measured by the laser interferometer 2P. Based on measurement results of the laser interferometer 2P, the cap member 30 on the first substrate stage 4 can be positioned with respect to the nozzle member 6. Of the portions of the nozzle member 6, the collection port 22 is provided in the lower surface opposing the upper surface of the cap member 30. By a recovery operation (suction operation) via the collection port 22, the cap member 30 can be vacuum-clamped to the lower surface of the nozzle member 6. The control device 7 uses the collection port 22 to hold the cap member 30 against the lower surface of the nozzle member 6, such that the nozzle member 6 and cap member 30 are in a prescribed positional relation.

In this embodiment, the lower surface 26 of the porous member 25 positioned at the collection port 22 is substantially flat, and is substantially flush with the land surface 17 of the nozzle member 6. By vacuum-clamping the cap member 30 using the collection port 22 of the nozzle member 6, the aperture 18K can be closed. By holding the cap member 30 against the lower surface of the nozzle member 6 so as to close the aperture 18K, liquid LQ can be held between the lower surface T1 of the final optical element FL and the nozzle member 6. Furthermore, a prescribed space SK comprising the inner space SP, and capable of holding liquid LQ, is formed between the final optical element FL and the cap member 30 held by the nozzle member 6.

Figure 9:
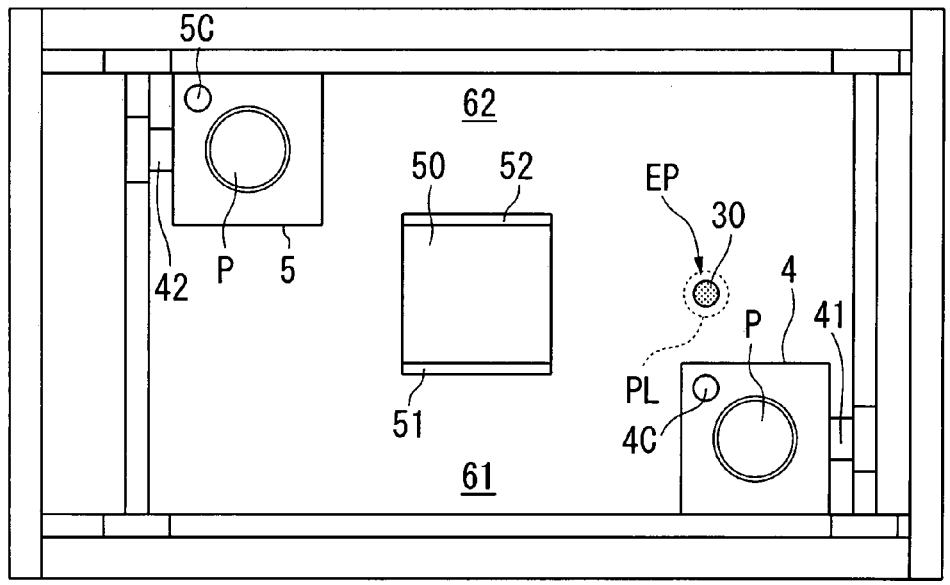
FIG. 9 is a drawing used to explain the exposure method in the first embodiment.
Figure 18:
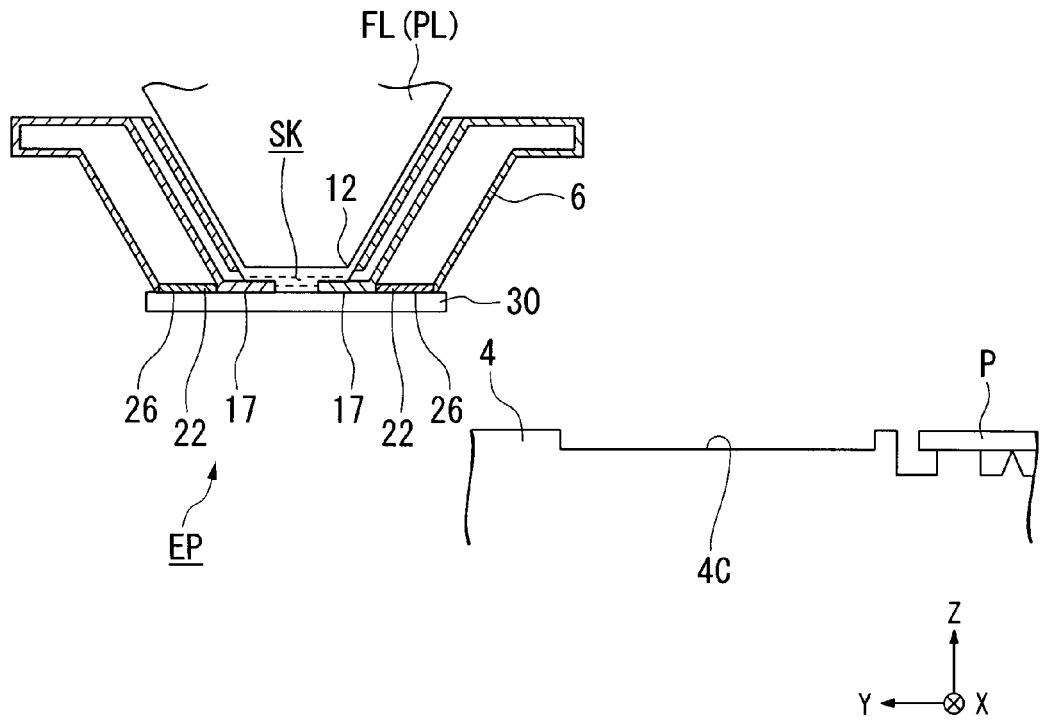
FIG. 18 is a drawing used to explain the exposure method in the first embodiment.

After holding the cap member 30 against the lower surface of the nozzle member 6, the control device 7 releases the holding of the cap member 30 by the cap holder 4C of the first substrate stage 4. As shown in FIG. 9 and FIG. 18, the control device causes the first substrate stage 4 to be retracted from the position EP opposing (the position directly below) the final optical element FL. In this way, when the first substrate stage 4 withdraws from the final optical element FL, the cap member 30 held against the lower surface of the nozzle member 6 is removed from the first substrate stage 4, and liquid LQ can be held up to the final optical element FL.

Figure 19:
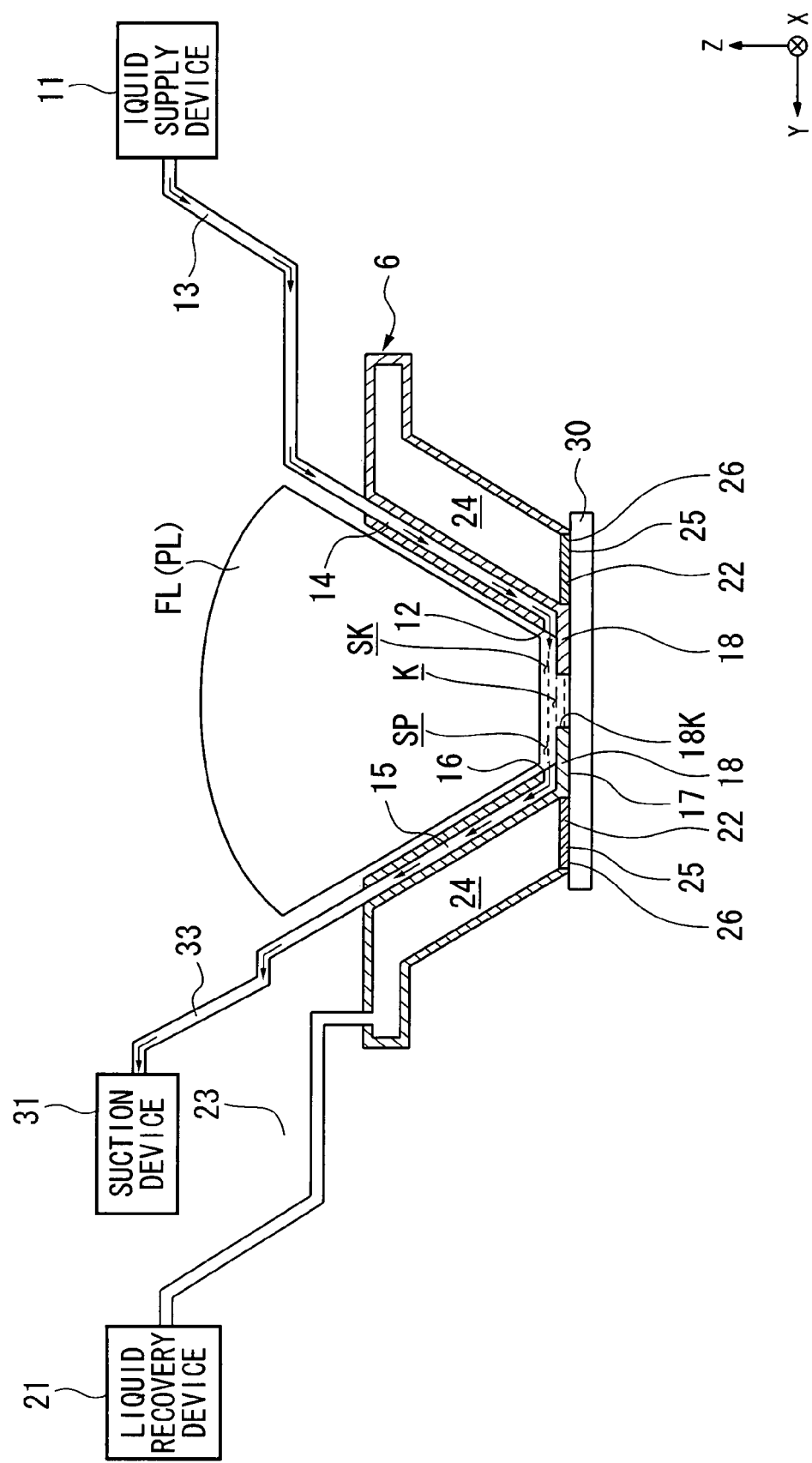
FIG. 19 is a drawing used to explain an example of operation in a state of holding a cap member.

FIG. 19 shows the state in which the cap member 30 is held using the collection port 22 of the nozzle member 6. As described above, supply ports 12 are provided lateral to the optical path space K in the Y-axis direction, and suction apertures 16 are provided lateral to the optical path space K in the X-axis direction. In FIG. 19, in order to facilitate viewing of the drawing as well as to simplify the explanation, a supply port 12 lateral to the −Y side of the optical path space K and a supply tube 13 connected to the supply port 12 are shown, and a suction aperture 16 lateral to the +Y side of the optical path space K and a suction tube 33 connected to the suction aperture 16 are shown.

As shown in FIG. 19, with the cap member 30 held against the lower surface of the nozzle member 6, the supply of liquid LQ from the supply ports 12 to the prescribed space SK including the inner space SP, between the final optical element FL and the cap member 30, and the recovery of liquid LQ via the suction apertures 16, are performed in parallel. As described above, by controlling the valve mechanisms 33B, the control device 7 can connect the suction apertures 16 and the suction device 31 having a vacuum system via the suction flow paths 15 and suction tubes 33. Hence by driving the suction device 31, the control device 7 can perform suction recovery of fluids (liquid LQ, air) in the prescribed space SK, including the inner space SP, between the final optical element FL and the cap member 30. The control device 7 drives the liquid recovery device 21 having a vacuum system to induce a negative pressure in the recovery flow path 24, maintains the clamping of the cap member 30 by the collection port 22, and with the aperture 18K closed, drives the liquid supply device 11 and the suction device 31. By this means, pure liquid LQ is supplied from the supply ports 12 to the prescribed space SK between the final optical element FL and the cap member 30, and in addition liquid LQ in the prescribed space SK can be recovered from the suction apertures 16. By this means, the image-plane side of the projection optical system PL can be continuously filled with liquid LQ, without halting the liquid supply operation of the liquid supply device 11.

The supply ports 12 to supply liquid LQ to the prescribed space SK and suction apertures 16 to recovery liquid LQ are provided at positions closer to the final optical element FL than the collection port 22 used for clamping of the cap member 30. Hence by holding the cap member 30 using the collection port 22 provided in the lower surface of the nozzle member 6, the prescribed space SK can be formed between the final optical element FL and the cap member 30, connected to the supply ports 12 and suction apertures 16.

Figure 10:
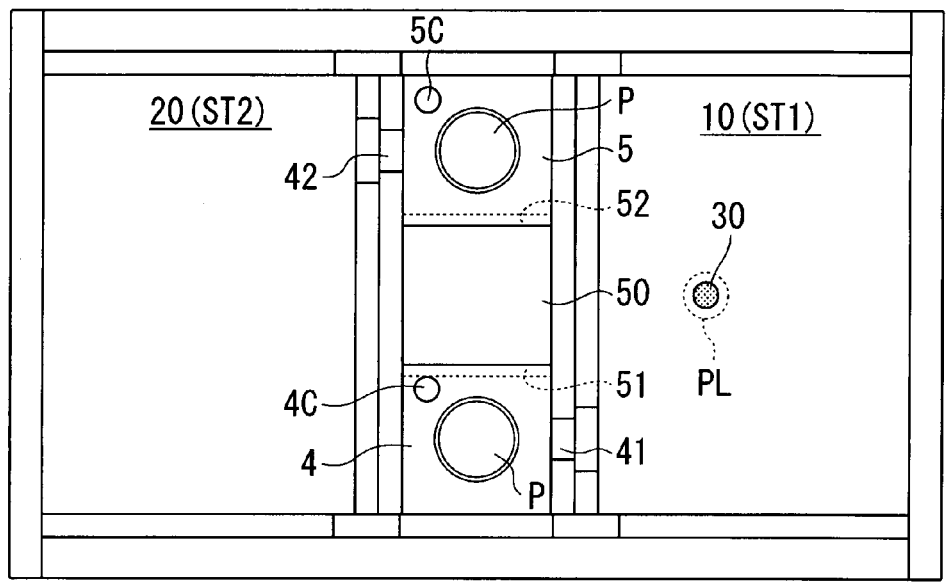
FIG. 10 is a drawing used to explain the exposure method in the first embodiment.

Next, while measuring the XY direction positions of the first and second substrate stages 4, 5 using the laser interferometers 2P, the control device 7 controls the substrate stage driving device PD to move the first substrate stage 4 to the measurement station ST2 (second work area 20), and to move the second substrate stage 5 to the exposure station ST1 (first work area 10). As shown in FIG. 10, the control device 7 controls the substrate stage driving device PD so as to move the first substrate stage 4 along the first passageway 61 and to move the second substrate stage 5 along the second passageway 62.

Figure 20:
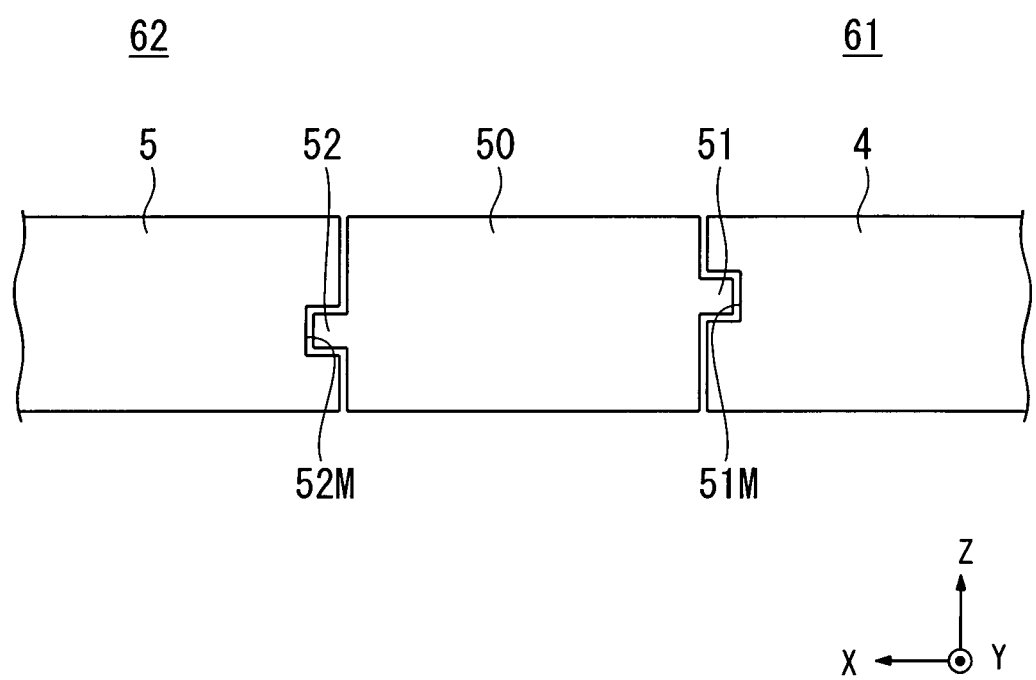
FIG. 20 is a drawing used to explain an example of an auxiliary.

FIG. 20 is a schematic drawing showing the relation between the first and second substrate stages 4, 5 passing through the first and second passageways 61, 62. As shown in FIG. 20, the auxiliary 50 has first and second regulating members 51, 52 which perform regulation such that the first substrate stage 4 and the second substrate stage 5 move through different paths. In this embodiment, the first regulating member 51 is provided on the −X side face of the auxiliary 50, and has a protruding member which protrudes on the −X side. The protruding member comprised by the first regulating member 51 is formed so as to extend in the Y-axis direction on the −X side face of the auxiliary 50. The second regulating member 52 is provided on the +X side face of the auxiliary 50, and has a protruding member which protrudes on the +X side. The protruding member comprised by the second regulating member 52 is formed so as to extend in the Y-axis direction on the +X side of the auxiliary 50.

The first regulating member 51 and the second regulating member 52 are provided at different positions (heights) in the Z-axis direction. A first groove 51M is formed in the +X side face of the first substrate stage 4, according to the first regulating member 51. A second groove 52M is formed in the −X side face of the second substrate stage 5, according to the second regulating member 52. When the first substrate stage 4 passes through the first passageway 61, the first regulating member 51 has the first groove 51M positioned on the inside, and movement of the first substrate stage 4 in the first passageway 61 is not impeded by the first regulating member 51. In other words, when the first substrate stage 4 passes through the first passageway 61, the first substrate stage 4 does not strike the first regulating member 51. Or, when passing through the passageway 61, the movement of the first substrate stage 4 is guided by the first regulating member 51. And, when the second substrate stage 5 passes through the second passageway 62, the second regulating member 52 has the second groove 52M positioned on the inside, and movement of the second substrate stage 5 in the second passageway 62 is not impeded by the second regulating member 52. In other words, when the second substrate stage 5 passes through the second passageway 62, the second substrate stage 5 does not strike the second regulating member 52. Or, when passing through the second passageway 62, the movement of the second substrate stage 5 is guided by the second regulating member 52.

On the other hand, when the first substrate stage 4 moves from one among the exposure station ST1 and the measurement station ST2 to the other, even if the first substrate stage 4 attempts to pass through the second passageway 62, the first substrate stage 4 strikes the second regulating member 52 in the second passageway 62. That is, the second regulating member 52 impedes movement of the first substrate stage 4 along the second passageway 62. Hence even if for example the second substrate stage 5 exists in proximity to the second passageway 62 at the measurement station ST2, collision of the first substrate stage 4 and the second substrate stage 5 is prevented. Similarly, even if the second substrate stage 5 attempts to pass through the first passageway 61, movement of the second substrate stage 5 in the first passageway 61 is impeded by the first regulating member 51.

The auxiliary 50 is for example formed from a material softer than that of the first and second substrate stages 4, 5. Significant damage is not imparted to the first or second substrate stages 4, 5 even when the first or second substrate stages 4, 5 strike the auxiliary 50. Or, a cushioning mechanism may be provided on the auxiliary 50, to absorb shocks when an object (a substrate stage) strikes. By this means, significant damage to the first and second substrate stages 4, 5 can be prevented even when the first or second substrate stage 4, 5 strikes the auxiliary 50. By providing such an auxiliary 50, direct collisions between the first substrate stage 4 and the second substrate stage 5 can be prevented, and increased damage can be suppressed.

Figure 11:
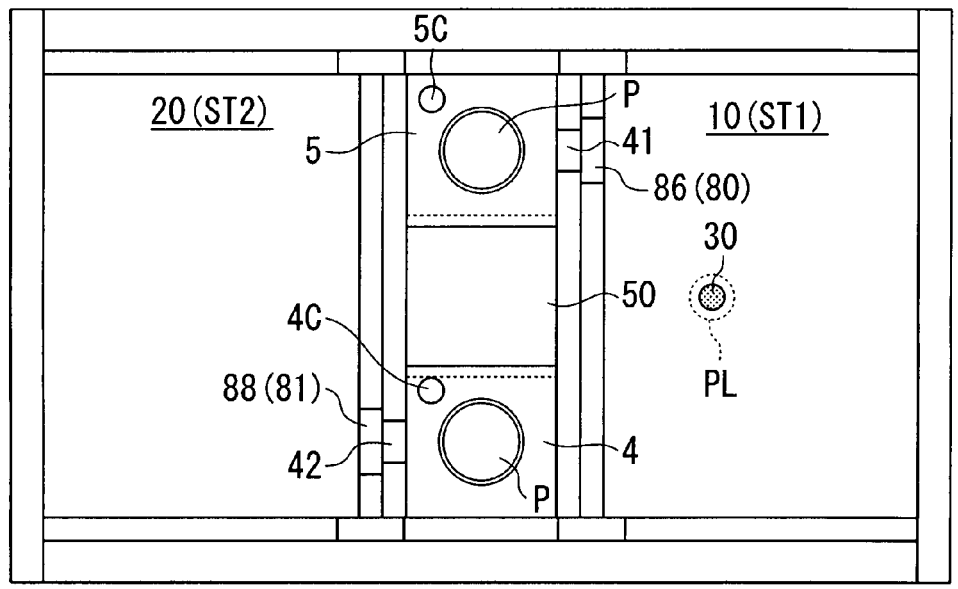
FIG. 11 is a drawing used to explain the exposure method in the first embodiment.
Figure 12:
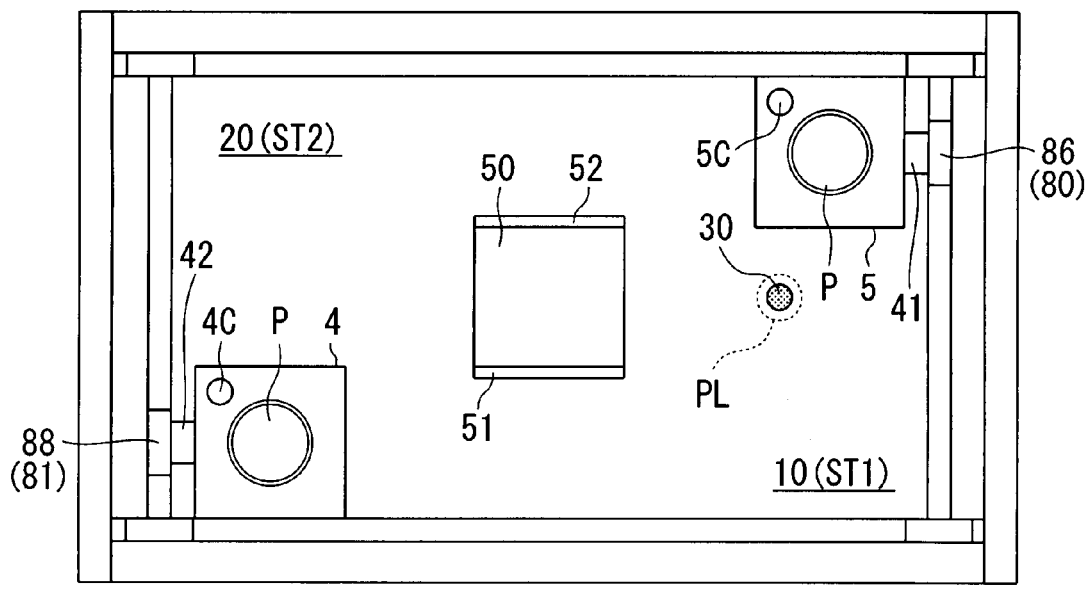
FIG. 12 is a drawing used to explain the exposure method in the first embodiment.

Next, as shown in FIG. 11, coupling of the joint 41 and the first substrate stage 4 and the coupling of the joint 42 and the second substrate stage 4 are released. The first substrate stage 4 is coupled to the slider 88 of a portion of the linear motor 81 via the joint 42, and the second substrate stage 5 is coupled to the slider 86 of a portion of the linear motor 80 via the joint 41. The control device 7 controls the substrate stage driving device PD as shown in FIG. 12 to move the second substrate stage 5 to the exposure station ST1 and to move the first substrate stage 4 to the measurement station ST2.

Figure 21:
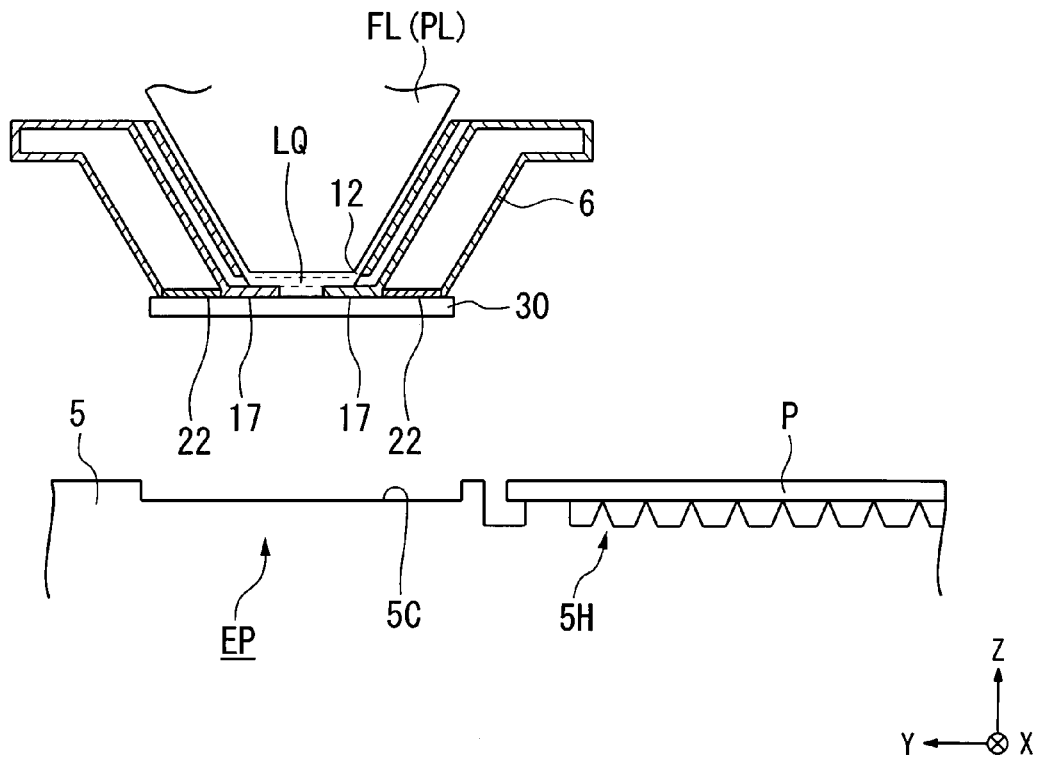
FIG. 21 is a drawing used to explain the exposure method in the first embodiment.

As shown in FIG. 13 and FIG. 21, the control device 7 moves the second substrate stage 5 existing at the exposure station ST1 to the position EP opposing (directly below) the final optical element FL, and causes the lower surface of the cap member 30 held by the nozzle member 6 and the cap holder 5C on the second substrate stage 5 to be opposed.

Figure 22:
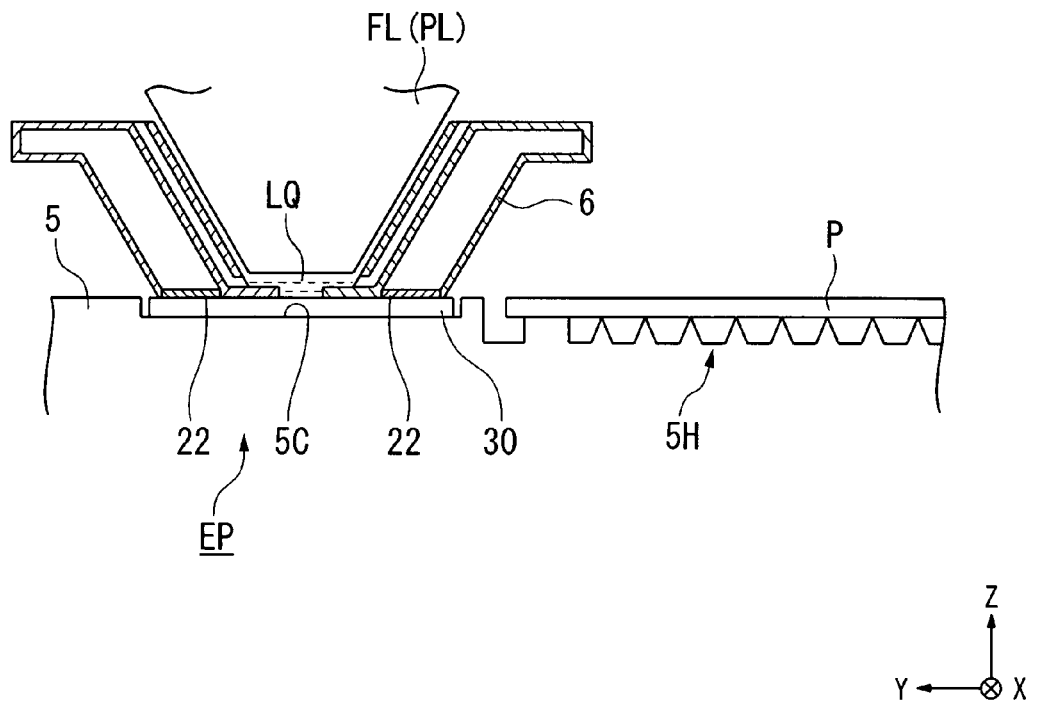
FIG. 22 is a drawing used to explain the exposure method in the first embodiment.

As shown in FIG. 22, the control device adjusts the positional relation in the Z-axis direction between the cap member 30 held by the nozzle member 6 and the cap holder 5C on the second substrate stage 5, and places the cap member 30 held by the nozzle member 6 on the cap holder 5C on the second substrate stage 5. Specifically, the second substrate stage 5 rises in the +Z direction, and the lower surface of the cap member 30 held by the nozzle member 6 makes contact with the cap holder 5C. At this time, position information in the XY directions for the second substrate stage 5 is measured by a laser interferometer 2P. Based on measurement results of the laser interferometer 2P, the cap holder 5C of the second substrate stage 5 can be positioned relative to the cap member 30 held by the nozzle member 6.

Figure 23:
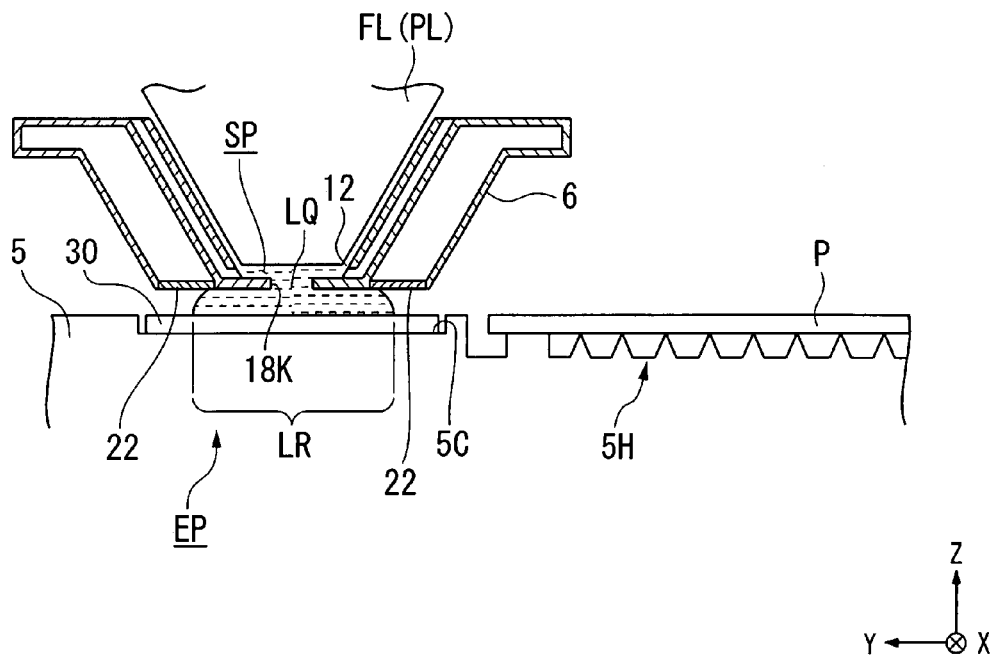
FIG. 23 is a drawing used to explain the exposure method in the first embodiment.

After the cap member 30 held by the nozzle member 6 makes contact with the cap holder 5C, the control device 7 holds the cap member 30 using the cap holder 5C. The control device 7 releases the clamping of the cap member 30 by the collection port 22. As shown in FIG. 23, the second substrate stage 5 descends in the −Z direction, and the lower surface of the nozzle member withdraws from the cap member 30 held by the cap holder 5C. Here, the operation to supply liquid from supply ports 12 is continued. By retracting the cap member 30 from the lower surface of the nozzle member 6, liquid LQ supplied to the inner space SP from the supply ports 12 flows into the space between the nozzle member 6 and the cap member 30 via the aperture 18K. With the supply of liquid LQ from supply ports 12 continued, liquid LQ flowing into the space between the nozzle member 6 and the cap member 30 via the aperture 18K is recovered through the collection port 22. By this means, a liquid immersion region LR for liquid LQ is formed above the cap member 30 mounted on the second substrate stage 5. Furthermore, the control device 7 controls the valve mechanisms 33B with prescribed timing to close the flow paths connecting the suction apertures 16 and the suction device 31, and opens the flow paths connecting the suction apertures 16 and the exterior space (atmosphere) SG. That is, the inner space SP is opened to the outer atmosphere via the suction apertures 16.

Figure 24:
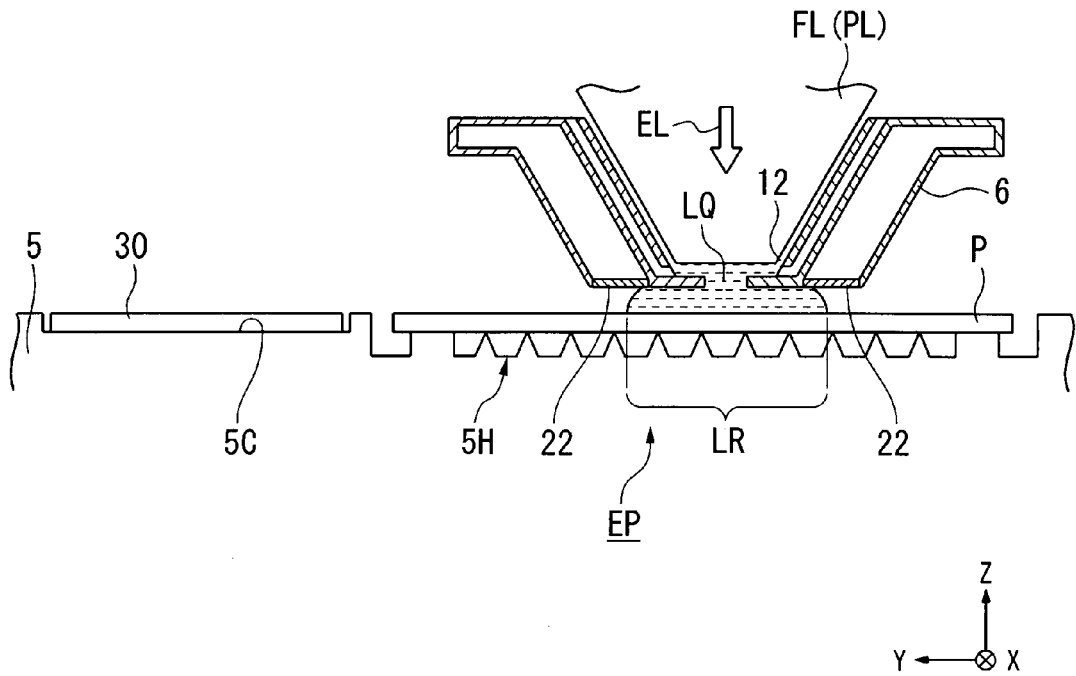
FIG. 24 is a drawing used to explain the exposure method in the first embodiment.

As shown in FIG. 14 and FIG. 24, while holding liquid LQ between the final optical element FL of the projection optical system PL and the cap member 30 held by the cap holder 5C of the second substrate stage 5, the control device moves the second substrate stage 5 in XY directions, and moves the liquid immersion region LR of liquid LQ formed on the cap member 30 onto the substrate P held by the substrate holder 5H of the second substrate stage 5. The upper surface of the cap member 30 held by the cap holder 5H of the second substrate stage 5, the upper surface of the substrate P held by the substrate holder 5H of the second substrate stage 5, and the upper surface 5F of the second substrate stage 5 are substantially flush. While performing in parallel both supply of liquid LQ from supply ports 12 and recovery of liquid LQ via the collection port 22, by moving the second substrate stage 5 in XY directions in the area comprising the position opposed to the final optical element FL, the liquid immersion region LR formed on the substrate P can be smoothly moved onto the substrate P. The control device 7 fills the space between the final optical element FL and the substrate P held by the second substrate stage 5 with liquid LQ, and performs exposure of the substrate P.

After the end of exposure of the substrate P held by the second substrate stage 5, when as described above the second substrate stage 5 is retracted from the final optical element FL, the cap member 30 is removed from the second substrate stage 5, the cap member 30 is clamped to the lower face of the nozzle member 6 using the collection port 22, and liquid LQ is held in the prescribed space SK between the final optical element FL and the cap member 30.

As described above, in this embodiment, a cap member 30 is provided which can be attached to and detached from both the first substrate stage 4 and the second substrate stage 5. Consequently even when the first substrate stage 4 and the second substrate stage 5 each withdraws from the prescribed area (in the area in which the liquid LQ can be held against the final optical element FL) comprising the position EP opposed to the lower surface T1 of the final optical element FL, by holding the cap member 30 using the collection port 22 of the nozzle member 6, liquid LQ can continue to be held between the final optical element FL and the cap member 30. Hence the prescribed space SK comprising the optical path space K and inner space SP can continue to be filled with liquid LQ, without halting the operation of supplying liquid LQ to fill the optical path space K of the exposure light EL with liquid LQ. If there is no cap member 30, when the first substrate stage 4 or the second substrate stage 5 withdraws from the final optical element FL, liquid LQ cannot be held. In this case, the supply of liquid LQ must first be halted, and all liquid LQ must be recovered. A certain amount of time is required for an operation to recovery all liquid LQ. Furthermore, when resuming supply of liquid LQ, a wait time must be set until the state of the liquid LQ, for example the temperature, as well as the quantity or size of air bubbles in the liquid LQ, has reached a desired state. In this case, a decline in the availability factor of the exposure apparatus EX may result. In this embodiment, the prescribed space SK comprising the optical path space K can continue to be filled with liquid LQ, and so declines in the availability factor of the exposure apparatus EX can be suppressed.

Furthermore, by continuing to fill with liquid LQ the space between the final optical element FL and the cap member 30, the final optical element FL can always be kept wet. Hence problems such as the formation of tracks (so-called watermarks) on the final optical element FL due to the evaporation of liquid LQ adhering to the final optical element FL can be prevented. Hence degradation of the performance of the exposure apparatus EX can be prevented.

Furthermore, in the liquid immersion system 1, the supply and recovery of liquid LQ to and from the prescribed space SK between the final optical element FL and cap member 30 are performed in parallel with the cap member 30 held by the nozzle member 6, so that the prescribed space SK is filled with pure liquid LQ. Hence contamination of the final optical element FL can be prevented, and the final optical element FL can be cleaned. In particular, there is the possibility of intermixing of matter arising from the substrate P (material comprised by the photosensitive material, for example) with the liquid LQ which forms the liquid immersion region LR on the substrate P. Hence there is the possibility of adhesion of the above-described matter on the lower surface (liquid contact surface) T1 of the final optical element FL which holds the liquid LQ with the substrate P. In this embodiment, the final optical element FL can be cleaned between exposure of the substrate P on the first substrate stage 4 and exposure of the substrate P on the second substrate stage 5.

Furthermore, in this embodiment an auxiliary 50 is comprised which prevents collisions between the first substrate stage 4 and the second substrate stage 5, so that collision of the first substrate stage 4 with the second substrate stage 5 can be prevented. Hence damage to the first substrate stage 4 and the second substrate stage 5 arising from collisions can be prevented.

Second Embodiment

Figure 25A:
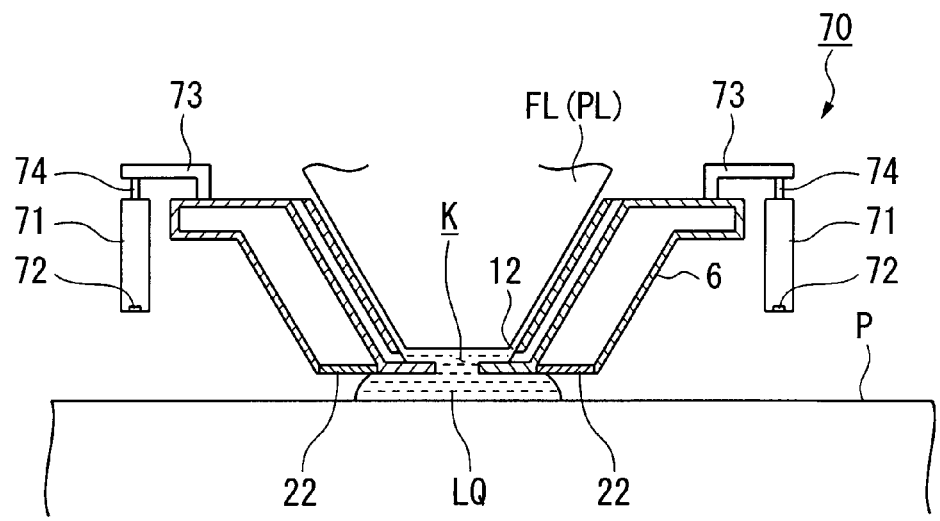
FIG. 25A is a drawing used to explain the exposure method in a second embodiment.
Figure 25B:
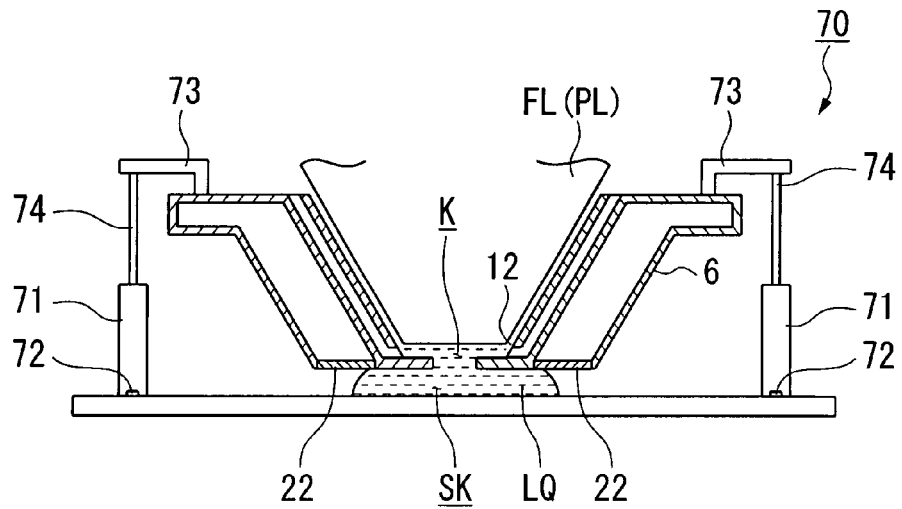
FIG. 25B is a drawing used to explain the exposure method in the second embodiment.

Next, a second embodiment is explained, referring to FIG. 25A and FIG. 25B. In the above-described first embodiment, a cap member 30 is clamped by a collection port 22 provided in the lower surface of a nozzle member 6 to form a prescribed space SK with the final optical element FL. A characteristic of the present embodiment is the fact that the cap member is held by a holding mechanism 70 separate from the nozzle member 6. In the following description, components the same as or similar to those of the abovementioned embodiment are denoted the same reference symbols, and description thereof is simplified or omitted.

In FIG. 25A and FIG. 25B, the exposure apparatus EX includes a cap holding mechanism 70 which holds the cap member 30 so as to form the prescribed space SK with the final optical element FL. The cap holding mechanism 70 has a movable member 71 which moves relative to the nozzle member 6, and a clamping hole 72, provides in the lower surface opposing the upper surface of the cap member 30, to clamp and hold the cap member 30. The movable member 71 is provided lateral to the collection port 22 relative to the optical path space K. In this embodiment, a plurality of (for example, three) movable members 71 are provided on the lateral to the outside of the nozzle member 6. Support members 73 corresponding to the movable members 71 are provided on the upper surface of the nozzle member 6. Between the support members 73 and movable members 71 are provided driving mechanisms 74, which drive the movable members 71 in the Z-axis direction toward the support members 73. The control device 7, by driving the driving mechanisms 74, can move the movable members 71, which is located lateral to the nozzle member 6, in the vertical direction.

As shown in FIG. 25A, when exposing the substrate P, the driving mechanisms 74 raise the movable members 71 such that the lower surfaces of the movable members 71 are positioned above the lower surface of the nozzle member 6, that is, such that the movable members 71 do not contact with the substrate P.

When holding the cap member 30 using the cap holding mechanism 70, the driving mechanisms 74 lower the lower surfaces of the movable members 71 below the lower surface of the nozzle member 6, as shown in FIG. 25B. The clamping holes 72 provided in the lower surfaces of the movable members 71 clamp and hold the upper surface of the cap member 30. The cap member 30 is held by the cap holding mechanism 70 such that the distance between the lower surface of the nozzle member 6 and the upper surface of the cap member 30 is for example substantially equal to the distance between the lower surface of the nozzle member 6 and the surface of the substrate P during exposure of the substrate P.

When the first substrate stage 4 and the second substrate stage 5 have withdrawn from the final optical element FL, the cap holding mechanism 70 holds the cap member 30. When the cap member 30 is being held by the cap holding mechanism 70, similarly to when the substrate P is undergoing liquid immersion exposure, the liquid immersion system 1 performs in parallel the supply of liquid LQ from supply ports 12 and the recovery of liquid LQ via the collection port 22 to and from the prescribed space SK between the final optical element FL and cap member 30. By this means, the prescribed space SK between the final optical element FL and cap member 30 can be continuously filled with liquid LQ.

The supply ports 12 which supply liquid LQ and collection port 22 which recovers liquid LQ to and from the prescribed space SK between the final optical element FL and cap member 30 are provided at positions closer to the final optical element FL than the clamping holes 72 provided in the movable members 71 for clamping and holding of the cap member 30. By holding the cap member 30 using the clamping holes 72 provided in the lower surfaces of the movable members 71, the prescribed space SK, connected to the supply ports 12 and collection port 22, can be formed between the final optical element FL and the cap member 30.

In the second embodiment, the movable members 71 are connected to the nozzle member 6 via the driving mechanisms 74 and support members 73, but may be connected for example to the lens barrel PK of the projection optical system PL and/or the body (column) of the exposure apparatus EX supporting the lens barrel PL.

Third Embodiment

Figure 26:
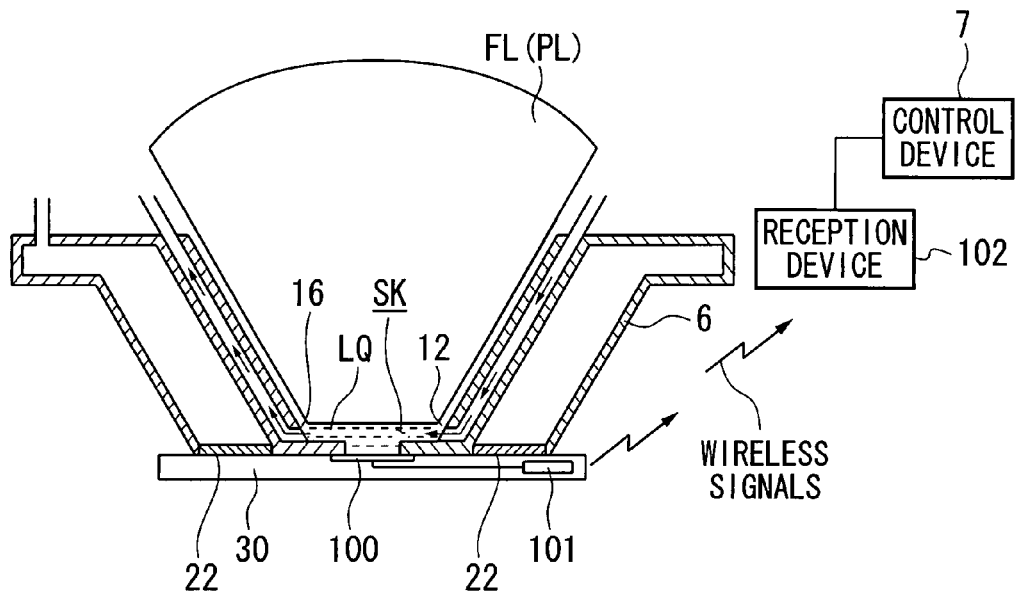
FIG. 26 is a drawing used to explain the cap member in a third embodiment.

Next, a third embodiment is explained referring to FIG. 26. A characteristic of this embodiment is the fact that a measurement device 100 is provided at the cap member 30 to perform prescribed measurements. In the following description, components the same as or similar to those of the abovementioned embodiments are denoted the same reference symbols, and description thereof is simplified or omitted.

In FIG. 26, a measurement device 100 is provided at the cap member 30 to perform prescribed measurements. In this embodiment, the measurement device 100 is a device which measures information relating to the exposure light EL. In this embodiment, similarly to the above-described first embodiment, the cap member 30 is clamped and held by the collection port 22 in the lower surface of the nozzle member 6. The space between the final optical element FL and the cap member 30 is filled with liquid LQ.

As the measurement device 100, for example, an illuminance unevenness sensor such as that disclosed in Japanese Unexamined Patent Application, First Publication No. S57-117238, a aerial image measurement sensor such as that disclosed in Japanese Unexamined Patent Application, First Publication No. 2002-14005, an irradiation quantity sensor (illuminance sensor) such as that disclosed in Japanese Unexamined Patent Application, First Publication No. H11-16816, or various other types of measurement equipment may be used. A light-receiving surface of the measurement device 100 is provided on the upper surface of the cap member 30, and a light-receiving element is provided within the cap member 30. The light-receiving element of the measurement device 100 receives, via the light-receiving surface, exposure light EL which has been emitted downward from the lower surface of the final optical element FL and has passed through the liquid LQ.

In this embodiment, a transmission device 101 is provided in the cap member 30 for wireless transmission of measurement results from the measurement device 100. The transmission device 101 is connected to the measurement device 100.

The exposure apparatus EX includes a reception device 102 which receives wireless signals, including measurement results, transmitted from the transmission device 101. Measurement results received by the reception device 102 are output to the control device 7. The measurement results of the measurement device 100 may also be displayed on a display device.

When the first substrate stage 4 and the second substrate stage 5 have each withdrawn from the final optical element FL, such as the period between exposure of the substrate P on the first substrate stage 4 and exposure of the substrate P on the second substrate stage 5, the cap holding mechanism (collection port 22) holds the cap member 30. The control device 7 irradiates the measurement device 100 provided at the cap member 30 with exposure light EL while the space between the final optical element FL and cap member 30 is filled with liquid LQ. When the measurement device 100 is used to measure the exposure light EL, the liquid immersion system 1 is used to perform, in parallel, the supply and recovery of liquid LQ to and from the prescribed space SK between the final optical element FL and the cap member 30. Measurement results from the measurement device 100 are transmitted by the transmission device 101 and are received by the reception device 102. The control device 7 can for example adjust the illuminance of the exposure light EL or other conditions of irradiation of the exposure light EL based on the signals received by the reception device 102, that is, based on the measurement results of the measurement device 100.

In this way, by providing at the cap member 30 a measurement device 100 which performs prescribed measurements relating to exposure processing, measurements can be performed using the measurement device while the first substrate stage 4 and the second substrate stage 5 have each withdrawn from the final optical element FL, such as for example the period between exposure of the substrate P on the first substrate stage 4 and exposure of the substrate P on the second substrate stage 5. Hence reductions in the availability factor (throughput) of the exposure apparatus EX can be suppressed.

The measurement device 100 may also be a temperature sensor which measures the temperature of the liquid LQ. By providing a temperature sensor in the cap member 30, the temperature of the liquid LQ supplied from supply ports 12 to the optical path space K can be measured. When measuring the temperature of the liquid LQ, supply and recovery of liquid LQ to and from the prescribed space SK between the final optical element FL and the cap member 30 are performed in parallel. The control device 7 can adjust the temperature of the liquid LQ supplied from supply ports 12 to the optical path space K based on measurement results of the temperature sensor. When adjusting the temperature of the liquid LQ supplied from supply ports 12 to the optical path space K, for example a temperature controller capable of adjusting the temperature of the liquid LQ supplied to supply ports 12, provided in the liquid supply device 11 of the liquid immersion system 1, may be used to adjust the temperature of liquid LQ supplied from supply ports 12 to the optical path space K.

As the measurement device 100, an observation device which measures at least one among the surface state of the final optical element FL and the state of the liquid LQ may be used. As the observation device, a device including for example a CCD or other image capture element can be employed. The observation device provided at the cap member 30 may for example capture images of the liquid LQ in the prescribed space SK, or of the lower surface T1 of the final optical element FL, and outputs the results to the control device 7. Based on the measurement results (observation results) of the observation device, the control device 7 may for example determine whether the liquid LQ is contaminated, and more specifically whether foreign matter exists in the liquid LQ, or whether air bubbles exist in the liquid LQ, or may otherwise determine the state of the liquid LQ. Based on the observation results of the observation device, the control device 7 can adjust the state of the liquid LQ supplied from supply ports 12 to the optical path space K. When adjusting the state of liquid LQ supplied from supply ports 12 to the optical path space K, the control device 7 may use a filter device to clean liquid LQ supplied to supply ports 12, and/or a deaerator to deaerate liquid LQ, provided in the liquid supply device 11 of the liquid immersion system 1, to adjust the state of the liquid LQ supplied from supply ports 12 to the optical path space K.

Furthermore, based on measurement results (observation results) of the observation device, the control device 7 may determine for example whether the lower surface T1 of the final optical element FL is contaminated, and more specifically whether foreign matter adheres to the lower surface T1, or whether air bubbles adhere to the lower surface T1, or may otherwise determine the surface state of the final optical element FL. Based on the observation results of the observation device, the control device 7 can for example clean the final optical element FL, or can take other prescribed measures.

As described above, based on measurement results of a measurement device 100 provided at the cap member 30, the control device can adjust the irradiation conditions of the exposure light EL, and can adjust the exposure conditions including conditions of the liquid LQ supplied.

Fourth Embodiment

Figure 27:
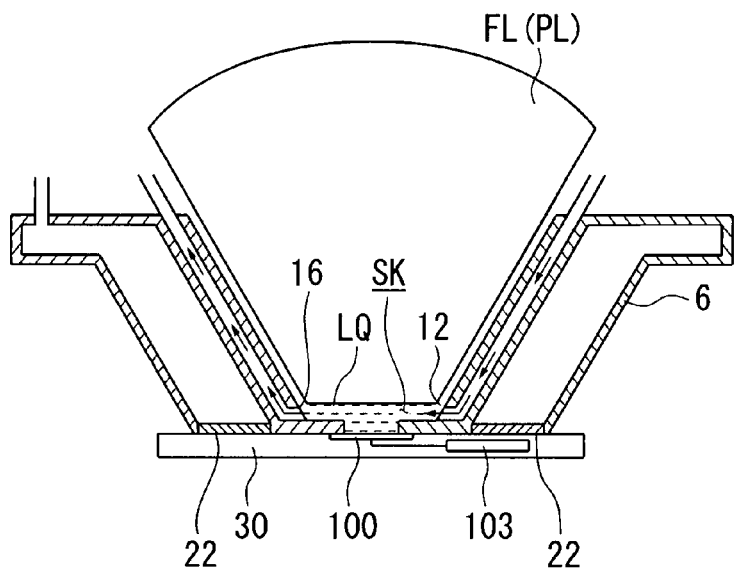
FIG. 27 is a drawing used to explain the cap member in a fourth embodiment.

Next, a fourth embodiment is explained referring to FIG. 27. A characteristic of this embodiment is the fact that a storage device 103 to store the measurement results of the measurement device 100 is provided in the cap member 30. In the following description, components the same as or similar to those of the abovementioned embodiments are denoted the same reference symbols, and description thereof is simplified or omitted.

As shown in FIG. 27, a storage device 103 to store measurement results of the measurement device 100 is provided in the cap member 30. The storage device 103 is connected to the measurement device 100, and can store the results of the measurement device 100.

When the first substrate stage 4 and the second substrate stage 5 have each withdrawn from the final optical element FL, between exposure of the substrate P on the first substrate stage 4 and exposure of the substrate P on the second substrate stage 5 or at other times, the cap holding mechanism (collection port 22) holds the cap member 30. With the space between the final optical element FL and cap member 30 filled with liquid LQ, the control device 7 irradiates the measurement device 100 provided in the cap member 30 with exposure light EL. Measurement results of the measurement device 100 are stored in the storage device 103. The information stored in the storage device 103 is extracted (read) with prescribed timing. Based on the measurement results of the measurement device 100, the control device 7 can for example adjust the illuminance of the exposure light EL or other exposure conditions.

In the fourth embodiment also, as the measurement device 100, a measurement device which measures information related to the exposure light EL, a measurement device (observation device) which measures at least one among the surface state of the final optical element FL and the state of the liquid LQ, a measurement device (temperature sensor) which measures the temperature of the liquid LQ, and similar may be used.

Fifth Embodiment

Figure 28:
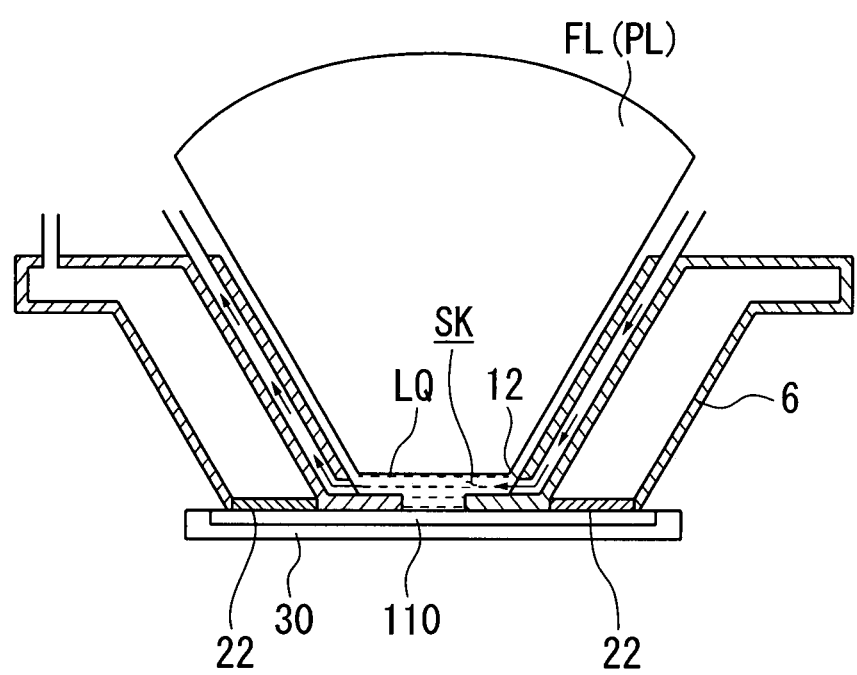
FIG. 28 is a drawing used to explain the cap member in a fifth embodiment.

Next, a fifth embodiment is explained referring to FIG. 28. A characteristic of this embodiment is the fact that a temperature controller 110 is provided in the cap member 30, to adjust at least one among the temperature of a prescribed member in proximity to the cap member 30, and the temperature of the liquid LQ. In the following description, components the same as or similar to those of the abovementioned embodiments are denoted the same reference symbols, and description thereof is simplified or omitted.

As shown in FIG. 28, a temperature controller 110 is provided on the upper surface of the cap member 30. The temperature controller 110 is provided in a position in contact with the nozzle member 6, and can adjust the temperature of the nozzle member 6.

When the first substrate stage 4 and the second substrate stage 5 each have withdrawn from the final optical element FL, such as the period between exposure of the substrate P on the first substrate stage 4 and exposure of the substrate P on the second substrate stage 5 or similar, the cap holding mechanism (collection port 22) holds the cap member 30. With the space between the final optical element FL and cap member 30 filled with liquid LQ, the control device 7 can use the temperature controller 110 provided in the cap member 30 to adjust the temperature of the nozzle member 6. For example, there is the possibility that the heat of evaporation due to evaporation of liquid LQ in contact with the nozzle member 6 may cause a decrease in the temperature of the nozzle member 6. The control device 7 can use the temperature controller 110 to compensate for the decrease in temperature of the nozzle member 6. Furthermore, by providing a temperature sensor capable of detecting the temperature of the nozzle member 6 in the cap member 30, the temperature controller 110 can be controlled based on the detection results of the temperature sensor to adjust the temperature of the nozzle member 6.

The temperature controller can adjust the temperature of the liquid LQ filling the prescribed space SK between the final optical element FL and the cap member 30. Furthermore, by adjusting the temperature of the liquid LQ in the prescribed space SK, the temperature controller 110 can also adjust the temperature of the nozzle member 6 and final optical element FL in contact with the liquid LQ.

In the above-described third through fifth embodiments, the collection port 22 of the nozzle member 6 is used to hold the cap member 30. In the third through fifth embodiments, a cap holding mechanism 70 such as that explained in the second embodiment can be used to hold the cap member 30 in a retracted state from the nozzle member 6 while performing prescribed processing.

In the case of an exposure apparatus EX including two substrate stages, such as in the above-described first through fifth embodiments, when liquid LQ is held in the space between the final optical element FL and cap member 30, supply and recovery of liquid LQ to and from the prescribed space SK between the final optical element FL and cap member 30 need not be performed.

In the above-described first through fifth embodiments, examples of a twin-stage type exposure apparatus including two substrate stages capable of holding a substrate P and moving were described; but application to an exposure apparatus including a single substrate stage is also possible. For example, when the single substrate stage withdraws from the final optical element FL of the projection optical system PL, the cap holding mechanism may hold the cap member 30, and a liquid immersion system 1 may be used to perform the supply and recovery of liquid LQ in parallel to a prescribed space SK between the final optical element FL and the cap member 30.

Or, when the single substrate stage has withdrawn from the final optical element FL of the projection optical system PL, the cap member 30 may be held by the cap holding mechanism, and a measurement device provided at the cap member 30 may be used, as described in the above third and fourth embodiments, to perform prescribed measurements. Or, a temperature controller provided at the cap member 30 may be used to perform temperature adjustments, as explained in the above-described fifth embodiment.

In each of the above embodiments, when prescribed measurements are performed using a measurement device provided at the cap member 30, the supply and recovery of liquid LQ to and from the prescribed space SK between the final optical element FL and the cap member 30 are performed in parallel; but measurements may also be performed with the supply and recovery of liquid LQ halted.

Furthermore, in the above embodiments, when a measurement device provided at the cap member 30 is used to perform prescribed measurements, the prescribed space SK between the final optical element FL and the cap member 30 is filled with liquid LQ. However, a measurement device provided at the cap member 30 may be used to perform prescribed measurements without filling the prescribed space SK between the final optical element FL and cap member 30 with liquid LQ.

In the above-described embodiments, when a measurement device is provided at the cap member 30, measurement processing may be performed with the cap member 30 held by a cap holder 4C (5C). Furthermore, when a temperature controller is provided at the cap member 30, temperature adjustments may be performed with the cap member 30 held by a cap holder 4C (5C).

By making the upper surface of the cap member 30 a flat surface, and by irradiating the upper surface of the cap member 30 with the detection light La of the focus/leveling detection system 8, calibration of the focus/leveling detection system 8 may be performed. In this way, the upper surface of the cap member 30 may be used as a reference surface for the focus/leveling detection system 8.

In the above-described first through fifth embodiments, a position detection device which detects the position of the cap member 30 may be provided. When the cap member 30 is mounted on a cap holder 4C (5C), or when the cap member 30 is held by a cap holding mechanism, by detecting the position of the cap member 30 using a position detection device, the cap member 30 can be positioned in a desired position based on the detection results. The position detection device can determine position information for the cap member 30 by for example optically detecting the position of an edge of the cap member 30.

Sixth Embodiment

Next, a sixth embodiment is explained referring to FIG. 29 through FIG. 39. A characteristic of this embodiment is the fact that a third stage 53, used to prevent collisions between the first substrate stage 4 and the second substrate stage 5, is movably provided on the base member BP. The first substrate stage 4, the second substrate stage 5, and the third stage 53 are driven by a driving device including a linear motor and similar; but in the drawings used in the following explanation, this driving device is omitted. Furthermore, components the same as or similar to those of the abovementioned embodiments are denoted the same reference symbols, and description thereof is simplified or omitted.

An auxiliary 50 to prevent collisions between the first substrate stage 4 and the second substrate stage 5 is provided on the base member BP. Similarly to the above-described embodiments, the auxiliary 50 is fixed at a prescribed position between a first work area 10 comprising an exposure station ST1 and a second work area 20 comprising a measurement station ST2. A first passageway 61 is formed between the auxiliary 50 and the −X side wall 43, and a second passageway 62 is formed between the auxiliary 50 and the +X side wall 44. The auxiliary 50 has regulating members 51 and 52, which perform regulation such that the first substrate stage 4 and the second substrate stage 5 move only on different paths.

In this embodiment, a third stage 53 capable of moving in the XY plane is provided on the base member BP. The third stage 53 does not hold a substrate P, and the upper surface F of the third stage 53 is a flat surface. The third stage 53 is provided to prevent collisions between the first substrate stage 4 and the second substrate stage 5, and is capable of movement independently of the first substrate stage 4 and the second substrate stage 5. Similarly to the first and second substrate stages 4 and 5, the third stage 53 can hold liquid LQ in the space up to the final optical element FL when opposed to the final optical element FL. Furthermore, position information for the third stage 53 is measured by a laser interferometer 2P.

In this embodiment, the auxiliary 50 has an inner space 50H capable of accommodating the third stage 53. The auxiliary 50 is formed into a tunnel shape, and first and second entry/exit apertures 54, 55 are provided, on the +Y side and on the −Y side, to enable the third stage 53 to enter into and exit from the inner space 50H. Hence when the third stage 53, accommodated within the inner space 50H of the auxiliary 50, has exited from the first entry/exit aperture 54 to the second work area 20, the third stage can pass through the second passageway 62 and move to the first work area 10, and can enter the inner space 50H of the auxiliary 50 from the second entry/exit aperture 55. The third stage 53 can move in the order of the inner space 50H of the auxiliary 50, the first entry/exit aperture 54, the second work area 20, the first passageway 61, the first work area 10, and the second entry/exit aperture 55; can move in the order of the inner space 50H of the auxiliary 50, the second entry/exit aperture 55, the first work area 10, the first passageway 61, the second work area 20, and the first entry/exit aperture 54; and, can also move in the order of the inner space 50H of the auxiliary 50, the second entry/exit aperture 55, the first work area 10, the second passageway 62, the second work area 20, and the first entry/exit aperture 54.

Figure 39:
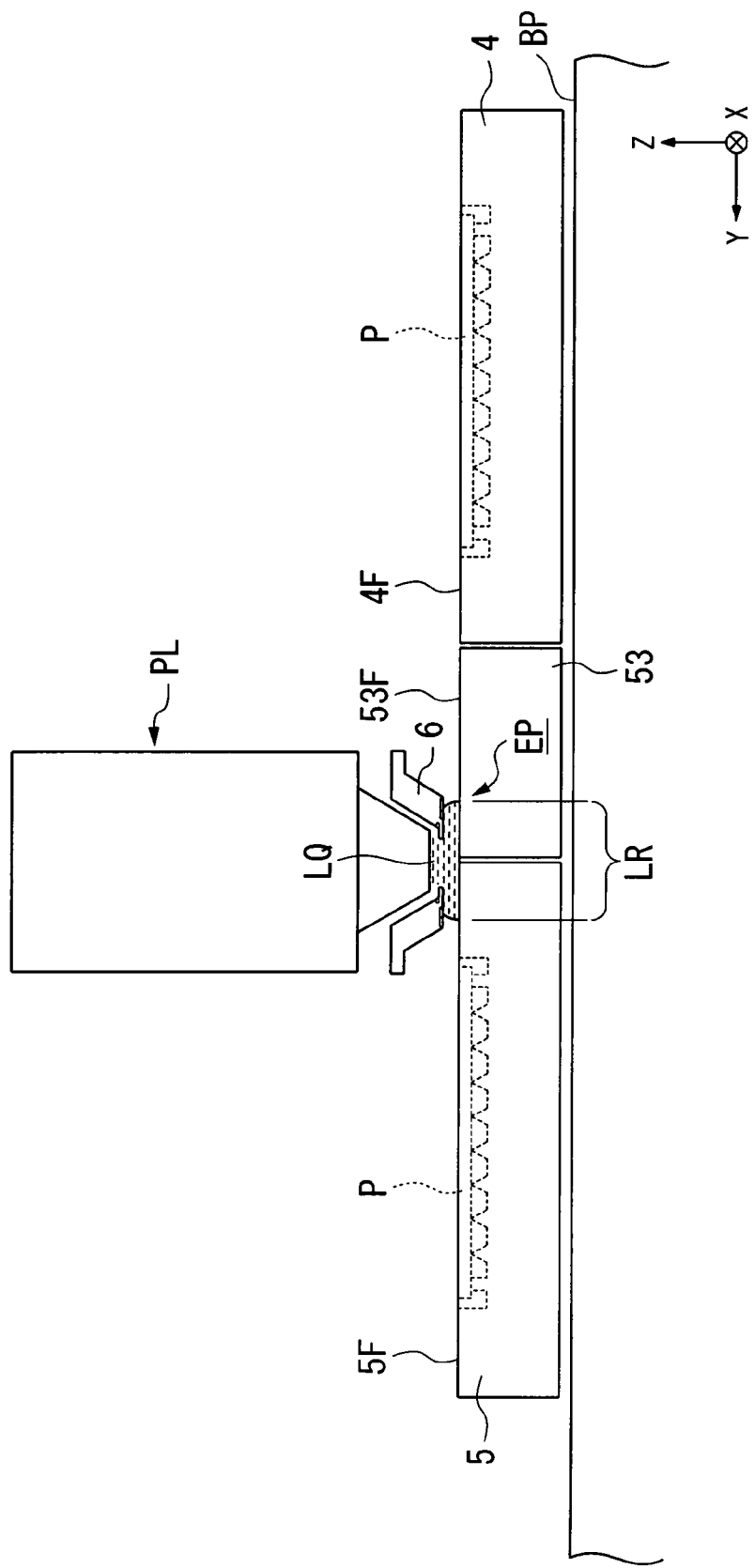
FIG. 39 is a drawing used to explain the exposure method in the sixth embodiment.

The control device 7 can adjust the positional relations between the first substrate stage 4, the second substrate stage 5, and the third stage 53. For example, as shown in FIG. 39, the first substrate stage 4, the third stage 53, and the second substrate stage 5 can be brought into proximity or into contact, and the upper surface 4F of the first substrate stage 4, the upper surface 53F of the third stage 53, and the upper surface 5F of the second substrate stage 5 can be made substantially the same height (flush).

Furthermore, while supplying and recovering liquid LQ by means of the liquid immersion system 1, the control device 7 can move the third stage 53 and the second substrate stage 5, together in a state of either proximity or contact, in a prescribed area comprising the position EP opposed to (directly below) the projection optical system PL, and by this means can move the liquid immersion region LR of liquid LQ between the upper surface 53F of the third stage 53 and the upper surface 5F of the second substrate stage 5. Similarly, while supplying and recovering liquid LQ by means of the liquid immersion system 1, the control device 7 can move the third stage 53 and the first substrate stage 4, together in a state of either proximity or contact, in a prescribed area comprising the position EP opposed to (directly below) the projection optical system PL, and by this means can move the liquid immersion region LR of liquid LQ between the upper surface 53F of the third stage 53 and the upper surface 4F of the first substrate stage 4.

Figure 29:
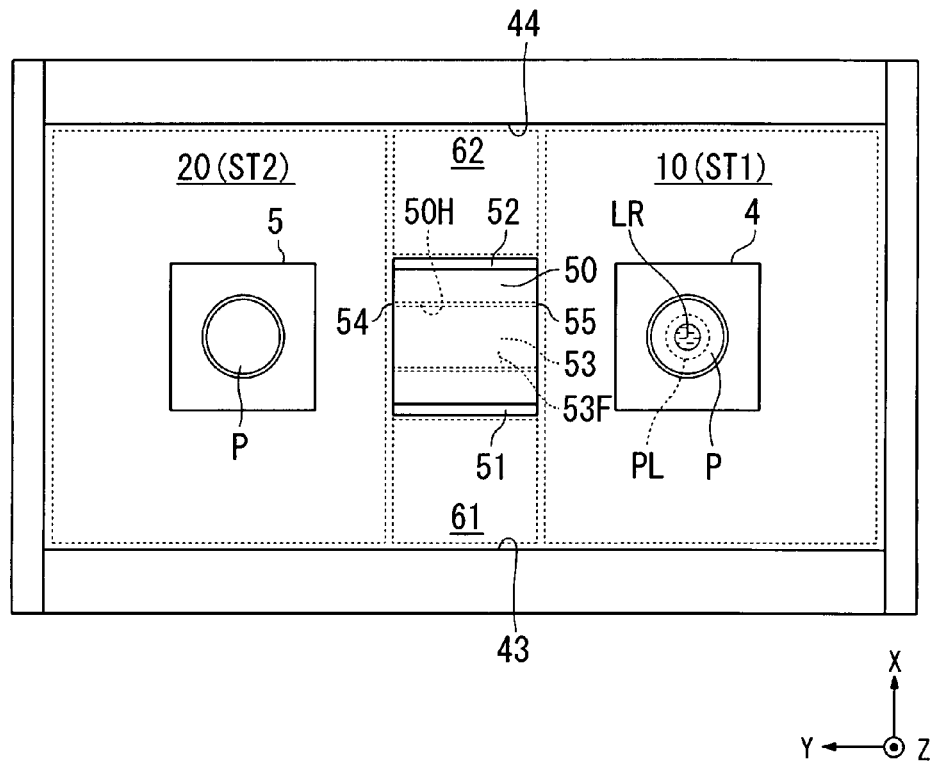
FIG. 29 is a drawing used to explain the exposure method in a sixth embodiment.
Figure 30:
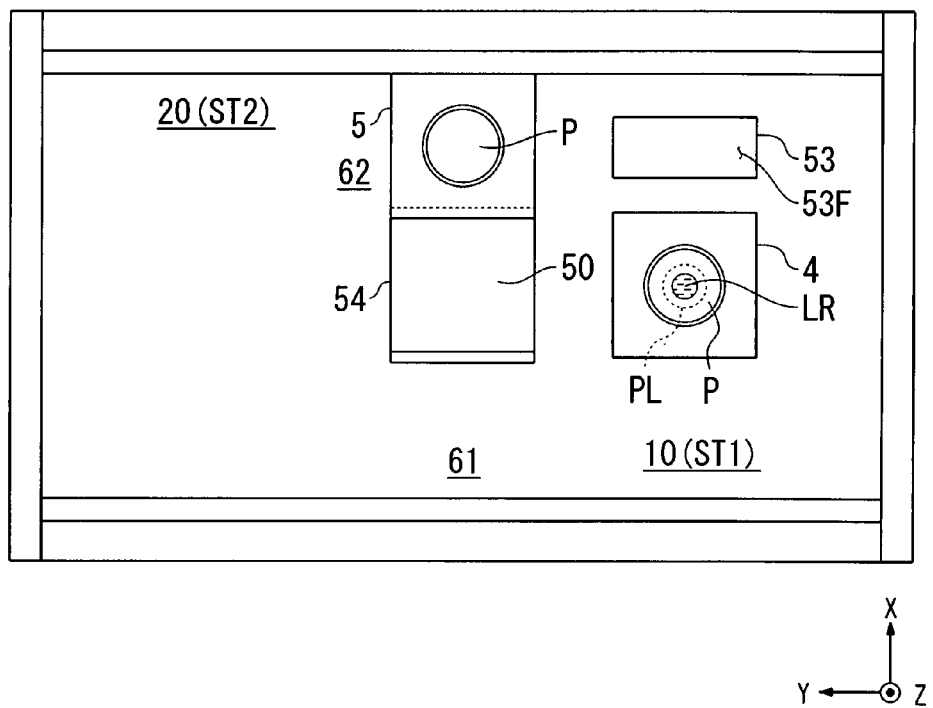
FIG. 30 is a drawing used to explain the exposure method in the sixth embodiment.

Next, a method of exposing the substrate P is explained. As shown in FIG. 29, at the exposure station ST1 liquid immersion exposure of the substrate P held by the first substrate stage 4 is performed, and at the measurement station ST2, measurement processing of the substrate P held by the second substrate stage 5 is performed. The third stage 53 is positioned in the inner space 50H of the auxiliary 50. As shown in FIG. 30, during exposure of the substrate P, after the third station 53 has exited from the first entry/exit aperture 54 for the second work area 20 of the measurement station ST2, the third stage 53 passes through the second passageway 62 and moves to the first work area 10 of the exposure station ST1. And the second substrate stage 5, having ended measurement processing at the measurement station ST2, passes through the second passageway 62 and moves to the exposure station ST1.

Figure 31:
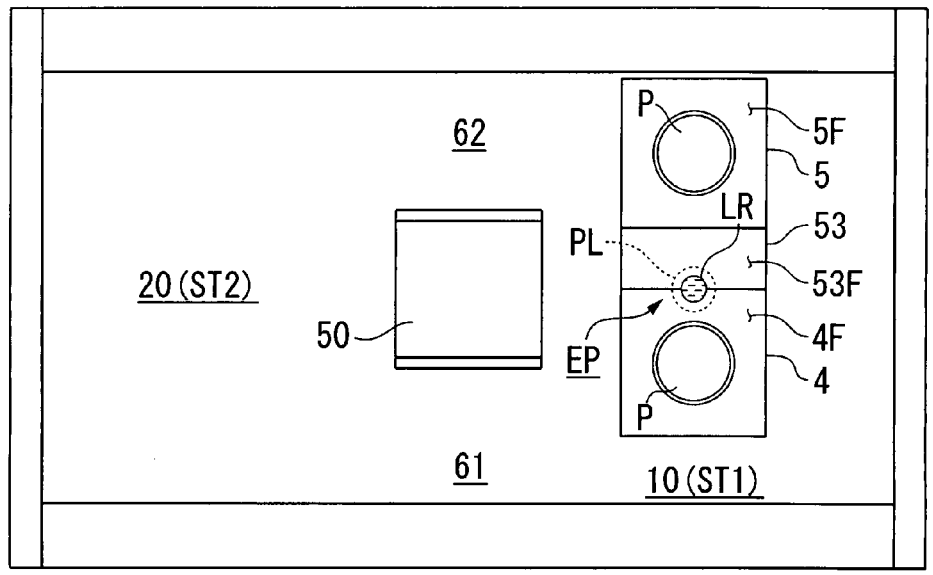
FIG. 31 is a drawing used to explain the exposure method in the sixth embodiment.
Figure 32:
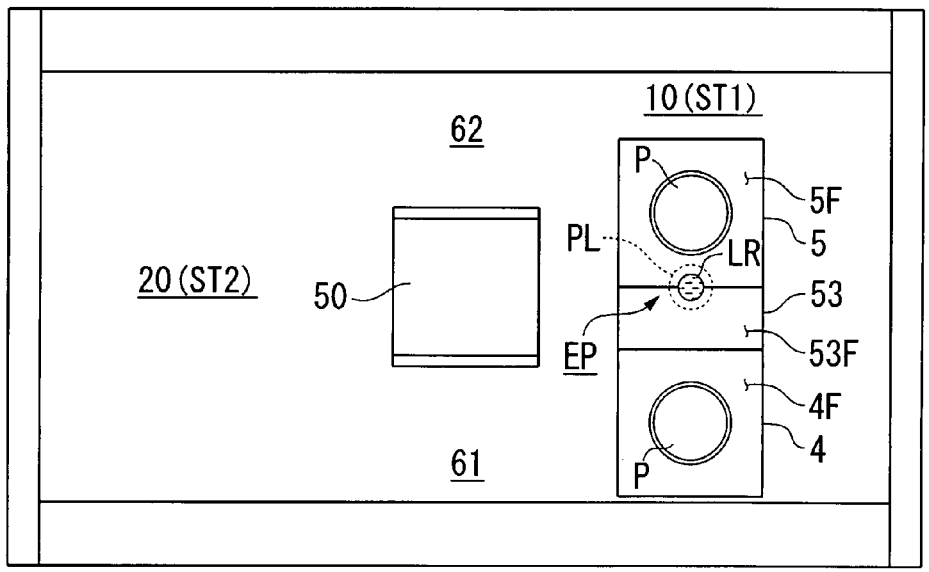
FIG. 32 is a drawing used to explain the exposure method in the sixth embodiment.

After exposure processing of the substrate P on the first substrate stage 4 has ended, in the first work area 10 of the exposure station ST1 the control device 7 causes the +X side face of the first substrate stage 4 and the −X side face of the third stage 53 to come into proximity (or contact), and causes the +X side face of the third stage 53 and the −X side face of the second substrate stage 5 to come into proximity (or contact). The control device 7 then moves the first substrate stage 4, the third stage 53, and the second substrate stage 5 together in the −X direction. That is, as shown in FIG. 31, in a prescribed area comprising the position EP opposing (directly below) the projection optical system PL, the first substrate stage 4 and the third stage 53 are moved together in the −X direction in a state of proximity (or contact), so that the liquid immersion region LR formed on the upper surface 4F of the first substrate stage 4 can be moved to the upper surface 53F of the third stage 53. As shown in FIG. 32, in a prescribed area comprising the position EP opposing (directly below) the projection optical system PL, the control device 7 moves the third stage 53 and the second substrate stage 5 together in the −X direction in a state of proximity (or contact), so that the liquid immersion region LR of liquid LQ formed on the upper surface 53F of the third stage 53 can be moved to the upper surface 5F of the second substrate stage 5.

Figure 33:
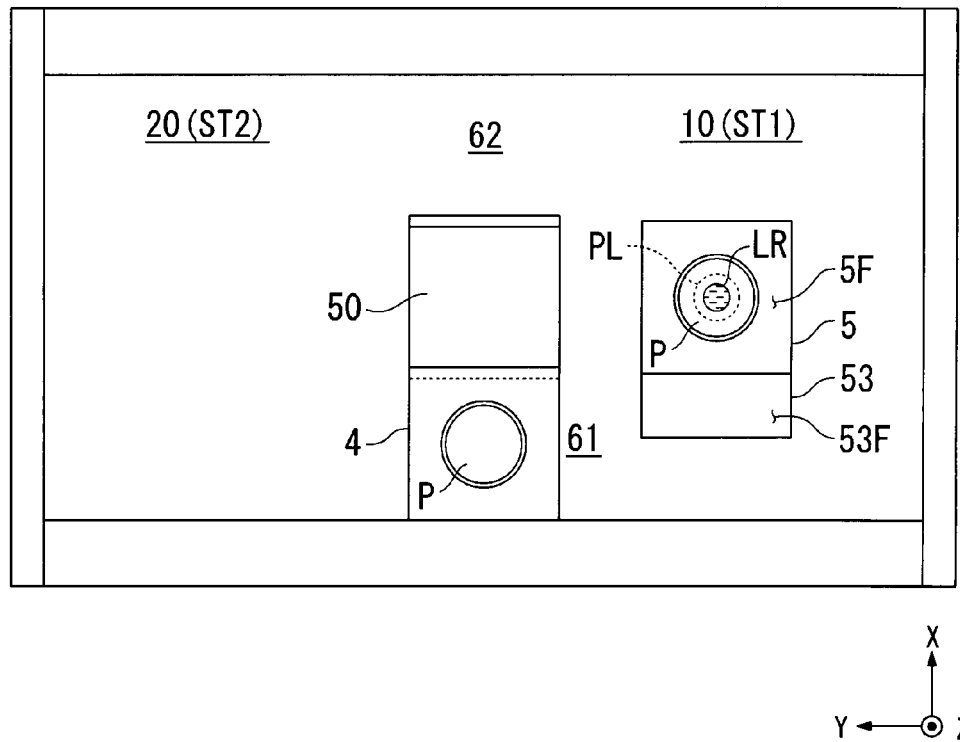
FIG. 33 is a drawing used to explain the exposure method in the sixth embodiment.
Figure 34:
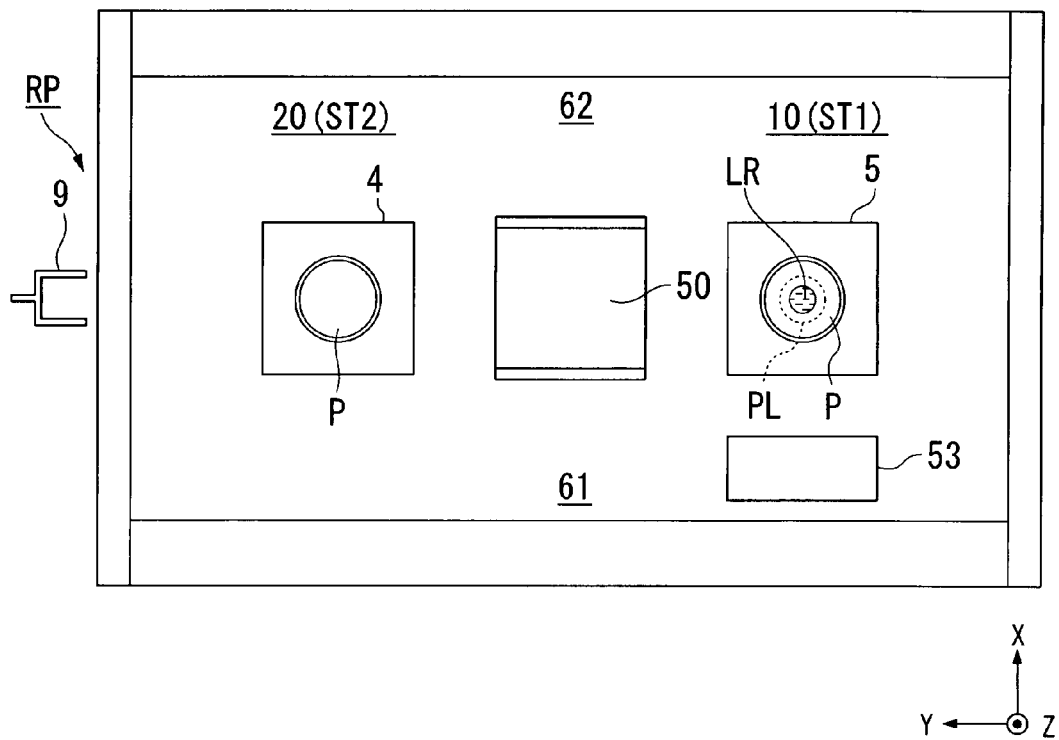
FIG. 34 is a drawing used to explain the exposure method in the sixth embodiment.

As shown in FIG. 33, the liquid immersion region LR is moved onto the substrate P held by the second substrate stage 5. The control device 7 fills with liquid LQ the space between the final optical element FL and the substrate P held on the second substrate stage 5, and exposes the substrate P. When the exposure processing ends, the first substrate stage 4 holding the substrate P passes through the first passageway 61, and then, as shown in FIG. 34, moves to the measurement station ST2. The third stage 53 withdraws from the second substrate stage 5 so as not to impede the exposure operation of the second substrate stage 5.

Figure 35:
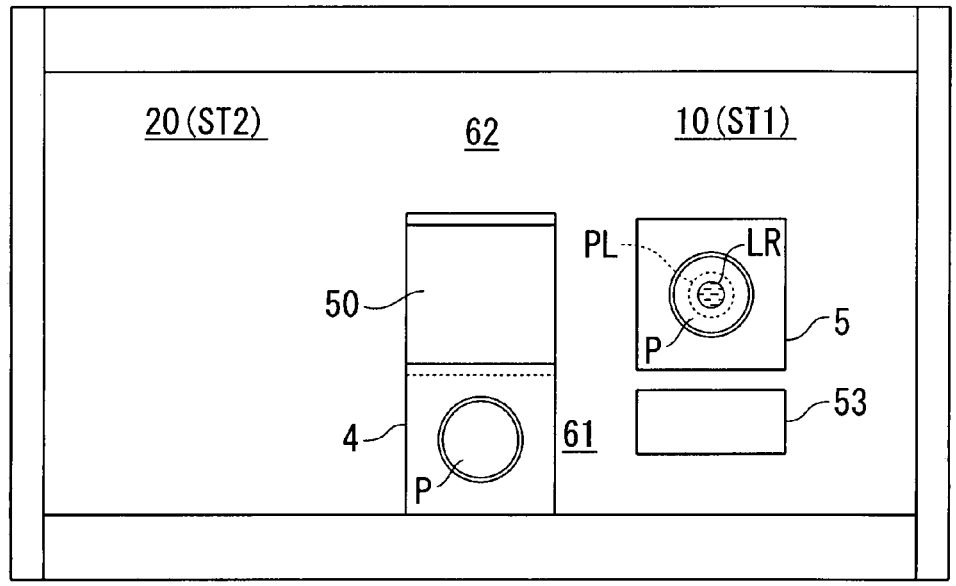
FIG. 35 is a drawing used to explain the exposure method in the sixth embodiment.

At the substrate exchange position RP, the control device 7 unloads the substrate P subjected to exposure processing on the first substrate stage 4, which has moved to the measurement station ST2, and loads a substrate P to be subjected to exposure processing onto the first substrate stage 4. Then, the control device 7 performs measurements of the substrate P loaded onto the first substrate stage 4. As shown in FIG. 35, the control device 7 then moves the first substrate stage 4, for which measurement processing has been completed at the measurement station ST2, through the first passageway 61 to the exposure station ST1.

Figure 36:
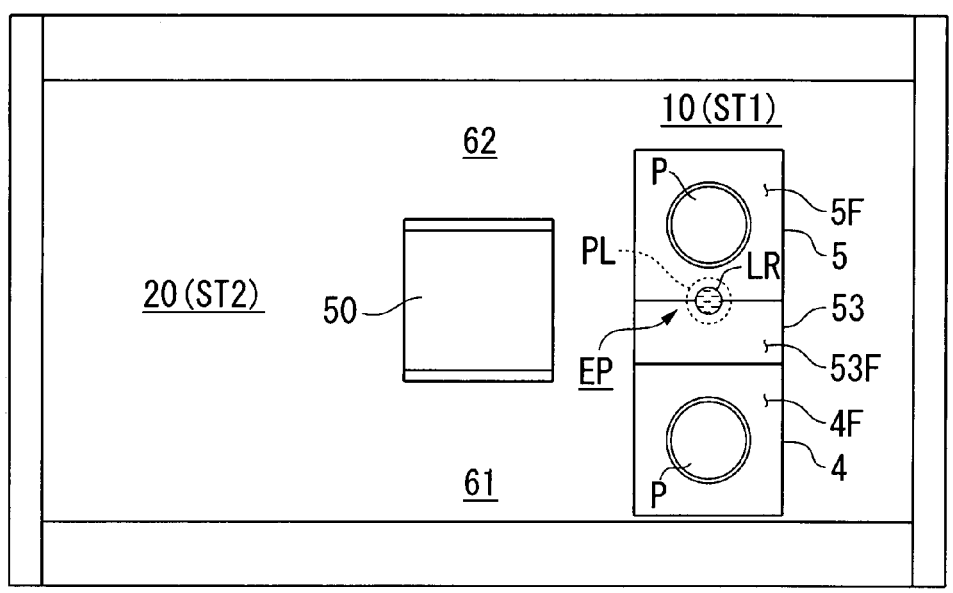
FIG. 36 is a drawing used to explain the exposure method in the sixth embodiment.
Figure 37:
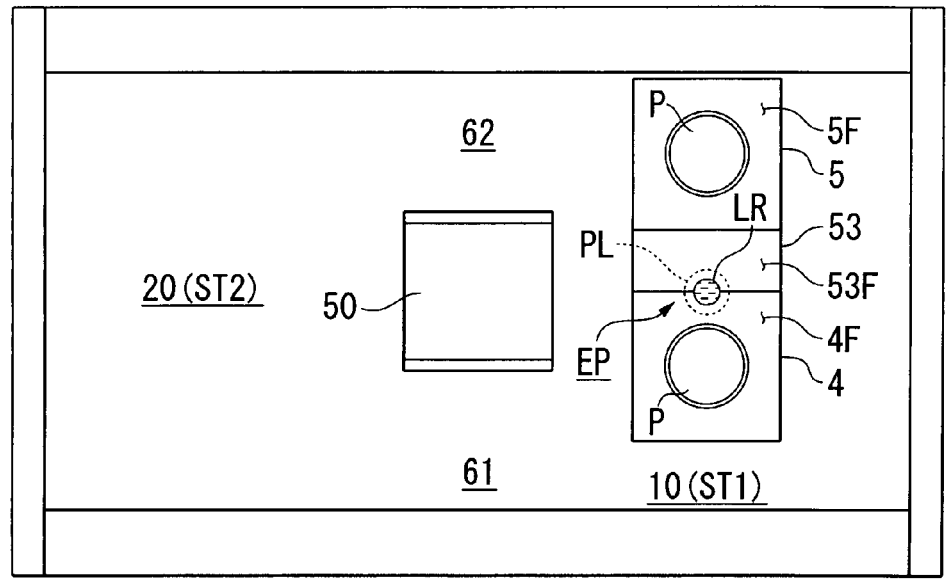
FIG. 37 is a drawing used to explain the exposure method in the sixth embodiment.

After exposure processing of the substrate P on the second substrate stage 5 has ended, the control device 7 causes the −X side face of the second substrate stage 5 and the +X side face of the third stage 53 to come into proximity (or contact), and causes the −X side face of the third stage 53 and the +X side face of the first substrate stage 4 to come into proximity (or contact). The control device 7 then moves the first substrate stage 4, third stage 53, and the second substrate stage 5 together in the +X direction. That is, as shown in FIG. 36, within a prescribed area comprising the position EP opposing (directly below) the projection optical system PL, the control device 7 moves the second substrate stage 4 and the third stage 53 together in the +X direction in a state of proximity (or contact), and by this means can move the liquid immersion region LR of liquid LQ formed on the upper surface 5F of the second substrate stage 5 to the upper surface 53F of the third stage 53. As shown in FIG. 37, within a prescribed area comprising the position EP opposing (directly below) the projection optical system PL, the control device 7 moves the third stage 53 and first substrate stage 4 together in the +X direction in a state of proximity (or contact), and by this means can move the liquid immersion region LR of liquid LQ formed on the upper surface 53F of the third stage 53 to the upper surface 4F of the first substrate stage 4.

Figure 38:
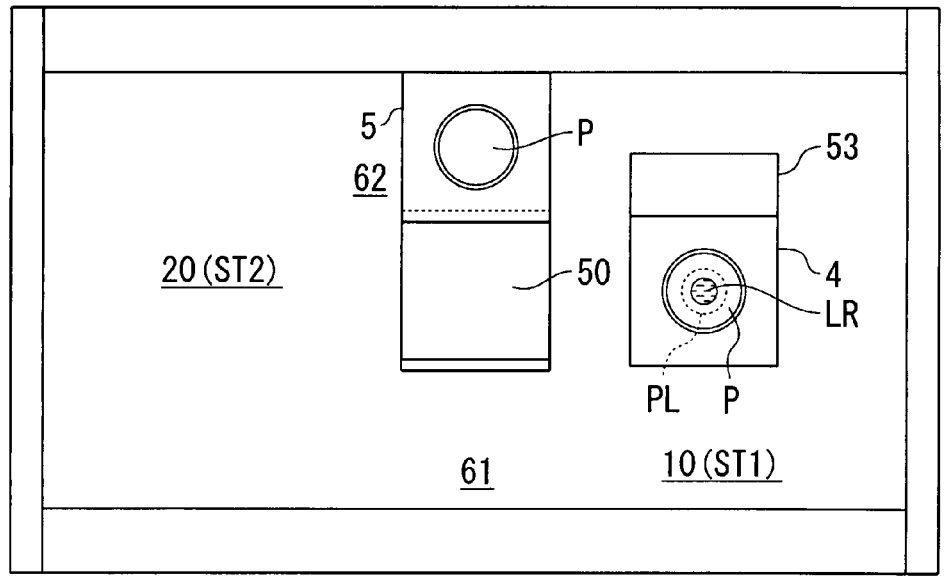
FIG. 38 is a drawing used to explain the exposure method in the sixth embodiment.

As shown in FIG. 38, the liquid immersion region LR moves onto the substrate P held by the first substrate stage 4. The control device 7 fills the area between the final optical element FL and the substrate P held by the first substrate stage 4 with liquid LQ, and exposes the substrate P. The second substrate stage 5 holding the substrate P which has been subjected to exposure processing passes through the second passageway 62 and moves to the measurement station ST2. And, the third stage 53 withdraws from the first substrate stage 4 so as not to impede the exposure operation of the first substrate stage 4. The control device 7 repeats the above-described operations, repeating in alternation exposure of a substrate P on the first substrate stage 4 and exposure of a substrate P on the second substrate stage 5.

As described above, in this embodiment the regulating members 51, 52 are provided such that the first substrate stage 4 can pass only through the first passageway 61, and such that the second substrate stage 5 can pass only through the second passageway 62; by means of the auxiliary 50 comprising these regulating members 51, 52, collisions of the first substrate stage 4 and the second substrate stage 5 are prevented.

The liquid immersion region LR of liquid LQ can be moved, via the third stage 53, between the upper surface 4F of the first substrate stage 4 and the upper surface 5F of the second substrate stage 5, and so the optical path space K can continue to be filled with liquid LQ, without halting the supply of liquid LQ by the liquid immersion system 1. Hence declines in the availability factor of the exposure apparatus EX accompanying halts in the supply of liquid LQ and similar can be suppressed.

Movement of the liquid immersion region LR between the upper surface 4F of the first substrate stage 4 and the upper surface 5F of the second substrate stage 5 is mediated by the third stage 53; the third stage 53 intervenes between the first substrate stage 4 and the second substrate stage 5, and so collisions of the first substrate stage 4 and the second substrate stage 5 can be prevented. The third stage 53 may for example be formed from a material which is softer than that of the first and second substrate stages 4, 5, or, a cushioning mechanism which absorbs shocks when struck by an object may be provided in the third stage 53, and by this means significant damage to the first and second substrate stages 4, 5 when the first or second substrate stages 4, 5 strike the third stage 53 can be prevented.

Seventh Embodiment

Figure 40:
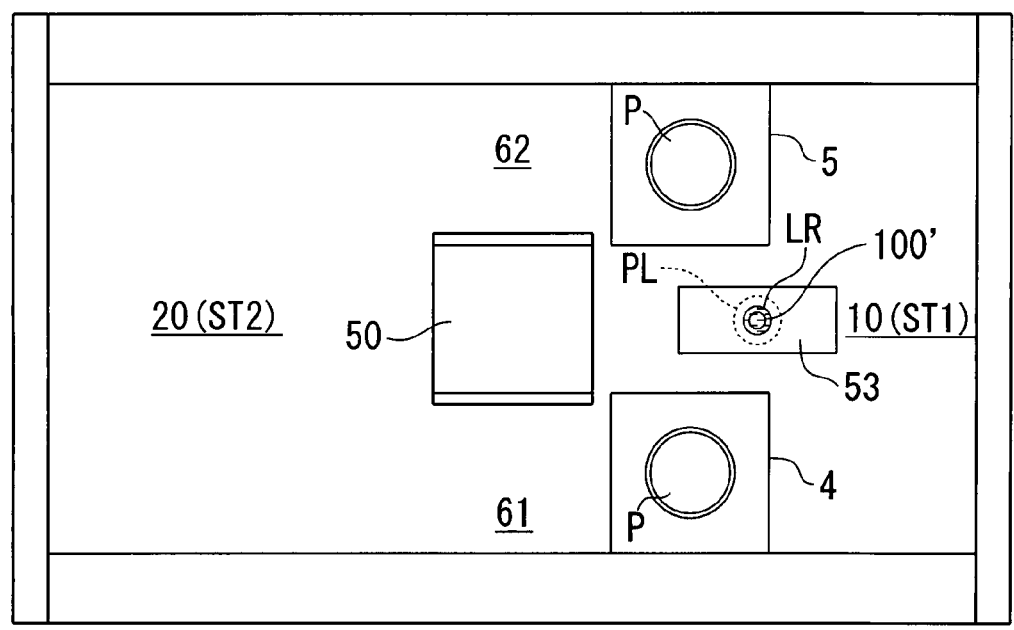
FIG. 40 is a drawing used to explain the auxiliary in a seventh embodiment.

Next, a seventh embodiment is explained, referring to FIG. 40. As shown in FIG. 40, a measurement device 100' which performs prescribed measurements relating to exposure processing can be provided on the third stage 53. In the following description, components the same as or similar to those of the abovementioned embodiments are denoted the same reference symbols, and description thereof is simplified or omitted.

As the measurement device 100', similarly to the above third embodiment, an illumination unevenness sensor which measures information related to exposure light EL, a aerial image measuring sensor, an irradiation quantity sensor (illuminance sensor), or various other kinds of measurement equipment may be used. As the measurement device 100', a temperature sensor which measures the temperature of the liquid LQ may be used, or an observation device which measures at least one among the surface state of the final optical element FL and the state of the liquid LQ may be used.

A measurement operation using the measurement device 100' on the third stage 53 is performed when the liquid immersion region LR has moved from the upper surface 4F of the first substrate stage 4 or from the upper surface 5F of the second substrate stage 5 after exposure processing. The control device 7 can adjust the exposure conditions based on the measurement results of the measurement device 100' provided on the third stage 53.

A transmission device for wireless transmission of the measurement results of this measurement device 100' may be provided with this measurement device 100' on the third stage 53, and a storage device to store results may also be provided.

As described in the above fifth embodiment, a temperature controller to adjust the temperature of at least a portion among the nozzle member 6, the liquid LQ, and the final optical element FL may be provided on the third stage 53.

The upper surface 53F of the third stage 53 may be made flat, and by irradiating the upper surface 53F of the third stage 53 with detection light La of the focus/leveling detection system 8, calibration of the focus/leveling detection system 8 may be performed. Thus the upper surface 53F of the third stage 53 can be used as a reference surface for the focus/leveling detection system 8.

Eighth Embodiment

Next, an eighth embodiment is explained, referring to FIG. 41 through FIG. 45. In the following description, components the same as or similar to those of the abovementioned embodiments are denoted the same reference symbols, and description thereof is simplified or omitted.

In this embodiment, an auxiliary 50 is provided on the base member BP which prevents collisions between the first substrate stage 4 and the second substrate stage 5. Similarly to the above embodiments, the auxiliary 50 is fixed in a prescribed position between a first work area 10 comprising an exposure station ST1 and a second work area 20 comprising a measurement station ST2. A first passageway 61 is formed between the auxiliary and the −X side wall 43, and a second passageway 62 is formed between the auxiliary and the +X side wall 44. In this embodiment, the first substrate stage 4 can pass through the first passageway 61 and the second passageway 62, and the second substrate stage 5 can also pass through the first passageway 61 and the second passageway 62.

Similarly to the above-described sixth and seventh embodiments, the exposure apparatus EX has a third stage 53, provided on the base member BP to enable movement in the XY plane. Position information for the third stage 53 is measured by a laser interferometer 2P.

The auxiliary 50 has an inner space 50H capable of accommodating the third stage 53. The auxiliary 50 is formed into a tunnel shape. In this embodiment, first and second entry/exit apertures 54, 55 are provided, on the +X side and on the −X side, to enable the third stage 53 to enter into and exit from the inner space.

As shown in FIG. 41, liquid immersion exposure of the substrate P held by the substrate stage 4 is performed at the exposure station ST 1. Measurement processing of the substrate P held by the second substrate stage 5 is performed at the measurement station ST2. The third stage 53 is positioned in the inner space 50H of the auxiliary 50. During exposure of a substrate P, after the third stage 53 exists from the first entry/exit aperture 54 to the second passageway 62 as shown in FIG. 42, the third stage moves to the first work area 10 of the exposure station ST1. Also, after the end of measurement processing at the measurement station ST2, the second substrate stage 5 passes through the second passageway 62 and moves to the exposure station ST1.

After the end of exposure processing of the substrate P on the first substrate stage 4, the control device 7 causes the +X side face of the first substrate stage 4 and the −X side face of the third stage 53 to come into proximity (or contact), and causes the +X side face of the third stage 53 and the −X side face of the second substrate stage 5 to come into proximity (or contact), as shown in FIG. 43, and then moves the first substrate stage 4, third stage 53, and the second substrate stage 5 together in the −X direction. By this means, the liquid immersion region LR formed on the upper surface 4F of the first substrate stage 4 passes over the upper surface 53F of the third stage 53, and moves to the upper surface 5F of the second substrate stage 5.

As shown in FIG. 44, the liquid immersion region LR is moved onto the substrate P held by the second substrate stage 5, and the substrate P on the second substrate stage 5 is subjected to liquid immersion exposure. The substrate stage 4 holding the substrate P for which exposure processing has ended passes through the first passageway 61 and moves to the measurement station ST2. The third stage 53 withdraws from the substrate stage 5 so as not to impede the exposure operation of the second substrate stage 5.

The control device 7 unloads the substrate P for which exposure processing has ended on the first substrate stage 4 which has moved to the measurement station ST2, and loads a substrate P to be subjected to exposure processing onto the first substrate stage 4. The control device 7 then performs measurements of the substrate P loaded onto the first substrate stage 4. As shown in FIG. 45, the third stage 53 enters into the inner space 50I1 of the auxiliary 50.

During exposure of the substrate P on the second substrate stage 5 at the exposure station ST1, the third stage 53 positioned in the inner space 50H of the auxiliary 50 exits from the first entry/exit aperture 54 into the second passageway 62, and then moves to the first work area 10. Furthermore, after the end of measurement processing at the measurement station ST2, the first substrate stage 4 passes through the second passageway 62 and moves to the exposure station ST1.

After the end of exposure processing of the substrate P on the second substrate stage 5, the control device 7 brings the +X side face of the second substrate stage 5 and the −X side face of the third stage 53 into proximity (or contact), brings the +X side face of the third stage 53 and the −X side face of the first substrate stage 4 into proximity (or contact), and moves the first substrate stage 4, the third stage 53, and the second substrate stage 5 together in the −X direction. By this means, the liquid immersion region LR formed on the upper surface 5F of the second substrate stage 5 passes over the upper surface 53F of the third stage 53 and onto the upper surface 4F of the first substrate stage 4. Liquid immersion exposure of the substrate P on the first substrate stage 4 is then performed.

The control device 7 repeats the above-described operations, repeating in alternation exposure of a substrate P on the first substrate stage 4 and exposure of a substrate P on the second substrate stage 5. In this embodiment, the first substrate stage 4 and the second substrate stage 5 move between the exposure station ST1 and the measurement station ST2 on the same paths.

As explained above, in this embodiment the liquid immersion region LR of liquid LQ can move between the upper surface 4F of the first substrate stage 4 and the upper surface 5F of the second substrate stage 5 via the third stage 53, so that the optical path space K can continue to be filled with liquid LQ without halting the supply of liquid LQ by the liquid immersion system 1. Hence reductions in the availability factor of the exposure apparatus EX due to halts in the supply of liquid LQ and similar can be suppressed. Movement of the liquid immersion region LR between the upper surface 4F of the first substrate stage 4 and the upper surface 5F of the second substrate stage 5 is accomplished via the third stage 53, so that collisions between the first substrate stage 4 and the second substrate stage 5 are prevented.

Ninth Embodiment

Next, a ninth embodiment is explained referring to FIG. 46 to FIG. 52. In the following description, components the same as or similar to those of the abovementioned embodiments are denoted the same reference symbols, and description thereof is simplified or omitted.

In this embodiment, a fixed auxiliary is not provided on the base member BP; as an auxiliary to prevent collisions of the first substrate stage 4 and the second substrate stage 5, only a movable third stage 53 is provided on the base member BP. The third stage 53 is provided so as to enable motion substantially in the Y-axis direction. Position information for the third stage 53 is measured by a laser interferometer 2P.

Figure 46:
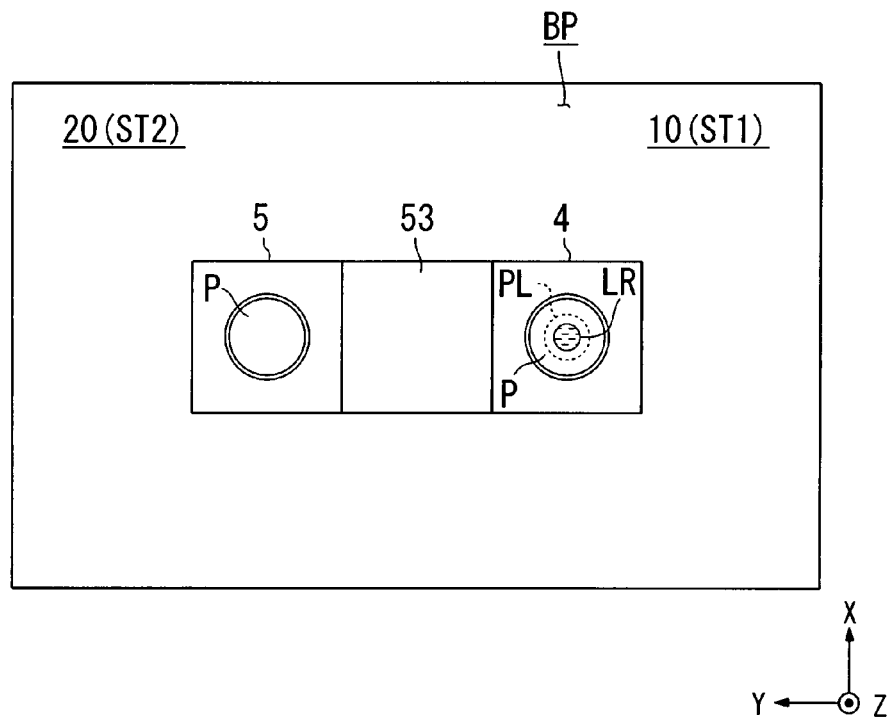
FIG. 46 is a drawing used to explain the exposure method in a ninth embodiment.

As shown in FIG. 46, at the exposure station ST1 the substrate P held by the first substrate stage 4 is subjected to liquid immersion exposure, and at the measurement station ST2 the substrate P held by the second substrate stage 5 is subjected to measurement processing. The third stage 53 is positioned between the first substrate stage 4 and the second substrate stage 5.

Figure 47:
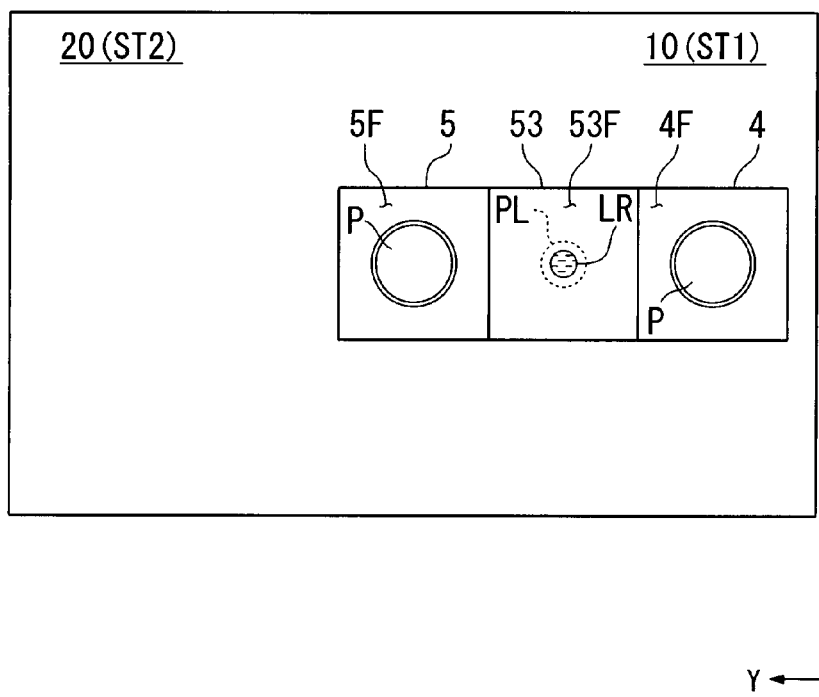
FIG. 47 is a drawing used to explain the exposure method in the ninth embodiment.

After the end of exposure processing of the substrate P on the first substrate stage 4, the control device 7 brings the +Y side face of the first substrate stage 4 and the −Y side face of the third stage 53 into proximity (or contact), and moves the first substrate stage 4 and the third stage 53 together in the −Y direction. By this means, as shown in FIG. 47, the liquid immersion region LR formed on the upper surface 4F of the first substrate stage 4 is moved to the upper surface 53F of the third stage 53. In this embodiment, when the liquid immersion region LR moves from the first substrate stage 4 onto the third stage 53, the control device 7 brings the +Y side face of the third stage 53 and the −Y side face of the second substrate stage 5 into proximity (or contact), and moves the second substrate stage 5 together with the first substrate stage 4 and the third stage 53 in the −Y direction.

Figure 48:
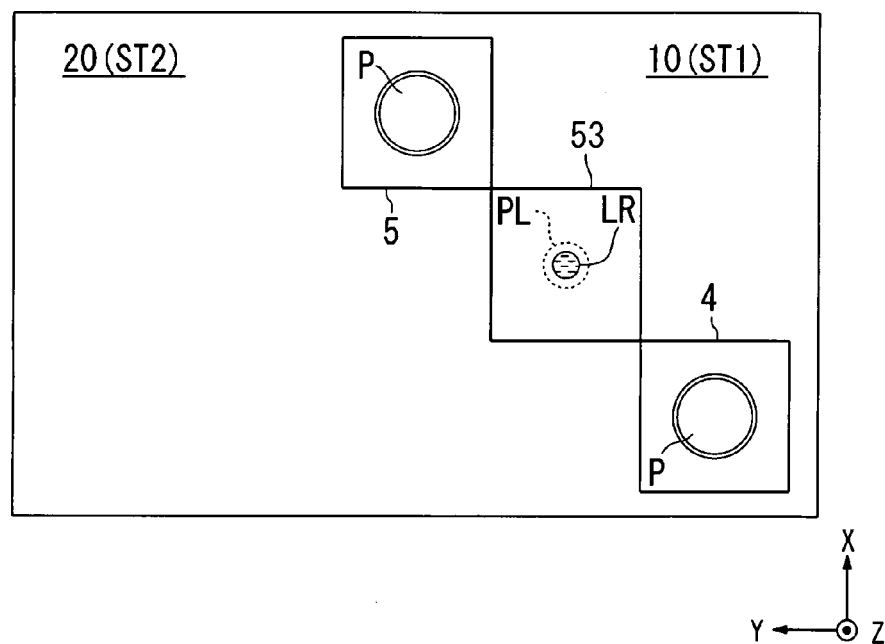
FIG. 48 is a drawing used to explain the exposure method in the ninth embodiment.
Figure 49:
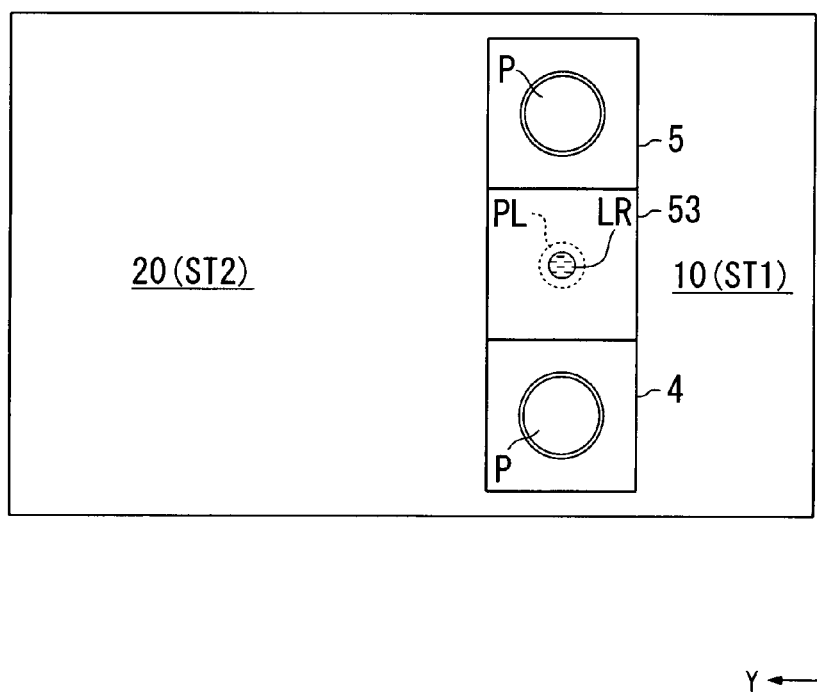
FIG. 49 is a drawing used to explain the exposure method in the ninth embodiment.
Figure 50:
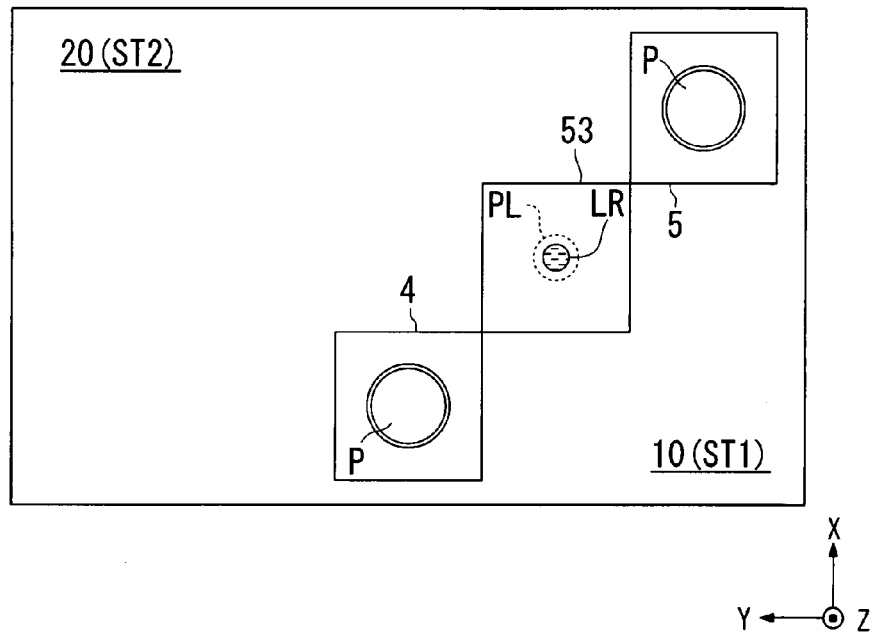
FIG. 50 is a drawing used to explain the exposure method in the ninth embodiment.

Next, as shown in FIG. 48, with the space between the final optical element FL of the projection optical system PL and the third stage 53 filled with liquid LQ, the control device 7 moves the first substrate stage 4 in the −X direction, and moves the second substrate stage 5 in the +Y direction. Then, as shown in FIG. 49, the control device 7 moves the first substrate stage 4 in the +Y direction, and moves the second substrate stage 5 in the −Y direction, to move the first substrate stage 4 to the −X side of the third stage 53 and the second substrate stage 5 to the +X side of the third stage 53. Then, as shown in FIG. 50, the control device 7 moves the first substrate stage 4 in the +Y direction and the second substrate stage 5 in the −Y direction.

Figure 51:
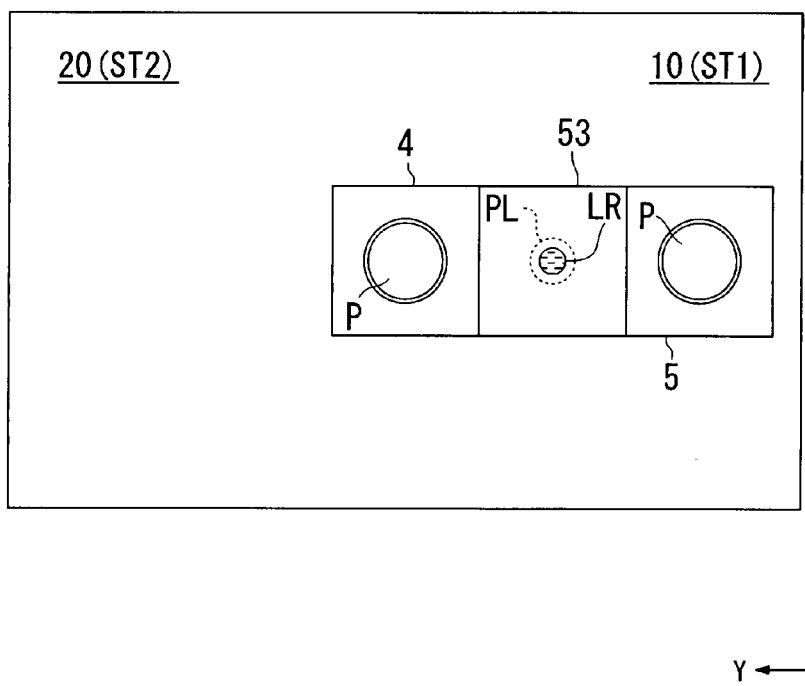
FIG. 51 is a drawing used to explain the exposure method in the ninth embodiment.
Figure 52:
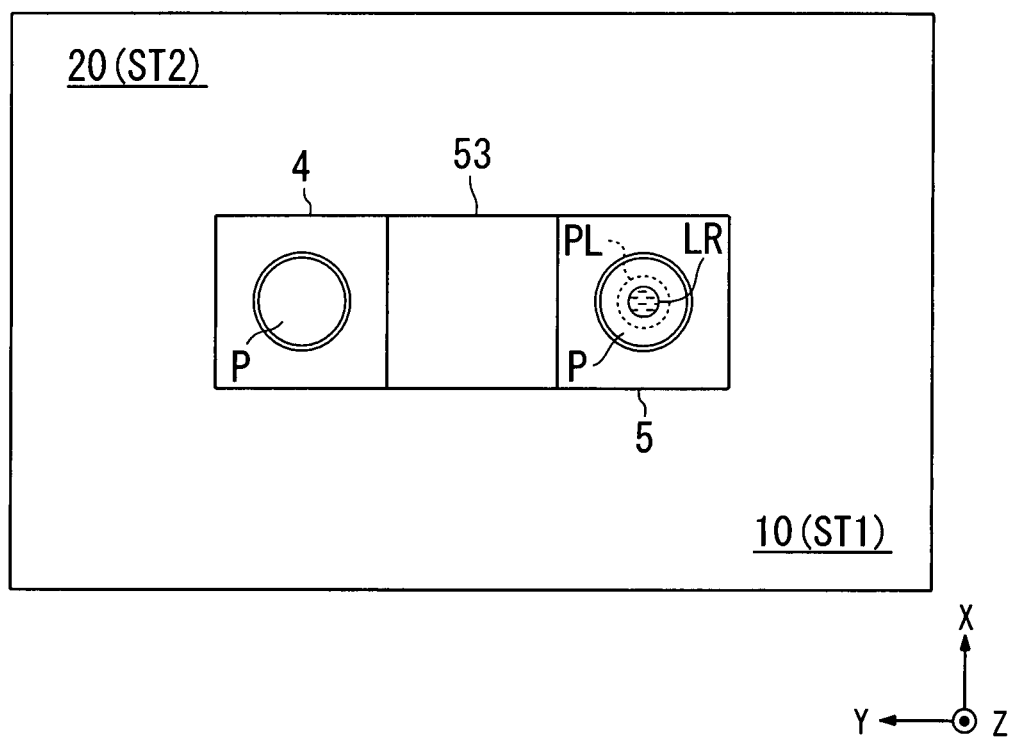
FIG. 52 is a drawing used to explain the exposure method in the ninth embodiment.

As shown in FIG. 51, the control device 7 brings the +Y side face of the second substrate stage 5 and the −Y side face of the third stage 53 into proximity (or contact), and moves the second substrate stage 5 and the third stage 53 together in the +Y direction. By this means, as shown in FIG. 52, the liquid immersion region LR formed on the upper surface 53F of the third stage 53 is moved to the upper surface 5F of the second substrate stage 5. In this embodiment, when the liquid immersion region LR moves from the third stage 53 to the second substrate stage 5, the control device 7 brings the +Y side face of the third stage 53 and the −Y side face of the first substrate stage 4 into proximity (or contact), and moves the first substrate stage 4, together with the second substrate stage 5 and the third stage 53, in the +Y direction.

Thus in this embodiment, the liquid immersion region LR is moved onto the substrate P held by the second substrate stage 5, and liquid immersion exposure of the substrate P on the second substrate stage 5 is performed. Furthermore, the first substrate stage 4, holding a substrate P for which exposure processing is ended, is moved to the measurement station ST2. The control device 7 unloads the substrate P for which exposure processing has ended on the first substrate stage 4 which has moved to the measurement station ST2, and loads a substrate P to be subjected to exposure processing onto the first substrate stage 4. Then, the control device 7 performs measurements of the substrate P loaded onto the first substrate stage 4.

After exposure processing of the substrate P on the second substrate stage 5 has ended, an operation similar to that described above is performed, so that the liquid immersion region LR formed on the upper surface 5F of the second substrate stage 5 moves to the upper surface 53F of the third stage 53, and then to the upper surface 4F of the first substrate stage 4. The control device 7 repeats the above-described operations, repeating in alternation exposure of a substrate P on the first substrate stage 4 and exposure of a substrate P on the second substrate stage 5.

As described above, in this embodiment also, the liquid immersion region LR of liquid LQ can move between the upper surface 4F of the first substrate stage 4 and the upper surface 5F of the second substrate stage 5 via the third stage 53, and so the optical path space K can continue to be filled with liquid LQ without halting the supply of liquid LQ by the liquid immersion system 1. Hence a decline in the availability factor of the exposure apparatus EX accompanying halts in the supply of liquid LQ and similar can be suppressed. Furthermore, movement of the liquid immersion region LR between the upper surface 4F of the first substrate stage 4 and the upper surface 5F of the second substrate stage 5 is performed via the third stage 53, and the third stage 53 intervenes between the first substrate stage 4 and the second substrate stage 5, so that collisions between the first substrate stage 4 and the second substrate stage 5 can be prevented.

Tenth Embodiment

Next, a tenth embodiment is explained referring to FIG. 53 through FIG. 79. In the following description, components the same as or similar to those of the abovementioned embodiments are denoted the same reference symbols, and description thereof is simplified or omitted.

In this embodiment, a mask stage 3, while holding a mask M, can move in the X-axis, Y-axis, and θZ directions through driving by a mask stage driving device MD including linear motors or other actuators. Position information for the mask stage 3 (and so for the mask M) is measured by the laser interference system 2. The laser interference system 2 has laser interferometers 2Mz, 2My which measure position information for the mask stage 3 using moving mirrors 3K provided on the mask stage 3. The laser interferometer 2Mx can irradiate moving mirrors 3K with measurement light, taking the X-axis direction as the measurement direction, and can measure the position of the mask stage in the X-axis direction. The laser interferometer 2My can irradiate moving mirrors 3K with measurement light, taking the Y-axis direction as the measurement direction, and can measure the position of the mask stage in the Y-axis direction. A plurality of at least one type among the laser interferometer 2Mx and the laser interferometer 2My are provided, and by irradiation with a plurality of beams of at least one type among measurement light taking the X-axis direction as the measurement axis and measurement light taking the Y-axis direction as the measurement axis, the laser interference system 2 can use the plurality of measurement light beams to measure position information for the mask stage 3 in the θZ direction. The control device 7 drives the mask stage driving device MD based on measurement results of the laser interference system 2, and performs position control of the mask M held by the mask stage 3.

Figure 53:
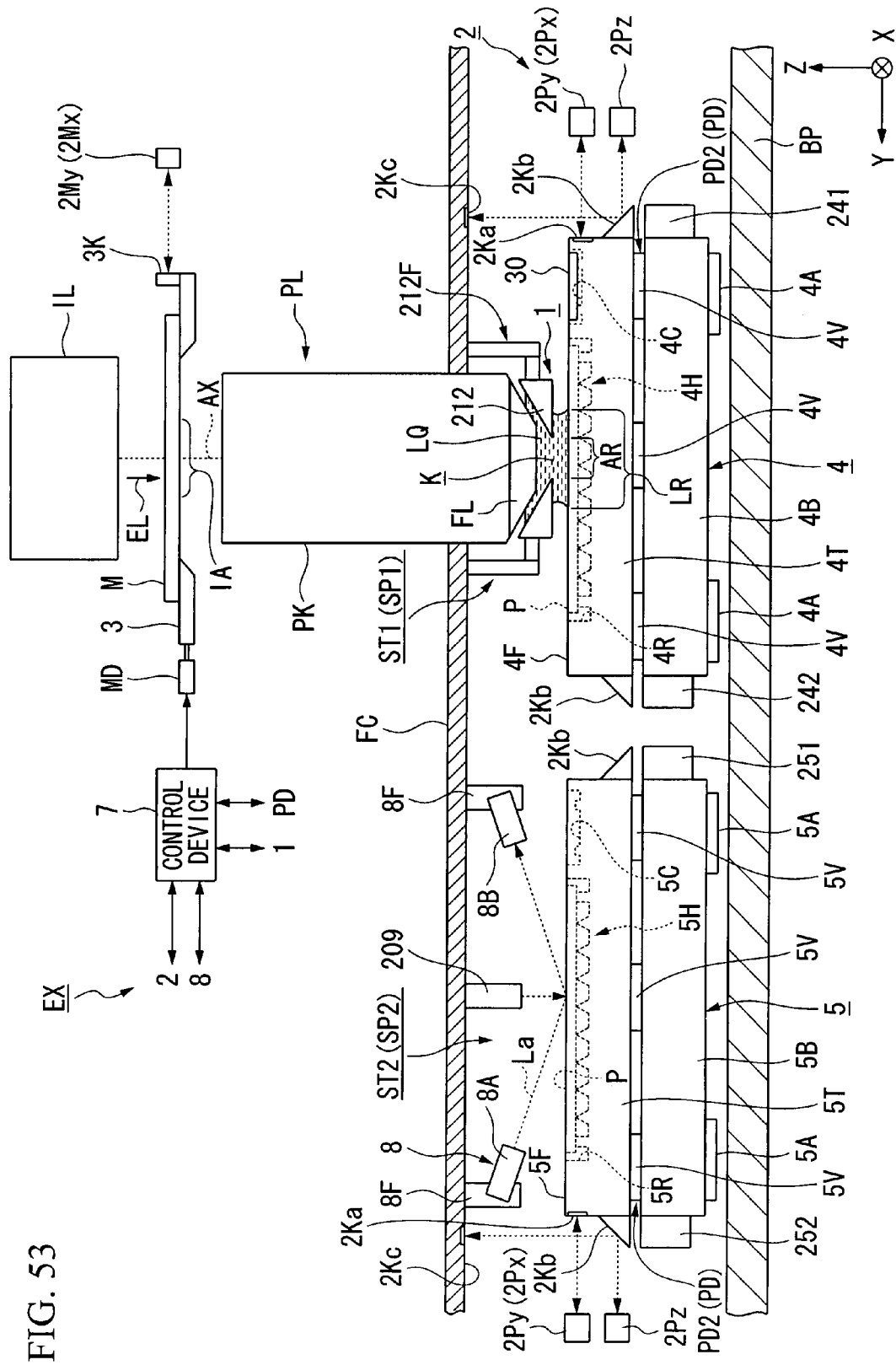
FIG. 53 is a summary view showing the configuration of the exposure apparatus according to a tenth embodiment.
Figure 54:
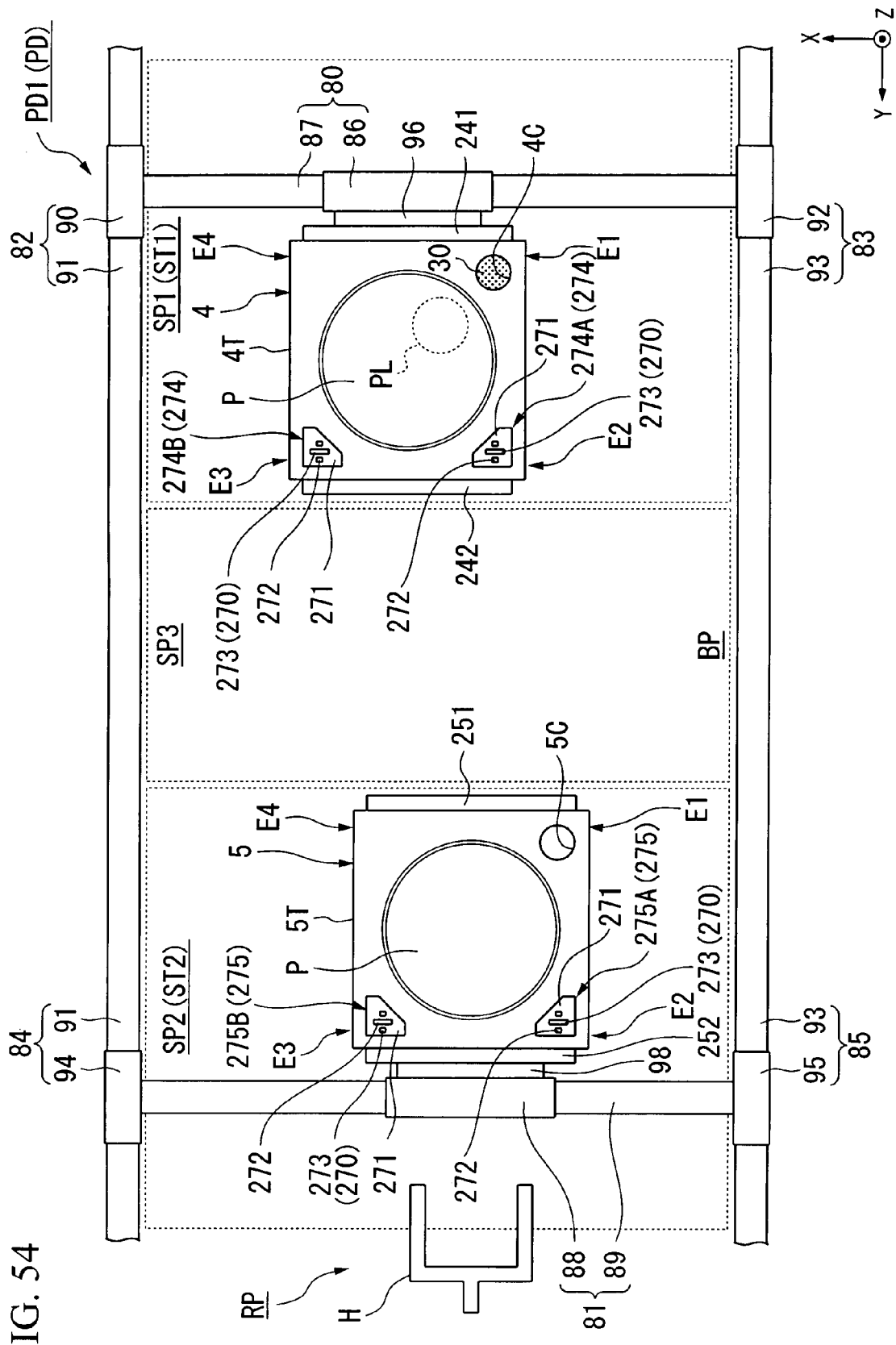
FIG. 54 is a plane view seen from above of the first substrate stage and second substrate stage.

Next, movable substrate stages 4, 5 holding substrates P are explained, referring to FIG. 53 and FIG. 54. FIG. 54 is a plane view seen from above of the substrate stages 4 and 5.

In FIG. 53 and FIG. 54, the first substrate stage 4 includes a stage body 4B, a first substrate table 4T mounted on the stage body 4B, and a substrate holder 4H provided on the first substrate table 4T and which holds the substrate P. The substrate holder 4H is positioned in a depression portion 4R provided on the first substrate table 4T. The upper surface 4F surrounding the depression portion 4R of the first substrate table 4T is a flat surface of substantially the same height as (flush with) the surface of the substrate P held by the substrate holder 4H. There may be a step between the surface of the substrate P held by the substrate holder 4H and the upper surface 4F of the first substrate table 4T.

The second substrate stage 5 has a configuration equivalent to that of the first substrate stage 4, including a stage body 5B, a second substrate table 5T mounted on the stage body 5B, and substrate holder 5H provided on the second substrate table 5T and which holds the substrate P. The substrate holder 5H is positioned in a depression portion 5R provided on the second substrate table 5T. The upper surface 5F surrounding the depression portion 5R of the second substrate table 5T is a flat surface of substantially the same height as (flush with) the surface of the substrate P held by the substrate holder 5H. There may be a step between the surface of the substrate P held by the substrate holder 5H and the upper surface 5F of the second substrate table 5T.

The first substrate stage 4, including the stage body 4B, the substrate table 4T, and the substrate holder 4H, has substantially the same shape and size as the second substrate stage 5, including the stage body 5B, the substrate table 5T, and the substrate holder 5H. As shown in FIG. 54, in this embodiment the substrate tables 4T, 5T of the first and second substrate stages 4, 5 are both substantially rectangular in the XY directions (in plane view). The upper surfaces 4F, 5F of the substrate tables 4T, 5T are provided with four corners E1 to E4. These four corners E1 to E4 are provided on around the periphery of the substrate P held by the substrate holders 4H and 5H, and are opposable to the final optical element FL. That is, the first and second substrate stages 4 and 5 each have corners E1 to E4 around the substrates P held by the substrate holders 4H, 5H and which are opposable to the final optical element FL.

In the following explanation, among the four corners on each of the upper surfaces 4F, 5F of the substrate tables 4T, 5T, the corner on the −X side and −Y side is the first corner E1; the corner on the −X side and +Y side is the second corner E2; the corner on the +X side and +Y side is the third corner E3; and the corner on the +X side and −Y side is the fourth corner E4.

The exposure apparatus EX includes a substrate stage driving device PD which drives the first and second substrate stages 4 and 5. The substrate stage driving device PD includes a first driving system PD1 and a second driving system PD2. The first driving system PD1, by moving the stage bodies 4B, 5B in the X-axis direction, Y-axis direction, and θZ direction on the base member BP, can move the substrate tables 4T, 5T mounted on the stage bodies 4B, 5B in the X-axis direction, Y-axis direction, and θZ direction. The second driving system PD2 can move the substrate tables 4T, 5T in the Z-axis direction, θX direction, and AY direction relative to the stage bodies 4B, 5B.

As shown in FIG. 53, the stage bodies 4B, 5B of the first and second substrate stages 4, 5 are supported in contact-free fashion relative to the upper surface (guide surface) of the base member BP by air bearings 4A, 5A. The upper surface of the base member BP is substantially parallel to the XY plane. The first substrate stage 4 and the second substrate stage 5 can move independently over the base member BP in the XY plane.

The first driving system PD1 of the substrate stage driving device PD includes linear motors or other actuators, and can drive stage bodies 4B, 5B supported in a contact-free state over the base member BP, in the X-axis direction, Y-axis direction, and θZ direction. In FIG. 54, the first driving system PD1 includes linear motors 80, 81, 82, 83, 84, 85. The first driving system PD1 includes a pair of Y-axis linear guides 91, 93 extending in the Y-axis direction. The Y-axis linear guides 91, 93 are positioned separated by a prescribed interval in the X-axis direction. Each of the Y-axis linear guides 91, 93 includes, for example, magnet units, incorporating permanent magnet groups having a plurality of sets of N-pole magnets and S-pole magnets, arranged at prescribed intervals along the Y-axis direction and in alternation. On one of the Y-axis linear guides 91, two sliders 90, 94 are supported to enable motion in the Y-axis direction in a contact-free state. Similarly, two sliders 92, 95 are supported on the other Y-axis linear guide 93 to enable motion in the Y-axis direction in a contact-free state. Each of the sliders 90, 92, 94, 95 includes for example a coil unit, incorporating armature coils arranged at prescribed intervals along the Y axis. That is, in this embodiment, by means of the sliders 90, 94, including coil units, and the Y-axis linear guide 91 including a magnet unit, moving-coil type Y-axis linear motors 82, 84 are configured. Similarly, by means of the sliders 92, 95, including coil units, and the Y-axis linear guide 93 including a magnet unit, moving-coil type Y-axis linear motors 83, 85 are configured.

The sliders 90, 92 comprised by the Y-axis linear motors 82, 83 are respectively fixed to one end portion and the other end portion in the length direction of an X-axis linear guide 87 extending in the X-axis direction. Furthermore, the sliders 94, 95 comprised by the Y-axis linear motors 84, 85 are respectively fixed to one end portion and the other end portion in the length direction of an X-axis linear guide 89 extending in the X-axis direction. Hence the X-axis linear guide 87 is movable in the Y-axis direction by means of the Y-axis linear motors 82, 83, and the X-axis linear guide 89 is movable in the Y-axis direction by means of the Y-axis linear motors 84, 85.

Each of the X-axis linear guides 87, 89 includes for example a coil unit incorporating armature coils arranged at prescribed intervals along the X axis. On one of the X-axis linear guides 87 is supported the slider 86 to enable motion in the X-axis direction in a contact-free state. Similarly, on the other X-axis linear guide 89 is supported the slider 88 to enable motion in the X-axis direction in a contact-free state. The sliders 86, 88 includes for example magnet units having permanent magnet groups having a plurality of sets of N-pole magnets and S-pole magnets, arranged at prescribed intervals along the X-axis direction and in alternation.

In FIG. 54, each of the first and second substrate stages 4, 5 is releasably connected to the sliders 86, 88 via joint members 96, 98, such as those disclosed for example in Published Japanese Translation No. 2000-511704 of the PCT International Application, and Japanese Unexamined Patent Application, First Publication No. 2001-223159. The first substrate stage 4 includes a first joint member 241, provided on the −Y side face of the stage body 4B, and a second joint member 242, provided on the +Y side face. Similarly, the second substrate stage 5 includes a third joint member 251, provided on the −Y side face of the stage body 5B, and a fourth joint member 252, provided on the +Y side face. The joint member 96 provided on the slider 86 connects in alternation with the first and third joint members 241, 251 of the stage bodies 4B, 5B. The joint member 98 provided on the slider 88 connects in alternation with the second and fourth joint members 242, 252 on the stage bodies 4B, 5B. By means of these joint members, the slider 86 is connected in alternation with the first and second substrate stages 4, 5, and the slider 88 is connected in alternation with the first and second substrate stages 4, 5.

By means of the slider 86 and the X-axis linear guide 87, at least a portion of a moving magnet type X-axis linear motor 80 is formed to drive the stage body 4B of the first substrate stage 4 or the stage body 5B of the second substrate stage 5, connected via the joint member 96 to the slider 86, in the X-axis direction. And by means of the slider 88 and the X-axis linear guide 89, at least a portion of a moving magnet type X-axis linear motor 81 is formed to drive the stage body 5B of the second substrate stage 5 or the stage body 4B of the first substrate stage 4, connected via the joint member 98 to the slider 88, in the X-axis direction. By driving the X-axis linear motors 80 and 81, the control device 7 can control the positions in the X-axis direction of the first and second substrate stages 4 and 5.

Furthermore, by using the pair of Y-axis linear motors 82, 83, the control device 7 can drive the X-axis linear guide 87 to control the positions in the Y-axis direction of the first substrate stage 4 or second substrate stage 5 connected to the slider 86 via the joint member 96. Similarly, by using the pair of Y-axis linear motors 84, 85, the control device 7 can drive the X-axis linear guide 89 to control the positions in the Y-axis direction of the first substrate stage 4 or second substrate stage 5 connected to the slider 88 via the joint member 98. Furthermore, by making the driving amounts (thrusts) generated by the pair of Y-axis linear motors 82, 83 slightly different, the control device 7 can control the positions in the θZ direction of the first and second substrate stages connected to the slider 86. Similarly, by making the driving amounts (thrusts) generated by the pair of Y-axis linear motors 84, 85 slightly different, the control device 7 can control the positions in the θZ direction of the first and second substrate stages connected to the slider 88.

As shown in FIG. 53, the second driving system PD2 of the substrate stage driving device PD includes for example voice coil motors or other actuators 4V and 5V, intervening between the stage bodies 4B, 5B and the substrate tables 4T, 51, and measurement devices (encoders or similar), not shown, which measure the driving amounts for each actuator. As shown in FIG. 53, the substrate table 4T is supported on the stage body 4B by at least three actuators 4V. Each of the actuators 4V can independently drive the substrate table 4T in the Z-axis direction relative to the stage body 4B. By adjusting the driving amounts of each of the three actuators 4V, the control device 7 can drive the substrate table 4T in the Z-axis direction, θX direction, and θY direction relative to the stage body 4B. Similarly, the substrate table 5T is supported on the stage body 5B by at least three actuators 4V. By adjusting the driving amounts of each of the three actuators 5V, the control device 7 can drive the substrate table 5T in the Z-axis direction, θX direction, and θY direction relative to the stage body 5B.

In this way, the substrate stage driving device PD, including the first and second driving systems PD1 and PD2, can move, with six degrees of freedom in the X-axis, the Y-axis, the Z-axis, the θX, the θY, and the θZ directions, each of the substrate tables 4T, 5T of the first and second substrate stages 4, 5. By controlling the substrate stage driving device PD, the control device 7 can control the positions in six degrees of freedom, in the X-axis, the Y-axis, the Z-axis, the θX, the θY, and the θZ directions, of the surfaces of the substrates P held by the substrate holders 4H, 5H of the substrate tables 4T, 5T.

Furthermore, as shown in FIG. 54, the exposure apparatus EX comprises a first area SP1, a second area SP2, and a third area SP3 set on the base member BP. The first area SP1 comprises the area opposing the final optical element FL of the projection optical system PL, and is an area comprising at least a portion of the exposure station ST1. The second area SP2 is an area different from the first area SP1, and is an area comprising at least a portion of the measurement station ST2. The third area SP3 is an area between the first area SP1 and the second area SP2, and is an area in which connection and release of the slider 86 and substrate stage 4 (or 5), connection and release of the slider 88 and substrate stage 5 (or 4), connection of the slider 86 with the substrate stage 5 (or 4), and connection of the slider 88 with the substrate stage 4 (or 5), are performed, as disclosed in for example Published Japanese Translation No. 2000-511704 of the PCT International Application and Japanese Unexamined Patent Application, First Publication No. 2001-223159.

The control device 7 can use the substrate stage driving device PD (first driving system PD 1) to move the first substrate stage 4 within a prescribed area on the base member BP comprising the first area SP1, the second area SP2, and the third area SP3. Similarly, the control device 7 can use the substrate stage driving device PD (first driving system PD1) to move the second substrate stage 5 within a prescribed area on the base member BP comprising the first area SP1, the second area SP2, and the third area SP3, independently of the first substrate stage 4.

Next, an example of a laser interference system 2 to measure position information for the first and second substrate stages 4, 5, is explained, referring to FIG. 53. The laser interference system 2 uses reflective surfaces 2Ka, 2Kb provided at prescribed positions on the substrate tables 4T, 5T of the first and second substrate stages 4, 5 to measure position information relating to the six degrees of freedom in the X-axis, the Y-axis, the Z-axis, the θX, the θY, and the θZ directions of the substrate tables 4T and 5T.

The laser interference system 2 has laser interferometers 2Px, 2Py, 2Pz, which use the reflecting surfaces 2Ka, 2Kb provided at prescribed positions on the respective substrate tables 4T, 5T of the first and second substrate stages 4, 5 to measure position information for the first and second substrate stages 4, 5 (substrate tables 4T, 5T). The laser interferometers 2Px, 2Py, 2Pz are provided at both the exposure station ST1 and at the measurement station ST2. The laser interferometers 2Px, 2Py, 2Pz provided at the exposure station ST1 measure position information for the first substrate stage 4 (or the second substrate stage 5) existing at the exposure station ST1. The laser interferometers 2Px, 2Py, 2Pz provided at the measurement station ST2 measure position information for the second substrate stage 5 (or first substrate stage 4) existing at the measurement station ST2.

The laser interferometer 2Px can irradiate the reflecting surface 2Ka with measurement light taking the X-axis direction as the measurement axis, and measures the position in the X-axis direction of the first and second substrate stages 4, 5. The laser interferometer 2Py can irradiate the reflecting surface 2Ka with measurement light taking the Y-axis direction as the measurement axis, and measures the position in the Y-axis direction of the first and second substrate stages 4, 5.

The laser interferometer 2Pz can irradiate the reflecting surface 2Kb with measurement light taking the Z-axis direction as the measurement axis, and measures the position in the Z-axis direction of the first and second substrate stages 4, 5. The reflecting surface 2Kb is inclined by a prescribed angle (for example, 45°) so as to be directed upward; measurement light emitted from the laser interferometer 2Pz and incident on the reflecting surface 2Kb is reflected by the reflecting surface 2Kb, and is incident on a reflecting surface 2Kc provided on a prescribed support frame FC. Measurement light reflected by this reflecting surface 2Kc is reflected by the reflecting surface 2Kb of the substrate table 4T or 5T, and is received by the laser interferometer 2Pz. The laser interferometer 2Pz can use the received measurement light to measure position information in the Z-axis direction for the first or second substrate stage 4, 5. Technology relating to laser interferometry (Z interferometer) capable of measuring position information of a substrate table (substrate stage) in the Z-axis direction is for example disclosed in Japanese Unexamined Patent Application, First Publication No. 2000-323404 and Published Japanese Translation No. 2001-513267 of the PCT International Application.

Furthermore, by providing a plurality of at least one type among the laser interferometer 2Px and the laser interferometer 2Py, and by irradiating with a plurality of beams of at least one type among measurement light taking the X-axis direction as the measurement axis and measurement light taking the Y-axis direction as the measurement axis, the laser interference system 2 can use the plurality of measurement light beams to measure position information in the θZ direction for the first and second substrate stages 4, 5. Furthermore, by providing a plurality of laser interferometers 2Pz, and by irradiating with a plurality of measurement light beams taking the Z-axis direction as the measurement axis, the laser interference system 2 can use the plurality of measurement light beams to measure position information in the θX and θY directions for the first and second substrate stages 4, 5.

The control device 7 drives the substrate stage driving device PD based on measurement results of the laser interference system 2, and performs position control of the substrate tables 4T, 5T of the first and second substrate stages 4, 5, and therefore position control of the substrates P held by the substrate holders 4H, 5H of the substrate tables 4T, 5T.

In the following description, the laser interferometers 2Px, 2Py, 2Pz are called X interferometers 2Pz, Y interferometers 2Py, and Z interferometers 2Pz, as appropriate.

A projection optical system PL, a liquid immersion system 1, and similar are provided at the exposure station ST1. At the exposure station ST1, a substrate P is exposed via the projection optical system PL and liquid LQ. At the measurement station ST2, measurement systems (8, 9) which perform measurements related to exposure of substrates P are provided. At the measurement station ST2, measurements related to exposure and exchange of substrates P are performed. The first substrate stage 4 and the second substrate stage 5 each can move, while holding a substrate P, between the first area SP1 below the projection optical system PL of the exposure station ST1 and the second area SP2 below the measurement systems (8, 9) of the measurement station ST2.

The measurement station ST2 is provided with a focus/leveling detection system 8, which detects surface position information (surface position information for the Z axis, θX, and θY directions) for the surfaces of substrates P held by the first and second substrate stages 4, 5. The focus/leveling detection system 8 includes a projection system 8A, which irradiates the surface of a substrate P with detection light La from an oblique direction, and a light-receiving system 8B, which can receive detection light La reflected by the surface of a substrate P. In this embodiment, the projection system 8A and light-receiving system 8B are supported by a support frame FC via a support mechanism 8F. At the measurement station ST2, the focus/leveling detection system 8 detects, in alternation, surface position information for the surface of the substrate P held by the first substrate stage 4 and surface position information for the surface of the substrate P held by the second substrate stage 5.

The substrate tables 4T, 5T of the first and second substrate stages 4, 5 are respectively provided with measurement regions 274, 275, opposable to the final optical element FL, to perform measurements related to exposure. At the measurement station ST2, reference marks 272 are provided in the measurement regions 274 and 275, and a mark detection system 209 to detect alignment marks provided on substrates P held by the first and second substrate stages 4, 5 is provided.

As shown in FIG. 54, a transport system H to perform exchanges of substrates P is provided in vicinity of the measurement station ST2. The control device 7 can use the transport system H perform substrate exchange tasks, in which a substrate P which has been subjected to exposure processing, on a first substrate stage 4 (or second substrate stage 5) which has moved to the substrate exchange position (loading position) RP of the measurement station ST2 is unloaded, and a substrate P which is to be subjected to exposure processing is loaded onto the first substrate stage 4 (or second substrate stage 5).

As shown in FIG. 54, measurement regions 274, 275 to perform measurements related to exposure, opposable to the final optical element FL, are provided on the substrate tables 4T, 5T of the first and second substrate stages 4, 5. The measurement regions 274 (274A, 274B) are provided at prescribed positions on the substrate table 4T of the first substrate stage 4. The substrate table 4T has two measurement regions, 274A and 274B. The first measurement region 274A is provided at the second corner E2 on the upper surface 4F of the substrate table 4T. The second measurement region 274B is provided at the third corner E3. The measurement regions 275 (275A, 275B) are provided at prescribed positions on the substrate table 5T of the second substrate stage 5. Similarly to the substrate table 4T, the substrate table 5T also has two measurement regions, 275A and 275B. The first measurement region 275A is provided at the second corner E2 on the upper surface 5F of the substrate table 5T. The second measurement region 275B is provided at the third corner E3.

Each of the first and second measurement regions 274A, 274B on the first substrate stage 4 and first and second measurement regions 275A, 275B on the second substrate stage 5 is provided with a reference surface 271, a reference mark (reference mask) 272, and a aperture 273, such as are disclosed in for example Japanese Unexamined Patent Application, First Application No. 2002-158168. Below the apertures 273 (within the substrate tables 4T, 5T) are provided optical sensors 270 capable of receiving light passing through the apertures 273.

Figure 55:
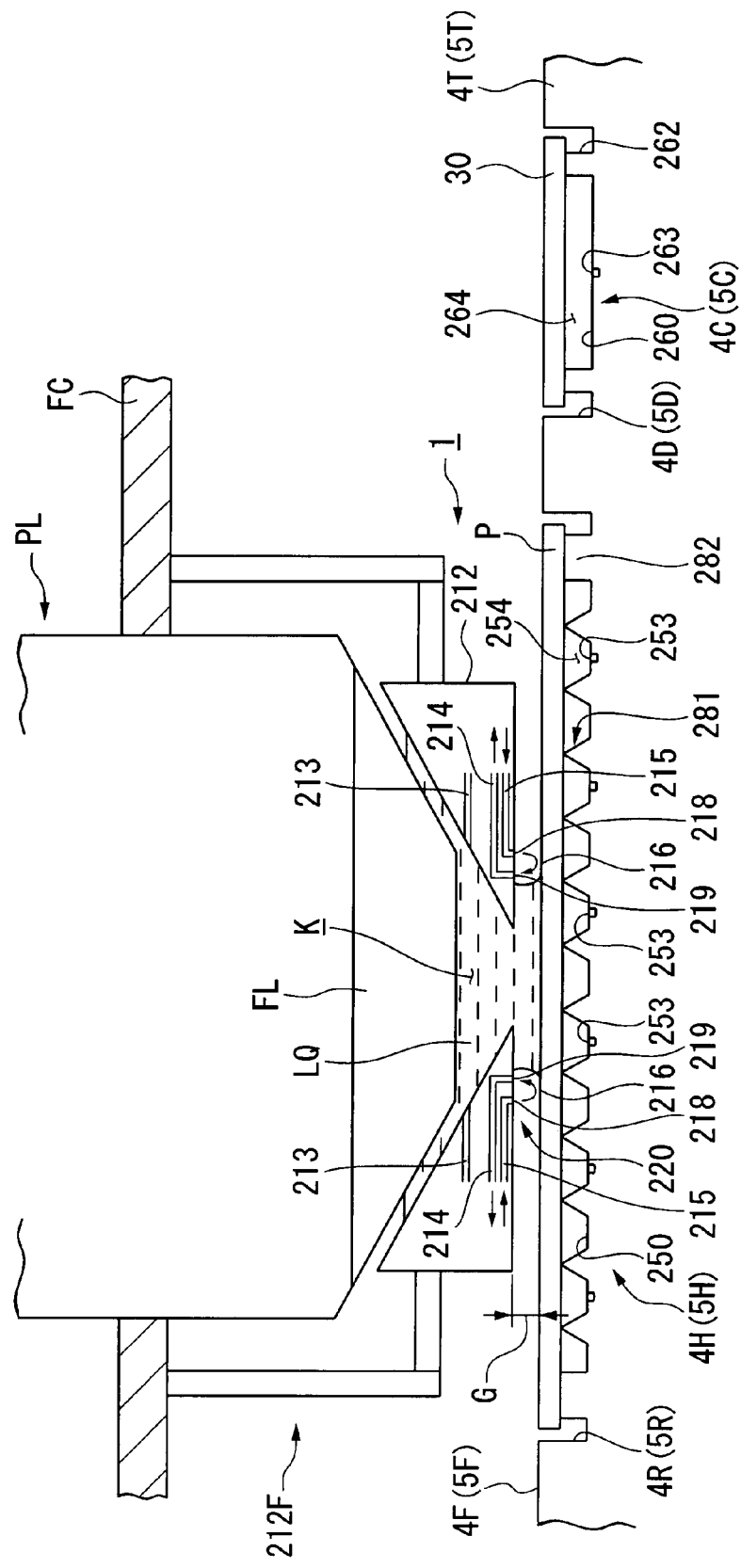
FIG. 55 shows the principal portions of an exposure apparatus.

Next, a liquid immersion system 1 is explained, referring to FIG. 55. As described above, the exposure apparatus EX of this embodiment is a liquid immersion exposure apparatus which performs exposure in a state in which the optical path space K on the light emission side of the final optical element FL is filled with liquid LQ, and includes a liquid immersion system 1 used to fill the optical path space K with liquid LQ. The liquid immersion system 1 includes a seal member 212 such as that disclosed for example in Japanese Unexamined Patent Application, First Publication No. 2004-289126 and Japanese Unexamined Patent Application, First Publication No. 2004-289128, provided surrounding the final optical element FL, to fill a prescribed space, comprising the optical path space K on the light emission side of the final optical element FL, with liquid LQ.

The seal member 212 of this embodiment includes a flow path 213 to perform supply and recovery of liquid LQ to and from the optical path space K. The liquid immersion system 1 includes a liquid supply device to supply liquid LQ to the optical path space K via the flow path 213, and a liquid recovery device to recover liquid LQ. The liquid supply device is capable of supplying liquid LQ to the optical path space K via the flow path 213; the liquid recovery device is capable of recovering liquid LQ from the optical path space K via the flow path 213.

The seal member 212 of this embodiment includes a gas inlet 15 and gas outlet 214, forming a gas seal 216 to confine liquid LQ in the space between the lower surface of the seal member 212 and the surface of the substrate P. In the lower surface of the seal member 212 are formed a first groove 218, connected to the gas inlet 15, formed in a ring shape so as to surround the optical path space K, and a second groove 219, connected to the gas outlet 214, formed in a ring shape so as to surround the optical path space K. The first groove 218 is formed outwardly lateral to the second groove 219 related to the optical path space K.

By means of a gas introduction (supply) operation via the gas inlet 15 and a gas evacuation (suction) operation via the gas outlet 214, the control device 7 can form a fluid bearing (gas bearing) 220 between the lower surface of the seal member 212 and the surface of the substrate P. A vacuum preloaded gas bearing 220 is formed between the lower surface of the seal bearing 212 and the surface of the substrate P. By means of the gas bearing 220, a gap G (of for example 0.1 to 1.0 mm) is maintained between the lower surface of the seal member 212 and the surface of the substrate P.

Furthermore, the seal member 212 is supported by the support frame FC via the support mechanism 212F. The support mechanism 212F includes, for example, a spring member, a flexure or other elastic member, or a flexible member, and flexibly (movably) supports the seal member 212. A gas bearing 220 is formed between the lower surface of the seal bearing 212 and the surface of the substrate P, and the seal bearing 212 is flexibly supported by the support mechanism 212F. Even when there are changes in the position and attitude of the substrate P opposing the lower surface of the seal bearing 212, the position and attitude of the seal bearing 212 change so as to follow changes in the position and attitude of the substrate P. Hence even when the position and attitude of the substrate P change, the gap G is maintained between the lower surface of the seal bearing 212 and the surface of the substrate P.

The substrate holder 4H is provided on the inside of a depression portion 4R, formed at a prescribed position in the upper surface 4F of the substrate table 4T. As shown in FIG. 55, an upper surface 250, opposable to the lower surface of the substrate P positioned on the inside of the depression portion 4R, is provided on the inside of the depression portion 4R. On the upper surface 250 are provided support portions 281, including a plurality of pin-shape members supporting the lower surface of the substrate P, and a peripheral wall 282, having an upper surface opposing the lower surface of the substrate P and provided so as to surround the supporting portions 281. In the upper surface 250 are further provided suction apertures 253 connected to a vacuum system, not shown. By driving the vacuum system to cause suction via the suction apertures 253 of air in the space 254 formed by the upper surface 250, the peripheral wall 282, and the lower surface of the substrate P supported by the support portions 281, to induce a negative pressure in the space 254, the control device 7 can clamp and hold the lower surface of the substrate P to the support portions 281. That is, the substrate holder 4H of this embodiment includes a so-called pin chuck mechanism, and can perform vacuum clamping of the substrate P. By releasing the suction operation via the suction apertures 253, the control device 7 can release the substrate P from the substrate holder 4H. In this way, the substrate holder 4H can releasably hold the substrate P.

The substrate holder 5H has the same configuration as the substrate holder 4H, and is provided within a depression portion 5R formed at a prescribed position in the upper surface 5F of the substrate table 5T. The substrate holder 5H can also releasably hold a substrate P.

The upper surface 4F of the first substrate stage 4 is positioned on adjacent around the periphery of the upper surface of the substrate P held by the substrate holder 4H of the first substrate stage 4. The upper surface of the substrate P held by the substrate holder 4H and the upper surface 4F of the first substrate stage 4 are substantially flush. Similarly, the upper surface 5F of the second substrate stage 5 is positioned on adjacent around the periphery of the upper surface of the substrate P held by the substrate holder 5H of the second substrate stage 5. The upper surface of the substrate P held by the substrate holder 5H and the upper surface 5F of the second substrate stage 5 are substantially flush.

Inner side faces forming the depression portions 4R, 5R of the substrate stages 4, 5 are arranged to oppose the side faces of substrates P held by the substrate holders 4, 5. A prescribed gap is formed between the side faces of substrates P and the inner side faces of the substrate stages 4, 5. The gap formed between the side faces of substrates P held by the substrate holders 4H, 5H and the inner side faces of substrate stages 4, 5 is very small, for example from 0.1 to 1 mm approximately. Hence the permeation of liquid LQ from the space between the surface of the substrate P and the upper surface 4F, 5F of the substrate stage 4, 5 into the interior of the substrate stage 4, 5 and lower-surface side of the substrate P is suppressed.

Furthermore, the exposure apparatus EX of this embodiment includes a cap member 30, which can hold liquid LQ up to the final optical element FL, such as is disclosed for example in Japanese Unexamined Patent Application, First Publication No. 2004-289128. The cap member 30 is formed according to the size and shape of the liquid immersion region LR formed by the seal member 212. In this embodiment, the cap member 30 is a plate-shape member of substantially the same thickness as a substrate P, of substantially circular shape in plane view. Furthermore, the surface of the cap member 30 has the property of repelling the liquid LQ. In this embodiment, the cap member 30 is formed from for example a fluoride resin material comprising polytetrafluoroethylene or another material with liquid-repelling properties. The cap member 30 may also be formed from stainless steel, titanium, or another prescribed metal, and the surface covered with a material having liquid-repelling properties.

The seal member 212 can releasably hold the cap member 30 so as to be opposed to the final optical element FL. The seal member 212 uses the clamping action resulting from formation of a gas bearing between the cap member 30 and the seal member 212, and holds the cap member 30 in a state of maintaining a prescribed gap between the lower surface of the seal member 212 and the upper surface of the cap member 30.

The substrate table 4T of the first substrate stage 4 includes a first cap holder 4C to releasably hold the cap member 30. Similarly, the substrate table 5T of the second substrate stage 5 includes a second cap holder 5C to releasably hold the cap member 30.

The first cap holder 4C is provided at a prescribed position on the substrate table 4T; the second cap holder 5C is provided at a prescribed position on the substrate table 5T. As described above, the substrate holder 4T of the first substrate stage 4 and substrate holder 5T of the second substrate stage 5 are of substantially the same shape and size. In this embodiment, the first cap holder 4C and the second cap holder 5C are provided at substantially the same position on the substrate tables 4T, 5T. Specifically, as shown in FIG. 54, the first and second cap holders 4C, 5C are provided at the respective first corners E1 of the substrate tables 4T, 5T.

As shown in FIG. 55, the first cap holder 4C is provided on the inside of a depression portion 3D formed in a prescribed position of the upper surface 4F of the substrate table 4T. On the inside of the depression portion 4D is provided an upper surface 260, opposable to the lower surface of the cap member 30 positioned on the inside of the depression portion 4D. A peripheral wall 262, having an upper surface opposable to the peripheral area of the lower surface of the cap member 30, is provided on the upper surface 260. Furthermore, a suction aperture 263, connected to a vacuum system, not shown, is provided in the upper surface 260. The control device 7 drives the vacuum system to induce suction, via the suction aperture 263, of air in the space 264 formed by the upper surface 260, the peripheral wall 262, and the lower surface of the cap member 30 supported by the peripheral wall 262, by this means inducing a negative pressure in the space 264, to clamp the lower surface of the cap member 30. That is, the first cap holder 4C of this embodiment includes a so-called vacuum chuck mechanism, and can clamp the cap member 30. By releasing the suction operation via the suction aperture 263, the control device 7 can release the cap member 30 from the upper surface 260 of the first cap holder 4C. In this way, the first cap holder 4C can releasably hold the cap member 30.

The second cap holder 5C has a configuration equivalent to that of the first cap holder 4C, provided inside a depression portion 5D formed in a prescribed position of the upper surface 5F of the substrate table 5T. The second cap holder 5C also releasably holds the cap member 30.

The upper surface 4F of the first substrate stage 4 is positioned on adjacent lateral to the periphery of the upper surface of the cap member 30 held by the first cap holder 4C. The upper surface of the cap member 30 held by the first cap holder 4C is substantially flush with the upper surface 4F of the first substrate stage 4. Similarly, the upper surface 5F of the second substrate stage 5 is positioned on adjacent lateral to the periphery of the upper surface of the cap member 30 held by the second cap holder 5C. The upper surface of the cap member 30 held by the second cap holder 5C is substantially flush with the upper surface 5F of the second substrate stage 5.

Inner side faces forming the depression portions 4D, 5D of the substrate stages 4, 5 are positioned opposing the side face of the cap member 30 held by the first and second cap holders 4C, 5C. A prescribed gap is formed between the side face of the cap member 30 and the inner side faces of the substrate stages 4, 5. The gap formed between the side face of the cap member 30 held by the first and second cap holders 4C, 5C and the inner side faces of the first and second substrate stages 4, 5 is very small, for example from 0.1 to 1 mm approximately. Hence the permeation of liquid LQ from the space between the surface of the cap member 30 and the upper surfaces 4F, 5F of the substrate stages 4, 5 into the interior of the substrate stages 4, 5 and lower-surface side of the cap member 30 is suppressed.

In this embodiment, the exposure apparatus EX includes one cap member 30. Hence when the cap member 30 is held by the cap holder 4C of the first substrate stage 4, the cap holder 5C of the second substrate stage 5 does not hold the cap member 30, and is in the empty state. Similarly, when the cap holder 5C of the second substrate stage 5 holds the cap member 30, the cap holder 4C of the first substrate stage 4 does not hold the cap member 30, and is in the empty state.

Figure 56:
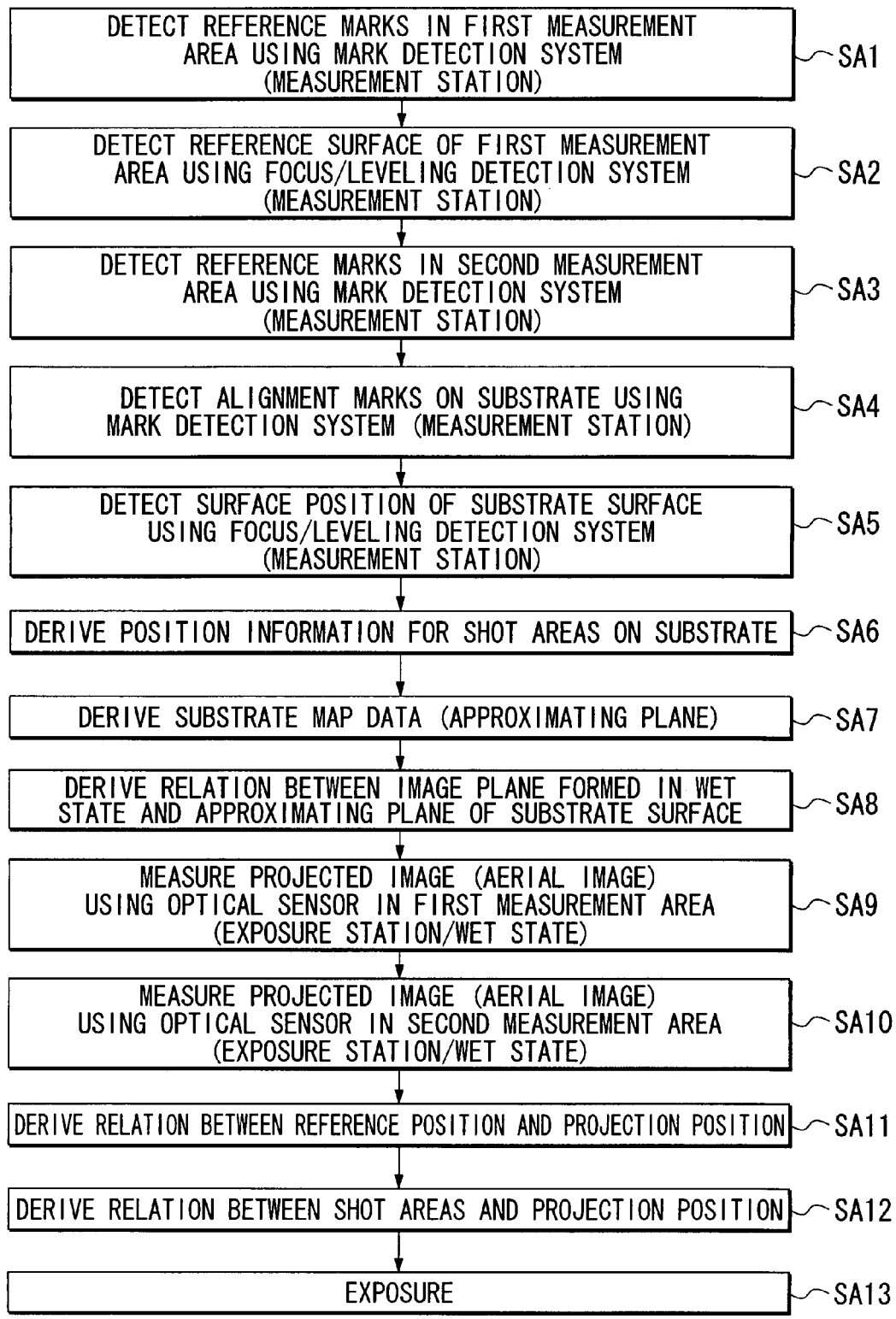
FIG. 56 is a flowchart used to explain basic operation of an exposure apparatus.

Next, the basic operation of the exposure apparatus EX is explained, referring to the flowchart of FIG. 56.

In this embodiment, when one stage 4 (or 5) among the first and second substrate stages 4, 5 is positioned at the first area SP1 of the exposure station ST1, the other stage 5 (or 4) is at the second area SP2 of the measurement station ST2 for prescribed processing. Specifically, with the optical path space K of the exposure light EL filled with liquid LQ, the control device executes control to move one stage 4 (or 5) among the first substrate stage 4 and the second substrate stage 5, existing at the exposure station ST1, while performing exposure of the substrate P held by the stage 4 (or 5) via the projection optical system PL and liquid LQ. On the other hand, the control device 7 performs measurements, without the mediation of liquid LQ, of position information for an unexposed substrate P held by the other stage 5 (or 4) existing at the measurement station ST2. Here, position information for a substrate P includes at least one among surface position information (position information in the Z, θX, θY directions) for the substrate P relative to the image plane of the projection optical system PL or another prescribed reference plane or surface, and alignment information (position information in the X, Y, θZ directions for a plurality of shot areas on the substrate P) relative to a prescribed reference position.

In the following description, a state in which the optical path space K is not filled with liquid LQ is called a "dry" state, and a state in which the optical path space K is filled with liquid LQ is called a "wet" state. The image plane formed via the projection optical system PL and liquid LQ is called the image plane formed in a wet state.

At the measurement station ST2, the control device 7 initiates exchange of substrates P and prescribed measurement processing. For example, the control device 7 positions the second substrate stage 5 at the substrate exchange position RP of the measurement station ST2, and uses the transport system H to load a substrate P for exposure processing onto the second substrate stage 5. Then, at the measurement station ST2, the control device 7 initiates measurement processing related to the second substrate stage 5 holding the substrate P. On the other hand, the first substrate stage 4 is positioned at the exposure station ST1, and exposure of the substrate P, for which measurement processing at the measurement station ST2 has been completed, is initiated.

In this embodiment, measurements performed at the measurement station ST2 include detection operations using a mark detection system 209 and a focus/leveling detection system 8. At the measurement station ST2, the control device 7 moves the second substrate stage 5 in XY directions, to position the first measurement region 275A on the second substrate stage 5 in the detection area of the mark detection system 209. At the measurement station ST2, an X interferometer 2Pz and Y interferometer 2Py measure position information in the X-axis direction and Y-axis direction for the second substrate stage 5, and the mark detection system 209 detects reference marks 272 provided in the first measurement region 275A on the second substrate stage 5, without using liquid (step SA1).

By this means, the control device 7 can determine position information relating to the X-axis direction and Y-axis direction for the reference marks 272 in the first measurement region 275A in a coordinate system defined by the laser interference system 2 (X, Y interferometers 2Px, 2Py).

Further, at the measurement station ST2, the Z interferometer 2Pz measures position information in the Z-axis direction for the second substrate stage 5, and the focus/leveling detection system 8 detects the reference surface 271 provided in the first measurement region 275A on the second substrate stage 5, without using liquid (step SA2). By this means, the control device 7 can determine surface position information relating to the Z-axis, θX, and θY directions for the reference surface 271 in the first measurement region 275A in the coordinate system defined by the laser interference system 2 (Z interferometer 2Pz).

Next, at the measurement station ST2, the control device 7 moves the second substrate stage 5 in XY directions and positions the second measurement region 275B on the second substrate stage 5 at the detection area of the mark detection system 209. At the measurement station ST2, an X interferometer 2Px and Y interferometer 2Py measure position information in the X-axis direction and Y-axis direction for the second substrate stage 5, and the mark detection system 209 detects the reference marks 272 provided in the second measurement region 275B on the second substrate stage 5, without using liquid (step SA3).

By this means, the control device 7 can determine position information related to the X-axis direction and Y-axis direction for the reference marks 272 in the second measurement region 275B in the coordinate system defined by the laser interference system 2 (X, Y interferometers 2Px, 2Py).

Furthermore, at the measurement station ST2, the X interferometer 2Px and Y interferometer 2Py measure position information in the X-axis direction and Y-axis direction for the second substrate stage 5 holding a substrate P, and the mark detection system 209 detects alignment marks provided on the substrate P accompanying a plurality of shot areas on the substrate P, without using liquid (step SA4).

By this means, the control device 7 can determine position information related to the X-axis and Y-axis directions for each alignment mark in the coordinate system defined by the laser interference system 2 (X, Y interferometers 2Px, 2Py).

Furthermore, at the measurement station ST2, a Z interferometer 2Pz measures position information in the Z-axis direction for the second substrate stage 5, and the focus/leveling detection system 8 detects surface position information for the surface of the substrate P held by the second substrate stage 5, without using liquid (step SA5).

In this embodiment, the control device 7 controls movement of the second substrate stage 5, and while moving the second substrate stage 5 holding the substrate P in the XY plane, uses the focus/leveling detection system 8 to detect the surface position at a plurality of detection points on the surface of the substrate P. For example, while monitoring the outputs of X and Y interferometers 2Px, 2Py, the control device 7 moves the second substrate stage 5, and uses the focus/leveling detection system 8 to detect surface position information at a plurality of points in the plane (the XY plane) on the surface of the substrate P. By this means, the control device 7 can determine surface position information at the plurality of detection points on the surface of the substrate P in the coordinate system defined by the laser interference system 2 (Z interferometer 2Pz). Detection results of the focus/leveling detection system 8 are associated with positions of the substrate P in the XY plane, and are stored in the control device 7.

Based on position information for each alignment mark on the substrate P, determined in step SA4, the control device 7 performs computation processing to determine position information for each of the plurality of shot areas on the substrate P relative to stipulated reference positions, using the measurement results of step SA1 and the measurement results of step SA3 (step SA6).

Furthermore, the control device 7 creates map data based on position information for the plurality of detection points on the surface of the substrate P, detected in step SA5, and based on the map data determines an approximate plane (approximate surface) for each of the shot areas on the surface of the substrate P, with the reference surface 271 as reference (step SA7).

The control device 7 stores the approximate plane for the surface of the substrate P determined at the measurement station ST2.

When processing at the exposure station ST1 and processing at the measurement station ST2 have both ended, the control device 7 moves the first substrate stage 4 to the measurement station ST2, and moves the second substrate stage 5 to the exposure station ST1. After the first substrate stage 4 holding a substrate P which has been subjected to exposure processing is moved to the measurement station ST2, the transport system H unloads the substrate P from the first substrate stage 4. Then, a substrate P to be subjected to exposure processing is loaded onto the first substrate stage 4 at the measurement station ST2, and the above-described measurement processing is performed.

On the other hand, the control device 7 moves the second substrate stage 5, holding a substrate P which has been subjected to measurement processing at the measurement station ST2, to the exposure station ST1, and then, at the exposure station ST1, moves the second substrate stage 5, and positions the first measurement region 275A on the second substrate stage 5 in the projection area AR of the projection optical system PL.

At this time, the position and attitude of the substrate table 5T are controlled such that the image plane formed in the wet state and the reference surface 271 substantially coincide. By this means, the relation between the measured values of the Z interferometer 2Pz, the image plane formed in the wet state, and the reference surface 271 is defined, and so the control device 7 can determine the relation between the approximate plane to the surface of the substrate P, determined in step SA7, the measured values of the Z interferometer 2Pz, and the image plane formed in the wet state (step SA8).

Then, while measuring position information for the second substrate stage 5 using the laser interference system 2, the control device 7 can use the optical sensor 270 provided at the first measurement region 275A to detect, in the wet state, the aerial image of alignment marks provided on the mask M (step SA9).

That is, the control device 7 brings the first measurement region 275A into opposition with the projection optical system PL, and with the optical path space K between the final optical element FL of the projection optical system PL and the first measurement region 275A filled with liquid LQ, illuminates the alignment marks provided on the mask M with exposure light EL. By this means a aerial image of the alignment marks provided on the mask M is projected onto the first measurement region 275A via the projection optical system PL and liquid LQ, and the optical sensor 270 provided at the first measurement region 275A of the second substrate stage 5 can measure the aerial image of alignment marks provided on the mask M in the wet state.

Next, at the measurement station ST2, the control device 7 moves the second substrate stage 5 in XY directions, and positions the second measurement region 275B on the second substrate stage 5 in the projection area of the projection optical system PL. Then, using a procedure similar to that of step SA9 above, while using the laser interference system 2 to measure position information for the second substrate stage 5, the control device 7 uses the optical sensor 270 provided at the second measurement region 275B to detect, in the wet state, a aerial image of alignment marks provided on the mask M (step SA10).

By this means, the control device 7 can determine the position in the X-axis direction and Y-axis direction of the aerial image (projected image) in the coordinate system defined by the laser interference system 2 (X, Y interferometers 2Px, 2Py), using the optical sensors 270 (aperture 273) provided at the first measurement region 275A and the second measurement region 275B.

A prescribed positional relation is formed between the pattern on the mask M and the alignment marks, and the positional relation between the reference marks 272 and apertures 273 (optical sensors) in the first measurement region 275A and the second measurement region 275B is also known. Based on the measurement results of step SA9 and the measurement results of step SA10, the control device 7 derives the relation between prescribed reference positions in the coordinate system defined by the laser interference system 2 and the position of the projected pattern of the mask M (step SA11).

Based on the positional relation determined in step SA6 between the prescribed reference positions and each of the shot areas on the substrate P (array information for shot areas relative to prescribed reference positions) in the coordinate system defined by the laser interference system 2, and the relation determined in step SA11 between prescribed reference positions and the projected position of the pattern of the mask M in the coordinate system defined by the laser interference system 2, the control device 7 derives the relation between each of the shot areas on the substrate P and the projected position of the pattern of the mask M in the coordinate system defined by the laser interference system 2 (step SA12).

And, based on the approximate plane for the surface of the substrate P determined in step SA8 and values measured by the Z interferometer 2Pz associated with the image plane formed in the wet state, the control device 7 controls the second driving system PD2 to adjust the position of the surface of the substrate P (the exposure surface), while controlling the position in the X-axis, Y-axis, and θZ directions of the substrate P, by controlling the first driving system PD1 based on the relation between each of the shot areas on the substrate P and the projected position of the pattern of the mask M determined in step SA12, to successively expose the plurality of shot areas on the substrate P (step SA13).

After liquid immersion exposure processing of the substrate P on the second substrate stage 5 has ended, the control device 7 moves the second substrate stage 5 at the exposure station ST1 to the measurement station ST2. In parallel with this, the first substrate stage 4, holding a substrate P for which measurement processing at the measurement station ST2 has ended, is moved to the exposure station ST1. The transport system H unloads the substrate P for which exposure processing has ended, and which is being held by the second substrate stage 5, which has moved to the measurement station ST2.

In this way, the first substrate stage 4 and the second substrate stage 5 are sent to the exposure station ST1 in alternation, and a plurality of substrates P are exposed successively.

A focus/leveling detection system may be provided at the exposure station ST1 also, and in the above-described step SA8, the positional relation between the image plane formed in the wet state and the reference surface 271 may be detected using this focus/leveling detection system, to determine the relation between the value measured by the Z interferometer 2Pz, the image plane formed in the wet state, and the reference surface 271. Or, in step SA8, while using the Z interferometer 2Pz to measure the position of the second substrate stage 5 (second substrate table 5T), the optical sensor 270 at the first measurement region 275A may be used to detect the position of the image plane formed in the wet state, to determine the relation between the value measured by the Z interferometer 2Pz, the image plane formed in the wet state, and the reference surface 271.

Furthermore, the optical sensors 270 provided at the measurement regions 275 of the second substrate stage 5 can perform measurements relating to the exposure light EL in the wet state. The control device 7 irradiates the optical sensors 270 with exposure light EL via the projection optical system PL and liquid LQ. When for example the illuminance, illuminance unevenness, and similar of the exposure light can be measured, the control device 7 can perform adjustments of the irradiation state of exposure light EL based on measurement results of the optical sensors 270.

Next, a method of exposure of substrates P using an exposure apparatus EX with the above-described configuration is explained, for the case of a sequence using a cap member 30 in particular, referring to the plane views of FIG. 57 to FIG. 69, and to FIG. 70 to FIG. 77.

Figure 57:
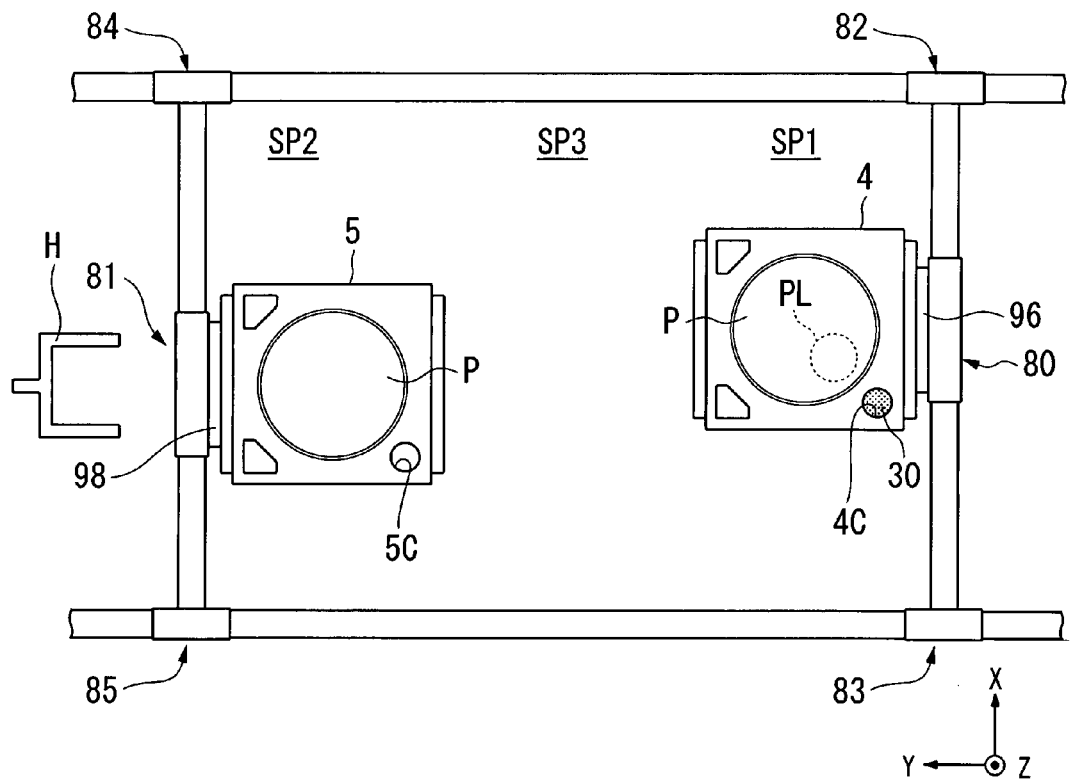
FIG. 57 is a drawing used to explain the exposure method in the tenth embodiment.
Figure 70:
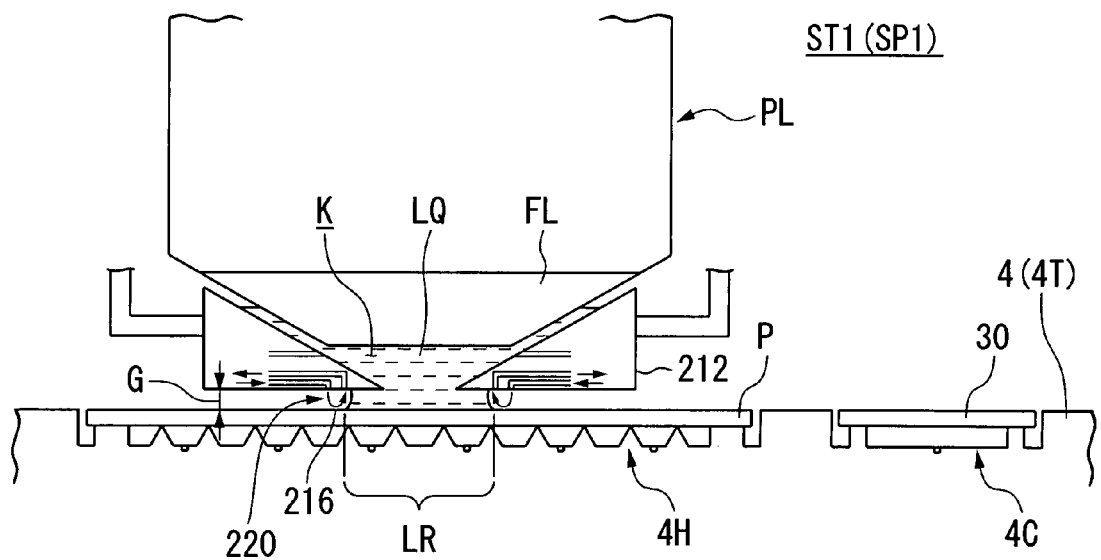
FIG. 70 is a drawing used to explain the exposure method in the tenth embodiment.

As shown in FIG. 57 and FIG. 70, in the first area SP1 of the exposure station ST1, a substrate P held by the first substrate stage 4 is subjected to liquid immersion exposure. At the measurement station ST2, measurement processing and similar are performed for the second substrate stage 5 holding a substrate P.

The control device 7 uses a liquid immersion system 1 to fill the optical path space K between the projection optical system FL and the substrate P held by the first substrate stage 4 with liquid LQ, and performs exposure of the substrate P. During exposure of the substrate P, the liquid immersion system 1 can supply and recovery liquid LQ to and from a space comprising the optical path space K between the final optical element FL and substrate P, via the flow path 213. If the space comprising the optical path space K between the final optical element FL and the substrate P is filled with liquid LQ, then during exposure of the substrate P, the liquid immersion system 1 may halt the supply and recovery of liquid LQ.

As shown in FIG. 57 and FIG. 70, during exposure of the substrate P held by the substrate holder 4H of the first substrate stage 4, the cap member 30 is held in the first cap holder 4C provided at the first corner E1 on the first substrate stage 4.

Figure 58:
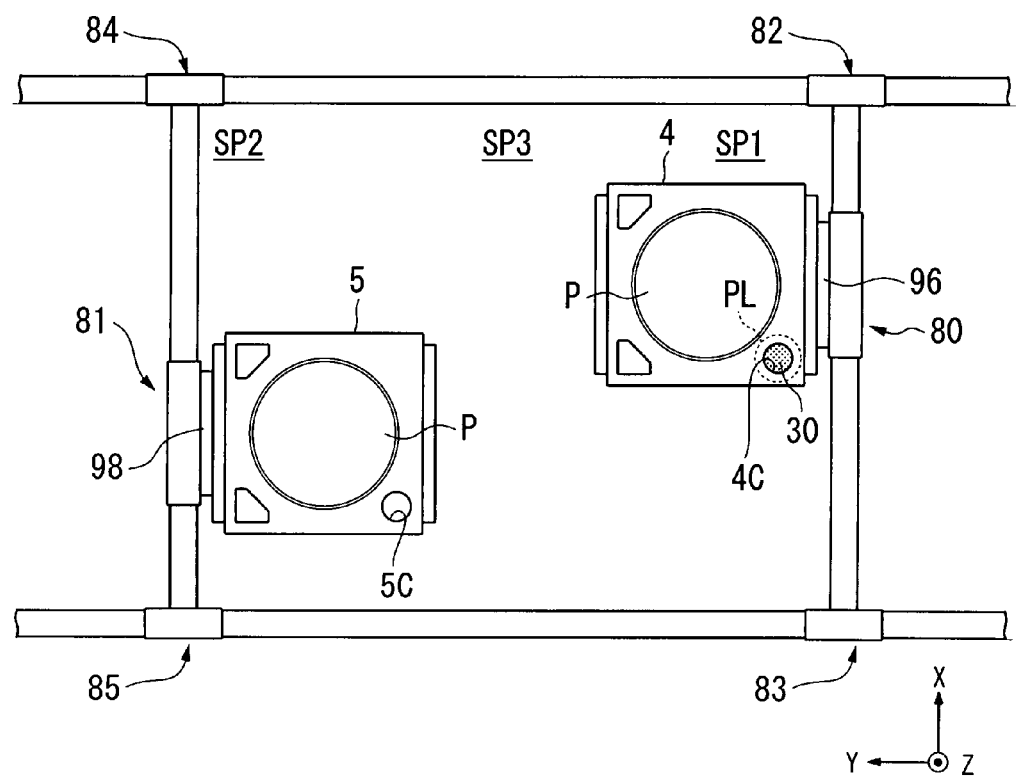
FIG. 58 is a drawing used to explain the exposure method in the tenth embodiment.
Figure 71:
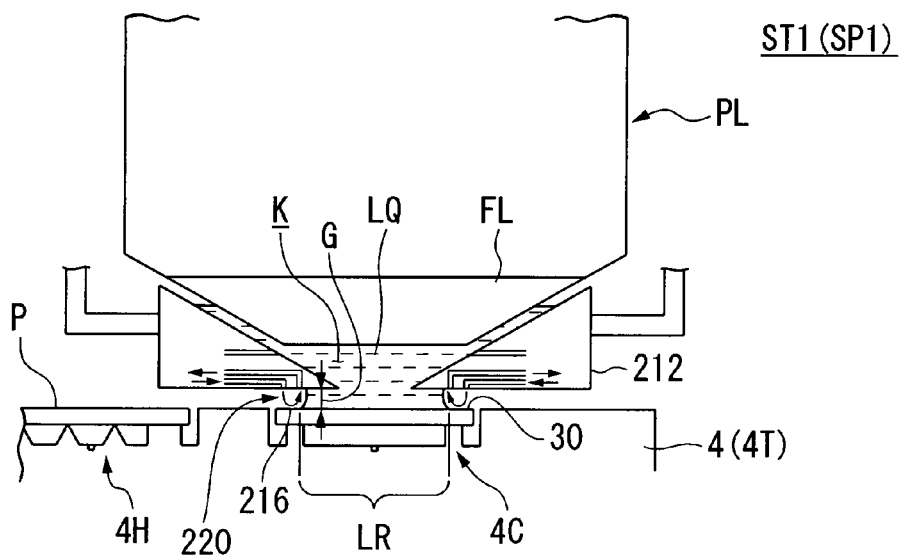
FIG. 71 is a drawing used to explain the exposure method in the tenth embodiment.

As shown in FIG. 58 and FIG. 71, after liquid immersion exposure of the substrate P on the first substrate stage 4 has ended, the control device 7 moves the first substrate stage 4 in XY directions relative to the final optical element FL and seal member 212, in order to move the liquid immersion region LR of liquid LQ, formed on the substrate P held by the substrate holder 4H of the first substrate stage 4, into the cap member 30 held by the first cap holder 4C of the first substrate stage 4. With the space between the final optical element FL of the projection optical system PL and the first substrate stage 4 holding liquid LQ, the control device 7 uses the substrate stage driving device PD to move the first substrate stage 4 in XY directions such that the cap member 30 held by the first cap holder 4C opposes the final optical element FL. By this means, the control device 7 can move the liquid immersion region LR of liquid LQ, formed on the substrate P, onto the cap member 30 held by the first cap holder 4C.

The area of the upper surface of the cap member 30 is set to be substantially larger than the area of the liquid immersion region LR as defined by the gas bearing mechanism of the seal member 212. Hence the liquid immersion region LR can be stably maintained on the upper surface of the cap member 30, without running out from the upper surface of the cap member 30.

The upper surface of the cap member 30 held by the first cap holder 4C, the upper surface of the substrate P held by the substrate holder 4H of the first substrate stage 4, and the upper surface 4F of the first substrate stage 4 are substantially flush. The control device uses the liquid immersion system 1 to perform supply and recovery of liquid LQ in parallel via the flow path 213 while moving the first substrate stage 4 in XY directions in a prescribed area comprising the position opposing the final optical element FL, and by this means can smoothly move the liquid immersion region LR formed on the substrate P to above the cap member 30.

When the liquid immersion region LR formed on the substrate P is moved onto the cap member 30, the operations of supplying and recovering liquid LQ by the liquid immersion system 1 may be halted.

As explained above, the seal member 212 can form a gas bearing 220 between the lower surface of the seal member 212 and the surface of the substrate P. By opposing the seal member 212 and the cap member 30, a gas bearing 220 can be formed between the seal member 212 and the cap member 30. As shown in FIG. 71, a prescribed gap G is formed between the lower surface of the seal member 212 and the upper surface of the cap member 30.

Figure 72:
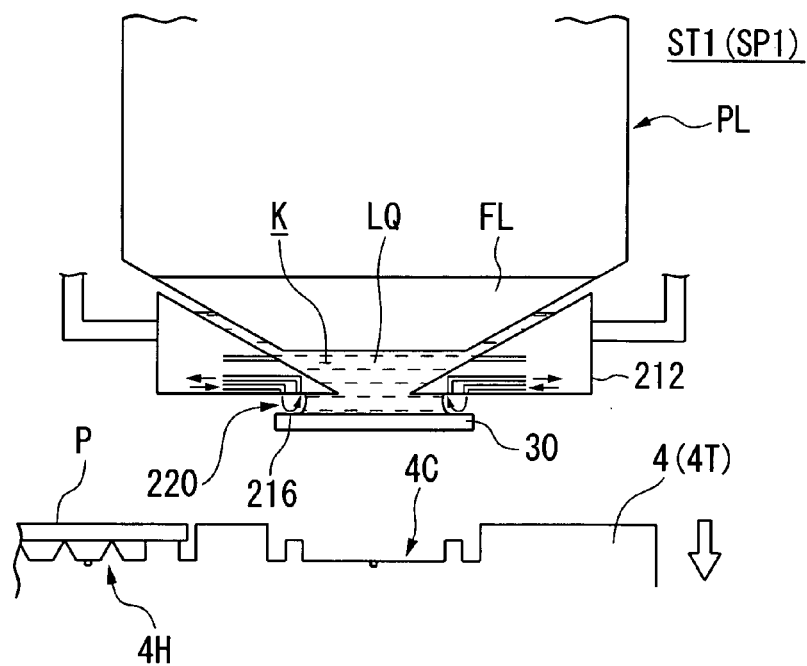
FIG. 72 is a drawing used to explain the exposure method in the tenth embodiment.

Next, the control device 7 releases the holding of the cap member 30 by the first cap holder 4C. By this means, the first cap holder 4C can release the cap member 30. That is, a state is entered in which the cap member 30 is clamped to the lower surface of the seal member 12, with the gap G intervening. As shown in FIG. 72, with the gas bearing 220 formed between the upper surface of the cap member 30 and the lower surface of the seal member 212, the control device 7 moves the first substrate table 4T downward (in the −Z direction). A gas bearing 220 is formed between the lower surface of the seal member 212 and the upper surface of the cap member 30, and so, with the gap G maintained between the lower surface of the seal member 212 and the upper surface of the cap member 30, the cap member 30 can be held at the lower surface of the seal member 212.

The seal member 212 can hold the cap member 30 such that the cap member 30 and the final optical element FL are opposed. The cap member 30 held by the seal member 212 is released from the first cap holder 4C of the first substrate stage 4 by moving the first substrate table 4T downward (in the −Z direction). The cap member 30 is released from the first substrate stage 4, and the cap member 30 held by the seal member 212 can hold liquid LQ between the seal member 212 and the final optical element FL.

Figure 73:
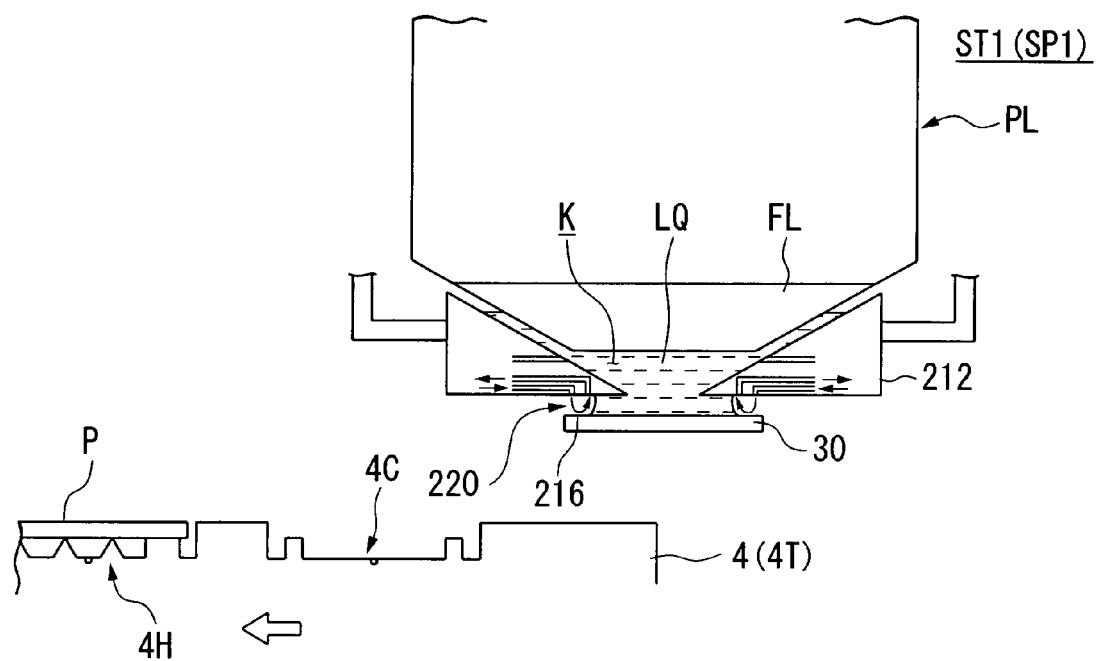
FIG. 73 is a drawing used to explain the exposure method in the tenth embodiment.

With the cap member 30 held by the seal member 212, after the upper surface of the first substrate table 4T has moved downward below the lower surface of the cap member 30 (in the −Z direction), the control device 7 horizontally moves the first substrate stage 4 from the first area SP1 comprising the position opposing the final optical element FL toward the third area SP3, as shown in FIG. 73.

In this way, when both the first substrate stage 4 and the second substrate stage 5 have withdrawn from the first area SP1, the seal member 212 holds the cap member 30 so as to be opposed to the final optical element FL.

The cap member 30 held by the seal member 212 can hold liquid LQ up to the final optical element FL, and when the seal member 221 is holding the cap member 30, the liquid immersion system 1 can fill the space comprising the optical path space K between the final optical element FL and cap member 30 with liquid LQ. For example, when the seal member 212 is holding the cap member 30, the liquid immersion system 1 can supply and recover liquid LQ to and from the space comprising the optical path space K between the cap member 30 held by the seal member 212 and the final optical element FL, via the flow path 213. Because the seal member 212 forms a gas bearing 220, gas is introduced via the gas inlet 15 and gas is evacuated via the gas outlet 214, so that a gas seal 216 can be formed to confine the liquid LQ between the lower surface of the seal member 212 and the surface of the cap member 30. If liquid LQ fills the space comprising the optical path space K between the cap member 30 held by the seal member 212 and the final optical element FL, then the liquid immersion system 1 may halt the supply and recovery of liquid LQ.

Figure 59:
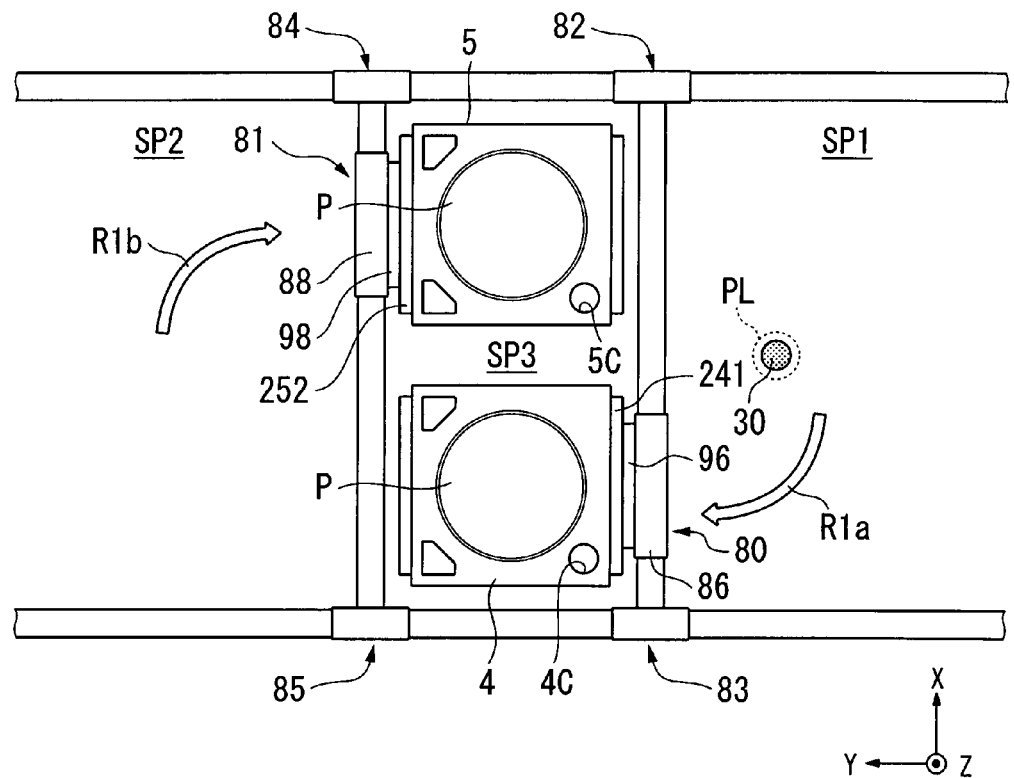
FIG. 59 is a drawing used to explain the exposure method in the tenth embodiment.

Next, the control device 7 uses the laser interference system 2 to measure the positions of the first and second substrate stages 4, 5, while controlling the substrate stage driving device PD to move both the first substrate stage 4 and the second substrate stage 5 to the third area SP3, as shown in FIG. 59. In this embodiment, the first substrate stage 4, having moved from the first area SP1 to the third area SP3, is positioned on the −X part area of the third area SP3 in the figure, and the second substrate stage 5, having moved from the second area SP2 to the third area SP3, is positioned on the +X part area of the third area SP3 in the figure. When the first substrate stage 4 moves from the first area SP1 to the third area SP3, movement is along the path indicated by the arrow R1a in FIG. 59; and when the second substrate stage 5 moves from the second area SP2 to the third area SP3, movement is along the path indicated by the arrow R1b in FIG. 59.

Figure 60:
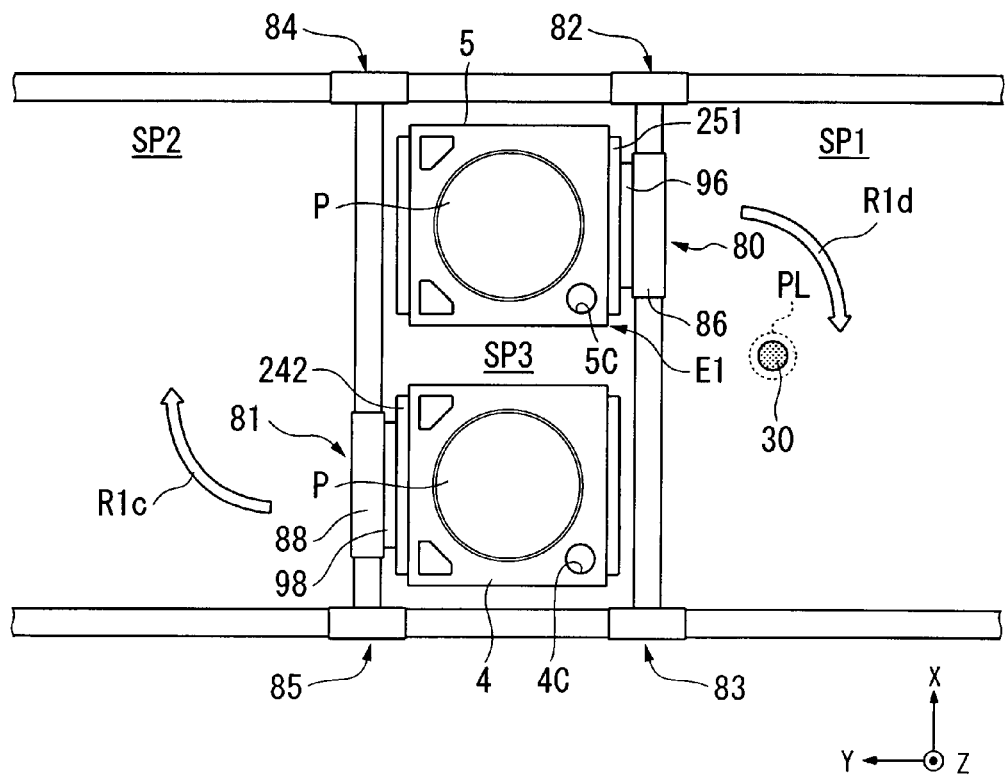
FIG. 60 is a drawing used to explain the exposure method in the tenth embodiment.

Next, as shown in FIG. 60, in the third area SP3 the connection of the joint member 96 of the slider 86 and the first joint member 241 of the first substrate stage 4, and the connection of the joint member 98 of the slider 88 and the fourth joint member 252 of the second substrate stage 5, are released. The first substrate stage 4 is connected to the slider 88 of the linear motor 81 via the second joint member 242 and the joint member 98, and in addition the second substrate stage 5 is connected to the slider 86 of the linear motor 80 via the third joint member 51 and the joint member 96.

Thus in the third area SP3, the slider 86 of the linear motor 80 which had been connected to the first substrate stage 4 is connected to the second substrate stage 5, and the slider 88 of the linear motor 81 which had been connected to the second substrate stage 5 is connected to the first substrate stage 4.

In the following description, an operation to release the connection of the slider 86 with the substrate stage 4 (or 5), release the connection of the slider 88 with the substrate stage 5 (or 4), connect the slider 86 with the substrate stage 5 (or 4), and connect the slider 88 to the substrate stage 4 (or 5), is called a switching operation of two substrate stages and two sliders.

Next, the control device 7 controls the substrate stage driving device PD to move the second substrate stage 5 to the first area SP1 of the exposure station ST1, and moves the first substrate stage 4 to the second area SP2 of the measurement station ST2. When the first substrate stage 4 moves from the third area SP3 to the second area SP2, movement is along the path indicated by the arrow R1c in FIG. 60. When the second substrate stage 5 moves from the third area SP3 to the first area SP1, movement is along the path indicated by the arrow R1d in FIG. 60.

At this time, the control device 7 moves the second substrate stage 5 from the third area SP3 to the first area SP1, such that the cap member 30 held by the seal member 212 is opposed to the second cap holder 5C provided on the second substrate stage 5. Here, as shown in FIG. 60, among the first through fourth corners E1 to E4 of the upper surface 5F of the second substrate stage 5 (substrate table 5T), the second cap holder 5C of the second substrate stage 5 is positioned at the first corner E1 closest to the final optical element FL when the second substrate stage 5 is positioned in the third area SP3. Specifically, when the second substrate stage 5 holding an unexposed substrate P is positioned in the +X part area of the third area SP3, the second cap holder 5C is positioned at the first corner E1 closest to the position directly below the final optical element FL (the position directly below the cap member 30 held by the seal member 212) in the first area SP1 among the first through fourth corners E1 to E4 of the upper surface 5F of the substrate table 5T.

Even when, prior to exposing the substrate P held by the second substrate stage 5, the cap member 30 is released from the seal member 212 and is held by the second cap holder 5C of the second substrate stage 5, when the second substrate stage 5 is positioned in the third area SP3, by positioning the second cap holder 5C on the second substrate stage 5 at the first corner E1 closest to the final optical element FL among the first through fourth corners E1 to E4 of the upper surface 5F, the distance of movement when the second substrate stage 5 moves from the third area SP3 to the first area SP1 in order that the cap member 30 held by the seal member 212 is opposed to the second cap holder 5C can be shortened. That is, the second cap holder 5C is provided at a prescribed position of the second substrate stage 5, such that when the second substrate stage 5 is moved from the third area SP3 to the first area SP1 in order to have the second cap holder 5C hold the cap member 30 held by the seal member 212, the distance of movement of the second substrate stage 5 is shortened.

Figure 61:
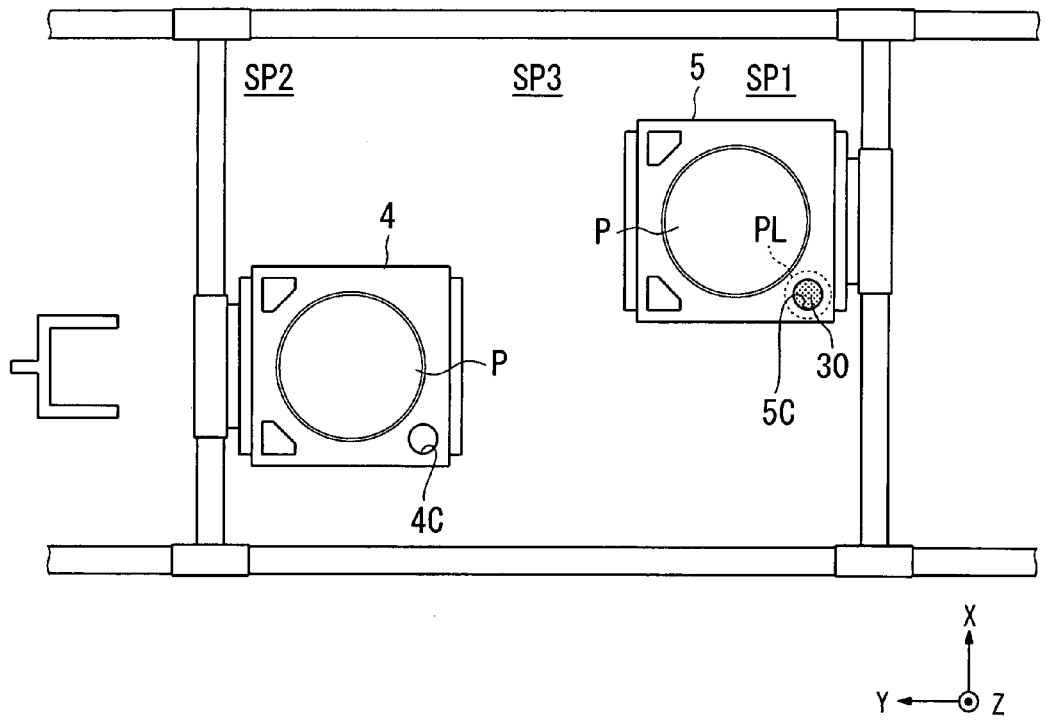
FIG. 61 is a drawing used to explain the exposure method in the tenth embodiment.

As shown in FIG. 61, the control device 7 moves the second substrate stage 5 such that the cap member 30 held by the seal member 212 is opposed to the second cap holder 5C on the second substrate stage 5. When the second cap holder 5C is positioned below the cap member 30, the control device 7 moves the second substrate stage 5 in horizontal directions with the second substrate table 5T lowered a prescribed distance in the −Z direction relative to the cap member 30 held by the seal member 212, in order that the seal member 212 and/or the cap member 30 held by the seal member 212 does not strike the second substrate stage 5.

Figure 75:
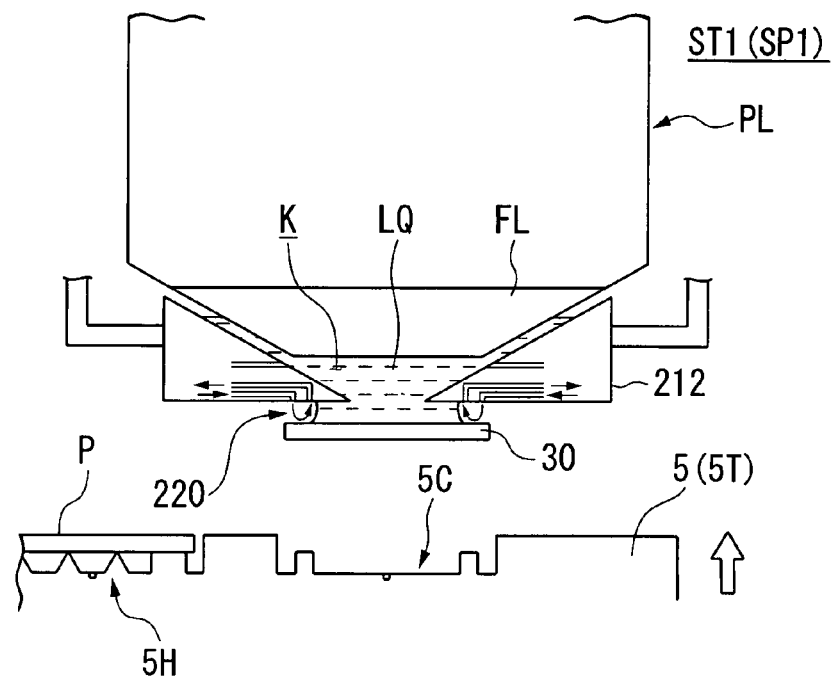
FIG. 75 is a drawing used to explain the exposure method in the tenth embodiment.

As described above, the second cap holder 5C is provided at a prescribed position of the second substrate stage 5 such that the distance of movement of the second substrate stage 5 when the second substrate stage 5 moves from the third area SP3 to the first area SP1 is shortened; hence as shown in FIG. 75, the second cap holder 5C of the second substrate stage 5 can be positioned under the cap member 30 held by the seal member 212 in a short time.

The control device 7 adjusts the positional relation in the Z-axis direction of the cap member 30 held by the seal member 212 and the second cap holder 5C on the second substrate stage 5, and places the cap member 30 held by the seal member 212 on the second cap holder 5C. Specifically, the control device 7 controls the second driving system PD2 to move the second substrate table 5T upward (in the +Z direction), causing the lower surface of the cap member 30 held by the seal member 212 to make contact with the upper surface of the second cap holder 5C. At this time, position information in the XY directions for the second substrate table 5T is measured by the laser interference system 2, and position information in the Z-axis direction is measured by the measurement device of the second driving system PD2. The control device 7 can execute control such that the cap holder 5C of the second substrate stage 5 is positioned at the desired position relative to the cap member 30 held by the seal member 212.

Figure 76:
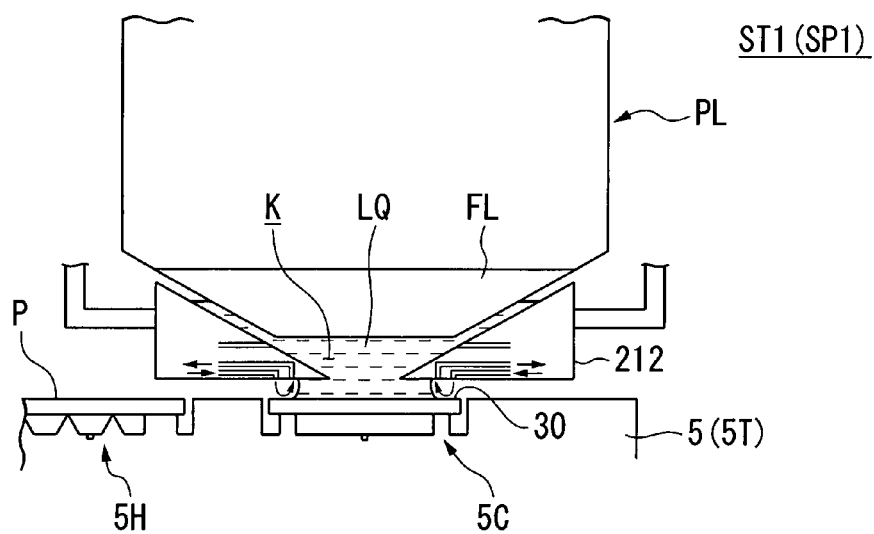
FIG. 76 is a drawing used to explain the exposure method in the tenth embodiment.

After bringing the cap member 30 held by the seal member 212 into contact with the second cap holder 5C, the control device 7 controls the vacuum system connected to the suction aperture 263 of the second cap holder 5C, and vacuum-clamps the cap member 30 with the second cap holder 5C. By this means, as shown in FIG. 61 and FIG. 76, a liquid immersion region LR of liquid LQ is formed above the cap member 30 held by the second cap holder 5C. Furthermore, a gas bearing 220 is formed between the lower surface of the seal member 212 and the upper surface of the cap member 30, and a gap G is maintained between the lower surface of the seal member 212 and the upper surface of the cap member 30 held by the second cap holder 5C.

Figure 62:
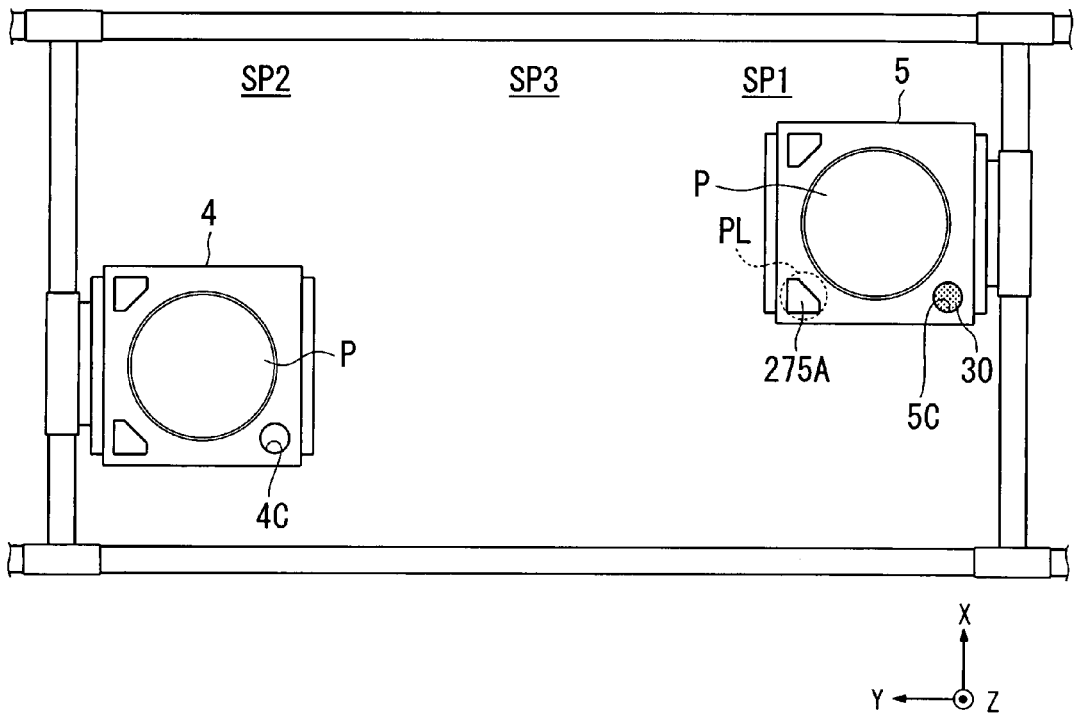
FIG. 62 is a drawing used to explain the exposure method in the tenth embodiment.

As shown in FIG. 62, the control device 7 moves the liquid immersion region LR of liquid LQ, formed above the cap member 30 held by the second cap holder 5C, from above the cap member 30 to the first measurement region 275A of the second substrate stage 5. In this way, the cap member 30 held by the seal member 212 is released from the seal member 212 before initiation of exposure of the substrate P held by the second substrate stage 5, and is held by the second cap holder 5C positioned on the second substrate stage 5.

In order to move the liquid immersion region LR of liquid LQ formed above the cap member 30 held by the second cap holder 5C onto the first measurement region 275A of the second substrate stage 5, the control device 7 moves the second substrate stage 5 in XY directions relative to the final optical element FL and seal member 212. With liquid LQ held between the final optical element FL of the projection optical system PL and the second substrate stage 5, the control device 7 uses the substrate stage driving device PD to move the second substrate stage 5 in XY directions, such that the first measurement region 275A on the second substrate stage 5 is opposed to the final optical element FL. By this means, the liquid immersion region LR of liquid LQ formed above the cap member 30 can be moved onto the first measurement region 275A on the second substrate stage 5.

Here, after holding the cap member 30 held by the seal member 212 with the second cap holder 5C of the second substrate stage 5, when the control device 7 moves the liquid immersion region LR on the cap member 30 onto the first measurement region 275A, the liquid LQ in the liquid immersion region LR moves relative to the liquid immersion region LR and the second substrate stage 5 so as not to make contact with the substrate P held by the second substrate stage 5. With the liquid immersion region LR of liquid LQ formed above the first measurement region 275A, the control device 7 uses the first measurement region 275A to for example perform prescribed measurements to acquire alignment information, as explained referring to the flowchart of FIG. 56.

Figure 63:
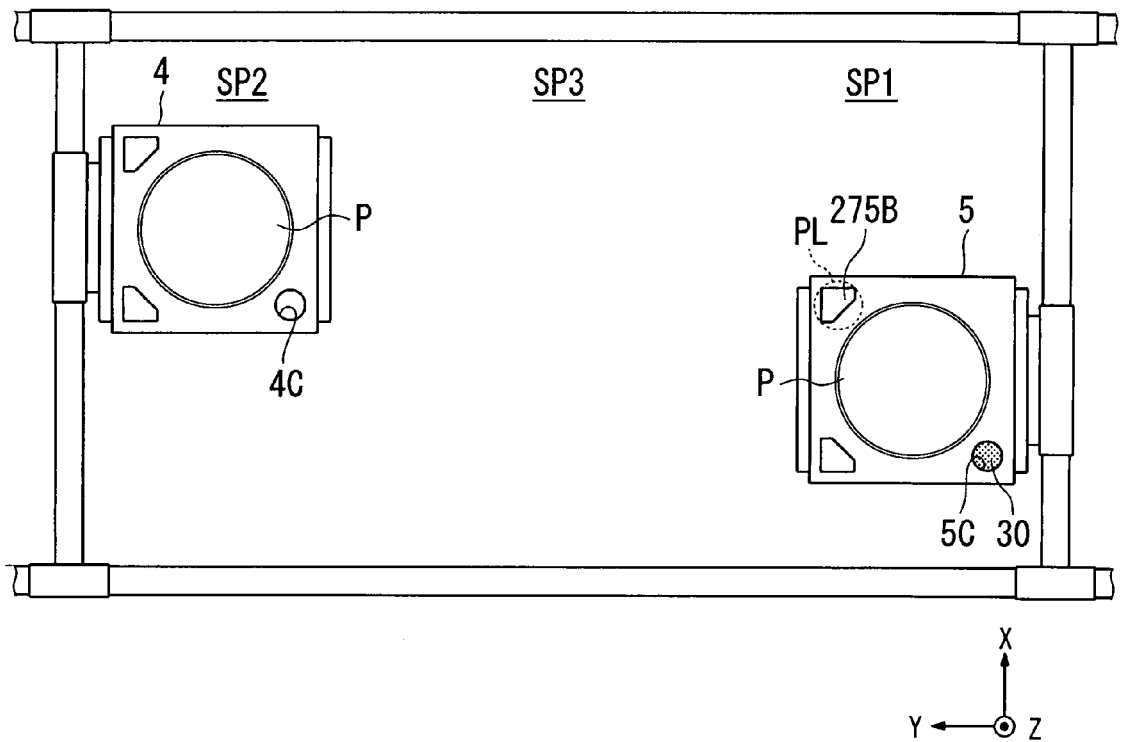
FIG. 63 is a drawing used to explain the exposure method in the tenth embodiment.

After measurements using the first measurement region 275A have ended, the control device 7 moves the second substrate stage 5 in XY directions relative to the final optical element FL and seal member 212, in order to move the liquid immersion region LR of liquid LQ formed above the first measurement region 275A of the second substrate stage 5 onto the second measurement region 275B of the second substrate stage 5, as shown in FIG. 63. With liquid LQ held between the final optical element FL of the projection optical system PL and the second substrate stage 5, the control device 7 uses the substrate stage driving device PD to move the second substrate stage 5 in XY directions such that the second measurement region 275B on the second substrate stage 5 and the final optical element FL are opposed. By this means, the control device 7 can move the liquid immersion region LR of liquid LQ formed in the first measurement region 275A onto the second measurement region 275B.

When moving the liquid immersion region LR above the first measurement region 275A to the second measurement region 275B also, the control device 7 moves the second substrate stage 5 relative to the liquid immersion region LR such that the liquid LQ of the liquid immersion region LR does not make contact with the substrate P held by the second substrate stage 5. And, with the liquid immersion region LR of liquid LQ formed above the second measurement region 275B, the control device 7 uses the second measurement region 275B to perform prescribed measurements to for example acquire alignment information, as explained referring to FIG. 56.

Figure 64:
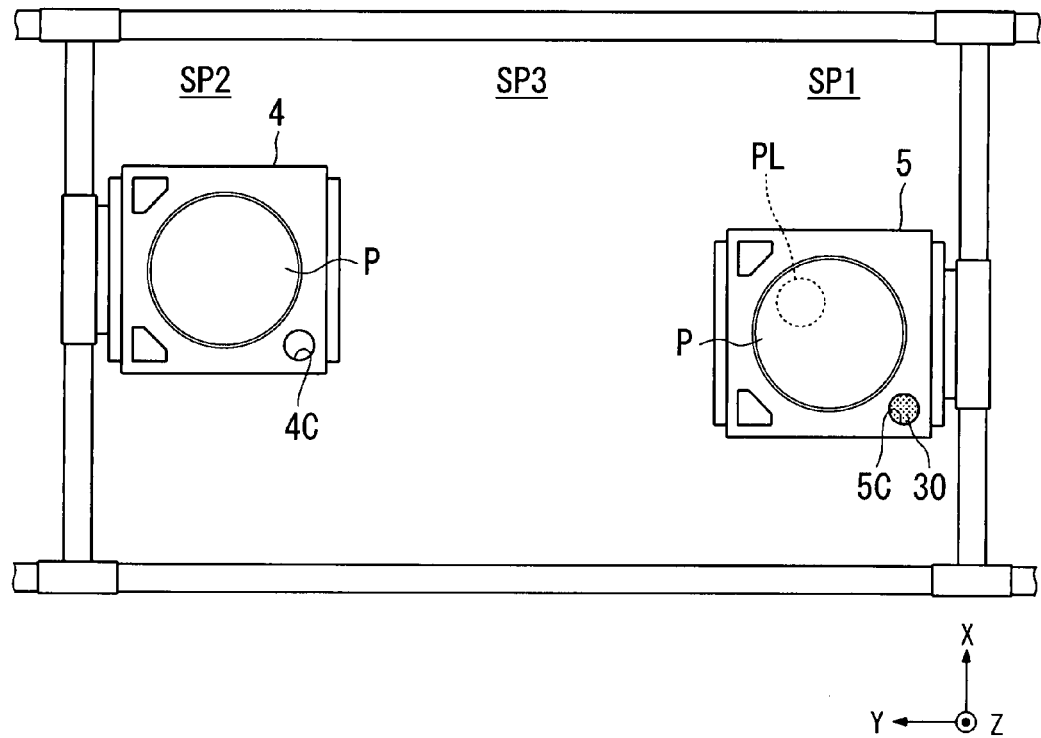
FIG. 64 is a drawing used to explain the exposure method in the tenth embodiment.
Figure 77:
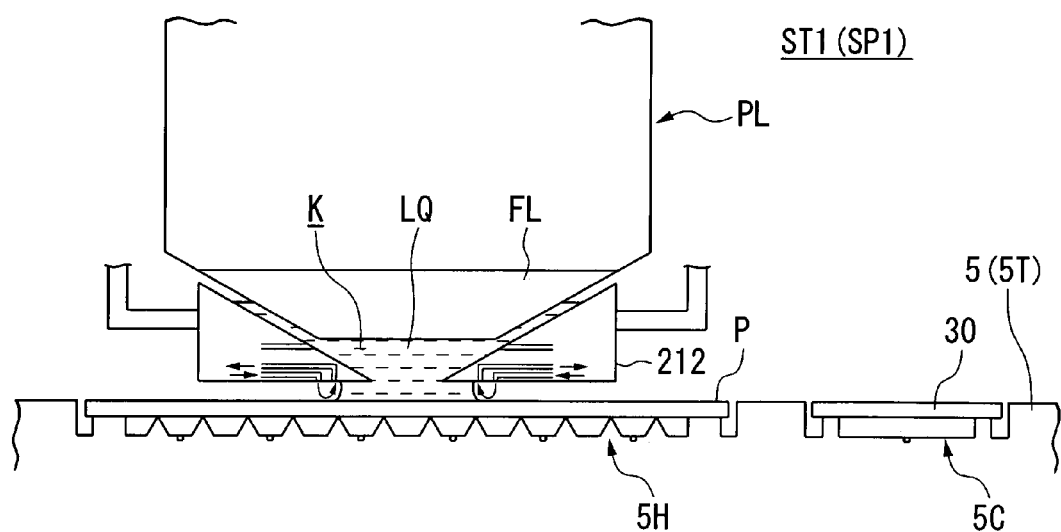
FIG. 77 is a drawing used to explain the exposure method in the tenth embodiment.

After the end of measurements using the second measurement region 275B, the control device 7 moves the second substrate stage 5 in XY directions relative to the final optical element FL and seal member 212 as shown in FIG. 64, in order to move the liquid immersion region LR of liquid LQ formed above the second measurement region 275B of the second substrate stage 5 over the substrate P held by the substrate holder 5H of the second substrate stage 5. With liquid LQ held between the final optical element FL of the projection optical system PL and the second substrate stage 5, the control device 7 uses the substrate stage driving system PD to move the second substrate stage 5 in XY directions such that the substrate P on the second substrate stage 5 and the final optical element FL are opposed. By this means, as shown in FIG. 64 and FIG. 77, the control device 7 can move the liquid immersion region LR of liquid LQ formed on the second measurement region 275B on the second substrate stage 5 onto the substrate P.

As described referring to the flowchart of FIG. 56, while adjusting the position of the substrate P held by the second substrate stage 5 based on the measurement results at the measurement station ST2 and the measurement results using the first and second measurement regions 275A, 275B at the exposure station ST1, the control device 7 exposes the substrate P via the projection optical system PL and liquid LQ. A plurality of shot areas are set on the substrate P; after forming a liquid immersion region LR on the second measurement region 275B and performing prescribed measurements, the control device 7 initiates exposure from a shot area close to the second measurement region 275A among the plurality of shot areas on the substrate P, as shown in FIG. 64.

During exposure of the substrate P held by the substrate holder 5H of the second substrate stage 5, the second cap holder 5C provided in the first corner E1 on the second substrate stage 5 holds the cap member 30. Also, when the second substrate stage 5 is positioned in the first area SP1, the first substrate stage 4 is at the second area SP2 of the measurement station ST2 comprising the substrate exchange position RP, and measurement processing, substrate exchange processing, and other prescribed processing are performed.

Figure 65:
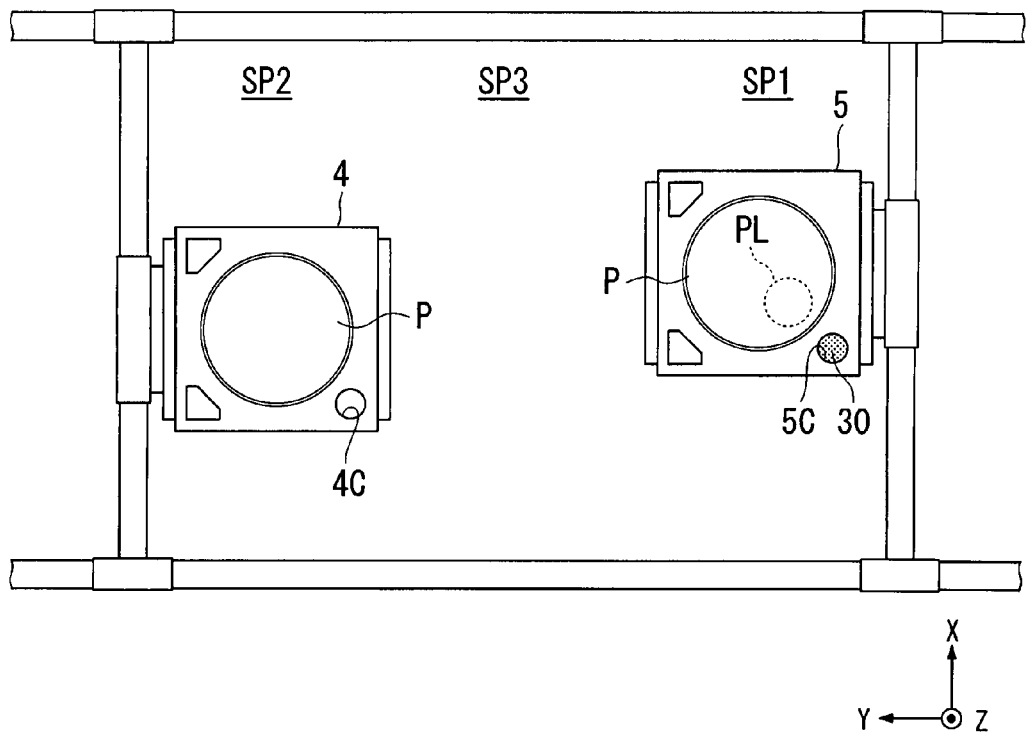
FIG. 65 is a drawing used to explain the exposure method in the tenth embodiment.

The control device 7 successively exposes the plurality of shot areas set on the substrate P. And, as shown in FIG. 65, when the plurality of shot areas on the substrate P held by the second substrate stage 5 are successively exposed, the control device 7 ends exposure at a shot area close to the second cap holder 5C among the plurality of shot areas, as shown in FIG. 65.

Figure 66:
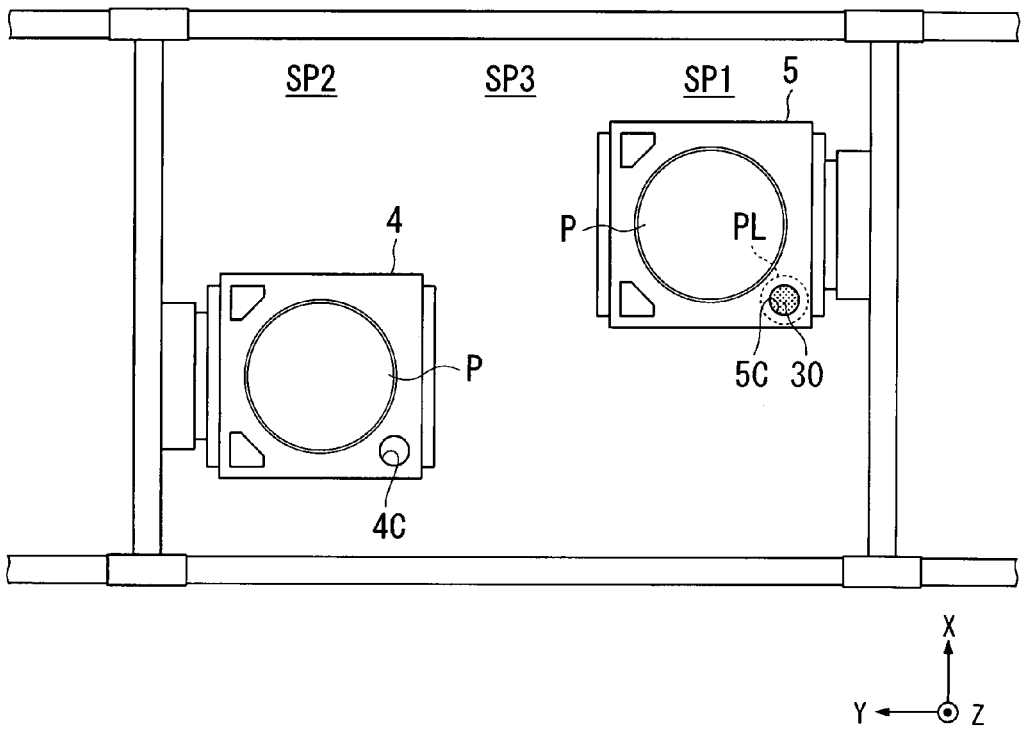
FIG. 66 is a drawing used to explain the exposure method in the tenth embodiment.

As shown in FIG. 66, after liquid immersion exposure of the plurality of shot areas on the substrate P held by the second substrate stage 5 has ended, the control device 7 moves the second substrate stage 5 in XY directions relative to the final optical element FL and seal member 212, in order to move the liquid immersion region LR of liquid LQ formed on the substrate P held by the substrate holder 5H onto the cap member 30 held by the second cap holder 5C. The control device 7 uses the substrate stage driving device PD to move the second substrate stage 5 in XY directions, such that, with liquid LQ held between the final optical element FL of the projection optical system PL and the second substrate stage 5, the cap member 30 held by the second cap holder 5C is opposed to the final optical element FL. By this means, the liquid immersion region LR of liquid LQ formed on the substrate P can be moved onto the cap member 30 held by the second cap holder 5C.

Next, the control device 7 releases the holding of the cap member 30 by the second cap holder 5C. By this means, the second cap holder 5C can release the cap member 30. With a gas bearing 220 formed between the upper surface of the cap member 30 and the lower surface of the seal member 212, the second substrate table 5T is lowered a prescribed distance in the −Z direction, similarly to the operation of the first substrate stage 4 explained referring to FIG. 72 and FIG. 73, and after release of the cap member 30 from the upper surface of the cap holder 5C, the second substrate stage 5 is moved from the first area SP1 toward the third area SP3. A gas bearing 220 is formed between the lower surface of the seal member 212 and the upper surface of the cap member 30. With the gap G maintained between the lower surface of the seal member 212 and the upper surface of the cap member 30, the cap member 30 can be held at the lower surface of the seal member 212.

In this way, the cap member 30 held by the second cap holder 5C is released from the second cap holder 5C, and is held by the seal member 212 so as to oppose the final optical element FL.

Figure 67:
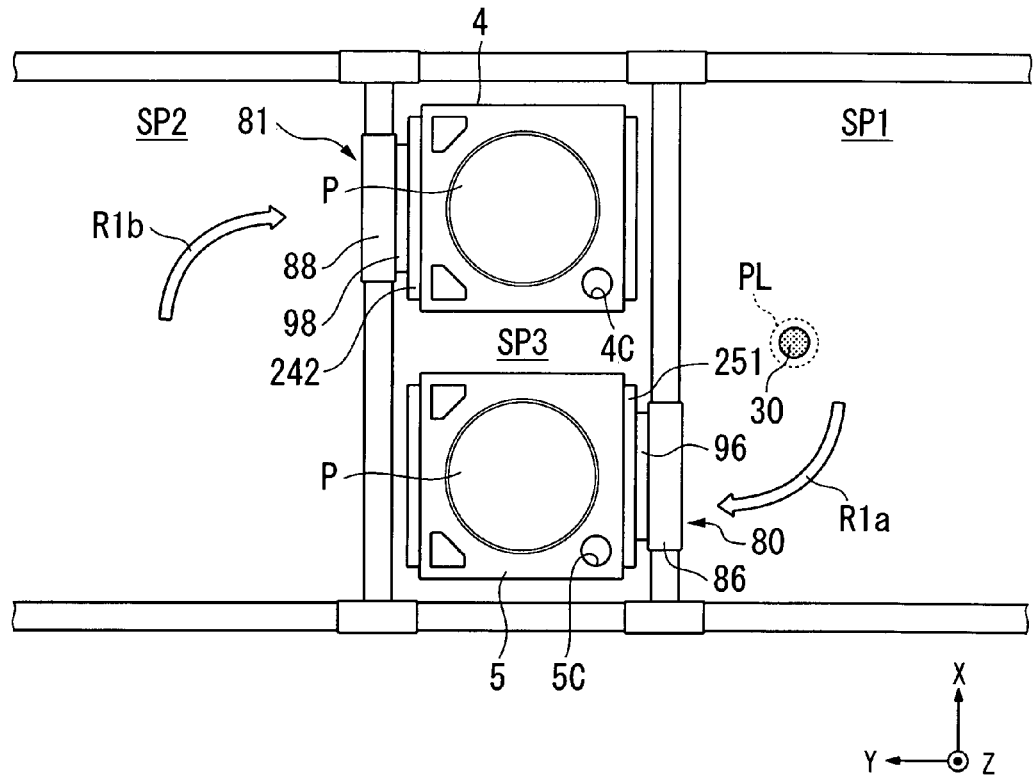
FIG. 67 is a drawing used to explain the exposure method in the tenth embodiment.

Next, the control device 7 uses the laser interference system 2 to measure the positions of the first and second substrate stage 4, 5, while controlling the substrate stage driving PD to move the first substrate stage 4 and second substrate stage 5 to the third area SP3, as shown in FIG. 67. In this embodiment, the second substrate stage 5, having moved from the first area SP1 to the third area SP3, is positioned in the −X part area of the third area SP3, as in the figure. The first substrate stage 4, having moved from the first area SP1 to the third area SP3, is positioned in the +X part area of the third area SP3, as in the figure. When the second substrate stage 5 moves from the first area SP1 to the third area SP3, movement is along the path indicated by the arrow R1$a$ in FIG. 67, and when the first substrate stage 4 moves from the second area SP2 to the third area SP3, movement is along the path indicated by the arrow R1$b$ in FIG. 67.

Figure 68:
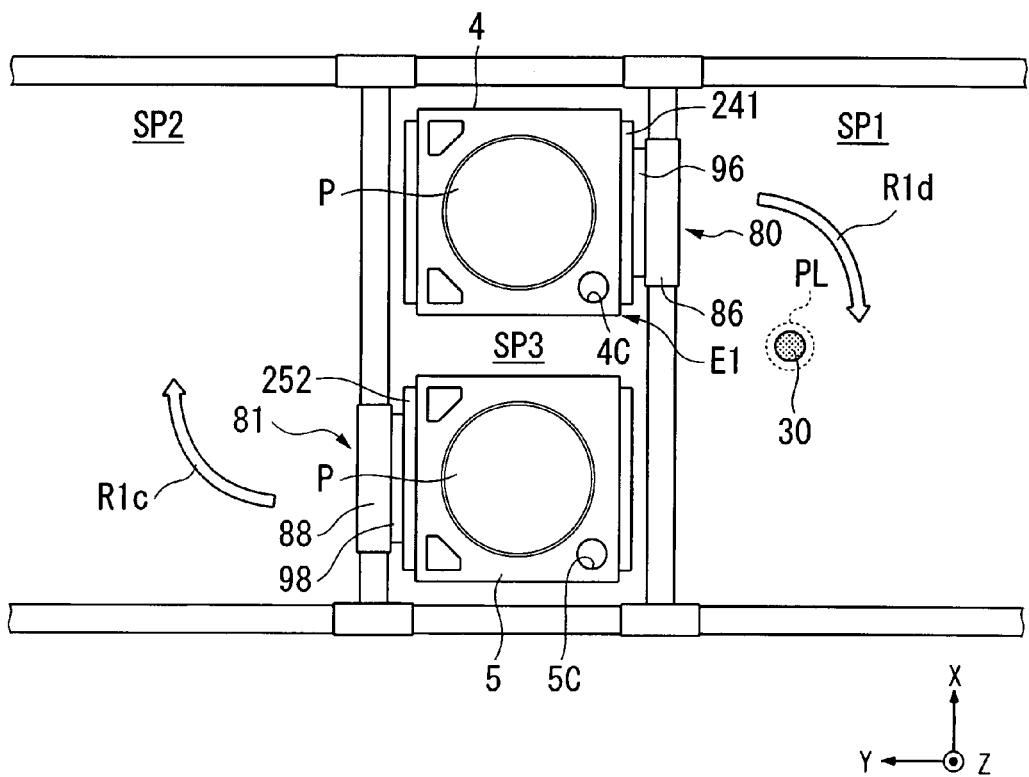
FIG. 68 is a drawing used to explain the exposure method in the tenth embodiment.

Next, as shown in FIG. 68, a switching operation of the two substrate stages 4, 5 with the two sliders 86, 88 is performed in the third area SP3. That is, the second substrate stage 5 is connected to the slider 88 of the linear motor 81, and the first substrate stage 4 is connected to the slider 86 of the linear motor 80.

The control device 7 controls the substrate stage driving device PD to move the first substrate stage 4 to the first area SP1 of the exposure station ST1, and to move the second substrate stage 5 to the second area SP2 of the measurement station ST2. When the second substrate stage 5 moves from the third area SP3 to the second area SP2, movement is along the path indicated by the arrow R1$c$ in FIG. 68; and when the first substrate stage 4 moves from the third area SP3 to the first area SP1, movement is along the path indicated by the arrow R1$d$ in FIG. 68.

The control device 7 moves the first substrate stage 4 from the third area SP3 to the first area SP1 such that the cap member 30 held by the seal member 212 and the first cap holder 4C provided on the first substrate stage 4 are opposed. Here, as shown in FIG. 68, among the first through fourth corners E1 to E4 of the upper surface 4F of the first substrate stage 4 (substrate table 4T), when the first substrate stage 4 is positioned in the third area SP3, the first cap holder 4C is positioned at the first corner E1 closest to the final optical element FL. Specifically, when the first substrate stage 4 holding an unexposed substrate P is positioned in the +X part area of the third area SP3, the first cap holder 4C is positioned at the first corner E1 closest to the position directly below the final optical element FL in the first area SP1 (the position directly below the cap member 30 held by the seal member 212), among the first through fourth corners E1 to E4 of the upper surface of the substrate table 4T.

In this way, when the first substrate stage 4 is positioned in the third area SP3, the first cap holder 4C is positioned at the first corner E1 closest to the final optical element FL among the first through fourth corners E1 to E4 of the upper surface 4F, so that the movement distance when the first substrate stage 4 is moved from the third area SP3 to the first area SP1 in order that the cap member 30 held by the seal member 212 is opposed to the first cap holder 4C can be shortened. That is, the first cap holder 4C is provided at a prescribed position on the first substrate stage 4 in order to shorten the movement distance of the first substrate stage 4 when the first substrate stage 4 is moved from the third area SP3 to the first area SP1 in order to cause the first cap holder 4C to hold the cap member 30 held by the seal member 212.

Figure 69:
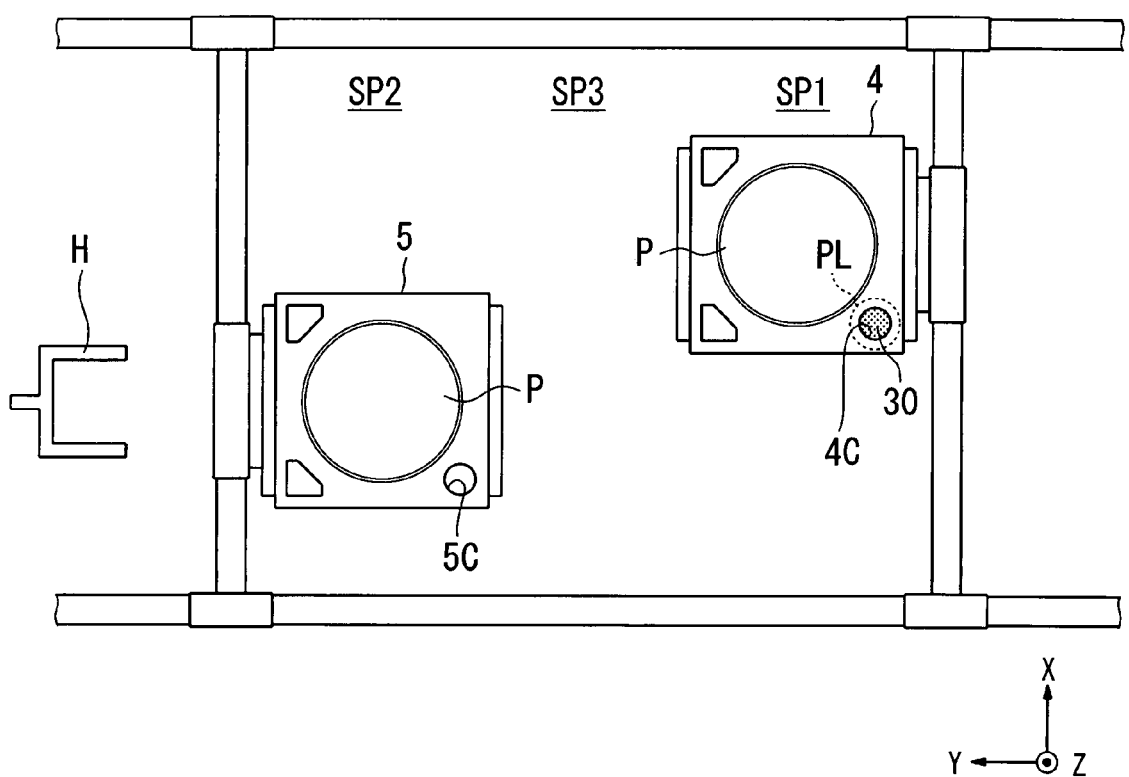
FIG. 69 is a drawing used to explain the exposure method in the tenth embodiment.

As shown in FIG. 69, the control device 7 opposes the lower surface of the cap member 30 held by the seal member 212 and the first cap holder 4C on the first substrate stage 4. The first cap holder 4C is provided on the first substrate stage 4 such that the movement distance of the first substrate stage 4 is shortened when moving the first substrate stage 4 from the third area SP3 to the first area SP1 in order to cause the first cap holder 4C to hold the cap member 30 held by the seal member 212, and so the first cap holder 4C can be positioned below the cap member 30 held by the seal member 212 in a short time.

Next, similarly to the operation of the second substrate stage 5 explained referring to FIG. 75, the control device 7 moves the first substrate table 4T a prescribed distance in the +Z direction, and drives the vacuum system connected to the first cap holder 4C to hold the cap member 30 being held by the seal member 212 to the upper surface of the first cap holder 4C. By this means, a liquid immersion region LR of liquid LQ is formed above the cap member 30 held by the first cap holder 4C.

Then, the control device 7 uses the substrate stage driving device PD to move the first substrate stage 4 in XY directions such that the first measurement region 274A on the first substrate stage 4 is opposed to the final optical element FL, and releases the cap member 30 from the seal member 212, as well as moving the liquid immersion region LR of liquid LQ formed on the cap member 30 to the first measurement region 274A on the first substrate stage 4. When the liquid immersion region LR on the cap member 30 is moved to the first measurement region 274A, the control device 7 moves the first substrate stage 4 relative to the liquid immersion region LR such that the liquid LQ in the liquid immersion region LR does not make contact with the substrate P held by the first substrate stage 4. Then, with the liquid immersion region LR of liquid LQ formed on the first measurement region 274A, the control device 7 performs prescribed measurements using the first measurement region 274A, similarly to the operation explained referring to the flowchart of FIG. 56.

After measurements using the first measurement region 274A have ended, the control device 7 uses the substrate stage driving device PD to move the first substrate stage 4 in XY directions such that the second measurement region 274B on the first substrate stage 4 opposes the final optical element FL, and moves the liquid immersion region LR of liquid LQ formed on the first measurement region 274A onto the second measurement region 274B on the first substrate stage 4. When the liquid immersion region LR on the first measurement region 274A is moved onto the second measurement region 274B, the control device 7 moves the first substrate stage 4 relative to the liquid immersion region LR such that the liquid LQ of the liquid immersion region LR does not make contact with the substrate P held by the first substrate stage 4. Then, with the liquid immersion region LR of liquid LQ formed on the second measurement region 274B, the control device 7 performs prescribed measurements using the second measurement region 274B, similarly to the operation explained referring to the flowchart of FIG. 56.

After measurements using the second measurement region 274B have ended, the control device 7 moves the first substrate stage 4 in XY directions relative to the final optical element FL and seal member 212, in order to move the liquid immersion region LR of liquid LQ formed on the second measurement region 274B of the first substrate stage 4 onto the substrate P held by the substrate holder 4H of the first substrate stage 4. With liquid LQ held between the final optical element FL of the projection optical system PL and the first substrate stage 4, the control device 7 uses the substrate stage driving device PD to move the first substrate stage 4 in XY directions such that the substrate P on the first substrate stage 4 and the final optical element FL are opposed. By this means, the control device 7 can move the liquid immersion region LR of liquid LQ formed on the second measurement region 274B of the first substrate stage 4 onto the substrate P.

Based on the measurement results at the measurement station ST2 and the measurement results using the first and second measurement regions 274A, 274B at the exposure station ST1, the control device 7 adjusts the position of the substrate P held by the first substrate stage 4, while exposing the substrate P via the projection optical system PL and liquid LQ. A plurality of shot areas are set on the substrate P; after forming the liquid immersion region LR on the second measurement region 274A and performing prescribed measurements, the control device 7 initiates exposure from a shot area close to the second measurement region 274B among the plurality of shot areas on the substrate P.

The control device 7 successively exposes the plurality of shot areas set on the substrate P. And, when successively exposing the plurality of shot areas on the substrate P held by the first substrate stage 4, the control device 7 ends exposure at a short area close to the first cap holder 4C among the plurality of shot areas.

Below, the processing explained referring to FIG. 57 through FIG. 77 is repeated. That is, the substrate stage 4 (or 5), for which prescribed processing has been performed in the second area SP2, and which is connected to the slider 88, is moved to the +X part area of the third area SP3 along the movement path indicated by the arrow R1*b*, after which the substrate stage is connected to the slider 86 in the third area SP3 and moved to the first area SP1 along the movement path indicated by the arrow R1*d*. Then, the substrate stage 4 (or 5), for which prescribed processing has been performed in the first area SP1, and which is connected to the slider 86, is moved to the −X part area of the third area SP3 along the movement path indicated by the arrow R1*a*, after which the substrate stage is connected to the slider 88 in the third area SP3, and is moved to the second area SP2 along the movement path indicated by the arrow R1*c*. The slider 86 is connected in alternation to the first and second substrate stages 4, 5, and moves between the first area SP1 and the third area SP3; the slider 88 is connected in alternation to the first and second substrate stages 4, 5, and moves between the second area SP2 and the third area SP3.

In this embodiment, the first substrate stage 4 and the second substrate stage 5 move from the second area SP2 via the third area SP3 to the first area SP1, and from the first area SP1 via the third area SP3 to the second area SP2, over substantially the same paths. Specifically, the first and second substrate stages 4, 5 each move in clockwise fashion over the base member BP substantially parallel to the XY plane, as indicated by the arrows R1*a* to R1*d*, to move between the first area SP1 and the second area SP2.

Figure 78:
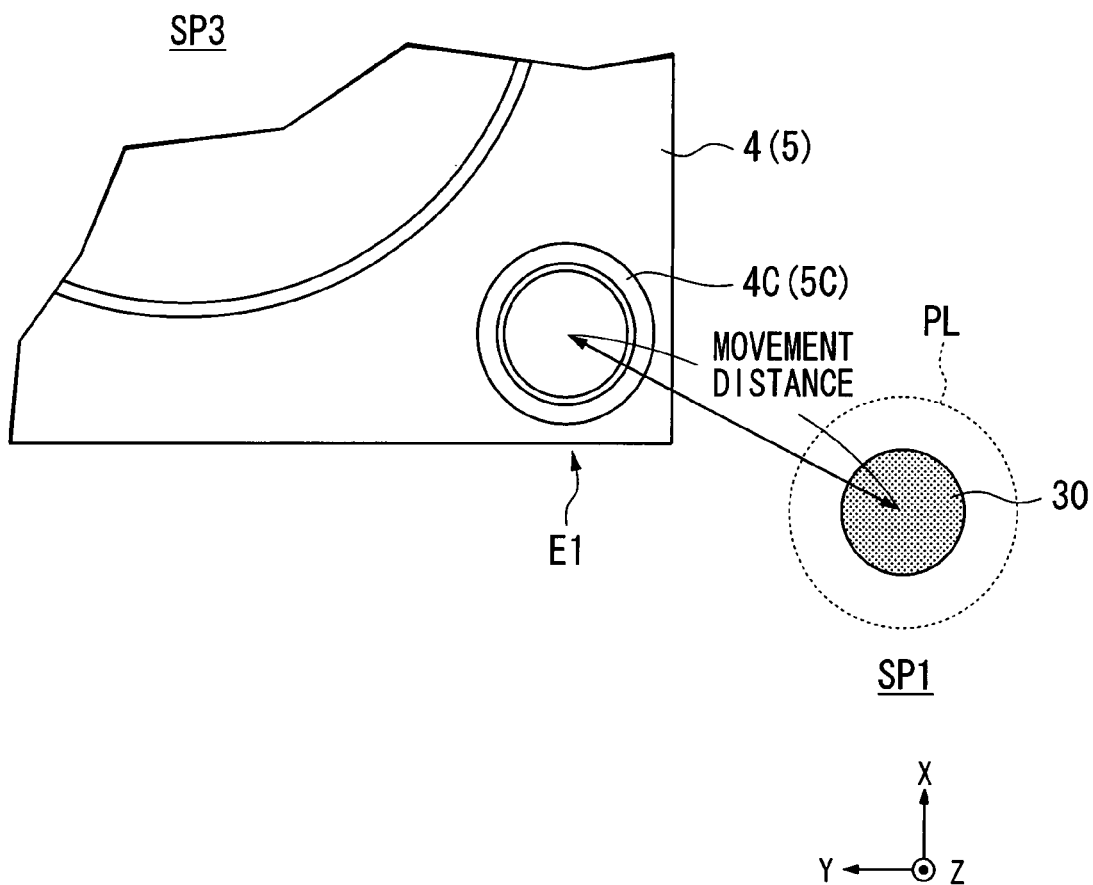
FIG. 78 is a schematic drawing used to explain the positional relation of a cap member held by a seal member and a cap holder.

On such a movement path, the first cap holder 4C and the second cap holder 5C are in substantially the same position on the first and second substrate stages 4 and 5, that is, are provided at the first corner E1, so that as shown schematically in FIG. 78, it is possible to shorten the movement distance to move the first and second substrate stages 4, 5 to the third area SP3 from the first area SP1 in order to cause the cap member 30 held by the seal member 212 to be opposed to the first and second cap holders 4C, 5C.

As described above, in this embodiment the first and second cap holders 4C, 5C are provided at prescribed positions on the first and second substrate stages 4, 5 such that the movement distance of the substrate stages 4, 5 is shortened when moving the first and second substrate stages 4, 5 from the third area SP3 to the first area SP1 in order to cause the cap member 30 held by the seal member 212 to be held by the first or second cap holder 4C, 5C. Consequently, the time required to pass the cap member 30 held by the seal member 212 from the seal member 212 to the first or second cap holder 4C, 5C can be shortened. Hence exposure of the next substrate P can be initiated in a short time after performing the switching operation of the two substrate stages 4, 5 with the two sliders 86, 88 in the third area SP3. As a result, reductions in throughput (the availability factor of the exposure apparatus EX) can be suppressed, and substrates P can be exposed efficiently.

Thus in this embodiment, prior to exposing the substrate P held by the substrate stage 4 (5), after holding the cap member 30 with the cap holder 4C (5C) positioned on the substrate stage 4 (5), the cap member 30 held by the seal member 212 is released from the seal member 212, and when the liquid immersion region LR on the cap member 30 is moved to the first and second measurement regions 274A, 274B (275A, 275B), the liquid immersion region LR and substrate stage 4 (5) are moved relative to each, other in order that the liquid LQ of the liquid immersion region LR does not come into contact with the substrate P held by the substrate stage 4 (5). That is, the liquid immersion region LR formed on the image-plane side of the projection optical system PL moves along the path indicated by the arrow RL in the schematic diagram of FIG. 79. When the substrate P and liquid LQ make contact, for example the properties of the film of photosensitive material formed on the substrate P and/or the properties of a topcoat film formed thereupon may change, or a prescribed substance may be eluted from the film into the liquid LQ, or other problems may arise. Hence prior to exposure of the substrate P, it is desirable that contact between the substrate P and liquid LQ be avoided insofar as possible. In this embodiment, as shown in the schematic diagram of FIG. 79, while the liquid immersion region LR on the cap member 30 held by the cap holder 4C (5C) is moved onto the measurement regions 274 (275), the substrate stage 4 (5) movement is controlled such that the liquid LQ of the liquid immersion region LR does not make contact with the substrate P held by the substrate stage 4 (5), that is, such that the liquid immersion region LR passes over the upper surface 4F (5F) of the substrate stage 4 (5), and so occurrence of the above-described problems can be avoided.

In this embodiment, when successively exposing the plurality of shot areas set on a substrate P, after a liquid immersion region LR is formed on the second measurement region 274B (275B) and prescribed measurements are performed, exposure is initiated from a shot area close to the second measurement region 274B (275B) among the plurality of shot areas, so that after the end of measurements, exposure of the substrate can be begun immediately. Hence throughput can be improved.

Figure 79:
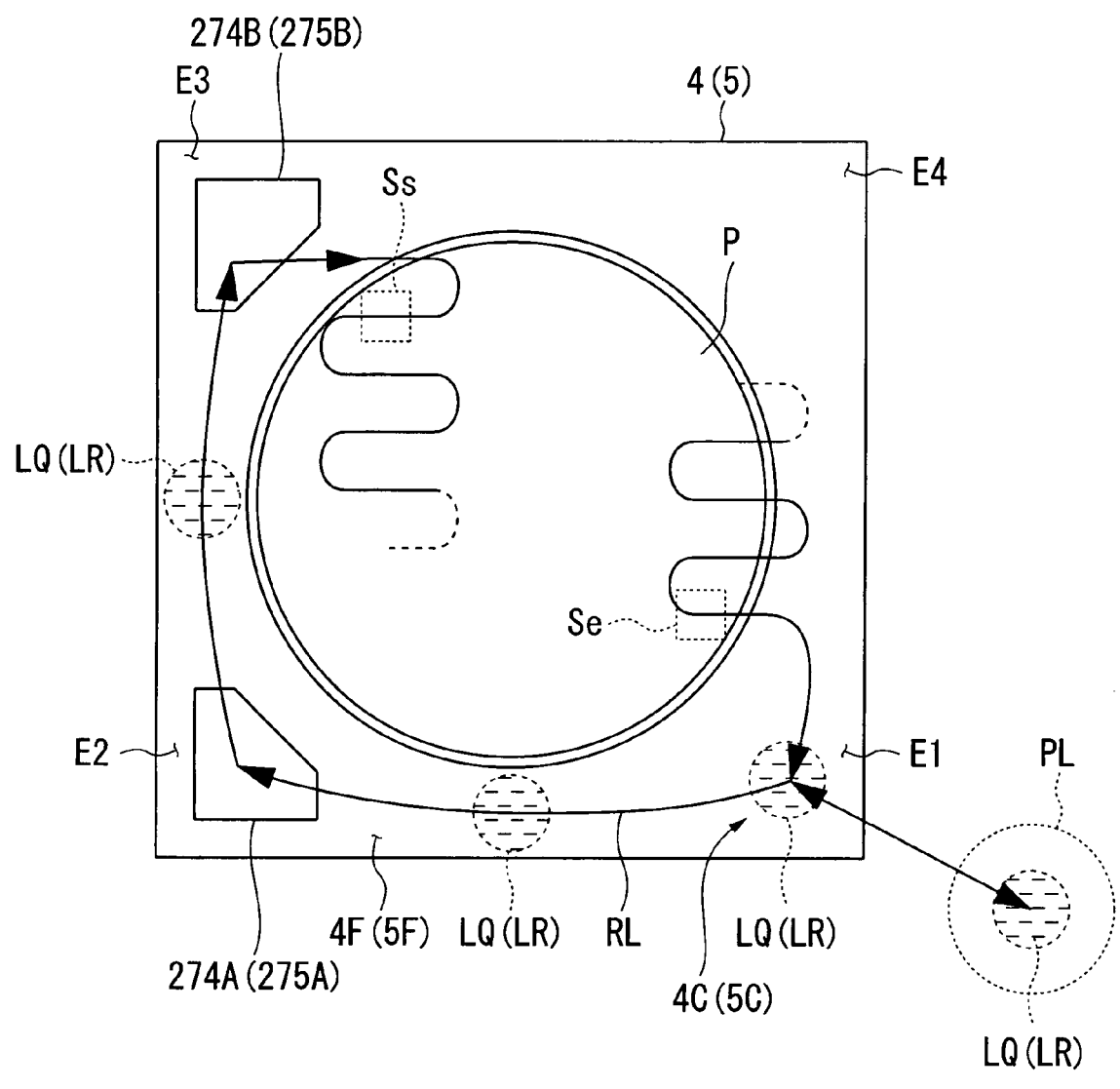
FIG. 79 is a schematic drawing used to explain the movement path of a liquid immersion region.

For example, as shown in the schematic diagram of FIG. 79, the distance between the shot area Ss first exposed among the plurality of shot areas on the substrate P held by the substrate stage 4 (5) and the measurement regions 274 (275) can be set to be shorter than the distance between the center of the substrate P and the measurement regions 274 (275), so that after the end of a measurement operation using the measurement regions 274 (275), exposure of the first shot area can be performed immediately.

Furthermore, in this embodiment, when successively exposing a plurality of shot areas set on a substrate P, exposure ends at a shot area close to the cap holder 4C (5C) among the plurality of shot areas, so that after the end of exposure of the substrate P, the liquid immersion region LR can immediately be moved onto the cap member 30, and the operation of holding the cap member 30 with the seal member 212 can be executed. Hence throughput can be improved.

For example, as shown in the schematic diagram of FIG. 79, by setting the distance between the shot area Se which is to be exposed last among the plurality of shot areas on the substrate P held by the substrate stage 4 (5) and the cap holder 4C (5C) to be shorter than the distance between the center of the substrate P and the cap holder 4C (5C), after exposure of the substrate P, the liquid immersion region LR can immediately be moved onto the cap member 30.

In this embodiment, when either one of the first and second substrate stages 4, 5 is positioned in the first area SP1, liquid LQ can be held between the final optical element FL and the first or second substrate stage 4, 5. When the first substrate stage 4 and the second substrate stage 5 have withdrawn from the first area SP1, liquid LQ can be held between the final optical element FL and the cap member 30. Thus in this embodiment, the space comprising the optical path space K on the light emission side of the final optical element FL can continue to be filled with liquid LQ. Hence drying of the final optical element FL can be prevented, and the formation of tracks of liquid LQ (in this embodiment, watermarks) on the final optical element FL and similar can be suppressed.

In this embodiment, each of the first and second substrate stages 4, 5 moves on the base member BP in a clockwise manner between the first area SP1 and the second area SP2; but movement may also be in the counterclockwise direction. In this case, the first cap holder 4C is provided in the fourth corner E4 on the first substrate stage 4, and the second cap holder 5C is provided in the fourth corner E4 on the second substrate stage 5.

11th Embodiment

Next, an 11th embodiment is explained. In the 11th embodiment, a characteristic portion different from the tenth embodiment is the fact that the first substrate stage 4 and the second substrate stage 5 move from the second area SP2 to the first area SP1 by different paths, and that the first cap holder 4C and the second cap holder 5C are provided in different positions on the first and second substrate stages 4, 5. In the following description, components the same as or similar to those of the tenth embodiments are denoted the same reference symbols, and description thereof is simplified or omitted.

Figure 80:
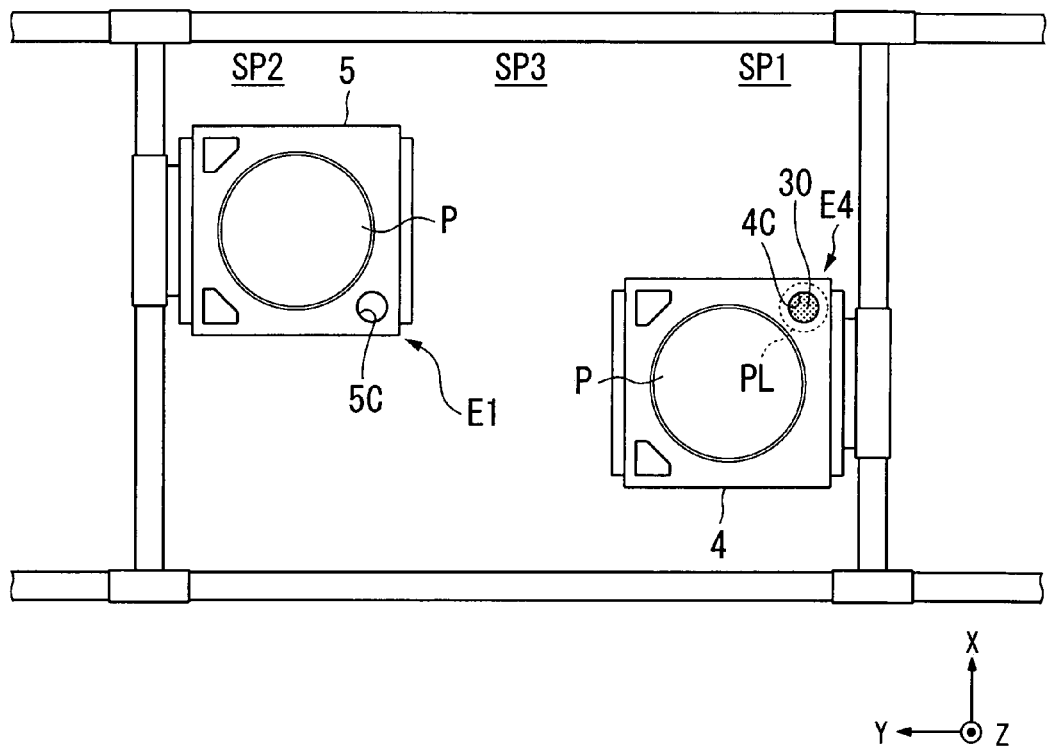
FIG. 80 is a drawing used to explain the exposure method according to an 11th embodiment.

In FIG. 80, liquid immersion exposure of a substrate P held by the first substrate stage 4 is performed in the first area SP1 of the exposure station ST1. At the measurement station ST2, measurement processing and similar is performed for the second substrate stage 5 holding a substrate P. The first cap holder 4C is positioned at the fourth corner E4 on the upper surface of the first substrate stage 4. The second cap holder 5C is positioned at the first corner E1 on the upper surface 5F of the second substrate stage 5.

After the end of liquid immersion exposure of the substrate P on the first substrate stage 4, the control device 7 moves the first substrate stage 4 such that the final optical element FL and the cap member 30 held by the first cap holder 4C are opposed, and moves the liquid immersion region LR of liquid LQ formed above the substrate P held by the substrate holder 4H of the first substrate stage 4 onto the cap member 30. Then, the control device 7 releases the cap member 30 from the first cap holder 4C, and, with the final optical element FL and cap member 30 opposed, holds the cap member 30 with the seal member 212.

Figure 81:
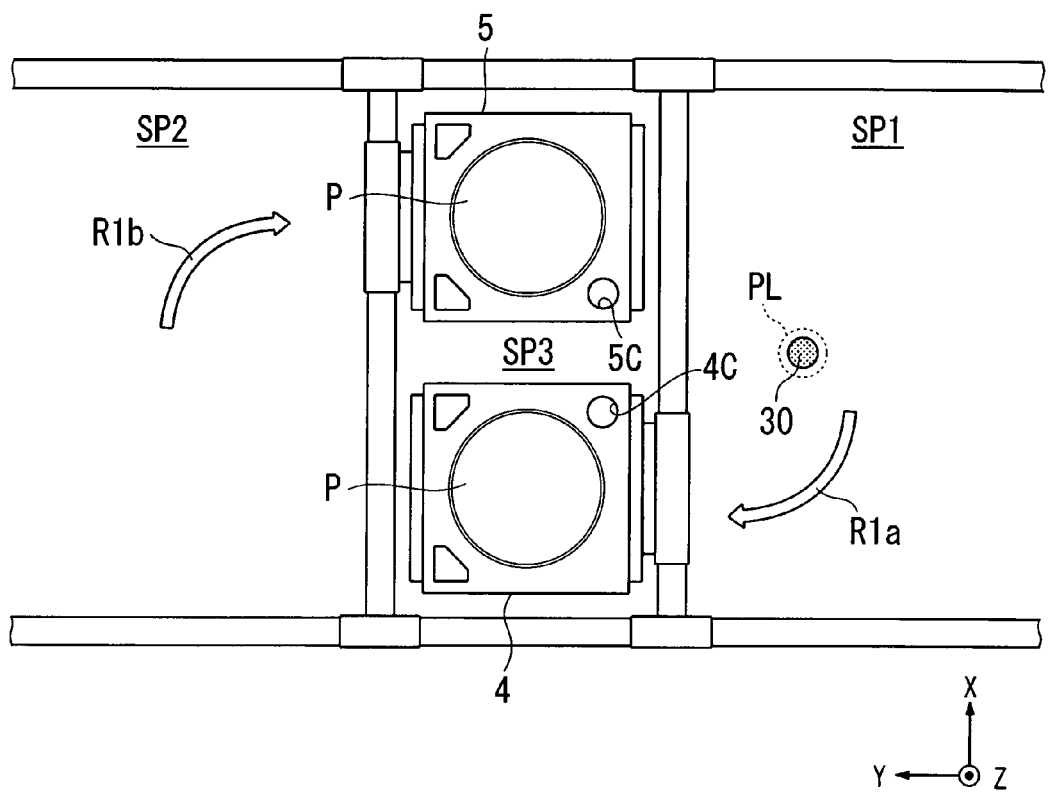
FIG. 81 is a drawing used to explain the exposure method according to the 11th embodiment.

Next, the control device 7 uses the laser interference system 2 to measure the positions of the first and second substrate stages 4, 5 while controlling the substrate stage driving device PD to move the first substrate stage 4 and the second substrate stage 5 to the third area SP3, as shown in FIG. 81. In this embodiment, upon moving from the first area SP1 to the third area SP3 the first substrate stage 4 is positioned in the −X part area of the third area SP3 in the figure, and upon moving from the second area SP2 to the third area SP3, the second substrate stage 5 is positioned in the +X part area of the third area SP3 in the figure. That is, when the first substrate stage 4 moves from the first area SP1 to the third area SP3, movement is along the path indicated by the arrow R1*a* in FIG. 81, and when the second substrate stage 5 moves from the second area SP2 to the third area SP3, movement is along the path indicated by the arrow R1*b* in FIG. 81.

Figure 82:
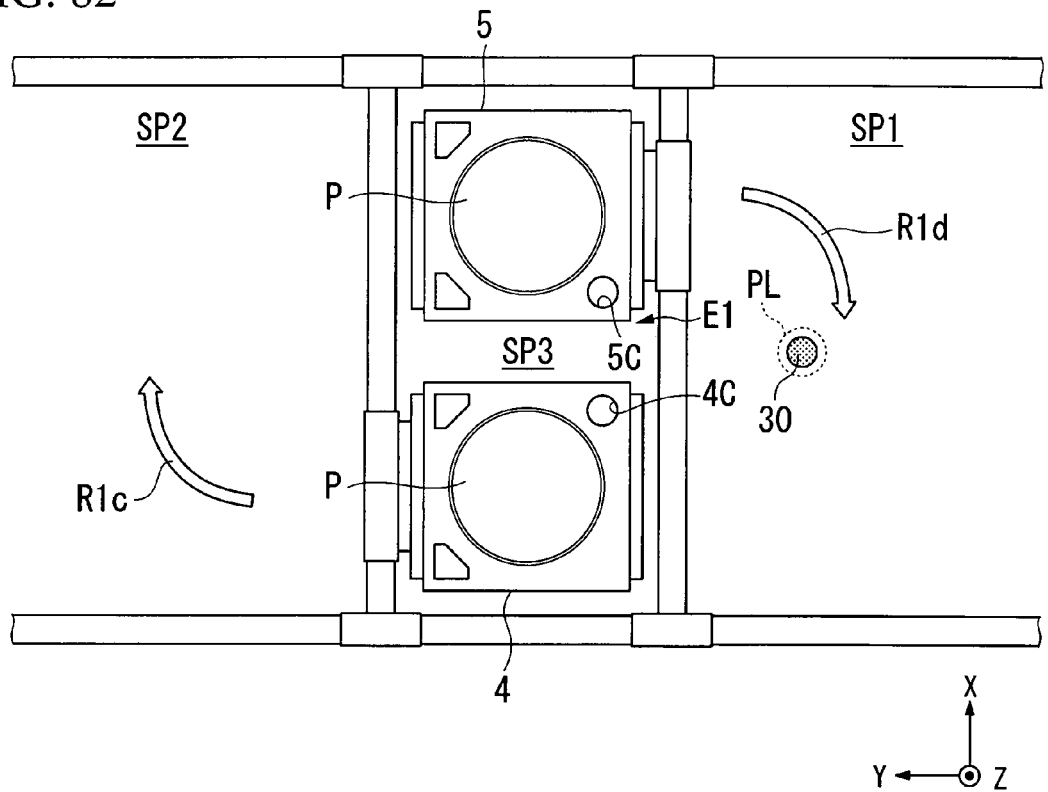
FIG. 82 is a drawing used to explain the exposure method according to the 11th embodiment.

Next, as shown in FIG. 82, the control device 7 performs a switching operation of the two substrate stages 4, 5 with the two sliders 86, 88 in the third area SP3.

The control device 7 controls the substrate stage driving device PD to move the second substrate stage 5 to the first area SP1 of the exposure station ST1, and to move the first substrate stage 4 to the second area SP2 of the measurement station ST2. When the first substrate stage 4 moves from the third area SP3 to the second area SP2, movement is along the path indicated by the arrow R1*c* in FIG. 82, and when the second substrate stage 5 moves from the third area SP3 to the first area SP1, movement is along the path indicated by the arrow R1*d* in FIG. 82.

Figure 83:
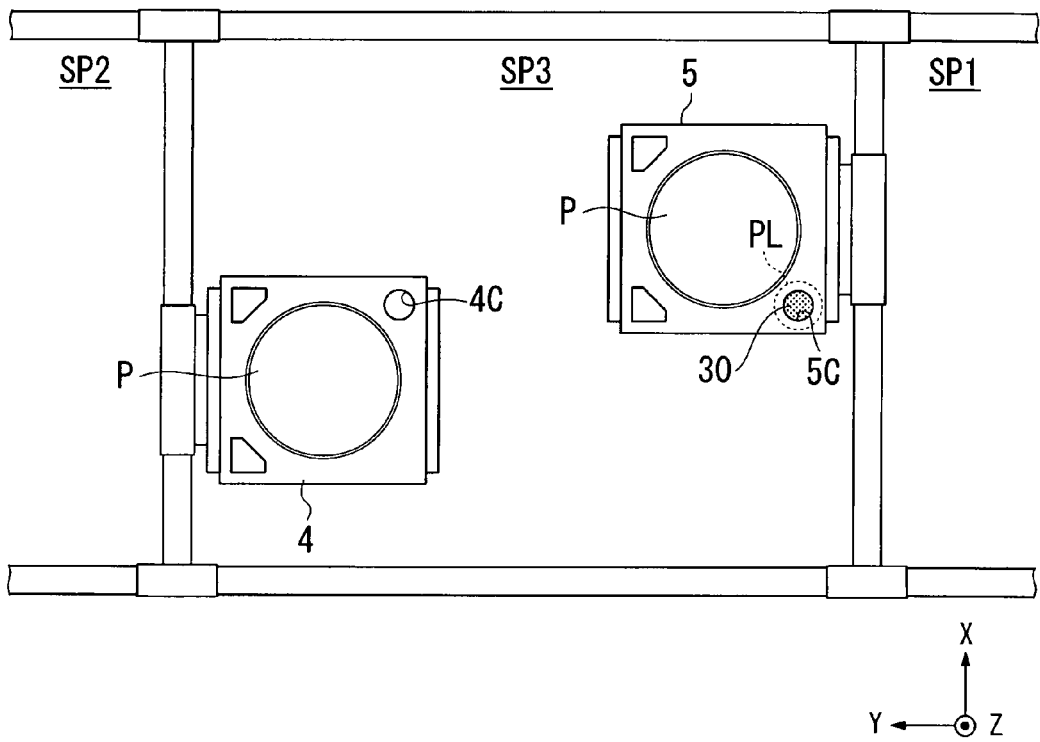
FIG. 83 is a drawing used to explain the exposure method according to the 11th embodiment.

As shown in FIG. 83, the control device 7 moves the second substrate stage 5 such that the cap member 30 held by the seal member 212 is opposed to the cap holder 5C provided on the second substrate stage 5. As shown in FIG. 82, the second cap holder 5C on the second substrate stage 5 is positioned in the first corner E1, among the first through fourth corners E1 to E4 of the upper surface 5F of the second substrate stage 5 (substrate table 5T), which is closest to the final optical element FL when the second substrate stage 5 is positioned in the third area SP3. Hence the movement distance can be shortened when moving the second substrate stage 5 from the third area SP3 to the first area SP1 to cause the cap member 30 held by the seal member 212 to be held by the second cap holder 5C.

Prior to exposure of the substrate P held by the second substrate stage 5, after holding the cap member 30 with the second cap holder 5C on the second substrate stage 5, the cap member 30 is released from the substrate stage 212 by the control device 7. That is, after holding the cap member 30 with the second cap holder 5C, the control device 7 moves the second substrate stage 5 in XY directions, and executes prescribed measurement processing similar to that in the tenth embodiment at the measurement regions 275 (275A, 275B) positioned to enable opposition to the final optical element FL above the second substrate stage 5. After the end of measurement processing and similar, the control device 7 successively exposes the plurality of shot areas set on the substrate P. When successively exposing the plurality of shot areas set on the substrate P, similarly to the above-described tenth embodiment, the control device 7 initiates exposure from the first shot area close to the second measurement region 275B, and ends exposure at the last shot area close to the second cap holder 5C. After the end of exposure of the plurality of shot areas on the substrate P, the control device 7 moves the second substrate stage 5 such that the final optical element FL and the second cap holder 5C are opposed, and releases the cap member 30 from the second cap holder 5C, and in addition holds the cap member 30 with the seal member 212 such that the final optical element FL and cap member 30 are opposed.

Figure 84:
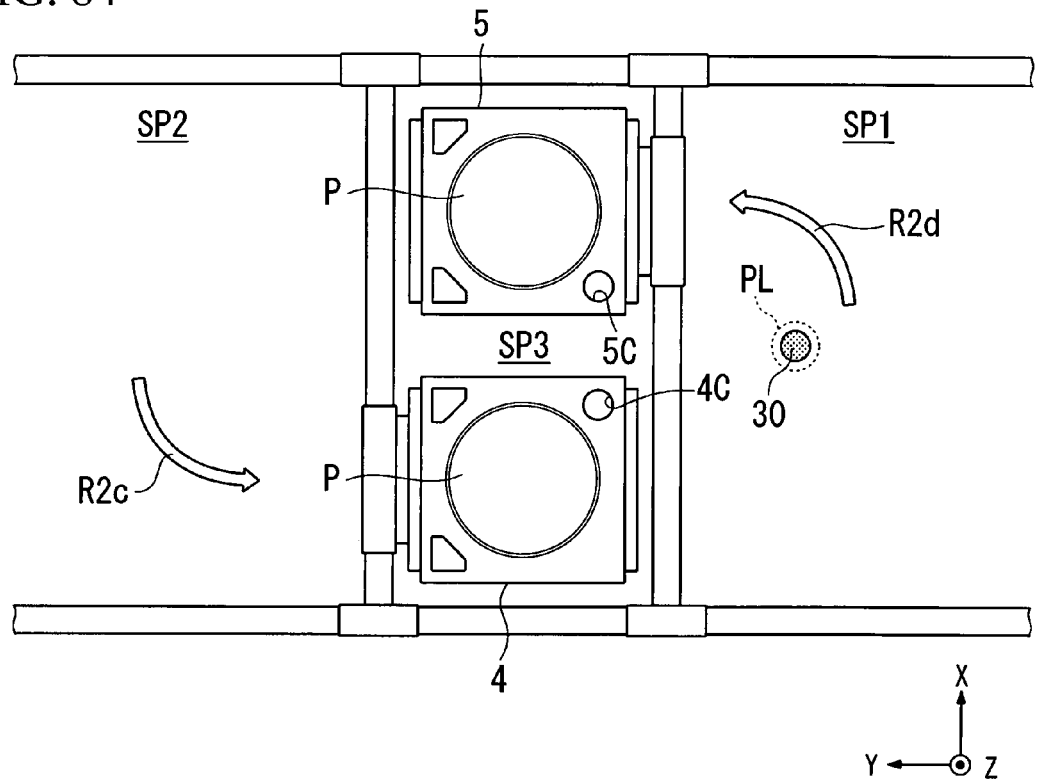
FIG. 84 is a drawing used to explain the exposure method according to the 11th embodiment.

Next, the control device 7 uses the laser interference system 2 to measure the positions of the first and second substrate stages 4, 5, while controlling the substrate stage driving device PD to move the first substrate stage 4 and the second substrate stage 5 to the third area SP3, as shown in FIG. 84. In this embodiment, upon moving from the first area SP1 to the third area SP3, the second substrate stage 5 is positioned in the +X part area of the third area SP3 in the figure, and upon moving from the second area SP2 to the third area SP3, the first substrate stage 4 is positioned in the −X part area of the third area SP3 in the figure. When the second substrate stage 5 moves from the first area SP1 to the third area SP3, movement is along the path indicated by the arrow R2d in FIG. 84, and when the first substrate stage 4 moves from the second area SP2 to the third area SP3, movement is along the path indicated by the arrow R2c in FIG. 84.

Figure 85:
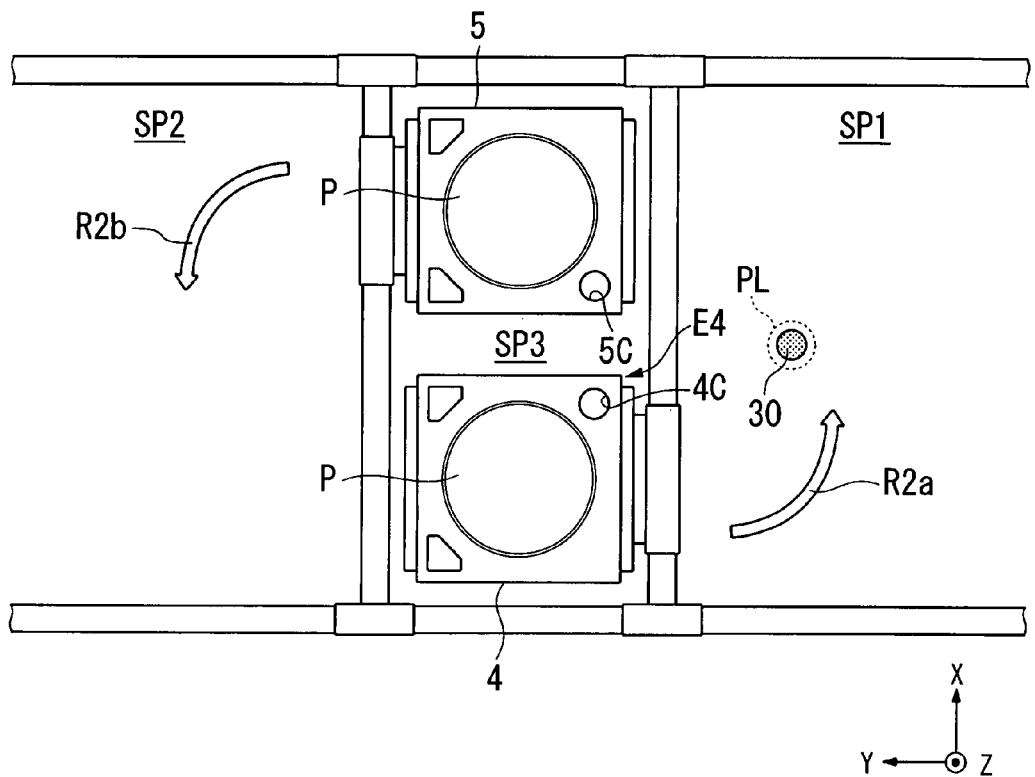
FIG. 85 is a drawing used to explain the exposure method according to the 11th embodiment.

Next, as shown in FIG. 85, the control device 7 performs a switching operation of the two substrate stages 4, 5 with the two sliders 86, 88 in the third area SP3.

Then, the control device 7 controls the substrate stage driving device PD to move the first substrate stage 4 to the first area SP1 of the exposure station ST1 and to move the second substrate stage 5 to the second area SP2 of the measurement station ST2. When the first substrate stage 4 moves from the third area SP3 to the first area SP1, movement is along the path indicated by the arrow R2a in FIG. 85, and when the second substrate stage 5 moves from the third area SP3 to the second area SP2, movement is along the path indicated by the arrow R2b in FIG. 85.

Figure 86:
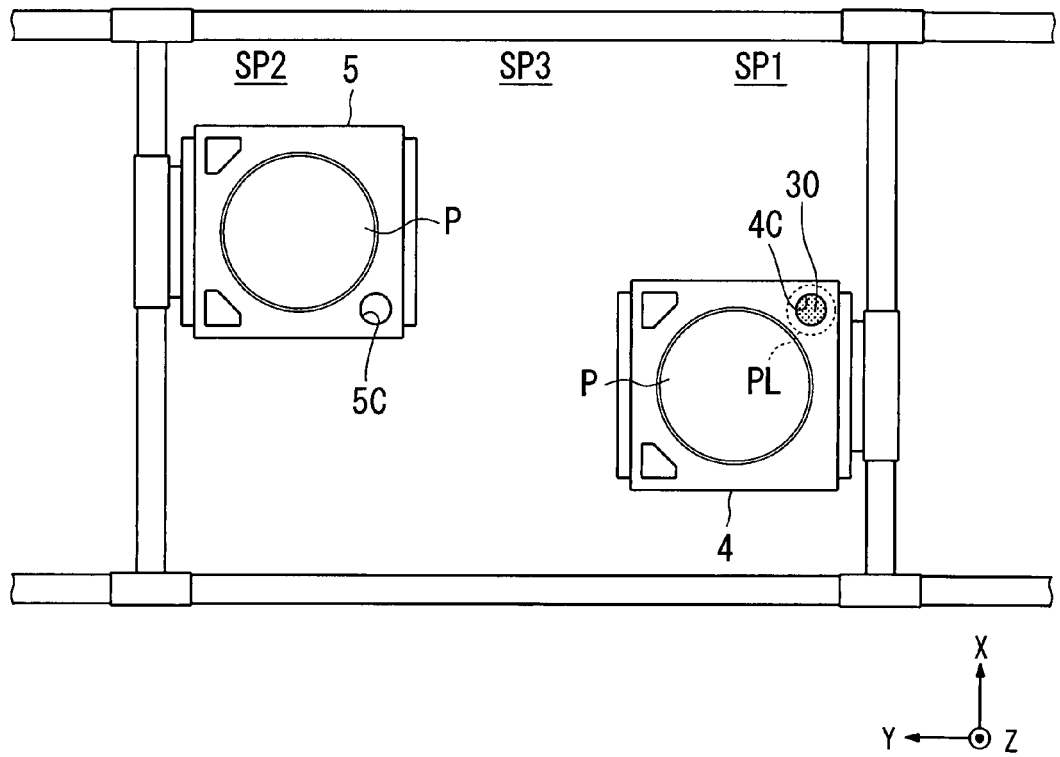
FIG. 86 is a drawing used to explain the exposure method according to the 11th embodiment.

The control device 7 moves the first substrate stage 4 such that the cap member 30 and the first cap holder 4C are opposed, as shown in FIG. 86, in order to hold the cap member 30 held by the seal member 212 with the first cap holder 4C provided on the first substrate stage 4. Here, as shown in FIG. 85, the cap holder 4C is positioned at the fourth corner E4, which among the first through fourth corners E1 to E4 of the upper surface of the first substrate stage 4 (substrate table 4T) is the closest to the first area SP1 when the first substrate stage 4 is positioned in the third area SP3. Hence the movement distance can be shortened when moving the first substrate stage 4 from the third area SP3 to the first area SP1 in order to cause the first cap holder 4C to hold the cap member 30 held by the seal member 212.

Prior to exposure of the substrate P held by the first substrate stage 4, after holding the cap member 30 with the first cap holder 4C of the first substrate stage 4, the control device 7 releases the cap member 30 from the seal member 212. That is, the control device 7 holds the cap member 30 with the first cap holder 4C, and then moves the first substrate stage 4 in XY directions, and similarly to the tenth embodiment, executes prescribed measurement processing and similar in the measurement regions 274 (274A, 274B) positioned opposably to the final optical element FL on the first substrate stage 4. After the end of the prescribed measurement processing and similar, the control device 7 successively exposes the plurality of shot areas set on the substrate P. When successively exposing the plurality of shot areas set on the substrate P, similarly to the process described above, the control device 7 initiates exposure from the first shot area close to the second measurement region 274B, and ends exposure at the last shot area close to the first cap holder 4C. After the end of exposure of the plurality of shot areas on the substrate P, the control device 7 moves the first substrate stage 4 such that the final optical element FL and first cap holder 4C are opposed, and releases the cap member 30 from the first cap holder 4C, while also holding the cap member 30 with the seal member 212 to enable opposition of the final optical element FL and cap member 30.

Thereafter, the processing explained referring to FIG. 80 through FIG. 86 is repeated. That is, after prescribed processing at the second area SP2, the second substrate stage 5, while connected to the slider 88, moves to the +X part area of the third area SP3 along the movement path indicated by the arrow R1b, after which the second substrate stage 5 is connected to the slider 86 and moves to the first area SP1 along the movement path indicated by the arrow R1d. After prescribed processing at the first area SP1, the second substrate stage 5, while connected to the slider 86, moves to the +X part area of the third area SP3 along the movement path indicated by the arrow R2d, after which, in the third area SP3, the second substrate stage 5 is connected to the slider 88 and moves to the first area SP1 along the movement path indicated by the arrow R2b to the second area SP2.

On the other hand, after prescribed processing at the second area SP2, the first substrate stage 4, while connected to the slider 88, moves to the −X part area of the third area SP3 along the movement path indicated by the arrow R2c, after which, in the third area SP3, the first substrate stage 4 is connected to the slider 86 and moves to the first area SP1 along the movement path indicated by the arrow R2a. After prescribed processing at the first area SP1, the first substrate stage 4, while connected to the slider 86, moves to the −X part area of the third area SP3 along the movement path indicated by the arrow R1a, after which, in the third area SP3, the first substrate stage 4 is connected to the slider 88 and moves to the first area SP1 along the movement path indicated by the arrow R1c to the second area SP2.

Thus in this embodiment, the first substrate stage 4 is always positioned in the −X part area when being in the third area SP3, and the second substrate stage 5 is always positioned in the +X part area when being in the third area SP3. That is, in this embodiment the first substrate stage 4 and second substrate stage 5 move from the second area SP2 via the third area SP3 to the first area SP1, and from the first area SP1 via the third area SP3 to the second area SP2, by different paths. The first substrate stage 4 and the second substrate stage 5 each move on the base member BP which is substantially parallel to the XY plane, moving between the first area SP1 and the second area SP2 in the clockwise direction, and moving between the first area SP1 and the second area SP2 in the counterclockwise direction.

Figure 87:
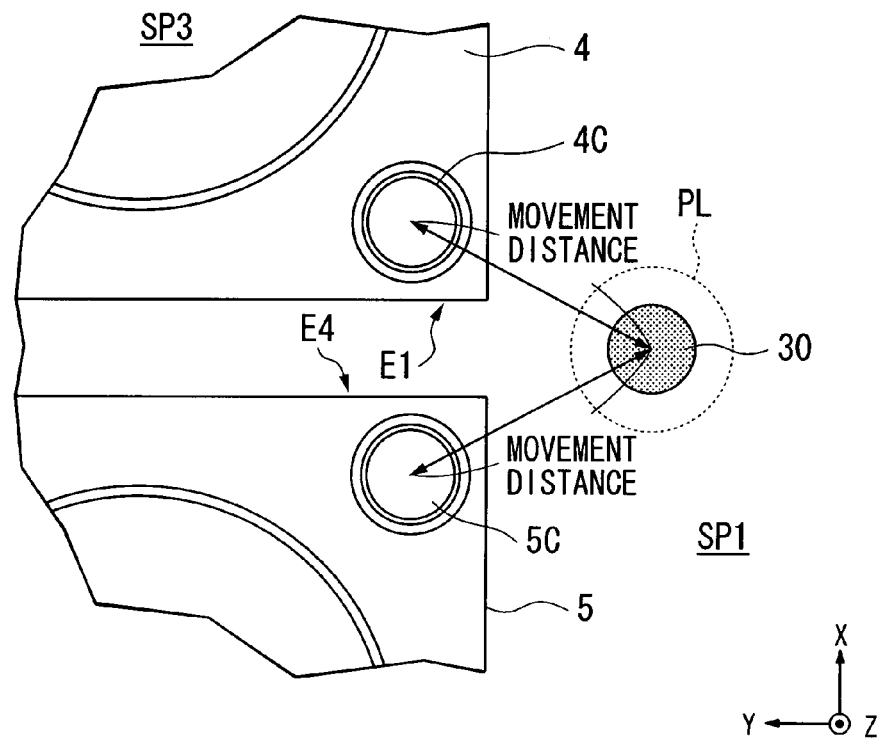
FIG. 87 is a schematic drawing used to explain the positional relation according to a cap member held by a seal member and a cap holder.

Given such movement paths, the first cap holder 4C and the second cap holder 5C are provided at different positions on the first and second substrate stages 4, 5, that is, on the first substrate stage 4 the first cap holder 4C is provided at the fourth corner E4, while on the second substrate stage 5 the second cap holder 5C is provided at the first corner E1, so that as indicated in the schematic diagram of FIG. 87, the movement distance can be shortened when the substrate stage 4 (5) is moved from the third area SP3 to the first area SP1 in order that the cap holder 4C (5C) can hold the cap member 30 being held by the seal member 212. By this means, the time from the switching operation of the two substrate stages 4, 5 with the two sliders 86, 88 in the third area SP3 until exposure of the next substrate P is begun can be shortened, and reductions in throughput (the availability factor of the exposure apparatus EX) can be suppressed.

Furthermore, in this embodiment also, after being held by the cap holder 4C (5C) positioned on the substrate stage 4 (5), the cap member 30 held by the seal member 212 is released from the seal member 212, and when the liquid immersion region LR on the cap member 30 is moved to above the measurement regions 274 (275), the liquid immersion region LR and substrate stage 4 (5) can undergo relative motion such that the liquid LQ of the liquid immersion region LR does not make contact with the substrate P held by the substrate stage 4 (5).

When a non-effective area of prescribed width is defined along the periphery of the substrate P, contact between the non-effective area of the substrate P and liquid LQ of the liquid immersion region LR may be allowed, deeming that there has been no contact between the liquid LQ of the liquid immersion region LR and the substrate P.

The movement paths of the first and second substrate stages 4, 5, and the positioning of the first and second cap holders 4C, 5C on the first and second substrate stages 4, 5 explained in the above tenth and 11th embodiments, are merely examples, and other configurations are possible. The position of the first cap holder 4C on the first substrate stage 4 and the position of the second cap holder 5C on the second substrate stage 5 can be determined according to the movement paths of the first and second substrate stages 4, 5 when moving from the second area SP2 via the third area SP3 to the first area SP1. In essence, it is sufficient that the positioning of the first and second cap holders 4C, 5C on the first and second substrate stages 4, 5 be optimized, according to the movement paths of the substrate stages 4, 5, such that the movement distance is short when moving the first and second substrate stages 4, 5 from the third area SP3 to the first area SP1 in order that the first and second cap holders 4C, 5C can hold the cap member 30 held by the seal member 212.

12th Embodiment

Figure 88:
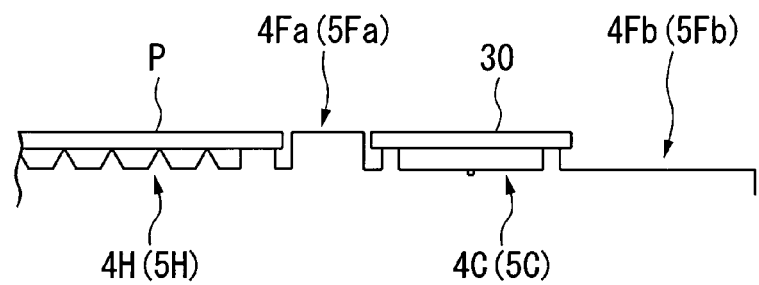
FIG. 88 shows the principal portions of the exposure apparatus according to a 12th embodiment.
Figure 89:
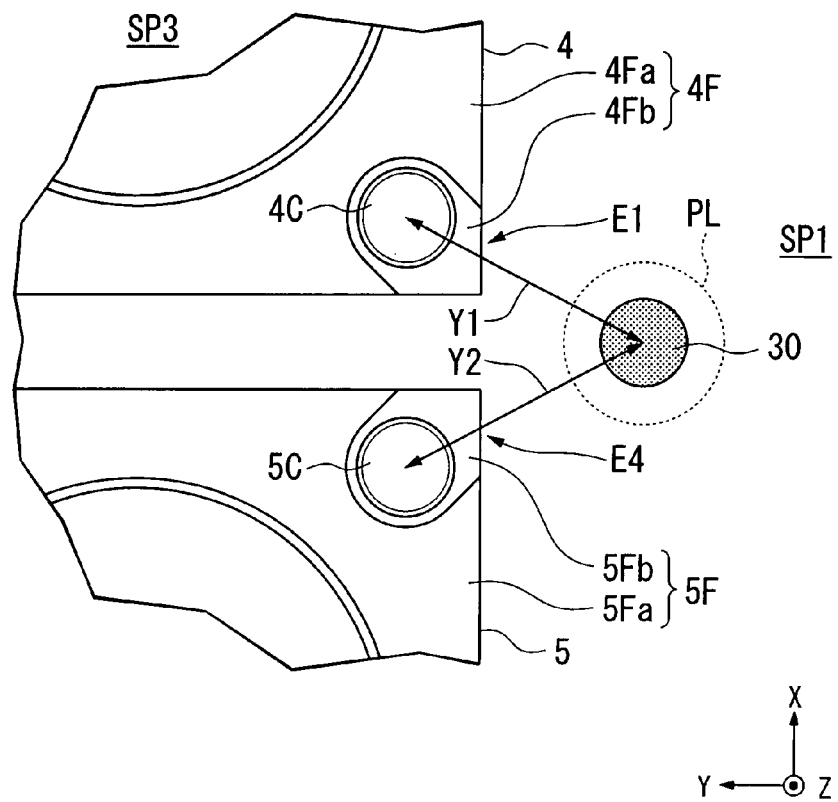
FIG. 89 shows the principal portions of the exposure apparatus according to the 12th embodiment.

Next, a 12th embodiment is explained, referring to FIG. 88 and FIG. 89. A characteristic of this embodiment are the facts that an area 4Fa (5Fa) substantially flush with the surface of the substrate P held by the substrate holder 4H (5H) and an area 4Fb (5Fb) from which a distance to the final optical element FL of which is longer than that from the area 4Fa (5Fa), are formed on the substrate stage 4(5) and located around the cap member 30 held by the cap holder 4C (5C). In the following description, components the same as or similar to those of the tenth and 11th embodiments are denoted the same reference symbols, and description thereof is simplified or omitted.

In FIG. 88 and FIG. 89, a fourth area 4Fa, substantially flush with the surface of the substrate P held by the substrate holder 4H, and a fifth area 4Fb, formed such that the distance from the final optical element FL is longer than for the fourth area 4Fa, are formed on the first substrate stage 4 and located around the periphery of the cap member 30 held by the first cap holder 4C. That is, of the upper surface 4F of the first substrate stage 4, a step is provided in proximity to the cap holder 4C, and the fifth area 4Fb is formed so as to be lower than the upper surface of the cap member 30 held by the cap holder 4C. The fifth area 4Fb, which is lower than the upper surface of the cap member 30, is formed so as to be connected to the side surfaces of the first cap holder 4C and substrate table 4T.

Similarly, a sixth area 5Fa, substantially flush with the surface of the substrate P held by the substrate holder 5H, and a seventh area 5Fb, formed such that the distance from the final optical element FL is longer than for the sixth area 5Fa, are formed on the second substrate stage 5 and located around the periphery of the cap member 30 held by the second cap holder 5C.

For example, when the first substrate stage 4 positioned in the third area SP3 is moved from the third area SP3 to the first area SP1 in order to cause the first cap holder 4C to hold the cap member 30 being held by the seal member 212, the control device 7 controls the movement of the first substrate stage 4 such that the fifth area 4Fb passes under the cap member 30 held by the seal member 212.

A fifth area 4Fb, lower than the fourth area 4Fa, is provided on the around the cap member 30 held by the cap holder 4C, and by moving the first substrate stage 4 such that the fifth area 4Fb passes below the cap member 30 held by the seal member 212, the operation of passing the cap member 30 held by the seal member 212 to the first cap holder 4C can be performed in a short time. By this means, for example the time from the switching operation of the two substrate stages 4, 5 with the two sliders 86, 88 in the third area SP3 until the initiation of exposure of the substrate P on the first substrate stage 4 can be shortened, and declines in throughput (the availability factor of the exposure apparatus EX) can be suppressed.

Figure 74:
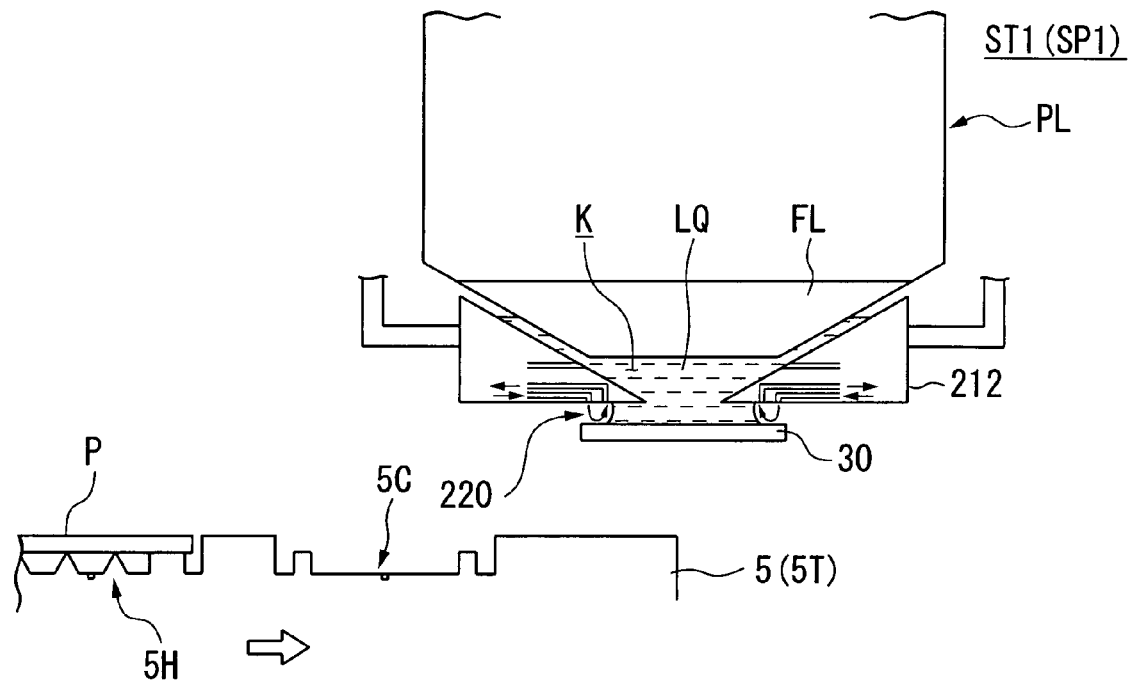
FIG. 74 is a drawing used to explain the exposure method in the tenth embodiment.

That is, when the cap member 30 held by the seal member 212 and the cap holder 4C on the first substrate stage 4 are opposed in order to have the first cap holder 4C hold the cap member 30 being held by the seal member 212, as explained referring to FIG. 74, the control device 7 moves the first substrate stage 4 in horizontal directions with the first substrate table 4T at a prescribed distance in the −Z direction relative to the seal member 212 and to the cap member 30 held by the seal member 212, such that the seal member 212 and/or the cap member 30 held by the cap member 212 does not strike the first substrate stage 4. Then, as explained referring to FIG. 75, the control device 7 moves the first substrate stage 4 upward (in the +Z direction), and the first cap holder 4C holds the cap member 30 being held by the seal member 212. In this operation, by controlling the movement of the first substrate stage 4 such that the fifth area 4Fb provided on the first substrate stage 4 passes below the cap member 30 being held by the seal member 212, the amount of movement in the −Z direction of the first substrate table 4T can be made small. That is, if the upper surface of the first cap holder 4C is positioned lower than (on the −Z side of) the lower surface of the cap member 30 held by the seal member 212, then even when the upper surface of the substrate table 4T (the fourth area 4Fa) is positioned on the upper side of (on the +Z side of) the cap member 30 held by the seal member 212, there is no collision of the cap member 30 held by the seal member 212 with the first substrate stage 4, and the first substrate stage 4 can move in horizontal directions in order to cause the cap member 30 being held by the seal member 212 to be opposed to the first cap holder 4C. Hence after causing the cap member 30 and the first cap holder 4C to be opposed, the amount of movement upward (in the +Z direction) of the first substrate stage 4 in order to bring the cap member 30 and the first cap holder 4C into contact can be made small.

FIG. 89 shows an example of a case in which a step such as that shown in FIG. 88 is formed in proximity to the cap holders 4C, 5C of the substrate stages 4, 5 in the above-described 11th embodiment. In this embodiment, when the first substrate stage 4 is moved from the third area SP3 to the first area SP1 over the movement path indicated by the arrow Y1 in FIG. 89, in order to cause the cap member 30 being held by the seal member 212 to be opposed to the first cap holder 4C, the fifth area 4Fb is formed so as to follow the arrow Y1. Specifically, the fifth area 4Fb is formed so as to follow a line connecting the first cap holder 4C on the first substrate stage 4 positioned in the third area SP3 and the cap member 30 being held by the seal member 212. By this means, the cap member 30 being held by the seal member 212 can be more rapidly passed to the first cap holder 4C.

Similarly, the control device 7 can control the movement of the second substrate stage 5 such that the seventh area 5Fb passes below the cap member 30 being held by the seal member 212 when the second substrate stage 5 positioned in the third area SP3 is moved from the third area SP3 to the first area SP1 in order to cause the second cap holder 5C to hold the cap member 30 being held by the seal member 212. And, when the second substrate stage 5 is moved from the third area SP3 to the first area SP1 over the movement path indicated by the arrow Y2 in FIG. 89 in order to cause the second cap holder 5C to hold the cap member 30 being held by the seal member 212, by forming the seventh area 5Fb so as to follow the arrow Y2, the cap member 30 being held by the seal member 212 can more rapidly be passed to the second cap holder 5C.

Exposure of the substrate P on the first substrate stage 4 (second substrate stage 5) is completed, the cap member 30 being held by the first cap holder 4C (second cap holder 5C) is released from the cap holder 4C (5C), and after being held by the seal member 212, the first substrate stage 4 (second substrate stage 5) is moved from the first area SP1 to the third area SP3, while in addition the control device 7 controls movement of the first substrate stage 4 (second substrate stage 5) such that the fifth area 4Fb (seventh area 5Fb) passes below the cap member 30 held by the seal member 212.

13th Embodiment

Figure 90:
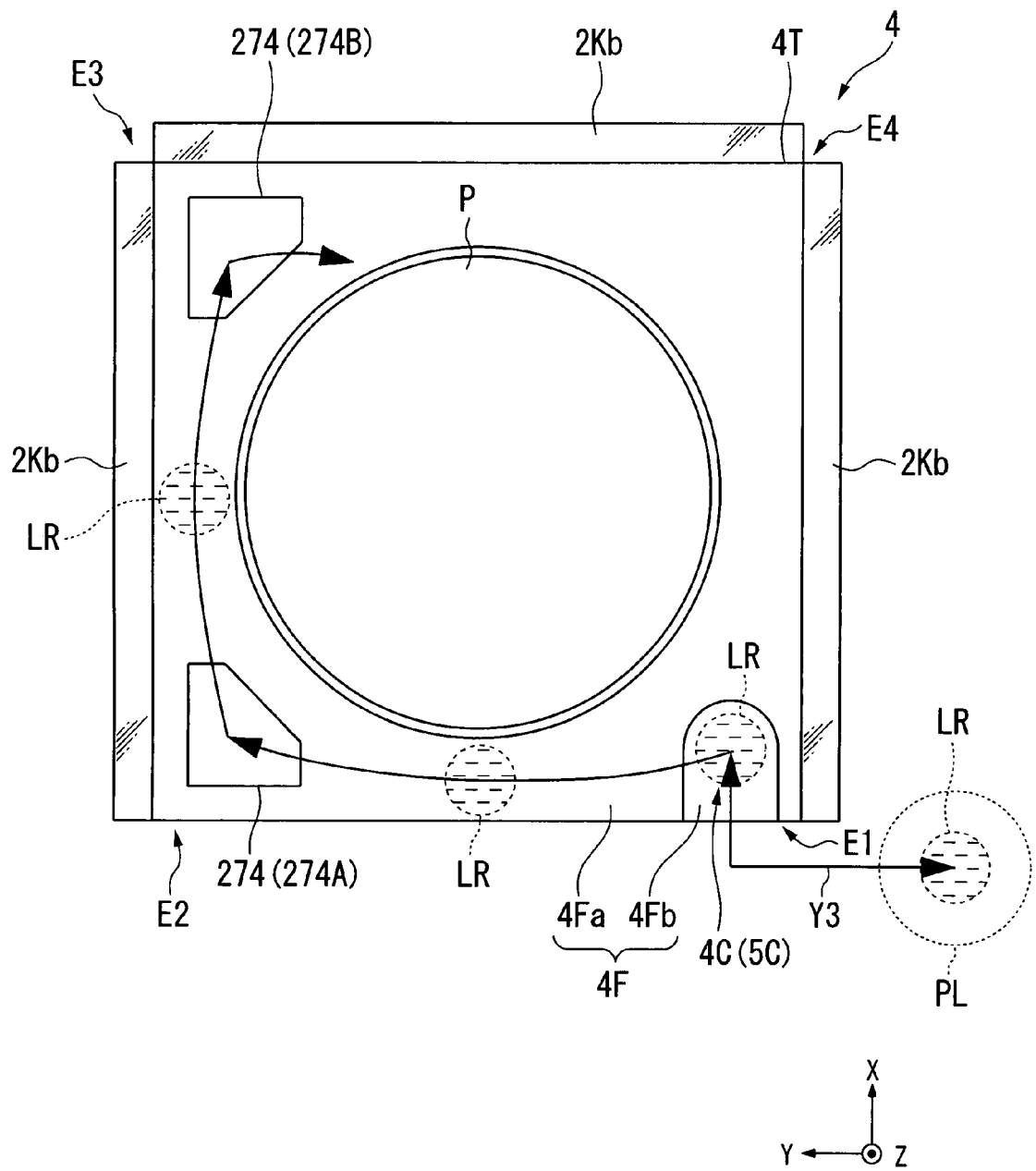
FIG. 90 shows the principal portions of the exposure apparatus according to a 13th embodiment.

Next, a 13th embodiment is explained, referring to FIG. 90. In the following description, components the same as or similar to those of the tenth through 12th embodiments are denoted the same reference symbols, and description thereof is simplified or omitted.

In FIG. 90, reflecting surfaces 2Kb are provided on side faces of the substrate table 4T of the first substrate stage 4. Similarly to the tenth embodiment, measurement light to measure position information in the Z-axis direction for the first substrate stage 4 (substrate table 4T) is emitted from a Z interferometer 2Pz. The reflecting surfaces 2Kb are provided on three side faces among the four side faces of the substrate table 4T, formed in substantially a rectangular shape. The first cap holder 4C is positioned at a corner on which a reflecting surface 2Kb is formed on only one among the two adjacent side faces, among the first through fourth corners E1 to E4 of the upper surface 4F of the substrate table 4T. In FIG. 90, reflecting surfaces 2Kb are provided on the three side faces other than the −X side face (the side faces on the +X side, +Y side, and −Y side) among the four side faces of the substrate table 4T; the first cap holder 4C is provided at the first corner E1. The first corner E1 is a corner at which a reflecting surface 2Kb is formed on only one side (the −Y side) among the adjacent side faces (the side faces on the −X and −Y sides).

In FIG. 90, a fifth area 4Fb is provided on the upper surface 4F of the substrate table 4T. The fifth area 4Fb is formed so as to connect the first cap holder 4C and the side face (the −X side face) on which no reflecting surface 2Kb is formed, among the side faces of the substrate table 4T.

For example, when the first substrate stage 4, positioned in the third area SP3, is moved from the third area SP3 to the first area SP1 in order to cause the first cap holder 4C to hold the cap member 30 being held by the seal member 212, the control device 7 controls movement of the first substrate stage 4 such that the reflecting faces 2Kb pass under the cap member 30 held by the seal member 212. In FIG. 90, the arrow Y3 indicates the positional relation (movement path) of the liquid immersion region LR formed on the image-plane side of the final optical element FL and the first substrate stage 4.

By this means, even if liquid LQ being held between the final optical element FL and the cap member 30 held by the seal member 212 were to leak, when moving from the third area SP3 to the first area SP1, by controlling movement of the first substrate stage 4 such that the reflecting surfaces 2Kb do not pass under the cap member 30 held by the seal member 212, adhesion of the leaking liquid LQ to the reflecting surfaces 2Kb and other problems can be suppressed.

Similarly, when moving from the first area SP1 to the third area SP3, by controlling the movement of the first substrate stage 4 such that the reflecting surfaces 2Kb do not pass underneath the cap member 30 held by the seal member 212, even if liquid LQ being held between the final optical element FL and the cap member 30 held by the seal member 212 were to leak, adhesion of the leaking liquid LQ to the reflecting surfaces 2Kb and other problems can be suppressed.

When the first cap holder 4C is provided at the first corner E1, reflecting surfaces 2Kb may be provided on the three side faces other than the −Y side face (on the +X, −X, and +Y side faces), among the four side faces of the substrate table 4T.

Similarly for the second substrate stage 5, of the four side faces of the substrate table 5T, reflecting faces 2Kb are provided on three side faces, and the second cap holder 5C is provided at the corner at which a reflecting face 2Kb is formed on only one among the two adjacent side faces among the four corners E1 to E4 of the upper surface 5F of the substrate table 5T. When for example, as in the above-described tenth embodiment, the second cap holder 5C is provided on the first corner E1 of the upper surface 5F of the substrate table 5T, reflecting surfaces 2Kb are provided on the +X, +Y, and −Y side faces among the four side faces of the substrate table 5T, or on the +X, −X, and +Y side faces; and when, as in the above-described 11th embodiment, the second cap holder 5C is provided at the fourth corner E4 of the upper surface 5F of the substrate table 5T, reflecting surfaces 2Kb are provided on the −X, +Y, and −Y side faces, or on the +X, −X, and +Y side faces, among the four side faces of the substrate table 5T.

When moving the second substrate stage 5 from one to the other among the third area SP3 and the first area SP1, by controlling movement of the second substrate stage 5 such that the reflecting surfaces 2Kb do not pass below the cap member 30 held by the seal member 212, even should there be leakage of liquid LQ held between the final optical element FL and the cap member 30 held by the seal member 212, adhesion of the leaked liquid LQ to a reflecting surface 2Kb can be suppressed.

In this embodiment, movement of the substrate stages 4, 5 is controlled in order to suppress adhesion of liquid LQ to the reflecting surfaces 2Kb, which are inclined at a prescribed angle so as to be directed upward; however, positioning of the reflecting surfaces 2Ka can be optimized, or movement of the substrate stages 4, 5 can be controlled so as to suppress the adhesion of liquid LQ to the reflecting surfaces 2Ka which are irradiated with measurement light in order to measure position information in the XY directions of the substrate stages 4, 5. For example, when reflecting surfaces 2Ka are provided on three side faces other than the −X side face among the four side faces of the substrate table of the first substrate stage 4, and the first substrate stage 4 is moved from one to the other among the third area SP3 and first area SP1, movement of the first substrate stage 4 can be controlled such that reflecting surfaces 2Ka do not pass below the cap member 30 held by the seal member 212.

14th Embodiment

Next, a 14th embodiment is explained. In the following description, components the same as or similar to those of the tenth through 13th embodiments are denoted the same reference symbols, and description thereof is simplified or omitted.

Figure 91:
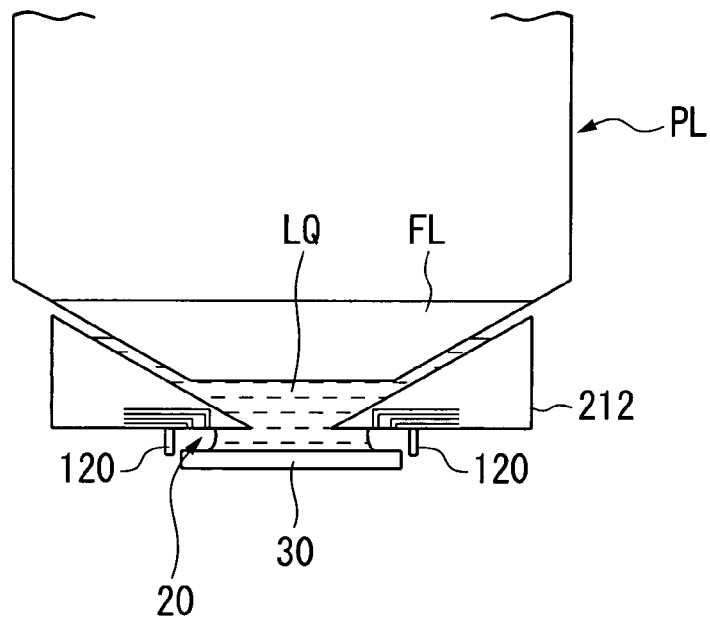
FIG. 91 shows the principal portions of the exposure apparatus according to a 14th embodiment.

In the tenth through 13th embodiments, the cap member 30 is held by a seal member 212, and by forming a gas bearing 220 between the cap member 30 and the seal member 212, the seal member 212 holds the cap member 30. In these cases, the gap G between the lower surface of the seal member 212 and the upper surface of the cap member 30, that is, the positional relation in the Z-axis direction between the seal member 212 and the cap member 30 is maintained, but there is the possibility of fluctuation in the relative positions of the seal member 212 and cap member 30 in the XY directions. Hence by providing a regulating member, which suppresses movement in directions (XY directions) along the lower surface of the seal member 212 of the cap member 30 held at the lower surface of the seal member 212, fluctuations in the relative, positions in XY directions of the seal member 212 and the cap member 30 held by the seal member 212 can be suppressed. For example, as shown in FIG. 91, pin-shape members 120 can be provided on the lower surface of the seal member 212 as regulating members. Pin-shape members 120 are provided on the lower surface of the seal member 212 so as to surround the cap member 30 held to the lower surface of the seal member 212. Pin-shape members 120 are provided on the lower surface of the seal member 212 enabling protrusion and retraction; when the cap member 30 is being held at the lower surface of the seal member 212, the members protrude from the lower surface of the seal member 212, and when the substrate P and the first or second substrate stage 4, 5 are opposed to the lower surface of the seal member 212, the members are accommodated within the seal member 212. By providing regulating members having such pin-shape members 120, movement in the XY directions of the cap member 30 held at the lower surface of the seal member 212 can be controlled.

In addition to the above-described pin-shape members 120, or in place of the pin-shape members 120, protrusions and depressions may be provided on the upper surface of the cap member 30, to suppress movement (fluctuations) in the XY directions of the cap member 30.

15th Embodiment

Next, a 15th embodiment is explained. In the following description, components the same as or similar to those of the tenth through 14th embodiments are denoted the same reference symbols, and description thereof is simplified or omitted.

In the tenth through 14th embodiments, the cap member 30 was held in a prescribed positional relation relative to the seal member 212 by a gas bearing 220 formed with the lower surface of the seal member 212. However, as a holding device to hold the cap member 30 in the prescribed positional relation with the seal member 212, if the cap member 30 can be held such that a space is formed in order to hold liquid LQ between the final optical element FL and the cap member 30, then any arbitrary configuration can be adopted. For example, the holding device 170 shown in FIG. 92 has a movable member 171 which moves relative to the seal member 212, and a suction hole 172, provides in the lower surface of the movable member 171 opposing the upper surface of the cap member 30, which vacuum-clamps the cap member 30. A plurality of (for example, three) movable members 171 are provided, lateral to the outside of the seal member 212. A support member 173 corresponding to the movable member 171 is provided at the side face of the seal member 212, and a driving device 174, which drives the movable member 171 in the Z-axis direction with respect to the support member 173, is provided between the support member 173 and the movable member 171. By driving the driving device 174, the control device 7 can move the movable member, which is lateral to the seal member 212, in the vertical direction.

Figure 92:
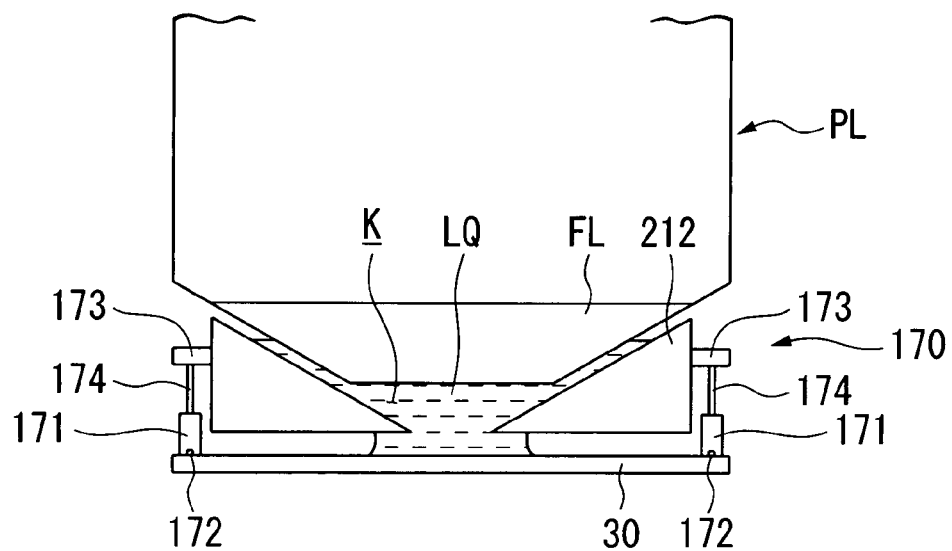
FIG. 92 shows the principal portions of the exposure apparatus according to a 15th embodiment.

When exposing the substrate P, the control device 7 uses the driving device 174 to raise the movable member 171 such that the lower surface of the movable member 171 is higher than the lower surface of the seal member 212, that is, such that the movable member 171 does not strike the substrate P. When using the holding device 170 to hold the cap member 30, the control device 7 uses the driving device 174 to lower the lower surface of the movable member 171 below the lower surface of the seal member 212 as shown in FIG. 92, and uses the suction hole 172 provided in the lower surface of the movable member 171 to suction and hold the upper surface of the cap member 30.

The movable member 171 is connected to the seal member 212 via the driving device 174 and support member 173, but may for example be connected to the lens barrel PK of the projection optical system PL, to a support frame FC, or to another support member (body or column of the exposure apparatus EX) supporting the lens barrel PK.

When the cap member 30 is held by the holding device 170, a gas bearing 220 may be formed between the seal member 212 and the cap member 30, or may not be formed. When a gas bearing 220 is not formed between the seal member 212 and the cap member 30, the lower surface of the seal member 212 and the upper surface of the cap member 30 may be brought into contact.

Furthermore, when for example the cap member 30 is formed from a magnetic (metal) material, as the holding device to hold the cap member 30 in a prescribed positional relation to the seal member 212, a device which uses magnetic force (a magnet or similar) to hold the cap member 30 may be used.

In each of the above-described tenth through 15th embodiments, the cap holders 4C, 5C are configured having a vacuum chuck mechanism; but if the cap member 30 can be releasably held, any arbitrary configuration can be adopted. For example, when the cap member 30 is formed from a magnetic (metal) material, the cap holders 4C, 5C may have a mechanism which holds the cap member 30 by magnetic force (using a magnet or similar).

Figure 93:
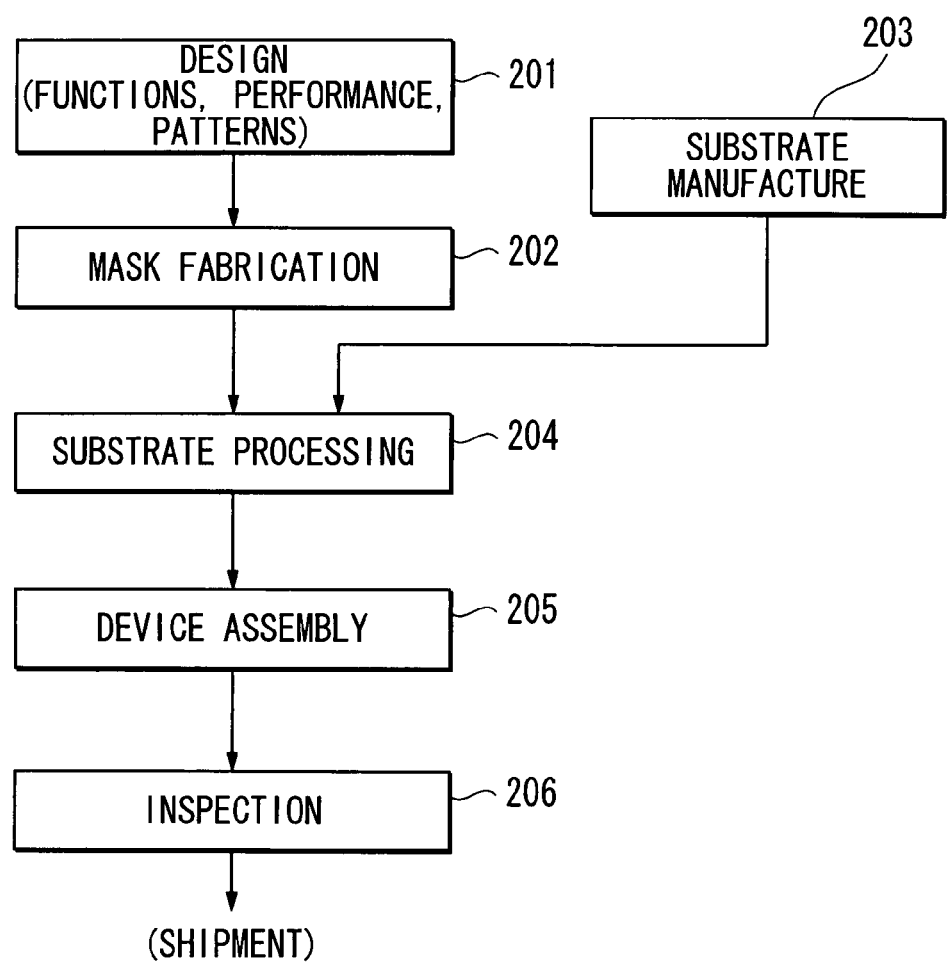
FIG. 93 is a flowchart used to explain an example of microdevice manufacturing processes.

In each of the above-described tenth through 15th embodiments, after moving the substrate table 4T (5T) downward (in the −Z direction) as shown in FIG. 92 in order to remove the cap member 30 held by the seal member 212 from the substrate stage 4 (5), the substrate stage 4 (5) is moved in a horizontal direction, as indicated in FIG. 93; but as described above, when the seal member 212 is flexibly supported by the support mechanism 212F, there is the possibility that the weight of the seal member 212 itself, and/or the weight of the cap member 30 held by the seal member 212, may cause the seal member 212 holding the cap member 30 to move downward (descend) by a prescribed amount. Should such a circumstance arise, the weight of the seal member 212 and cap member 30 themselves should be considered in optimizing the movement amount of the substrate table 4T (5T) in the −Z direction, such that the cap member 30 held by the seal member 212 does not strike the substrate stage 4 (5).

In each of the above-described tenth through 15th embodiments, the support mechanism 212F supporting the seal member 212 may be provided with a driving device (actuator) which drives the seal member 212, as disclosed in Japanese Unexamined Patent Application, First Publication No. 2004-343114.

In each of the above-described tenth through 15th embodiments, the substrate tables 4T, 5T are moved upward (in the +Z direction) (see FIG. 75) in order that the cap member 30 held by the seal member 212 and the cap holders 4C, 5C of the substrate stages 4, 5 do not make contact; but when the support mechanism 212F supporting the seal member 212 is provided with a driving device to drive the seal member 212 in the Z-axis direction, such as disclosed in Japanese Unexamined Patent Application, First Publication No. 2004-343114, the seal member 212 may be moved downward (in the −Z direction). Of course, both the substrate table 4T, 5T and the seal member 212 may be moved in the Z-axis direction. Similarly, when causing the cap holder 4C, 5C on the substrate stage 4, 5 and the cap member 30 held by the seal member 212 to move apart, at least one among the substrate stage 4, 5 and the seal member 212 can be moved in the Z-axis direction.

In each of the above-described tenth through 15th embodiments, when the cap member 30 being held by the seal member 212 (or by the holding device 170) is held by a cap holder 4C (5C), and when the cap member 30 being held by a cap holder 4C (5C) is held by the seal member 212 (or holding device 170), the laser interference system 2 and measurement device of the second driving system PD2 are used to control the positions and similar of the substrate stage 4 (5) and of the substrate table 4T (5T) such that the cap member 30 is held in a desired position; but, as disclosed in Japanese Unexamined Patent Application, First Publication No. 2004-289128, a sensor or similar to monitor the position of the cap member may be provided, in order to hold the cap member 30 in a prescribed position of the cap holder 4C (5C), or in order to hold the cap member 30 in a prescribed position of the seal member 212 (or holding device 170).

Furthermore, a sensor which is irradiated with exposure light EL (or with light of the same wavelength as exposure light EL), and/or a measurement member (measurement marks or similar), may be positioned on the upper surface of the cap member 30, and prescribed measurements may be performed when the cap member 30 is being held by the seal member 212 (or holding device 170).

The liquid LQ in each of the above embodiments comprises pure water. Pure water has advantages in that it can be easily obtained in large quantity at semiconductor manufacturing plants, etc. and in that it has no adverse effects on the photoresist on the substrate P or on the optical elements (lenses), etc. In addition, pure water has no adverse effects on the environment and contains very few impurities, so one can also expect an action whereby the surface of the substrate P and the surface of the optical element provided on the front end surface of the projection optical system PL are cleaned.

In addition, the index of refraction n of pure water (water) with respect to exposure light EL with a wavelength of 193 nm is nearly 1.44, so in the case where ArF excimer laser light (193 nm wavelength) is used as the light source of the exposure light EL, it is possible to shorten the wavelength to 1/n, that is, approximately 134 nm on the substrate P, to obtain high resolution. Also, the depth of focus is expanded by approximately n times, that is approximately 1.44 times, compared with it being in air, so in the case where it would be permissible to ensure the same level of depth of focus as the case in which it is used in air, it is possible to further increase the numerical aperture of the projection optical system PL, and resolution improves on this point as well.

In the above embodiments, an optical element FL is attached to the front end of the projection optical system PL, and this optical element FL can be used to adjust the optical characteristics, for example, the aberration (spherical aberration, coma aberration, etc.), of the projection optical system PL. Note that an optical plate used for the adjustment of the optical characteristics of the projection optical system PL may also be used as the optical element attached to the front end of the projection optical system PL. Or, it may also be a plane-parallel plate (cover glass or the like) through which the exposure light EL is able to pass.

When there is high pressure between the optical element at the end of the projection optical system PL and the substrate P arising due to the flow of liquid LQ, the optical element may be fixed firmly in place so that there is no movement of the optical element due to the pressure, rather than being an optical element that can be replaced.

In each of the above embodiments, configurations are employed in which the space between the projection optical system PL and the surface of the substrate P is filled with liquid LQ; but a configuration may be employed in which cover glass, which is a parallel-plate element, is for example mounted on the surface of the substrate P, and the space filled with liquid LQ.

The projection optical system in each of the above embodiments is configured with the optical path space on the image-plane side of the optical element at the end filled with liquid; but a projection optical system may also be adopted in which the optical path space on the object-plane side of the optical element at the end is also filled with liquid, such as is disclosed in PCT International Publication No. WO 2004/019128.

Note that the liquid LQ of the above embodiments is water (pure water), but it may be a liquid other than water. For example, if the light source of the exposure light EL is an $F_2$ laser, this $F_2$ laser light will not pass through water, so the liquid LQ may be, for example, a fluorocarbon fluid such as a perfluoropolyether (PFPE) or a fluorocarbon oil that an $F_2$ laser is able to pass through. In this case, liquid-affinity treatment may be performed by for example forming, on the portion in contact with the liquid LQ, a thin film of a material with a molecular structure of small polarity comprising fluorine. In addition, it is also possible to use, as the liquid LQ, liquids that have the transmittance with respect to the exposure light EL and whose refractive index are as high as possible and that are stable with respect to the photoresist coated on the projection optical system PL and the surface of the substrate P (for example, cedar oil).

Moreover as the liquid LQ, a liquid with a refractive index of 1.6 to 1.8 may be used. Furthermore, the optical element FL may be formed from a quartz, or a material with a higher refractive index than that of quartz (for example, above 1.6).

It is to be noted that as for substrate P of each of the above-described embodiments, not only a semiconductor wafer for manufacturing a semiconductor device, but also a glass substrate for a display device, a ceramic wafer for a thin film magnetic head, or a master mask or reticle (synthetic quartz or silicon wafer), etc. can be used.

As for exposure apparatus EX, in addition to a step-and-scan type scanning exposure apparatus (scanning stepper) in which while synchronously moving the mask M and the substrate P, the pattern of the mask M is scan-exposed, a step-and-repeat type projection exposure apparatus (stepper) in which the pattern of the mask M is exposed at one time in the condition that the mask M and the substrate P are stationary, and the substrate P is successively moved stepwise can be used.

Moreover, as for the exposure apparatus EX, the present invention can be applied to an exposure apparatus of a method in which a reduced image of a first pattern is exposed in a batch on the substrate P by using the projection optical system (for example, a refractive projection optical system having, for example, a reduction magnification of ⅛, which does not include a reflecting element), in the state with the first pattern and the substrate P being substantially stationary. In this case, the present invention can be also applied to a stitch type batch exposure apparatus in which after the reduced image of the first pattern is exposed in a batch, a reduced image of a second pattern is exposed in a batch on the substrate P, partially overlapped on the first pattern by using the projection optical system, in the state with the second pattern and the substrate P being substantially stationary. As the stitch type exposure apparatus, a step-and-stitch type exposure apparatus in which at least two patterns are transferred onto the substrate P in a partially overlapping manner, and the substrate P is sequentially moved can be used.

Furthermore, at least a portion of the above embodiments can also be applied to an exposure apparatus comprising only a single substrate stage, or to an exposure apparatus furnished with a substrate stage for holding a substrate, and a measurement stage on which is mounted a reference member formed with a reference mark, and various photoelectronic sensors, as disclosed for example in Japanese Unexamined Patent Application, First Publication No. H11-135400 (corresponding to PCT International Publication No. WO 1999/23692), and Japanese Unexamined Patent Application, First Publication No. 2000-164504 (corresponding to U.S. Pat. No. 6,897, 963).

The types of exposure apparatuses EX are not limited to exposure apparatuses for semiconductor element manufacture that expose a semiconductor element pattern onto a substrate P, but are also widely applicable to exposure apparatuses for the manufacture of liquid crystal display elements and for the manufacture of displays, and exposure apparatuses for the manufacture of thin film magnetic heads, image pickup elements (CCD), micro machines, MEMS, DNA chips, and reticles or masks.

In each of the abovementioned embodiments, an optical transmission type mask formed with a predetermined shielding pattern (or phase pattern or dimming pattern) on an optical transmission substrate is used. However instead of this mask, for example as disclosed in U.S. Pat. No. 6,778,257, an electronic mask (called a variable form mask; for example this includes a DMD (Digital Micro-mirror Device) as one type of non-radiative type image display element) for forming a transmission pattern or reflection pattern, or a light emitting pattern, based on electronic data of a pattern to be exposed may be used.

Furthermore the present invention can also be applied to an exposure apparatus (lithography system) which exposes a run-and-space pattern on a substrate P by forming interference fringes on the substrate P, as disclosed for example in PCT International Publication No. WO 2001/035168.

In the abovementioned embodiments, respective position information for the mask stage 3 and the substrate stages 4 and 5 is measured using an interference system (2). However the invention is not limited to this and for example, an encoder system which detects a scale (grating) provided in each stage may be used. In this case, preferably a hybrid system is furnished with both of an interference system and an encoder system, and calibration of the measurement results of the encoder system is performed using the measurement results of the interference system. Moreover, position control of the stage may be performed using the interference system and the encoder system interchangeably, or using both.

Moreover, the present invention can also be applied to an exposure apparatus as disclosed for example in Published Japanese Translation No. 2004-519850 (corresponding U.S. Pat. No. 6,611,316) of the PCT International Application, which combines patterns of two masks on a substrate via a projection optical system, and double exposes a single shot region on the substrate at substantially the same time, using a single scan exposure light.

As far as is permitted by the law of the countries specified or selected in this patent application, the disclosures in all of the Japanese Patent Publications and U.S. Patents related to exposure apparatuses and the like cited in the above respective embodiments and modified examples, are incorporated herein by reference.

As described above, the exposure apparatus EX of the embodiments of this application is manufactured by assembling various subsystems, including the respective constituent elements presented in the Scope of Patents Claims of the present application, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly to the exposure apparatuses of the various subsystems has ended, overall assembly is performed, and the various precisions are ensured for the exposure apparatus as a whole. Note that it is preferable that the manufacture of the exposure apparatus be performed in a clean room in which the temperature, the degree of cleanliness, etc. are controlled.

As shown in FIG. 93, microdevices such as semiconductor devices are manufactured by going through; a step 201 that performs microdevice function and performance design, a step 202 that creates the mask (reticle) based on this design step, a step 203 that manufactures the substrate that is the device base material, a step 204 including substrate processing steps such as a process that exposes the pattern on the mask onto a substrate by means of the exposure apparatus EX of the aforementioned embodiments, a process for developing the exposed substrate, and a process for heating (curing) and etching the developed substrate, a device assembly step (including treatment processes such as a dicing process, a bonding process and a packaging process) 205, and an inspection step 206, and so on.

What is claimed is:

1. An exposure method for exposing a substrate with an exposure beam via an optical member and a liquid, the method comprising:
   exposing the substrate held by a first mover in a first area, the exposure comprising positioning the first mover in a position opposed to the optical member, and disposing the liquid between the optical member and the substrate;
   holding the liquid between the optical member and a prescribed member, the holding of the liquid comprising removing the prescribed member from the first mover, and retracting the first mover from the position opposed to the optical member so as to move to a second area that is different from the first area, the second area being on one side of the first area when viewed in a direction parallel to an optical axis of the optical member, the exposed substrate on the first mover in the second area being replaced with a next substrate;
   attaching the prescribed member to a second mover, the attachment comprising positioning the second mover at the position opposed to the optical member after the retraction of the first mover from the optical member;
   after the attachment of the prescribed member to the second mover, exposing a second substrate held by the second mover in the first area, the exposure comprising disposing the liquid between the optical member and the second substrate held by the second mover; and
   holding the liquid between the optical member and the prescribed member, the holding of the liquid comprising removing the prescribed member from the second mover and retracting the second mover from the position opposed to the optical member so as to move to the second area; wherein
   the first mover is moved from the first area to the second area along a first path and the second mover is moved from the first area to the second area along a second path that is different from the first path, both the first and second paths being disposed on the one side of the first area,
   each of the first and second movers has a prescribed corner and a holder, the holder being configured to hold the prescribed member and arranged at the prescribed corner,
   when one mover of the first and second movers is moved to approach another mover of the first and second movers while the liquid is held between the optical member and the another mover, a side of the one mover that is adjacent to the prescribed corner of the one mover is positioned closest to the another mover relative to other sides of the one mover, and
   when the another mover is moved to approach the one mover while the liquid is held between the optical member and the one mover, a side of the another mover that is adjacent to the prescribed corner of the another mover is positioned closest to the one mover relative to the other sides of the another mover.

2. The exposure method according to claim 1, wherein the prescribed member is held by the first mover when the substrate held by the first mover is exposed, and wherein the prescribed member is held by a different member than the first and the second movers during a period after the prescribed member is removed from the first mover until the prescribed member is attached to the second mover.

3. The exposure method according to claim 1, further comprising:
   in parallel with the exposure of the substrate held by the first mover, detecting alignment information of the second substrate held by the second mover in the second area.

4. The exposure method according to claim 3, wherein
   the alignment information comprises position information of a mark on the substrate, and wherein the mark is detected via no liquid by means of a mark detection system provided at the second area.

5. The exposure method according to claim 1, wherein
   a replacement of the substrate held by the first mover is performed in parallel with the exposure of the second substrate held by the second mover.

6. The exposure method according to claim 1, wherein
   the first mover and the second mover are moved from the second area to the first area along different paths from each other.

7. A device manufacturing method comprising:
   exposing a substrate by use of the exposure method according to claim 1; and
   developing the exposed substrate.

8. The exposure method according to claim 1, further comprising:
   after the attachment of the prescribed member to the second mover, and before the exposing of the second substrate held by the second mover in the first area, performing a measurement related to exposure, via the optical member and the liquid, the measurement comprising arranging a first measurement region of the second mover to oppose the optical member, the first measurement region having an opening and being provided at a third corner that is different from a first corner and a second corner of the second mover, a second measurement region having a reference mark and being provided at the second corner, the holder being provided at the first corner, which is the prescribed corner, the measurement further comprising detecting the exposure beam transmitting through the optical member, the liquid, and the opening.

9. The exposure method according to claim 8, wherein
   the measurement related to exposure further comprises detecting the reference mark of the second measurement region, via the optical member and the liquid, and wherein
   the second mover is moved, after the attachment of the prescribed member, so that the measurement regions oppose the optical member, respectively.

10. The exposure method according to claim 8, wherein
    after the prescribed member is attached to the second mover, moving the liquid on the second mover from the prescribed corner to one of the second and third corners, and to another of the second and the third corners, along with the movement of the second mover.

11. An exposure method for exposing a substrate with an exposure beam via an optical member and a liquid, the method comprising:
    exposing the substrate held by a first mover in a first area, the exposure comprising positioning the first mover in a position opposed to the optical member, and disposing the liquid between the optical member and the substrate;
    holding the liquid between the optical member and a prescribed member, the holding of the liquid comprising removing the prescribed member from the first mover, and retracting the first mover from the position opposed to the optical member so as to move to a second area that is different from the first area, the second area being on one side of the first area when viewed in a direction parallel to an optical axis of the optical member, the exposed substrate on the first mover in the second area being replaced with a next substrate;

attaching the prescribed member to a second mover, the attachment comprising positioning the second mover at the position opposed to the optical member after the retraction of the first mover from the optical member;

after the attachment of the prescribed member to the second mover, exposing a second substrate held by the second mover in the first area, the exposure comprising disposing the liquid between the optical member and the second substrate held by the second mover; and holding the liquid between the optical member and the prescribed member, the holding of the liquid comprising removing the prescribed member from the second mover and retracting the second mover from the position opposed to the optical member so as to move to the second area; wherein the first mover is moved from the first area to the second area along a first path and the second mover is moved from the first area to the second area along a second path that is different from the first path, both the first and second paths being disposed on the one side of the first area, and the first mover includes a first cap holder positioned at a first corner of the first mover and positioned adjacent a first side of the first mover, and the second mover includes a second cap holder positioned at a second corner of the second mover and positioned adjacent a second side of the second mover, the first corner being opposite the second corner such that when the first side of the first mover is positioned adjacent to the second side of the second mover, the first and second cap holders are adjacent to each other.

12. The exposure method according to claim 11, wherein the prescribed member is held by the first mover when the substrate held by the first mover is exposed, and wherein the prescribed member is held by a different member than the first and the second movers during a period after the prescribed member is removed from the first mover until the prescribed member is attached to the second mover.

13. The exposure method according to claim 11, further comprising:

in parallel with the exposure of the substrate held by the first mover, detecting alignment information of the second substrate held by the second mover in the second area.

14. The exposure method according to claim 13, wherein the alignment information comprises position information of a mark on the substrate, and wherein the mark is detected via no liquid by means of a mark detection system provided at the second area.

15. The exposure method according to claim 11, wherein a replacement of the substrate held by the first mover is performed in parallel with the exposure of the second substrate held by the second mover.

16. The exposure method according to claim 11, wherein the first mover and the second mover are moved from the second area to the first area along different paths from each other.

17. A device manufacturing method comprising:

exposing a substrate by use of the exposure method according to claim 11; and developing the exposed substrate.

18. The exposure method according to claim 11, further comprising:

after the attachment of the prescribed member to the second mover, and before the exposing of the second substrate held by the second mover in the first area, performing a measurement related to exposure, via the optical member and the liquid, the measurement comprising arranging a first measurement region of the second mover to oppose the optical member, the first measurement region having an opening and being provided at a third corner that is different from a first corner and the second corner of the second mover, a second measurement region having a reference mark and being provided at the first corner of the second mover, the measurement further comprising detecting the exposure beam transmitting through the optical member, the liquid, and the opening.

19. The exposure method according to claim 18, wherein the measurement related to exposure further comprises detecting the reference mark of the second measurement region, via the optical member and the liquid, and wherein the second mover is moved, after the attachment of the prescribed member, so that the measurement regions oppose the optical member, respectively.

20. The exposure method according to claim 18, wherein after the prescribed member is attached to the second mover, moving the liquid on the second mover from the second corner to one of the first and third corners, and to another of the first and the third corners, along with the movement of the second mover.

* * * * *